US 6,560,301 B1

United States Patent
Cook et al.

(10) Patent No.: US 6,560,301 B1
(45) Date of Patent: *May 6, 2003

(54) INTEGRATED FREQUENCY TRANSLATION AND SELECTIVITY WITH A VARIETY OF FILTER EMBODIMENTS

(75) Inventors: Robert W. Cook, Switzerland, FL (US); Michael J. Bultman, Jacksonville, FL (US); Richard C. Looke, Jacksonville, FL (US); Charley D. Moses, Jr., Jacksonville, FL (US); David F. Sorrells, Jacksonville, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/293,283

(22) Filed: Apr. 16, 1999

Related U.S. Application Data

(63) Continuation-in-part of application No. 09/175,966, filed on Oct. 21, 1998, now Pat. No. 6,049,706.

(51) Int. Cl.$^7$ .................................................. H04B 1/10
(52) U.S. Cl. ........................ 375/350; 375/328; 375/351
(58) Field of Search .............................. 375/350, 316, 375/324, 328, 351; 455/313, 296, 323, 307; 329/304

(56) References Cited

U.S. PATENT DOCUMENTS

| 2,057,613 A | 10/1936 | Gardner ........................ 250/8 |
| 2,241,078 A | 5/1941 | Vreeland ...................... 179/15 |
| 2,270,385 A | 1/1942 | Skillman ..................... 179/15 |
| 2,283,575 A | 5/1942 | Roberts ......................... 250/6 |
| 2,358,152 A | 9/1944 | Earp ....................... 179/171.5 |
| 2,410,350 A | 10/1946 | Labin et al. .................. 179/15 |

(List continued on next page.)

FOREIGN PATENT DOCUMENTS

| DE | 35 41 031 A1 | 5/1986 | ............ H03D/3/00 |
| DE | 42 37 692 C1 | 3/1994 | ............ H04B/1/26 |
| DE | 196 27 640 A1 | 1/1997 | ............ H03D/7/12 |
| DE | 197 35 798 C1 | 7/1998 | ............ H04L/27/00 |
| EP | 0 035 166 A1 | 9/1981 | ............ H04B/1/26 |
| EP | 0 087 336 A1 | 8/1983 | ............ H03D/7/12 |
| EP | 0 099 265 A1 | 1/1984 | ............ H03D/3/04 |
| EP | 0 087 336 B1 | 7/1986 | ............ H03D/7/12 |
| EP | 0 254 844 A2 | 2/1988 | ............ H03D/7/00 |
| EP | 0 276 130 A2 | 7/1988 | ............ H03D/7/00 |
| EP | 0 276 130 A3 | 7/1988 | ............ H03D/7/00 |
| EP | 0 193 899 B1 | 6/1990 | ............ G01S/7/52 |

(List continued on next page.)

OTHER PUBLICATIONS

Aghvami, H. et al., "Land Mobile Satellites Using the Highly Elliptic Orbits—The UK T–SAT Mobile Payload," 4$^{th}$ *International Conf. On Satellite Systems for Mobile Communications and Navigation*, Oct. 17–19, 1988, pp. 147–153.

(List continued on next page.)

*Primary Examiner*—Chi Pham
*Assistant Examiner*—Phuong Phu
(74) *Attorney, Agent, or Firm*—Sterne, Kessler, Goldstein & Fox, P.L.L.C.

(57) ABSTRACT

Methods and apparatuses for frequency selectivity and frequency translation, and applications for such methods and apparatuses, are described herein. The method includes steps of filtering an input signal, and down-converting the filtered input signal. The filtering and the down-conversion operations are performed in an integrated, unified manner. The apparatus described herein can be implemented as an integrated circuit (IC).

19 Claims, 67 Drawing Sheets

U.S. PATENT DOCUMENTS

| | | | |
|---|---|---|---|
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredendall | 178/44 |
| 2,497,859 A | 2/1950 | Boughtwood et al. | 250/8 |
| 2,499,279 A | 2/1950 | Peterson | 332/41 |
| 2,802,208 A | 8/1957 | Hobbs | 343/176 |
| 2,985,875 A | 5/1961 | Grisdale et al. | 343/100 |
| 3,023,309 A | 2/1962 | Foulkes | 250/17 |
| 3,069,679 A | 12/1962 | Sweeney et al. | 343/200 |
| 3,104,393 A | 9/1963 | Vogelman | 343/200 |
| 3,114,106 A | 12/1963 | McManus | 325/56 |
| 3,118,117 A | 1/1964 | King et al. | 332/22 |
| 3,226,643 A | 12/1965 | McNair | 325/40 |
| 3,246,084 A | 4/1966 | Kryter | |
| 3,258,694 A | 6/1966 | Shepherd | 325/145 |
| 3,383,598 A | 5/1968 | Sanders | 325/163 |
| 3,384,822 A | 5/1968 | Miyagi | 325/30 |
| 3,454,718 A | 7/1969 | Perreault | 178/66 |
| 3,523,291 A | 8/1970 | Pierret | 340/347 |
| 3,548,342 A | 12/1970 | Maxey | 332/9 |
| 3,555,428 A | 1/1971 | Perreault | 325/320 |
| 3,617,892 A | 11/1971 | Hawley et al. | 325/145 |
| 3,621,402 A | 11/1971 | Gardner | 328/37 |
| 3,622,885 A | 11/1971 | Oberdorf et al. | |
| 3,623,160 A | 11/1971 | Giles et al. | 340/347 DA |
| 3,626,417 A | 12/1971 | Gilbert | 343/203 |
| 3,629,696 A | 12/1971 | Bartelink | 324/57 R |
| 3,662,268 A | 5/1972 | Gans et al. | 325/56 |
| 3,689,841 A | 9/1972 | Bello et al. | 325/39 |
| 3,714,577 A | 1/1973 | Hayes | 325/145 |
| 3,716,730 A | 2/1973 | Cerny, Jr. | |
| 3,717,844 A | 2/1973 | Barret et al. | 340/5 R |
| 3,735,048 A | 5/1973 | Tomsa et al. | 179/15 BM |
| 3,806,811 A | 4/1974 | Thompson et al. | 325/146 |
| 3,868,601 A | 2/1975 | MacAfee | 332/45 |
| 3,949,300 A | 4/1976 | Sadler | 325/31 |
| 3,967,202 A | 6/1976 | Batz | 325/31 |
| 3,980,945 A | 9/1976 | Bickford | 325/30 |
| 3,987,280 A | 10/1976 | Bauer | 235/150.53 |
| 3,991,277 A | 11/1976 | Hirata | 179/15 FD |
| 4,003,002 A | 1/1977 | Snijders et al. | 332/10 |
| 4,013,966 A | 3/1977 | Campbell | 325/363 |
| 4,017,798 A | 4/1977 | Gordy et al. | 325/42 |
| 4,019,140 A | 4/1977 | Swerdlow | 322/65 |
| 4,032,847 A | 6/1977 | Unkauf | 325/323 |
| 4,035,732 A | 7/1977 | Lohrmann | 325/446 |
| 4,047,121 A | 9/1977 | Campbell | 331/76 |
| 4,051,475 A | 9/1977 | Campbell | 343/180 |
| 4,066,841 A | 1/1978 | Young | 178/66 R |
| 4,066,919 A | 1/1978 | Huntington | 307/353 |
| 4,080,573 A | 3/1978 | Howell | |
| 4,081,748 A | 3/1978 | Batz | 325/56 |
| 4,130,765 A | 12/1978 | Arakelian et al. | 307/220 R |
| 4,130,806 A | 12/1978 | Van Gerwen et al. | 325/487 |
| 4,142,155 A | 2/1979 | Adachi | 325/47 |
| 4,170,764 A | 10/1979 | Salz et al. | 332/17 |
| 4,204,171 A | 5/1980 | Sutphin, Jr. | 328/167 |
| 4,210,872 A | 7/1980 | Gregorian | 330/9 |
| 4,245,355 A | 1/1981 | Pascoe et al. | 455/326 |
| 4,253,066 A | 2/1981 | Fisher et al. | 329/50 |
| 4,253,067 A | 2/1981 | Caples et al. | 329/110 |
| 4,253,069 A | 2/1981 | Nossek | 330/107 |
| 4,308,614 A | 12/1981 | Fisher et al. | 370/119 |
| 4,320,361 A | 3/1982 | Kikkert | 332/16 R |
| 4,320,536 A | 3/1982 | Dietrich | 455/325 |
| 4,334,324 A | 6/1982 | Hoover | |
| 4,346,477 A | 8/1982 | Gordy | 455/257 |
| 4,355,401 A | 10/1982 | Ikoma et al. | 375/5 |
| 4,356,558 A | 10/1982 | Owen et al. | 364/724 |
| 4,360,867 A | 11/1982 | Gonda | 363/158 |
| 4,363,132 A | 12/1982 | Collin | 455/52 |
| 4,365,217 A | 12/1982 | Berger et al. | 333/165 |
| 4,369,522 A | 1/1983 | Cerny, Jr. et al. | |
| 4,370,572 A | 1/1983 | Cosand et al. | 307/353 |
| 4,384,357 A | 5/1983 | deBuda et al. | |
| 4,389,579 A | 6/1983 | Stein | 307/353 |
| 4,392,255 A | 7/1983 | Del Giudice | 455/328 |
| 4,393,395 A | 7/1983 | Hacke et al. | 358/23 |
| 4,430,629 A | 2/1984 | Betzl et al. | 333/165 |
| 4,446,438 A | 5/1984 | Chang et al. | 328/127 |
| 4,456,990 A | 6/1984 | Fisher et al. | 370/119 |
| 4,470,145 A | 9/1984 | Williams | |
| 4,472,785 A | 9/1984 | Kasuga | 364/718 |
| 4,479,226 A | 10/1984 | Prabhu et al. | 375/1 |
| 4,481,490 A | 11/1984 | Huntley | 332/41 |
| 4,481,642 A | 11/1984 | Hanson | 375/9 |
| 4,483,017 A | 11/1984 | Hampel et al. | |
| 4,484,143 A | 11/1984 | French et al. | 329/50 |
| 4,485,488 A | 11/1984 | Houdart | 455/327 |
| 4,504,803 A | 3/1985 | Lee et al. | 332/31 R |
| 4,517,519 A | 5/1985 | Mukaiyama | 329/126 |
| 4,517,520 A | 5/1985 | Ogawa | 329/145 |
| 4,518,935 A | 5/1985 | van Roermund | 333/173 |
| 4,521,892 A | 6/1985 | Vance et al. | 375/88 |
| 4,563,773 A | 1/1986 | Dixon, Jr. et al. | 455/327 |
| 4,577,157 A | 3/1986 | Reed | 329/50 |
| 4,583,239 A | 4/1986 | Vance | 375/94 |
| 4,591,736 A | 5/1986 | Hirao et al. | 307/267 |
| 4,602,220 A | 7/1986 | Kurihara | 331/19 |
| 4,603,300 A | 7/1986 | Welles, II et al. | 329/50 |
| 4,612,464 A | 9/1986 | Ishikawa et al. | 307/496 |
| 4,612,518 A | 9/1986 | Gans et al. | 332/21 |
| 4,616,191 A | 10/1986 | Galani et al. | 331/4 |
| 4,621,217 A | 11/1986 | Saxe et al. | 315/1 |
| 4,628,517 A | 12/1986 | Schwarz et al. | 375/40 |
| 4,634,998 A | 1/1987 | Crawford | 331/1 A |
| 4,648,021 A | 3/1987 | Alberkrack | 363/157 |
| 4,651,034 A | 3/1987 | Sato | 307/556 |
| 4,653,117 A | 3/1987 | Heck | 455/209 |
| 4,675,882 A | 6/1987 | Lillie et al. | 375/80 |
| 4,688,253 A | 8/1987 | Gumm | 381/7 |
| 4,716,376 A | 12/1987 | Daudelin | 329/107 |
| 4,716,388 A | 12/1987 | Jacobs | 333/173 |
| 4,718,113 A | 1/1988 | Rother et al. | 455/209 |
| 4,726,041 A | 2/1988 | Prohaska et al. | 375/91 |
| 4,733,403 A | 3/1988 | Simone | 375/103 |
| 4,734,591 A | 3/1988 | Ichitsubo | 307/219.1 |
| 4,737,969 A | 4/1988 | Steel et al. | 375/67 |
| 4,743,858 A | 5/1988 | Everard | 330/10 |
| 4,745,463 A | 5/1988 | Lu | 358/23 |
| 4,751,468 A | 6/1988 | Agoston | 328/133 |
| 4,757,538 A | 7/1988 | Zink | 381/7 |
| 4,768,187 A | 8/1988 | Marshall | 370/69.1 |
| 4,769,612 A | 9/1988 | Tamakoshi et al. | 328/167 |
| 4,785,463 A | 11/1988 | Janc et al. | 375/1 |
| 4,791,584 A | 12/1988 | Greivenkamp, Jr. | 364/525 |
| 4,801,823 A | 1/1989 | Yokoyama | 307/353 |
| 4,806,790 A | 2/1989 | Sone | 307/353 |
| 4,810,904 A | 3/1989 | Crawford | 307/353 |
| 4,810,976 A | 3/1989 | Cowley et al. | 331/117 R |
| 4,811,362 A | 3/1989 | Yester, Jr. et al. | 375/75 |
| 4,816,704 A | 3/1989 | Fiori, Jr. | 307/519 |
| 4,819,252 A | 4/1989 | Christopher | 375/122 |
| 4,833,445 A | 5/1989 | Buchele | 341/118 |
| 4,841,265 A | 6/1989 | Watanabe et al. | 333/194 |
| 4,855,894 A | 8/1989 | Asahi et al. | 363/157 |
| 4,862,121 A | 8/1989 | Hochschild et al. | 333/173 |
| 4,868,654 A | 9/1989 | Juri et al. | 358/133 |
| 4,870,659 A | 9/1989 | Oishi et al. | 375/82 |
| 4,871,987 A | 10/1989 | Kawase | 332/100 |

| | | | | | | |
|---|---|---|---|---|---|---|
| 4,885,587 A | 12/1989 | Wiegand et al. ............... 42/14 | 5,278,826 A | 1/1994 | Murphy et al. ............... 370/76 |
| 4,885,756 A | 12/1989 | Fontanes et al. ............... 375/82 | 5,282,023 A | 1/1994 | Scarpa ........................ 358/36 |
| 4,888,557 A | 12/1989 | Puckette, IV et al. ....... 329/341 | 5,287,516 A | 2/1994 | Schaub ........................ 375/88 |
| 4,890,302 A | 12/1989 | Muilwijk ..................... 375/80 | 5,293,398 A | 3/1994 | Hamao et al. ................. 375/1 |
| 4,893,316 A | 1/1990 | Janc et al. .................... 375/44 | 5,303,417 A | 4/1994 | Laws ........................ 455/314 |
| 4,893,341 A | 1/1990 | Gehring ........................ 381/7 | 5,307,517 A | 4/1994 | Rich ........................... 455/306 |
| 4,894,766 A | 1/1990 | De Agro ..................... 363/159 | 5,315,583 A | 5/1994 | Murphy et al. ............... 370/18 |
| 4,896,152 A | 1/1990 | Tiemann ..................... 340/853 | 5,319,799 A | 6/1994 | Morita ........................ 455/78 |
| 4,902,979 A | 2/1990 | Puckette, IV ............... 329/343 | 5,321,852 A | 6/1994 | Seong ..................... 455/182.1 |
| 4,908,579 A | 3/1990 | Tawfik et al. ............... 328/167 | 5,325,204 A | 6/1994 | Scarpa ........................ 348/607 |
| 4,910,752 A | 3/1990 | Yester, Jr. et al. ............ 375/75 | 5,337,014 A | 8/1994 | Najle et al. ................. 324/613 |
| 4,914,405 A | 4/1990 | Wells ........................... 331/25 | 5,339,054 A | 8/1994 | Taguchi ...................... 332/100 |
| 4,920,510 A | 4/1990 | Senderowicz et al. ...... 364/825 | 5,339,459 A | 8/1994 | Schiltz et al. ............... 455/333 |
| 4,922,452 A | 5/1990 | Larsen et al. ................. 365/45 | 5,353,306 A | 10/1994 | Yamamoto ................... 375/14 |
| 4,931,921 A | 6/1990 | Anderson ................... 363/163 | 5,355,114 A | 10/1994 | Sutterlin et al. ......... 340/310 A |
| 4,943,974 A | 7/1990 | Motamedi .................... 375/1 | 5,361,408 A | 11/1994 | Watanabe et al. ........... 455/324 |
| 4,944,025 A | 7/1990 | Gehring et al. ............. 455/207 | 5,369,404 A | 11/1994 | Galton |
| 4,955,079 A | 9/1990 | Connerney et al. ......... 455/325 | 5,369,800 A | 11/1994 | Takagi et al. ................. 455/59 |
| 4,965,467 A | 10/1990 | Bilterijst ..................... 307/352 | 5,375,146 A | 12/1994 | Chalmers .................... 375/103 |
| 4,967,160 A | 10/1990 | Quievy et al. ................ 328/16 | 5,379,040 A | 1/1995 | Mizomoto et al. .......... 341/143 |
| 4,970,703 A | 11/1990 | Hariharan et al. .......... 367/138 | 5,379,141 A | 1/1995 | Thompson et al. ......... 359/125 |
| 4,982,353 A | 1/1991 | Jacob et al. ............... 364/724.1 | 5,388,063 A | 2/1995 | Takatori et al. ........ 364/724.17 |
| 4,984,077 A | 1/1991 | Uchida ....................... 358/140 | 5,390,364 A | 2/1995 | Webster et al. ............. 455/52.3 |
| 4,995,055 A | 2/1991 | Weinberger et al. ........... 375/5 | 5,400,084 A | 3/1995 | Scarpa ........................ 348/624 |
| 5,003,621 A | 3/1991 | Gailus ........................ 455/209 | 5,404,127 A | 4/1995 | Lee et al. ............... 340/310.02 |
| 5,005,169 A | 4/1991 | Bronder et al. ............... 370/76 | 5,410,541 A | 4/1995 | Hotto ........................... 370/76 |
| 5,006,810 A | 4/1991 | Popescu ..................... 328/167 | 5,410,743 A | 4/1995 | Seely et al. ................. 455/326 |
| 5,010,585 A | 4/1991 | Garcia ........................ 455/118 | 5,412,352 A | 5/1995 | Graham ...................... 332/103 |
| 5,014,304 A | 5/1991 | Nicollini et al. ............ 379/399 | 5,416,803 A | 5/1995 | Janer ........................... 375/324 |
| 5,015,963 A | 5/1991 | Sutton ........................ 329/361 | 5,422,913 A | 6/1995 | Wilkinson .................. 375/347 |
| 5,017,924 A | 5/1991 | Guiberteau et al. ......... 342/195 | 5,423,082 A | 6/1995 | Cygan et al. ................ 455/126 |
| 5,020,149 A | 5/1991 | Hemmie ..................... 455/325 | 5,428,638 A | 6/1995 | Cioffi et al. ................. 375/224 |
| 5,020,154 A | 5/1991 | Zierhut ....................... 455/608 | 5,428,640 A | 6/1995 | Townley ..................... 375/257 |
| 5,052,050 A | 9/1991 | Collier et al. ............... 455/296 | 5,434,546 A | 7/1995 | Palmer ........................ 332/151 |
| 5,065,409 A | 11/1991 | Hughes et al. ................ 375/91 | 5,438,692 A | 8/1995 | Mohindra .................... 455/324 |
| 5,083,050 A | 1/1992 | Vasile ........................ 307/529 | 5,444,415 A | 8/1995 | Dent et al. .................. 329/302 |
| 5,091,921 A | 2/1992 | Minami ....................... 375/88 | 5,444,416 A | 8/1995 | Ishikawa et al. ............ 329/341 |
| 5,095,533 A | 3/1992 | Loper et al. ................. 455/245 | 5,444,865 A | 8/1995 | Heck et al. .................... 455/86 |
| 5,095,536 A | 3/1992 | Loper ........................ 455/324 | 5,446,421 A | 8/1995 | Kechkaylo .................. 332/100 |
| 5,111,152 A | 5/1992 | Makino ....................... 329/300 | 5,446,422 A | 8/1995 | Mattila et al. ............... 332/103 |
| 5,113,094 A | 5/1992 | Grace et al. ................. 307/529 | 5,448,602 A | 9/1995 | Ohmori et al. .............. 375/347 |
| 5,113,129 A | 5/1992 | Hughes ....................... 323/316 | 5,451,899 A | 9/1995 | Lawton ....................... 329/302 |
| 5,115,409 A | 5/1992 | Stepp ......................... 364/841 | 5,454,007 A | 9/1995 | Dutta ........................... 375/322 |
| 5,122,765 A | 6/1992 | Pataut ......................... 332/105 | 5,454,009 A | 9/1995 | Fruit et al. .................. 372/202 |
| 5,124,592 A | 6/1992 | Hagino ....................... 307/520 | 5,463,356 A | 10/1995 | Palmer ........................ 332/117 |
| 5,126,682 A * | 6/1992 | Weinberg et al. ........... 329/304 | 5,463,357 A | 10/1995 | Hobden |
| 5,136,267 A | 8/1992 | Cabot ......................... 333/174 | 5,465,071 A | 11/1995 | Kobayashi et al. .......... 329/315 |
| 5,140,705 A | 8/1992 | Kosuga ....................... 455/318 | 5,465,410 A | 11/1995 | Hiben et al. ................. 455/266 |
| 5,150,124 A | 9/1992 | Moore et al. .................. 342/68 | 5,465,415 A | 11/1995 | Bien ............................ 455/326 |
| 5,151,661 A | 9/1992 | Caldwell et al. ............. 328/14 | 5,465,418 A | 11/1995 | Zhou et al. |
| 5,157,687 A | 10/1992 | Tymes | 5,471,162 A | 11/1995 | McEwan ....................... 327/92 |
| 5,159,710 A | 10/1992 | Cusdin ....................... 455/304 | 5,479,120 A | 12/1995 | McEwan ....................... 327/91 |
| 5,170,414 A | 12/1992 | Silvian ......................... 375/59 | 5,479,447 A | 12/1995 | Chow et al. ................. 375/260 |
| 5,172,070 A | 12/1992 | Hiraiwa et al. .............. 329/304 | 5,483,193 A | 1/1996 | Kennedy et al. ............. 329/300 |
| 5,191,459 A | 3/1993 | Thompson et al. .......... 359/133 | 5,483,549 A | 1/1996 | Weinberg et al. ........... 375/200 |
| 5,204,642 A | 4/1993 | Ashgar et al. ............... 331/135 | 5,483,691 A | 1/1996 | Heck et al. ............... 455/234.2 |
| 5,212,827 A | 5/1993 | Meszko et al. .............. 455/219 | 5,490,173 A | 2/1996 | Whikehart et al. .......... 375/316 |
| 5,214,787 A | 5/1993 | Karkota, Jr. ................. 455/3.2 | 5,493,581 A | 2/1996 | Young et al. ................ 375/350 |
| 5,220,583 A | 6/1993 | Solomon ..................... 375/82 | 5,493,721 A | 2/1996 | Reis ............................ 455/339 |
| 5,220,680 A | 6/1993 | Lee ............................ 455/102 | 5,495,200 A | 2/1996 | Kwan et al. ................. 327/554 |
| 5,222,144 A | 6/1993 | Whikehart ................... 381/15 | 5,495,202 A | 2/1996 | Hsu ............................. 327/113 |
| 5,230,097 A | 7/1993 | Currie et al. ............. 455/226.1 | 5,495,500 A | 2/1996 | Jovanovich et al. ......... 375/206 |
| 5,239,686 A | 8/1993 | Downey ....................... 455/78 | 5,499,267 A | 3/1996 | Ohe et al. .................... 375/206 |
| 5,241,561 A | 8/1993 | Barnard ........................ 375/1 | 5,500,758 A | 3/1996 | Thompson et al. .......... 359/189 |
| 5,249,203 A | 9/1993 | Loper .......................... 375/97 | 5,513,389 A | 4/1996 | Reeser et al. |
| 5,251,218 A | 10/1993 | Stone et al. ................. 370/120 | 5,515,014 A | 5/1996 | Troutman .................... 332/178 |
| 5,251,232 A | 10/1993 | Nonami ........................ 375/5 | 5,517,688 A | 5/1996 | Fajen et al. .................. 455/333 |
| 5,260,970 A | 11/1993 | Henry et al. .................. 375/10 | 5,519,890 A | 5/1996 | Pinckley ..................... 455/307 |
| 5,263,194 A | 11/1993 | Ragan ........................ 455/316 | 5,523,719 A | 6/1996 | Longo et al. ................ 327/557 |
| 5,263,196 A | 11/1993 | Jasper ........................ 455/324 | 5,523,726 A | 6/1996 | Kroeger et al. ............. 332/103 |
| 5,267,023 A | 11/1993 | Kawasaki ................... 358/23 | 5,523,760 A | 6/1996 | McEwan ....................... 342/89 |

| Patent No. | Date | Inventor | Class |
|---|---|---|---|
| 5,539,770 A | 7/1996 | Ishigaki | 375/206 |
| 5,555,453 A | 9/1996 | Kajimoto et al. | 455/266 |
| 5,557,641 A | 9/1996 | Weinberg | 375/295 |
| 5,557,642 A | 9/1996 | Williams | 375/316 |
| 5,563,550 A | 10/1996 | Toth | 329/347 |
| 5,574,755 A | 11/1996 | Persico | 375/295 |
| 5,579,341 A | 11/1996 | Smith et al. | 375/267 |
| 5,579,347 A | 11/1996 | Lindquist et al. | 375/346 |
| 5,584,068 A | 12/1996 | Mohindra | 455/324 |
| 5,592,131 A | 1/1997 | Labreche et al. | 332/103 |
| 5,600,680 A | 2/1997 | Mishima et al. | |
| 5,602,847 A | 2/1997 | Pagano et al. | 370/484 |
| 5,602,868 A | 2/1997 | Wilson | 375/219 |
| 5,604,592 A | 2/1997 | Kotidis et al. | 356/357 |
| 5,604,732 A | 2/1997 | Kim et al. | 370/342 |
| 5,606,731 A | 2/1997 | Pace et al. | |
| 5,608,531 A | 3/1997 | Honda et al. | 386/1 |
| 5,610,946 A | 3/1997 | Tanaka et al. | 375/269 |
| RE35,494 E | 4/1997 | Nicollini | 327/554 |
| 5,617,451 A | 4/1997 | Mimura et al. | 375/340 |
| 5,619,538 A | 4/1997 | Sempel et al. | 375/328 |
| 5,621,455 A | 4/1997 | Rogers et al. | 348/6 |
| 5,628,055 A | 5/1997 | Stein | |
| 5,630,227 A | 5/1997 | Bella et al. | 455/324 |
| 5,633,815 A | 5/1997 | Young | |
| 5,638,396 A | 6/1997 | Kilmek | 372/92 |
| 5,640,415 A | 6/1997 | Pandula | 375/202 |
| 5,640,424 A | 6/1997 | Banavong et al. | 375/316 |
| 5,640,428 A | 6/1997 | Abe et al. | 375/334 |
| 5,640,698 A | 6/1997 | Shen et al. | 455/323 |
| 5,648,985 A | 7/1997 | Bjerede et al. | 375/219 |
| 5,650,785 A | 7/1997 | Rodal | 342/357 |
| 5,661,424 A | 8/1997 | Tang | 327/105 |
| 5,663,878 A | 9/1997 | Walker | 363/159 |
| 5,663,986 A | 9/1997 | Striffler | 375/260 |
| 5,668,836 A | 9/1997 | Smith et al. | 375/316 |
| 5,675,392 A | 10/1997 | Nayebi et al. | 348/584 |
| 5,678,220 A | 10/1997 | Fournier | |
| 5,680,078 A | 10/1997 | Ariie | 332/178 |
| 5,680,418 A | 10/1997 | Croft et al. | 375/346 |
| 5,689,413 A | 11/1997 | Jaramillo et al. | 363/146 |
| 5,694,096 A | 12/1997 | Ushiroku et al. | 333/195 |
| 5,699,006 A | 12/1997 | Zele et al. | 327/341 |
| 5,705,949 A | 1/1998 | Alelyunas et al. | 329/304 |
| 5,705,955 A | 1/1998 | Freeburg et al. | 331/14 |
| 5,710,998 A | 1/1998 | Opas | 455/324 |
| 5,714,910 A | 2/1998 | Skoczen et al. | 331/3 |
| 5,715,281 A | 2/1998 | Bly et al. | 375/344 |
| 5,721,514 A | 2/1998 | Crockett et al. | 331/3 |
| 5,724,002 A | 3/1998 | Hulick | 329/361 |
| 5,724,653 A | 3/1998 | Baker et al. | 455/296 |
| 5,729,577 A | 3/1998 | Chen | 375/334 |
| 5,729,829 A | 3/1998 | Talwar et al. | 455/63 |
| 5,732,333 A | 3/1998 | Cox et al. | 455/126 |
| 5,736,895 A | 4/1998 | Yu et al. | 327/554 |
| 5,737,035 A | 4/1998 | Rotzoll | 348/725 |
| 5,742,189 A | 4/1998 | Yoshida et al. | 327/113 |
| 5,748,683 A | 5/1998 | Smith et al. | 375/347 |
| 5,757,870 A | 5/1998 | Miya et al. | 375/367 |
| RE35,829 E | 6/1998 | Sanderford, Jr. | 375/200 |
| 5,760,645 A | 6/1998 | Comte et al. | 329/304 |
| 5,764,087 A | 6/1998 | Clark | 327/105 |
| 5,767,726 A | 6/1998 | Wang | 327/356 |
| 5,768,118 A | 6/1998 | Faulk et al. | 363/72 |
| 5,768,323 A | 6/1998 | Kroeger et al. | 375/355 |
| 5,770,985 A | 6/1998 | Ushiroku et al. | 333/193 |
| 5,771,442 A | 6/1998 | Wang et al. | 455/93 |
| 5,777,692 A | 7/1998 | Ghosh | 348/725 |
| 5,777,771 A | 7/1998 | Smith | 359/180 |
| 5,778,022 A | 7/1998 | Walley | 375/206 |
| 5,786,844 A | 7/1998 | Rogers et al. | 348/6 |
| 5,793,801 A | 8/1998 | Fertner | 375/219 |
| 5,793,818 A | 8/1998 | Claydon et al. | 375/326 |
| 5,801,654 A | 9/1998 | Traylor | 341/144 |
| 5,802,463 A | 9/1998 | Zuckerman | 455/208 |
| 5,809,060 A | 9/1998 | Cafarella et al. | 375/206 |
| 5,812,546 A | 9/1998 | Zhou et al. | 370/342 |
| 5,818,582 A | 10/1998 | Fernandez et al. | 356/318 |
| 5,818,869 A | 10/1998 | Miya et al. | 375/206 |
| 5,825,254 A | 10/1998 | Lee | 331/25 |
| 5,834,985 A | 11/1998 | Sundegård | 332/100 |
| 5,841,324 A | 11/1998 | Williams | 331/17 |
| 5,841,811 A | 11/1998 | Song | 375/235 |
| 5,844,449 A | 12/1998 | Abeno et al. | 332/105 |
| 5,859,878 A | 1/1999 | Phillips et al. | 375/316 |
| 5,864,754 A | 1/1999 | Hotto | 455/280 |
| 5,870,670 A | 2/1999 | Ripley et al. | |
| 5,872,446 A | 2/1999 | Cranford, Jr. et al. | 323/315 |
| 5,881,375 A | 3/1999 | Bonds | 455/118 |
| 5,883,548 A | 3/1999 | Assard et al. | 329/306 |
| 5,892,380 A | 4/1999 | Quist | 327/172 |
| 5,894,239 A | 4/1999 | Bonaccio et al. | 327/176 |
| 5,894,496 A | 4/1999 | Jones | 455/126 |
| 5,896,562 A | 4/1999 | Heinonen | 455/76 |
| 5,900,747 A | 5/1999 | Brauns | 327/9 |
| 5,901,054 A | 5/1999 | Leu et al. | 363/41 |
| 5,901,187 A | 5/1999 | Iinuma | 375/347 |
| 5,901,344 A | 5/1999 | Opas | 455/76 |
| 5,901,347 A | 5/1999 | Chambers et al. | 455/234.1 |
| 5,901,348 A | 5/1999 | Bang et al. | 455/254 |
| 5,901,349 A | 5/1999 | Guegnaud et al. | 455/302 |
| 5,903,178 A | 5/1999 | Miyatsuji et al. | 327/308 |
| 5,903,187 A | 5/1999 | Claverie et al. | 329/342 |
| 5,903,196 A | 5/1999 | Salvi et al. | 331/16 |
| 5,903,421 A | 5/1999 | Furutani et al. | 361/58 |
| 5,903,553 A | 5/1999 | Sakamoto et al. | 370/338 |
| 5,903,595 A | 5/1999 | Suzuki et al. | 375/207 |
| 5,903,609 A | 5/1999 | Kool et al. | 375/261 |
| 5,903,827 A | 5/1999 | Kennan et al. | 455/326 |
| 5,903,854 A | 5/1999 | Abe et al. | 455/575 |
| 5,905,449 A | 5/1999 | Tsubouchi et al. | 340/925.69 |
| 5,907,149 A | 5/1999 | Marckini | 235/487 |
| 5,907,197 A | 5/1999 | Faulk | 307/119 |
| 5,909,447 A | 6/1999 | Cox et al. | 370/508 |
| 5,911,116 A | 6/1999 | Nosswitz | 455/83 |
| 5,911,123 A | 6/1999 | Shaffer et al. | 455/554 |
| 5,914,622 A | 6/1999 | Inoue | 327/172 |
| 5,915,278 A | 6/1999 | Mallick | 73/658 |
| 5,920,199 A | 7/1999 | Sauer | 324/678 |
| 5,926,065 A * | 7/1999 | Wakai et al. | 329/304 |
| 5,933,467 A | 8/1999 | Sehier et al. | 375/350 |
| 5,943,370 A | 8/1999 | Smith | 375/334 |
| 5,945,660 A | 8/1999 | Nakasuji et al. | |
| 5,952,895 A | 9/1999 | McCune, Jr. et al. | 332/128 |
| 5,953,642 A | 9/1999 | Feldtkeller et al. | 455/195.1 |
| 5,959,850 A | 9/1999 | Lim | |
| 5,960,033 A | 9/1999 | Shibano et al. | 375/207 |
| 6,028,887 A | 2/2000 | Harrison et al. | 375/206 |
| 6,041,073 A | 3/2000 | Davidovici et al. | 375/148 |
| 6,049,706 A * | 4/2000 | Cook et al. | 455/313 |
| 6,054,889 A | 4/2000 | Kobayashi | 327/357 |
| 6,061,551 A | 5/2000 | Sorrells et al. | |
| 6,061,555 A | 5/2000 | Bultman et al. | |
| 6,081,691 A | 6/2000 | Renard et al. | 455/12.1 |
| 6,084,922 A | 7/2000 | Zhou et al. | 375/316 |
| 6,091,939 A | 7/2000 | Banh | |
| 6,091,940 A | 7/2000 | Sorrells et al. | |
| 6,091,941 A | 7/2000 | Moriyama et al. | |
| 6,098,886 A | 8/2000 | Swift et al. | |
| 6,121,819 A | 9/2000 | Traylor | 327/359 |
| 6,125,271 A | 9/2000 | Rowland et al. | 455/313 |
| 6,144,236 A | 11/2000 | Vice et al. | 327/113 |

| | | | | |
|---|---|---|---|---|
| 6,144,846 A | 11/2000 | Durec .................. 455/323 |
| 6,147,340 A | 11/2000 | Levy .................. 250/214 R |
| 6,147,763 A | 11/2000 | Steinlechner .............. 356/484 |
| 6,150,890 A | 11/2000 | Damgaard et al. ............ 331/14 |
| 6,175,728 B1 | 1/2001 | Mitama .................. 455/323 |
| 6,215,475 B1 | 4/2001 | Meyerson et al. |
| 6,266,518 B1 | 7/2001 | Sorrells et al. |
| 6,314,279 B1 | 11/2001 | Mohindra |
| 6,330,244 B1 | 12/2001 | Swartz et al. |
| 6,353,735 B1 | 3/2002 | Sorrells et al. |
| 6,370,371 B1 | 4/2002 | Sorrells et al. |
| 6,421,534 B1 | 7/2002 | Cook et al. |

FOREIGN PATENT DOCUMENTS

| | | | | |
|---|---|---|---|---|
| EP | 0 380 351 A2 | 8/1990 | .......... H03H/17/04 |
| EP | 0 380 351 A3 | 2/1991 | .......... H03H/17/04 |
| EP | 0 411 840 A2 | 2/1991 | .......... G01R/33/36 |
| EP | 0 423 718 A2 | 4/1991 | ............ H04N/7/01 |
| EP | 0 411 840 A3 | 7/1991 | ............ G01R/33/36 |
| EP | 0 486 095 A1 | 5/1992 | ............ H03D/3/00 |
| EP | 0 423 718 A3 | 8/1992 | ............ H04N/7/01 |
| EP | 0 512 748 A2 | 11/1992 | ............ H04N/9/64 |
| EP | 0 529 836 A1 | 3/1993 | ............ H03L/7/089 |
| EP | 0 548 542 A1 | 6/1993 | ............ H03B/19/14 |
| EP | 0 512 748 A3 | 7/1993 | ............ H04N/9/64 |
| EP | 0 560 228 A1 | 9/1993 | ............ H03D/7/12 |
| EP | 0 632 288 A2 | 1/1995 | ............ G01S/13/75 |
| EP | 0 632 577 A1 | 1/1995 | ............ H03D/7/16 |
| EP | 0 411 840 B1 | 10/1995 | ............ G01R/33/36 |
| EP | 0 696 854 A1 | 2/1996 | ............ H04B/1/26 |
| EP | 0 632 288 A3 | 7/1996 | ............ G01S/13/75 |
| EP | 0 732 803 A1 | 9/1996 | ............ H03D/3/00 |
| EP | 0 486 095 B1 | 2/1997 | ............ H03D/3/00 |
| EP | 0 782 275 A2 | 7/1997 | ............ H04B/7/02 |
| EP | 0 785 635 A1 | 7/1997 | ............ H04B/1/713 |
| EP | 0 789 449 A2 | 8/1997 | ............ H03D/7/12 |
| EP | 0 795 955 A2 | 9/1997 | .......... H03D/13/00 |
| EP | 0 795 955 A3 | 9/1997 | .......... H03D/13/00 |
| EP | 0 795 978 A2 | 9/1997 | ............. H04L/5/06 |
| EP | 0 817 369 A3 | 1/1998 | ............ H03D/7/00 |
| EP | 0 817 369 A2 | 1/1998 | ............ H03D/7/00 |
| EP | 0 837 565 A1 | 4/1998 | ............ H04B/1/69 |
| EP | 0 862 274 A1 | 9/1998 | ............ H03M/1/06 |
| EP | 0 874 499 A2 | 10/1998 | ............ H04L/25/06 |
| EP | 0 512 748 B1 | 11/1998 | ............ H04N/9/64 |
| FR | 2 245 130 | 4/1975 | ............ H03K/5/13 |
| FR | 2 669 787 A1 | 5/1992 | ............ H03D/7/14 |
| FR | 2 743 231 A1 | 7/1997 | ............ H04B/7/12 |
| GB | 2 161 344 A | 1/1986 | ............ H04B/7/12 |
| GB | 2 215 945 A | 9/1989 | ............ H04L/27/00 |
| GB | 2 324 919 A | 11/1998 | ............ H03D/7/18 |
| JP | 47-2314 | 2/1972 | |
| JP | 55-66057 | 5/1980 | ............ G06K/7/10 |
| JP | 56-114451 | 9/1981 | ............ H04B/7/02 |
| JP | 58-7903 | 1/1983 | ............ H03C/1/02 |
| JP | 58-133004 | 8/1983 | ............ H03D/1/00 |
| JP | 59-144249 | 8/1984 | ............ H04L/27/00 |
| JP | 60-58705 | 4/1985 | ............ H03D/7/00 |
| JP | 60-130203 | 7/1985 | ............ H03D/7/00 |
| JP | 63-54002 | 3/1988 | ......... H03B/19/114 |
| JP | 63-65587 | 3/1988 | ............ G06K/7/10 |
| JP | 63-153691 | 6/1988 | .......... G06K/17/00 |
| JP | 2-39632 | 2/1990 | ............ H04B/7/12 |
| JP | 2-131629 | 5/1990 | ............ H04B/7/12 |
| JP | 2-276351 | 11/1990 | ............ H04L/27/22 |
| JP | 4-123614 | 4/1992 | ....... H03K/19/0175 |
| JP | 4-127601 | 4/1992 | ............ H03D/7/00 |
| JP | 5-175730 | 7/1993 | ............ H03D/1/00 |
| JP | 5-175734 | 7/1993 | ............ H03D/3/00 |
| JP | 6-237276 | 8/1994 | ............ H04L/27/20 |
| JP | 7-154344 | 6/1995 | ............ H04B/14/06 |
| JP | 7-307620 | 11/1995 | ............ H03D/1/18 |
| JP | 8-23359 | 1/1996 | ............ H04L/27/20 |
| JP | 8-32556 | 2/1996 | ............. H04L/1/04 |
| JP | 8-139524 | 5/1996 | ............ H03D/7/00 |
| WO | WO 80/01633 A1 | 8/1980 | ............ H04J/1/08 |
| WO | WO 91/18445 A1 | 11/1991 | ............ H03D/7/18 |
| WO | WO 94/05087 A1 | 3/1994 | ............ H03M/1/00 |
| WO | WO 95/01006 A1 | 1/1995 | ............ H03M/1/66 |
| WO | WO 96/02977 A1 | 2/1996 | ............ H04B/1/26 |
| WO | WO 96/08078 A1 | 3/1996 | ............ H03D/3/00 |
| WO | WO 96/39750 A1 | 12/1996 | ............ H04B/1/26 |
| WO | WO 97/08839 A3 | 3/1997 | ............ H04B/1/04 |
| WO | WO 97/08839 A2 | 3/1997 | ............ H04B/1/04 |
| WO | WO 97/38490 A1 | 10/1997 | ............ H03K/7/00 |
| WO | WO 98/00953 A1 | 1/1998 | ............ H04L/27/26 |
| WO | WO 98/24201 A1 | 6/1998 | ............ H04H/1/00 |
| WO | WO 98/40968 A2 | 9/1998 | ............ H03L/7/08 |
| WO | WO 98/40968 A3 | 9/1998 | ............ H03L/7/08 |
| WO | WO 99/23755 A1 | 5/1999 | ............ H03D/7/16 |

OTHER PUBLICATIONS

Akers, N.P. et al., "RF Sampling Gates: a Brief Review," *IEE Proc.,* vol. 133, Part A, No. 1, Jan. 1986, pp. 45–49.

Al–Ahmad, H.A.M. et al., "Doppler Frequency Correction for a Non–Geostationary Communications Satellite. Techniques for CERS and T–SAT," *Electronics Division Colloquium on Low Noise Oscillators and Synthesizer,* Jan. 23, 1986, pp. 4/1–4/5.

Ali, I. et al., "Doppler Characterization for LEO Satellites," *IEEE Trans. On Communications,* vol. 46, No. 3, Mar. 1998, pp. 309–313.

Allan, D.W., "Statistics of Atomic Frequency Standards," *Proc. Of the IEEE Special Issue on Frequency Stability,* Feb. 1966, pp. 221–230.

Allstot, D.J. et al., "MOS Switched Capacitor Ladder Filters," *IEEE Journal of Solid–State Circuits,* vol. SC–13, No. 6, Dec. 1978, pp. 806–814.

Allstot, D.J. and Black Jr. W.C., "Technological Design Considerations for Monolithic MOS Switched–Capacitor Filtering Systems," *Proceedings of the IEEE,* vol. 71, No. 8, Aug. 1983, pp. 967–986.

Alouini, M. et al., "Channel Characterization and Modeling for Ka–Band Very Small Aperture Terminals," *Proc. Of the IEEE,* vol. 85, No. 6, Jun. 1997, pp. 981–997.

Andreyev, G.A. and Ogarev, S.A., "Phase Distortions of Keyed Millimeter–Wave Signals in the Case of Propagation in a Turbulent Atmosphere," *Telecommunications and Radio Engineering,* vol. 43, No. 12, Dec. 1988, pp. 87–90.

Antonetti, A. et al., "Optoelectronic Sampling in the Picosecond Range," *Optics Communications,* vol. 21, No. 2, May 1977, pp. 211–214.

Austin, J. et al., "Doppler Correction of the Telecommunication Payload Oscillators in the UK T–SAT," 18th *European Microwave Conference,* Sep. 12–15, 1988, pp. 851–857.

Auston, D.H., "Picosecond optoelectronic switching and gating in silicon," *Applied Physics Letters,* vol. 26, No. 3, Feb. 1, 1975, pp. 101–103.

Baher, H., "Transfer Functions for Switched–Capacitor and Wave Digital Filters," *IEEE Transactions on Circuits and Systems,* vol. CAS–33, No. 11, Nov. 1986, pp. 1138–1142.

Baines, R., "The DSP Bottleneck," *IEEE Communications Magazine,* May 1995, pp. 46–54.

Banjo, O.P. and Vilar, E., "Binary Error Probabilities on Earth–Space Links Subject to Scintillation Fading," *Electronics Letters,* vol. 21, No. 7, Mar. 28, 1985, pp. 296–297.

Banjo, O.P. and Vilar, E., "The Dependence of Slant Path Amplitude Scintillations on Various Meteorological Parameters," *Antennas and Propagation (ICAP87) Part2: Propagation*, Mar. 30–Apr. 2, 1987, pp. 277–280.

Banjo, O.P. and Vilar, E. "Measurement and Modeling of Amplitude Scintillations on Low–Elevation Earth–Space Paths and Impact on Communication Systems," *IEEE Trans. On Communications*, vol. COM–34, No. 8, Aug. 1986, pp. 774–780.

Banjo, O.P. et al., "Tropospheric Amplitude Spectra Due to Absorption and Scattering in Earth–Space Paths," *Antennas and Propagation (ICAP 85)*, Apr. 16–19, 1985, pp. 77–82.

Basili, P. et al., "Observation of High $C^2$ and Turbulent Path Length on OTS Space–Earth Link," *Electronics Letters*, vol. 24, No. 17, Aug. 18, 1988, pp. 1114–1116.

Basili, P. et al., "Observation of High $C^2$ and Turbulent Path Length on OTS Space–Earth Link," *Electronics Letters*, vol. 24, No. 17, Aug. 18, 1988, pp. 1114–1116.

Blakey, J.R. et al., "Measurement of Atmospheric Millimetre–Wave Phase Scintillations in an Absorption Region," *Electronics Letters*, vol. 21, No. 11, May 23, 1985, pp. 486–487.

Burgueño, A. et al., "Influence of rain gauge integration time on the rain rate statistics used in microwave communications," *annales des telecommunications*, Sep./Oct. 1988, pp. 522–527.

Burgueño, A. et al., "Long–Term Joint Statistical Analysis of Duration and Intensity of Rainfall Rate with Application to Microwave Communications," *Antennas and Propagation (ICAP 87) Part 2: Propagation*, Mar. 30–Apr. 2, 1987, pp. 198–201.

Burgueño, A. et al., "Long Term Statistics of Precipitation Rate Return Periods in the Context of Microwave Communications," *Antennas and Propagation (ICAP 89) Part 2: Propagation*, Apr. 4–7, 1989, pp. 297–301.

Burgueño, A. et al., "Spectral Analysis of 49 Years of Rainfall Rate and Relation to Fade Dynamics," *IEEE Trans. On Communications*, vol. 38, No. 9, Sep. 1990, pp. 1359–1366.

Catalan, C. and Vilar, E., "Approach for satellite slant path remote sensing," *Electronics Letters*, vol. 34, No. 12, Jun. 11, 1998, pp. 1238–1240.

Chan, P. et al., "A Highly Linear 1–GHz CMOS Downconversion Mixer," *European Solid State Circuits Conference*, Seville, Spain, Sep. 22–24, 1993, pp. 210–213.

Copy of Declaration of Michael J. Bultman filed in patent application Ser. No. 09/176,022, which is directed to related subject matter.

Copy of Declaration of Robert W. Cook filed in patent application Ser. No. 09/176,022, which is directed to related subject matter.

Copy of Declaration of Alex Holtz filed in patent application Ser. No. 09/176,022, which is directed to related subject matter.

Copy of Declaration of Richard C. Looke filed in patent application Ser. No. 09/176,022, which is directed to related subject matter.

Copy of Declaration of Charley D. Moses, Jr. filed in patent application Ser. No. 09/176,022, which is directed to related subject matter.

Copy of Declaration of Jeffrey L. Parker and David F. Sorrells, with attachment Exhibit 1, filed in patent application Ser. No. 08/176,022, which is directed to related subject matter.

Dewey, R.J. and Collier, C.J., "Multi–Mode Radio Receiver," pp. 3/1–3/5.

Dialog File 347 (JAPIO) English Language Patent Abstract for JP 2–276351, published Nov. 13, 1990, (1 Page).

Dialog File 347 (JAPIO) English Language Patent Abstract for JP 2–131629, published May 21, 1990, (1 Page).

Dialog File 347 (JAPIO) English Language Patent Abstract for JP 2–39632, published Feb. 8, 1990, (1 Page).

Dialog File 348 (European Patents) English Language Patent Abstract for EP 0 785 635 A1, published Dec. 26, 1996, (3 Pages).

Dialog File 348 (European Patents) English Language Patent Abstract for EP 35166 A1, published Feb. 18, 1981, (2 Pages).

"DSO takes sampling rate to 1 Ghz," *Electronic Engineering*, Mar. 1987, pp. 77 and 79.

Erdi, G. and Henneuse, P.R., "A Precision FET–Less Sample–and–Hold with High Charge–to–Droop Current Ratio," *IEEE Journal of Solid–State Circuits*, vol. SC–13, No. 6, Dec. 1978, pp. 864–873.

Faulkner, N.D. and Vilar, E., "Subharmonic Sampling for the Measurement of Short Term Stability of Microwave Oscillators," *IEEE Trans. On Instrumentation and Measurement*, vol. IM–32, No. 1, Mar. 1983, pp. 208–213.

Faulkner, N.D. et al., "Sub–Harmonic Sampling for the Accurate Measurement of Frequency Stability of Microwave Oscillators," *CPEM 82 Digest: Conf. On Precision Electromagnetic Measurements*, 1982, pp. M–10 & M–11.

Faulkner, N.D. and Vilar, E., "Time Domain Analysis of Frequency Stability Using Non–Zero Dead–Time Counter Techniques," *CPEM 84 Digest Conf. On Precision Electromagnetic Measurements*, 1984, pp. 81–82.

Filip, M. and Vilar, E., "Optimum Utilization of the Channel Capacity of a Satellite Link in the Presence of Amplitude Scintillations and Rain Attenuation," *IEEE Trans. On Communications*, vol. 38, No. 11, Nov. 1990, pp. 1958–1965.

Fukahori, K., "A CMOS Narrow–Band Signaling Filter with Q Reduction," *IEEE Journal of Solid–State Circuits*, vol. SC–19, No. 6, Dec. 1984, pp. 926–932.

Fukuchi, H. and Otsu, Y., "Available time statistics of rain attenuation on earth–space path," *IEE Proc.*, vol. 135, pt. H, No. 6, Dec. 1988, pp. 387–390.

Gibbins, C.J. and Chadha, R., "Millimetre–wave propagation through hydrocarbon flame," *IEE Proc.*, vol. 134, pt. H, No. 2, Apr. 1987, pp. 169–173.

Gilchrist, B. et al., "Sampling hikes performance of frequency synthesizers," *Microwaves R&F*, Jan. 1984, pp. 93–94 and 110.

Gossard, E.E., "Clear weather meteorological effects on propagation at frequencies above 1 Ghz," *Radio Science*, vol. 16, No. 5, Sep.–Oct. 1981, pp. 589–608.

Gregorian, R. et al., "Switched–Capacitor Circuit Design," *Proceedings of the IEEE*, vol. 71, No. 8, Aug. 1983, pp. 941–966.

Groshong et al., "Undersampling Techniques Simplify Digital Radio," *Electronic Design*, May 23, 1991, pp. 67–68, 70, 73–75 and 78.

Grove, W.M., "Sampling for Oscilloscopes and Other RF Systems: Dc through X–Band," *IEEE Trans. On Microwave Theory and Techniques*, Dec. 1966, pp. 629–635.

Haddon, J. et al., "Measurement of Microwave Scintillations on a Satellite Down–Line at X–Band," $2^{nd}$ *Int'l Conf. On Antennas and Propagation Part 2: Propagation*, Apr. 13–16, 1991, pp. 113–117.

Haddon, J. and Vilar, E., "Scattering Induced Microwave Scintillations from Clear Air and Rain on Earth Space Paths and the Influence of Antenna Aperture," *IEEE Trans. On Antennas and Propagation*, vol. AP–34, No. 5, May 1986, pp. 646–657.

Hafdallah, H. et al., "2–4 Ghz MESFET Sampler," *Electronics Letters*, vol. 24, No. 3, Feb. 4, 1988, pp. 151–153.

Herben, M.H.A.J., "Amplitude and Phase Scintillation Measurements on 8–2 km Line–Of–Sight Path at 30 Ghz," *Electronics Letters*, vol. 18, No. 7, Apr. 1, 1982, pp. 287–289.

Hewitt, A. et al., "An 18 Ghz Wideband LOS Multipath Experiment," *Int'l Conf. On Measurements for Telecommunication Transmission Systems—MTTS 85*, Nov. 27–28, 1985, pp. 112–116.

Hewitt, A. et al., "An Autoregressive Approach to the Identification of Multipath Ray Parameters from Field Measurements," *IEEE Trans. On Communications*, vol. 37, No. 11, Nov. 1989, pp. 1136–1143.

Hewitt, A. and Vilar, E., "Selective fading on LOS Microwave Links: Classical and Spread–Spectrum Measurement Techniques," *IEEE Trans. On Communications*, vol. 36, No. 7, Jul. 1988, pp. 789–796.

Hospitalier, E., "Instruments for Recording and Observing Rapidly Varying Phenomena," *Science Abstracts*, vol. VII, 1904, pp. 22–23.

Howard, I.M. and Swansson, N.S., "Demodulating High Frequency Resonance Signals for Bearing Fault Detection," *The Institution of Engineers Australia Communications Conference*, Melbourne Sep. 18–20, 1990, pp. 115–121.

Hu, X., *A Switched–Current Sample–and–Hold Amplifier for FM Demodulation*, Thesis for Master of Applied Science, Dept. of Electrical and Computer Engineering, University of Toronto, 1995, pp. 1–64.

Hung, H–L. A. et al., "Characterization of Microwave Integrated Circuits Using An Optical Phase–Locking and Sampling System," *IEEE MTT–S Digest*, 1991, pp. 507–510.

Hurst, P.J., "Shifting the Frequency Response of Switched–Capacitor Filters by Nonuniform Sampling," *IEEE Transactions on Circuits and Systems*, vol. 38, No. 1, Jan. 1991, pp. 12–19.

Itakura, T., "Effects of the sampling pulse width on the frequency characteristics of a sample–and–hold circuit," *IEEE Proc. Circuits, Devices and Systems*, vol. 141, No. 4, Aug. 1994, pp. 328–336.

Janssen, J.M.L., "An Experimental 'Stroboscopic' Oscilloscope for Frequencies up to about 50 Mc/s: I. Fundamentals," *Philips Technical Review*, vol. 12, No. 2, Aug. 1950, pp. 52–59.

Janssen, J.M.L. and Michels, A.J., "An Experimental 'Stroboscopic' Oscilloscope for Frequencies up to about 50 Mc/s: II. Electrical Build–Up," *Philips Technical Review*, vol. 12, No. 3, Sep. 1950, pp. 73–82.

Jondral, V.F. et al., "Doppler Profiles for Communication Satellites," *Frequenz*, May–Jun. 1996, pp. 111–116.

Kaleh, G.K., "A Frequency Diversity Spread Spectrum System for Communication in the Presence of In–band Interference," *1995 IEEE Globecom*, pp. 66–70.

Karasawa, Y. et al., "A New Prediction Method for Tropospheric Scintillation on Earth–Space Paths," *IEEE Trans. On Antennas and Propagation*, vol. 36, No. 11, Nov. 1988, pp. 1608–1614.

Kirsten, J. and Fleming, J., "Undersampling reduces data–acquisition costs for select applications," *EDN*, Jun. 21, 1990, pp. 217–222, 224, 226–228.

Lam, W.K. et al., "Measurement of the Phase Noise Characteristics of an Unlocked Communications Channel Identifier," *Proc. Of the 1993 IEEE International Frequency Control Symposium*, Jun. 2–4, 1993, pp. 283–288.

Lam, W.K. et al., "Wideband sounding of 11.6 Ghz transhorizon channel," *Electronics Letters*, vol. 30, No. 9, Apr. 28, 1994, pp. 738–739.

Larkin, K.G., "Efficient demodulator for bandpass sampled AM signals," *Electronics Letters*, vol. 32, No. 2, Jan. 18, 1996, pp. 101–102.

Lau, W.H. et al., "Analysis of the Time Variant Structure of Microwave Line–of–sight Multipath Phenomena," *IEEE Global Telecommunications Conference & Exhibition*, Nov. 28–Dec. 1, 1988, pp. 1707–1711.

Lau, W.H. et al., "Improved Prony Algorithm to Identify Multipath Components," *Electronics Letters*, vol. 23, No. 20, Sep. 24, 1987, pp. 1059–1060.

Lesage, P. and Audoin, C., "Effect of Dead–Time on the Estimation of the Two–Sample Variance," *IEEE trans. On Instrumentation and Measurement*, vol. IM–28, No. 1, Mar. 1979, pp. 6–10.

Liechti, C.A., "Performance of Dual–gate GaAs MESFET's as Gain–Controlled Low–Noise Amplifiers and High–Speed Modulators," *IEEE Trans. On Microwave Theory and Techniques*, vol. MTT–23, No. 6, Jun. 1975, pp. 461–469.

Linnenbrink, T.E. et al., "A One Gigasample Per Second Transient Recorder," *IEEE trans. On Nuclear Science*, vol. NS–26, No. 4, Aug. 1979, pp. 4443–4449.

Liou, M.L., "A Tutorial on Computer–Aided Analysis of Switched–Capacitor Circuits," *Proceedings of the IEEE*, vol. 71, No. 8, Aug. 1983, pp. 987–1005.

Lo, P. et al., "Coherent Automatic Gain Control," *IEE Colloquium on Phase Locked Techniques*, Mar. 26, 1980, pp. 2/1–2/6.

Lo, P. et al., "Computation of Rain Induced Scintillations on Satellite Down–Links at Microwave Frequencies," *Third Int'l Conf. On Antennas and Propagation (ICAP 83) Part 2: Propagation*, Apr. 12–15, 1983, pp. 127–131.

Lo, P.S.L.O. et al., "Observations of Amplitude Scintillations on a Low–Elevation Earth–Space Path," *Electronics Letters*, vol. 20, No. 7, Mar. 29, 1984, pp. 307–308.

Madani, K. and Aithison, C.S., "A 20 Ghz Microwave Sampler," *IEEE Trans. On Microwave Theory and Techniques*, vol. 40, No. 10, Oct. 1992, pp. 1960–1963.

Marsland, R.A. et al., "130 Ghz GaAs monolithic integrated circuit sampling head," *Appl. Phys. Lett.*, vol. 55, No. 6, Aug. 7, 1989, pp. 592–594. 40–42 (Dec. 1995).

Martin, K. and Sedra, A.S., "Switched–Capacitor Building Blocks for Adaptive Systems," *IEEE Transactions on Circuits and Systems*, vol. CAS–28, No. 6, Jun. 1981, pp. 576–584.

Marzano, F.S. and d'Auria, G., "Model–based Prediction of Amplitude Scintillation variance due to Clear–Air Tropospheric Turbulence on Earth–Satellite Microwave Links," *IEEE Trans. On Antennas and Propagation*, vol. 46, No. 10, Oct. 1998, pp. 1506–1518.

Matricciani, E., "Prediction of fade durations due to rain in satellite communication systems," *Radio Science*, vol. 32, No. 3, May–Jun. 1997, pp. 935–941.

McQueen, J.G., "The Monitoring of High–Speed Waveforms," *Electronic Engineering*, Oct. 1952, pp. 436–441.

Merkelo, J. and Hall, R.D., "Broad–Band Thin–Fillm Signal Sampler," *IEEE Journal of Solid–State Circuits*, vol. SC–7, No. 1, Feb. 1972, pp. 50–54.

Merlo, U. et al., "Amplitude Scintillation Cycles in a Sirio Satellite–Earth Link," *Electronic Letters*, vol. 21, No. 23, Nov. 7, 1985, pp. 1094–1096.

Morris, D., "Radio–holographic reflector measurement of the 30–m millimeter radio telescope at 22 Ghz with a cosmic signal source," *Astronomy and Astrophysics*, vol. 203, NO. 2, Sep. (II) 1988, pp. 399–406.

Moulsley, T.J. et al., "The efficient acquisition and processing of propagation statistics," *Journal of the Institution of Electronic and Radio Engineers*, vol. 55, No. 3, Mar. 1985, pp. 97–103.

Ndzi, D. et al., "Wide–Band Statistical Characterization of an Over–the–Sea Experimental Transhorizon Link," *IEE Colloquium on Radio Communications at Microwave and Millimetre Wave Frequenices*, Dec. 16, 1996, pp. 1/1–1/6.

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of–Sight Radio*, Nov. 24, 1997, pp. 9/1–9/6.

"New zero IF chipset from Philips," *Electronic Engineering*, Sep. 1995, p. 10.

Ohara, H. et al., "First monolithic PCM filter cuts cost of telecom systems," *Electronic Design*, vol. 27, No. 8, Apr. 12, 1979, (6 pages).

Oppenheim, A.V. et al., *Signal and Systems*, Prentice–Hall, 1983, pp. 527–531 and 561–562.

Ortgies, G., "Experimental Parameters Affecting Amplitude Scintillation Measurements on Satellite Links," *Electronic Letters*, vol. 21, No. 17, Aug. 15, 1985, pp. 771–772.

Pärssinen et al., "A 2–GHz Subharmonic Sampler for Signal Downconversion," *IEEE Trans. on Microwave Theory and Techniques*, vol. 45, No. 12, Dec. 1997, (7 pages).

Peeters, G. et al., "Evaluation of Statistical Models for Clear–Air Scintillation Prediction Using Olympus Satellite Measurements," *International Journal if Satellite Communications*, vol. 15, No. 2, Mar.–Apr. 1997, pp. 73–88.

Perrey, A.G. and Schoenwetter, H.K., *NBS Technical Note 1121: A Schottky Diode Bridge Sampling Gate*, May 1980, pp. 1–14.

Poulton, K. et al., "A 1–Ghz 6–bit ADC System," *IEEE Journal of Solid–State Circuits*, vol. SC–22, No. 6, Dec. 1987, pp. 962–969.

Press Release, "Parkervision, Inc. Announces Fiscal 1993 Results," 2 Pages, Apr. 6, 1994.

Press Release, "Parkervision, Inc. Announces the Appointment of Michael Baker to the New Position of National Sales Manager," 1 Page, Apr. 7, 1994.

Press Release, "Parkervision's Cameraman Well–Received By Distance Learning Market," 2 Pages, Apr. 8, 1994.

Press Release, "Parkervision, Inc. Announces First Quarter Financial Results," 2 Pages, Apr. 26, 1994.

Press Release, "Parkervision, Inc. Announces The Retirement of William H. Fletcher, Chief Financial Officer," 1 Page, May 11, 1994.

Press Release, "Parkervision, Inc. Announces New Cameraman System II™ At Infocom Trade Show," 3 Pages, Jun. 9, 1994.

Press Release, "Parkervision, Inc. Announces Appointments to its National Sales Force," 2 Pages, Jun. 17, 1994.

Press Release, "Parkervision, Inc. Announcs Second Quarter and Six Months Financial Results," 3 Pages, Aug. 9, 1994.

Press Release, "Parkervision, Inc. Announces Third Quarter and Nine Months Financial Results," 3 Pages, Oct. 28, 1994.

Press Release, "Parkervison, Inc. Announces First Significant Dealer Sale of Its *Cameraman® System II*," 2 Pages, Nov. 7, 1994.

Press Release, "Parkervision, Inc. Announces Fourth Quarter and Year End Results," 2 Pages, Mar. 1, 1995.

Press Release, "Parkervision, Inc. Announces Joint Product Developments With VTEL," 2 Pages, Mar. 21, 1995.

Press Release, "Parkervision, Inc. Announces First Quarter Financial Results," 3 Pages, Apr. 28, 1995.

Press Release, "Parkervision Wins Top 100 Product Districts' Choice Award," 1 Page, Jun. 29, 1995.

Press Release, "Parkervision National Sales Manager Next President of USDLA," 1 Page, Jul. 6, 1995.

Press Release, "Parkervision Granted New Patent," 1 Page, Jul. 21, 1995.

Press Release, "Parkervision, Inc. Announces Second Quarter and Six Months Financial Results," 2 Pages, Jul. 31, 1995.

Press Release, "Parkervision, Inc. Expands Its Cameraman System II Product Line," 2 Pages, Sep. 22, 1995.

Press Release, "Parkervision Announces New Camera Control Technology," 2 Pages, Oct. 25, 1995.

Press Release, "Parkervision, Inc. Announces Completion of VTEL/Parkervision Joint Product Line," 2 Pages, Oct. 30, 1995.

Press Release, "Parkervision, Inc. Announces Third Quarter and Nine Months Financial Results," 2 Pages, Oct. 30, 1995.

Press Release, "Parkervision's Cameraman Personal Locator Camera System Wins Telecon XV Award," 2 Pages, Nov. 1, 1995.

Press Release, "Parkervision, Inc. Announces Purchase Commitment From VTEL Corporation," 1 Page, Feb. 26, 1996.

Press Release, "ParkerVision, Inc. Announces Fourth Quarter and Year End Results," 2 Pages, Feb. 27, 1996.

Press Release, "ParkerVision, Inc. Expands its Product Line," 2 Pages, Mar. 7, 1996.

Press Release, "ParkerVision Files Patents for its Research of Wireless Technology," 1 Page, Mar. 28, 1996.

Press Release, "Parkervision, Inc. Announces First Significant Sale of Its Cameraman® Three–Chip System," 2 pages, Apr. 12, 1996.

Press Release, "Parkervision, Inc. Introduces New Product Line For Studio Production Market," 2 Pages, Apr. 15, 1996.

Press Release, "Parkervision, Inc. Announces Private Placement of 800,000 Shares," 1 Page, Apr. 15, 1996.

Press Release, "Parkervision, Inc. Announces First Quarter Financial Results," 3 Pages, Apr. 30, 1996.

Press Release, "ParkerVision's New Studio Product Wins Award," 2 Pages, Jun. 5, 1996.

Press Release, "Parkervision, Inc. Announces Second Quarter and Six Months Financial Results," 3 Pages, Aug. 1, 1996.

Press Release, "Parkervision, Inc. Announces Third Quarter and Nine Months Financial Results," 2 Pages, Oct. 29, 1996.

Press Release, "PictureTel and ParkerVision Sign Reseller Agreement," 2 Pages, Oct. 30, 1996.

Press Release, "CLI and ParkerVision Bring Enhanced Ease–of–Use to Videoconferencing," 2 Pages, Jan. 20, 1997.

Press Release, "Parkervision, Inc. Announces Fourth Quarter and Year End Results," 3 Pages, Feb. 27, 1997.

Press Release, "Parkervision, Inc. Announces First Quarter Financial Results," 3 Pages, Apr. 29, 1997.

Press Release, "NEC and Parkervision Make Distance Learning Closer," 2 Pages, Jun. 18, 1997.

Press Release, "Parkervision Supplies JPL with Robotic Cameras, Cameraman Shot Director for Mars Mission," 2 Pages, Jul. 8, 1997.

Press Release, "ParkerVision and IBM Join Forces to Create Wireless Computer Peripherals," 2 Pages, Jul. 23, 1997.

Press Release, "ParkerVision, Inc. Announces Second Quarter and Six Months Financial Results," 3 Pages, Jul. 31, 1997.

Press Release, "Parkervision, Inc. Announces Private Placement of 990,000 Shares," 2 Pages, Sep. 8, 1997.

Press Release, "Wal–Mart Chooses Parkervision for Broadcast Production," 2 Pages, Oct. 24, 1997.

Press Release, "Parkervision, Inc. Announces Third Quarter Financial Results," 3 Pages, Oct. 30, 1997.

Press Release, "ParkerVision Announces Breakthrough in Wireless Radio Frequency Technology," 3 Pages, Dec. 10, 1997.

Press Release, "Parkervision, Inc. Announces the Appointment of Joseph F. Skovron to the Position of Vice President, Licensing—Wireless Technologies," 2 Pages, Jan. 9, 1998.

Press Release, "Parkervision Announces Existing Agreement with IBM Terminates—Company Continues with Strategic Focus Announced in Dec.," 2 Pages, Jan. 27, 1998.

Press Release, "Laboratory Tests Verify Parkervision Wireless Technology," 2 Pages, Mar. 3, 1998.

Press Release, "Parkervision, Inc. Announces Fourth Quarter and Year End Financial Results," 3 Pages, Mar. 5, 1998.

Press Release, "Parkervision Awarded Editiors' Pick of Show for NAB 98," 2 Pages, Apr. 15, 1998.

Press Release, "Parkervision Announces First Quarter Financial Results," 3 Pages, May 4, 1998.

Press Release, "Parkervision 'DIRECT2DATA' Introduced in Response to Market Demand," 3 Pages, Jul. 9, 1998.

Press Release, "Parkervision Expands Senio Management Team," 2 Pages, Jul. 29, 1998.

Press Release, "Parkervision Announces Second Quarter and Six Month Financial Results," 4 Pages, Jul. 30, 1998.

Press Release, "Parkervision Announces Third Quarter and Nine Month Financial Results," 3 Pages, Oct. 30, 1998.

Press Release, "Questar Infocomm, Inc. Invest $5 Million in Parkervision Common Stock," 3 Pages, Dec. 2, 1998.

Press Release, "Parkervision Adds Two New Directors," 2 Pages, Mar. 5, 1999.

Press Release, "Parkervision Announces Fourth Quarter and Year End Financial Results," 3 Pages, Mar. 5, 1999.

Press Release, "Joint Marketing Agreement Offers New Automated Production Solution," 2 Pages, Apr. 13, 1999.

"Project COST 205: Scintillations in Earth–satellite links," *Alta Frequenza: Scientific Review in Electronics*, vol. LIV, No. 3, May–Jun., 1985, pp. 209–211.

Razavi, B., *RF Microelectronics*, Prentice–Hall, 1998, pp. 147–149.

Reeves, R.J.D., "The Recording and Collocation of Waveforms (Part 1)," *Electronic Engineering*, Mar. 1959, pp. 130–137.

Reeves, R.J.D., "The Recording and Collocation of Waveforms (Part 2)," *Electronic Engineering*, Apr. 1959, pp. 204–212.

Rein, H.M. and Zahn, M., "Subnanosecond–Pulse Generator with Variable Pulsewidth Using Avalanche Transistors," *Electronic Letters*, vol. 11, No. 1, Jan. 9, 1975, pp. 21–23.

Riad, S.M. and Nahman, N.S., "Modeling of the Feed–through Wideband (DC to 12.4 Ghz) Sampling–Head," *IEEE MTT–S International Microwave Symposium Digest*, Jun. 27–29, 1978, pp. 267–269.

Rizzoli, V. et al., "Computer–Aided Noise Analysis of MESFET and HEMT Mixers," *IEEE Trans. On Microwave Theory and Techniques*, vol. 37, No. 9. Sep. 1989, pp. 1401–1410.

Rowe, H.E., Signals and Noise in Communication Systems, D. Van Nostrand Company, Inc., Princeton, New Jersey, 1965, including, for example, Chapter V, Pulse Modulation Systems.

Rücker, F. and Dintelmann, F., "Effects of Antenna Size on OTS Signal Scintillations and Their Seasonal Dependence," *Electronic Letters*, vol. 19, No. 24, Nov. 24, 1983, pp. 1032–1034.

Russell, R. and Hoarne, L., "Millimeter Wave Phase Locked Oscillators," *Military Microwaves '78 Conference Proceedings*, Oct. 25–27, 1978, pp. 238–242.

Sabel, L.P., "A DSP Implementation of a Robust Flexible Receiver/Demultiplexer for Broadcast Data Satellite Communications," *The Institution of Engineers Australia Communications Conference*, Melbourne Oct. 16–18, 1990, pp. 218–223.

Salous, S., "IF digital generation of FMCW waveforms for wideband channel characterization," *IEE Proceedings–I*, vol. 139, No. 3, Jun. 1992, pp. 281–288.

"Sampling Loops Lock Sources to 23 Ghz," *Microwaves & RF*, Sep. 1990, p. 212.

Sasikumar, M. et al., "Active Compensation in the Switched–Capacitor Biquad," *Proceedings of the IEEE*, vol. 71, No. 8, Aug. 1983, pp. 1008–1009.

Saul, P.H., "A GaAs MESFET Sample and Hold Switch," $5^{th}$ *European Solid State Circuits Conference–ESSCIRC 79*, 1979, pp. 5–7.

Shen, D.H. et al., "A 900–MHZ RF Front–End with Integrated Discrete–Time Filtering," *IEEE Journal of Solid–State Circuits*, vol. 31, No. 12, Dec. 1996, pp. 1945–1954.

Shen, X.D. and Vilar, E., "Anomalous transhorizon propagation and meterological processes of a multilink path," *Radio Science*, vol. 30, No. 5, Sep.–Oct. 1995, pp. 1467–1479.

Shen, X. and Tawfik, A.N., "Dynamic Behaviour of Radio Channels Due to Trans–Horizon Propagation Mechanisms," *Electronic Letters*, vol. 29, No. 17, Aug. 19, 1993, pp. 1582–1583.

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, Mar. 8, 1996, pp. 4/1–4/7.

Shen, X. and Vilar, E., "Path loss statistics and mechanism of transhorizon propagation over a sea path," *Electronics Letters*, vol. 32, No. 3, Feb. 1, 1996, pp. 259–261.

Shen, D. et al., "A 900 MHZ Integrated Discrete–Time Filtering RF Front–End," *IEEE International Solid State Circuits Conference*, vol. 39, Feb. 1996, pp. 54–55 and 417.

Spillard, C. et al., "X–Band Tropospheric Transhorizon Propagation Under Differing Meteorological Conditions," *Antennas and Propagation (ICAP)Part 2: Propagation*, Apr. 4–7, 1989, pp. 451–455.

Stafford, K.R. et al., "A Complete Monolithic Sample/Hold Amplifier," *IEEE Journal of Solid–State Circuits*, vol. SC–9, No. 6, Dec. 1974, pp. 381–387.

Staruk, W. Jr. et al., "Pushing HF Data Rates," *Defense Electronics*, May 1985, pp. 211, 213, 215, 217, 220 &222.

Stephenson, A.G., "Digitizing multiple RF signals requires an optimum sampling rate," *Electronics*, Mar. 27, 1972, pp. 106–110.

Sugarman, R., "Sampling Oscilloscope for Statistically Varying Pulses," *The Review of Scientific Instruments*, vol. 28, No. 11, Nov. 1957, pp. 933–938.

Sylvain, M., "Experimental probing of multipath microwave channels," *Radio Science*, vol. 24, No. 2, Mar.–Apr. 1989, pp. 160–178.

Takano, T., "NOVEL GaAs Pet Phase Detector Operable to Ka Band," *IEEE MT–S Digest*, 1984, pp. 381–383.

Tan, M.A., "Biquadratic Transconductance Switched–Capacitor Filters," *IEEE Transactions on Circuits and Systems– I: Fundamental Theory and Applications*, vol. 40, No. 4, Apr. 1993, pp. 272–275.

Tanaka, K. et al., "Single Chip Multisystem AM Stereo Decoder IC," *IEEE Trans. On Consumer Electronics*, vol. CE–32, No. 3, Aug. 1986, pp. 482–496.

Tawfik, A.N., "Amplitude, Duration and Predictability of Long Hop Trans–Horizon X–band Signals Over the Sea," *Electronic Letters*, vol. 28, No. 6, Mar. 12, 1992, pp. 571–572.

Tawfik, A.N. and Vilar, E., "Correlation of Transhorizon Signal Level Strength with Localized Surface Meteorological Parameters," *8th International Conf. On Antennas and Propagation*, Mar. 30–Apr. 2, 1993, pp. 335–339.

Tawfik, A.N. and Vilar, E., "Dynamic Structure of a Transhorizon Signal at X–band Over a Sea Path," *Antennas and Propagation (ICAP 89)Part 2: Propagation*, Apr. 4–7, 1989, pp. 446–450.

Tawfik, A.N. and Vilar, E., "Statistics of Duration and Intensity of Path Loss in a Microwave Transhorizon Sea–Path," *Electronics Letters*, vol. 26, No. 7, Mar. 29, 1990, pp. 474–476.

Tawfik, A.N. and Vilar, E., "X–Band Transhorizon Measurements of CW Transmissions Over the Sea–Part 1: Path Loss, Duration of Events, and Their Modeling," *IEEE Trans. On Antennas and Propagation*, vol. 41, No. 11, Nov. 1993, pp. 1491–1500.

Temes, G.C. and Tsividis, T., "The Special Section on Switched–Capacitor Circuits," *Proceedings of the IEEE*, vol. 71, No. 8, Aug. 1983, pp. 915–916.

Thomas, G.B., *Calculus and Analytic Geometry*, Third Edition, Addison–Wesley Publishing, 1960, pp. 119–133.

Tomassetti, Q., "An Unusual Microwave Mixer," *16th European Microwave Conference*, Sep. 8–12, 1986, pp. 754–759.

Tortoli, P. et al., "Bidirectional Doppler Signal Analysis Based on a Single RF Sampling Channel," *IEEE Trans. On Ultrasonics, Ferroelectrics, and Frequency Control*, vol. 41, No. 1, Jan. 1984, pp. 1–3.

Tsividis, Y. and Antognetti, P. (Ed.), *Design of MOS VLSI Circuits for Telecommunications*, p. 304.

Tsividis, Y., "Principles of Operation and Analysis of Switched–Capacitor Circuits," *Proceedings of the IEEE*, vol. 71, No. 8, Aug. 1983, pp. 926–940.

Tsurumi, H. and Maeda, T., "Design Study on a Direct Conversion Receiver Front–End for 280 MHZ, 900 MHZ, and 2.6 Ghz Band Radio Communication Systems," *41st IEEE Vehicular Technology Conference*, May 19–22, 1991, pp. 457–462.

Valdamanis, J.A. et al., "Picosecond and Subpicosend Optoelectronics for Measurements of Future High Speed Electronic Devices," *IEDM Technical Digest*, Dec. 5–7, 1983, pp. 597–600.

van de Kamp, M.M.J.L., "Asymmetric signal level distribution due to tropospheric scintillation," *Electronic Letters*, vol. 34, No. 11, May 28, 1998, pp. 1145–1146.

Vasseur, H. and Vanhoenacker, D., "Characterization of trophospheric turbulent layers from radiosonde data," *Electronics Letters*, vol. 34, No. 4, Feb. 19, 1998, pp. 318–319.

Verdone, R., "Outage Probability Analysis for Short–Range Communication Systems at 60 Ghz in ATT Urban Environments," *IEEE Trans. On Vehicular Technology*, vol. 46, No. 4, Nov. 1997, pp. 1027–1039.

Vierira–Ribeiro, S.A., *Single–IF DECT Receiver Architecture using a Quadrature Sub–Sampling Band–Pass Sigma–Delta Modulator*, Thesis for Degree of Master's of Engineering, Carleton University, Apr. 1995, pp. 1–180.

Vilar, E. et al., "A Comprehensive/Selective MM–Wave Satellite Downlink Experiment on Fade Dynamics," *10th International Conf. On Antennas and Propagation*, Apr. 14–17, 1997, pp. 2.98–2.101.

Vilar, E. et al., "A System to Measure LOS Atmospheric Transmittance at 19 Ghz," *Agard Conf. Proc. No. 346: Characteristics of the Lower Atmosphere Influencing Radio Wave Propagation*, vol. 4–7, 1983, pp. 8–1–8–16.

Vilar, E. and Smith, H., "A Theoretical and Experimental Study of Angular Scintillations in Earth Space Paths," *IEEE Trans. On Antennas and Propagation*, vol. AP–34, No. 1, Jan. 1986, pp. 2–10.

Vilar, E. et al., "A Wide Band Transhorizon Experiment at 11.6 Ghz," *8th International Conf. On Antennas and Propagation*, Mar. 30–Apr. 2, 1993, pp. 441–445.

Vilar, E. and Matthews, P.A., "Amplitude Dependence of Frequency in Oscillators," *Electronics Letters*, vol. 8, No. 20, Oct. 5, 1972, pp. 509–511.

Vilar, E. et al., "An experimental mm–wave receiver system for measuring phase noise due to atmospheric turbulence," *Conf. Proc. 25th Europan Microwave Conference*, vol. 39, No. 9, Sep. 1991, pp. 1306–1312.*

Vilar, E. and Burgueño, A., "Analysis and Modeling of Time Intervals Between Rain Rate Exceedances in the Context of Fade Dynamics," *IEEE Trans. On Communications*, vol. 39, No. 9, Sep. 1991, pp. 1306–1312.*

Vilar, E. et al., "Angle of Arrival Fluctuations in High and Low Elevation Earth Space Paths," *Antennas and Propagation (ICAP 85)*, Apr. 16–19, 1985, pp. 83–88.*

Vilar, E. "Antennas and Propagation: A Telecommunications Systems Subject," *Electronics Division Colloquium on Teaching Antennas and Propagation to Undergraduates*, Mar. 8, 1988, (6 Pages).*

Vilar, E. et al., "CERS*. Millimetre–Wave Beacon Package and Related Payload Doppler Correction Strategies," *Electronics Division Colloquium on CERS—Communications Engineering Research Satellite*, Apr. 10, 1984, pp. 10/1–10/10.*

Vilar, E. and Moulsley, T.J., "Comment and Reply: Probability Density Function of Amplitude Scintillations," *Electronics Letters*, vol. 21, No. 14, Jul. 4, 1985, pp. 620–622.

Vilar, E. et al., "Comparison of Rainfall Rate Duration Distributions for ILE–IFE and Barcelona," *Electronics Letters*, vol. 28, No. 20, Sep. 24, 1992, pp. 1922–1924.

Vilar, E. "Depolarization and Field Transmittances in Indoor Communications," *Electronics Letters*, vol. 27, No. 9, Apr. 24, 1991, pp. 732–733.

Vilar, E. and Larsen, J.R., "Elevation Dependence of Amplitude Scintillations on Low Elevation Earth Space Paths," *Antennas and Propagation (ICAP 89) Part 2: Propagation*, Apr. 4–7, 1989, pp. 150–154.

Vilar, E. et al., "Experimental System and Measurements of Transhorizon Signal Levles at 11 Ghz," $18^{th}$ *European Microwave Conference*, Sep. 12–15, 1988, pp. 429–435.

Vilar, E. and Matthews, P.A., "Importance of Amplitude Scintillations in Millimetric Radio Links," *Conf. Proc. $4^{th}$ European Microwave Conference*, Sep. 10–13, 1974, pp. 202–206.*

Vilar, E. and Haddon, J., "Measurement and Modeling of Scintillation Intensity to Estimate Turbulence Parameters in an Earth–Space Path," *IEEE Trans. On Antennas and Propagation*, vol. AP–32, No. 4, Apr. 1984, pp. 340–346.*

Vilar, E. and Matthews, P.A., "Measurement of Phase Fluctuations on Millimetric Radiowave Propagation," *Electronics Letters*, vol. 7, No. 18, Sep. 9, 1971, pp. 566–568.*

Vilar, E. and Wan, K.W., "Narrow and Wide Band Estimates of Field Strength for Indoor Communications in the Millimetre Band," *Electronics Division Colloquium on Radiocommunications in the Range 30–60 Ghz*, Jan. 17, 1991, pp. 5/1–5/8.*

Vilar, E. and Faulkner, N.D., "Phase Noise and Frequency Stability Measurements. Numerical Techniques and Limitations," *Electronics Division Colloquium on Low Noise Oscillators and Synthesizer*, Jan. 23, 1986, (5 Pages).*

Vilar, E. and Senin, S., "Propagation phase noise identified using 40 Ghz satellite downlink," *Electronics Letters*, vol. 33, No. 22, Oct. 23, 1997, pp. 1901–1902.

Vilar, E. et al., "Scattering and Extinction: Dependence Upon Raindrop Size Distribution in Temperate (Barcelona) and Tropical (Belem) Regions," $10^{th}$ *International Conf. On Antennas and Propagation*, Apr. 14–17, 1997, pp. 2.230–2.233.

Vilar, E. and Haddon, J., "Scintillation Modeling and Measurement—A Tool for Remote–Sensing Slant Paths," *Agard Conf. Proc. No. 332: Propagation Aspects of Frequency Sharing, Interference And System Diversity*, Oct. 18–22, 1982, pp. 27-1–27-13.

Vilar, E., "Some Limitations on Digital Transmission Through Turbulent Atmosphere," *Int'l Conf. On Satellite Communication Systems Technology*, Apr. 7–10, 1975, pp. 169–187.

Vilar, E. and Matthews, P.A., "Summary of Scintillation Observations in a 36 Ghz Link Across London," *Int'l Conf. On Antennas and Propagation Part 2: Propagation*, Nov. 28–30, 1978, pp. 36–40.

Vilar, E. et al., "Wideband Characterization of Scattering Channels," $10^{th}$ *International Conf. On Antennas and Propagation*, Apr. 14–17, 1997, pp. 2.353–2.358.

Vollmer, A., "Complete GPS Receiver Fits on Two Chips," *Electronic Design*, Jul. 6, 1998, pp. 50, 52, 54, 56.

*Voltage and Time Resolution in Digitizing Oscilloscopes: Application Note 348*, Hewlett Packard, Nov. 1986, pp. 1–11.

Wan, K.W. et al., "A Novel Approach to the Simultaneous Measurement of Phase and Amplitude Noises in Oscillator," $19^{th}$ *European Microwave Conference Proceedings*, Sep. 4–7, 1989, pp. 809–813.

Wan, K.W. et al., "Extended Variances and Autoregressive/Moving Average Algorithm for the Measurement and Synthesis of Oscillator Phase Noise," *Proc. Of the $43^{rd}$ Annual Symposium on Frequency Control*, 1989, pp. 331–335.

Wan, K.W. et al., "Wideband Transhorizon Channel Sounder at 11 Ghz," *Electronics Division Colloquium on High Bit Rate UHF/SHF Channel Sounders—Technology and Measurement*, Dec. 3, 1993, pp. 3/1–3/5.

Wang, H., "A 1–V Multigigahertz RF Mixer Core in 0.5—$\mu$m CMOS," IEEE 1998, 3 pages.

Watson, A.W.D. et al., "Digital Conversion and Signal Processing for High Performance Communications Receivers," pp. 367–373.

Weast, R.C. et al., (Ed.), *Handbook of Mathematical Tables*, Second Edition, The Chemical Rubber Co., 1964, pp. 480–485.

Wiley, R.G., "Approximate FM Demodulation Using Zero Crossings," *IEEE Trans. On Communications*, vol. COM–29, No. 7, Jul. 1981, pp. 1061–1065.

Worthman, W., "Convergence . . . Again," *RF Design*, Mar. 1999, p. 102.

Young, I.A. and Hodges, D.A., "MOS Switched–Capacitor Analog Sampled–Data Direct–Form Recursive Filters," *IEEE Journal of Solid–State Circuits*, vol. SC–14, No. 6, Dec. 1979, pp. 1020–1033.

Razavi, B., A 900–MHz/1.8–Ghz CMOS Transmitter for Dual–Band Applications, *Symposium on VLSI Circuits Digest of Technical Papers*, IEEE, pp. 128–131 (1998).

Ritter, G.M., "SDA, A New Solution for Transceivers," *16th European Microwave Conference*, Microwave Exhibitions and Publishers, pp. 729–733 (Sep. 8, 1986).

DIALOG File 351 (Derwent WPI) English Language Patent Abstract for FR 2 669 787, 1 page (May 29, 1992—Date of publication of application).

Miki, S. and Nagahama, R., *Modulation System II*, Common Edition 7, Kyoritsu Publishing Co., Ltd., pp. 146–154 (Apr. 30, 1956).

Miki, S. and Nagahama, R., *Modulation System II*, Common Edition 7, Kyoritsu Publishing Co., Ltd., pp. 146–149 (Apr. 30, 1956). (Partial Translation of Doc. AQ51).

Rabiner, L.R. and Gold, B., *Theory And Applications Of Digital Signal Processing*, Prentice–Hall, Inc., pp. xiii–xii and 40–46 (1975).

English–language Abstract of Japanese Patent Publication No. 08–032556, from http://www1.ipdl.jpo.go.jp, 2 Pages (Feb. 2, 1996—Date of publication of application).

English–language Abstract of Japanese Patent Publication No. 08–139524, from http://www1.ipdl.jpo.go.jp, 2 Pages (May 31, 1996—Date of publication of application).

English–language Abstract of Japanese Patent Publication No. 59–144249, from http://www1.ipdl.jpo.go.jp, 2 Pages (Aug. 18, 1984—Date of publication of application).

English–language Abstract of Japanese Patent Publication No. 63–054002, from http://www1.ipdl.jpo.go.jp, 2 Pages (Mar. 8, 1988—Date of publication of application).

English–language Abstract of Japanese Patent Publication No. 06–237276, from http://www1.ipdl.jpo.go.jp, 2 Pages (Aug. 23, 1994—Date of publication of application).

English–language Abstracte of Japanese Patent Publication No. 08–023359, from http://www1.ipdl.jpo.go.jp, 2 Pages (Jan. 23, 1996—Date of publication of application).

Translation of Japanese Patent Publication No. 47–2314, 7 pages.

Partial Translation of Japanese Patent Publication No. 58–7903, 3 pages.

English–language Abstract of Japanese Patent Publication No. 58–133004, from http://www1.ipdl.jpo.go.jp, 2 Pages (Aug. 8, 1993—Date of publication of application).

U.S. patent application Ser. No. 09/566,188, Cook et al., filed May 5, 2000.

English–language Abstract of Japanese Patent Publication No. 60–058705, from http://www1.ipdl.jpo.go.jp, 2 Pages (Apr. 4, 1985—Date of publication of application).

English–language Abstract of Japanese Patent Publication No. 04–127601, from http://www1.ipdl.jpo.go.jp, 2 Pages (Apr. 28, 1992—Date of publication of application).

English–language Abstract of Japanese Patent Publication No. 05–175730, from http://www1.ipdl.jpo.go.jp, 2 Pages (Jul. 13, 1993—Date of publication of application).

English–language Abstract of Japanese Patent Publication No. 05–175734, from http://www1.ipdl.jpo.go.jp, 2 Pages (Jul. 13, 1993—Date of publication of application).

English–language Abstract of Japanese Patent Publication no. 07–154344, from http://www1.ipdl.jpo.go.jp, 2 Pages (Jun. 16, 1995—Date of publication of application).

English–language Abstract of Japanese Patent Publication No. 07–307620, from htttp://www1.ipdl.jpo.go.jp, 2 Pages (Nov. 21, 1995—Date of publication of application).

Oppenheim, A.V. and Schafer, R.W., *Digital Signal Processing*, Prentice–Hall, pp. vii–x, 6–35, 45–78, 87–121 and 136–165 (1975).

English–language Abstract of Japanese Patent Publication No. 55–066057, from http://www1.ipdl.jpo.go.jp, 1 Page (May 19, 1980—Date of publication of application).

English–language Abstract of Japanese Patent Publication No. 63–065587, from http://www1.ipdl.jpo.go.jp, 1 Page (Mar. 24, 1988—Date of publication of application).

English–language Abstract of Japanese Patent Publication No. 63–153691, from http://www1.ipdl.jpo.go.jp, 1 Page (Jun. 27, 1988—Date of publication of application).

English–language Abstract of Japanese Patent Publication No. 60–130203, from http://www1.ipdl.jpo.go.jp, 1 Page, Jul. 11, 1985—Date of publication of application).

Fest, Jean–Pierre, "Le Convertisseur A/N Revolutionne Le Recepteur Radio," *Electronique*, JMJ (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Translation of Specification and Claims of FR Patent No. 2245130, 3 pages.

\* cited by examiner

Phase Modulation Example
702

Frequency Modulation Example
704

Amplitude Modulation Example
706

| Time\Node | t (rising edge of φ₁) | t-1 (rising edge of φ₂) | t (rising edge of φ₁) | t (rising edge of φ₂) | t+1 (rising edge of φ₁) |
|---|---|---|---|---|---|
| 2602 | $VI_{t-1}$ 1504 | $VI_{t-1}$ 1508 | $VI_t$ 1516 | $VI_t$ 1526 | $VI_{t+1}$ 1538 |
| 2604 | — | $VI_{t-1}$ 1510 | $VI_{t-1}$ 1518 | $VI_t$ 1528 | $VI_t$ 1540 |
| 2606 | $VO_{t-1}$ 1506 | $VO_{t-1}$ 1512 | $VO_t$ 1520 | $VO_t$ 1530 | $VO_{t+1}$ 1542 |
| 2608 | — | $VO_{t-1}$ 1514 | $VO_{t-1}$ 1522 | $VO_t$ 1532 | $VO_t$ 1544 |
| 2610 | 1507 | — | $VO_{t-1}$ 1524 | $VO_{t-1}$ 1534 | $VO_t$ 1546 |
| 2612 | — | 1515 | — | $VO_{t-1}$ 1536 | $VO_{t-1}$ 1548 |
| 2618 | — | — | — | — | $VI_t -$ 1550<br>$0.1 * VO_t -$<br>$0.8 * VO_{t-1}$ |

| Time<br>Value | t-2 | t-1 | t | t+1 |
|---|---|---|---|---|
| Value held in Downconvert and Delay Module | $VI_{t-2}$ | $VI_{t-1}$<br>2004 | $VI_t$ | $VI_{t+1}$ |
| Value at node 1902 | $\alpha_1 * VI_{t-3}$ | $\alpha_1 * VI_{t-2}$ | $\alpha_1 * VI_{t-1}$  2006 | $\alpha_1 * VI_t$ |
| Value of Output Signal VO | $VO_{t-2}=\alpha_1*VI_{t-3}$<br>$-B_1*VO_{t-3}-$<br>$B_0*VO_{t-4}$ | $VO_{t-1}=\alpha_1*VI_{t-2}$<br>$-B_1*VO_{t-2}-$<br>$B_0*VO_{t-3}$ | $VO_t=\alpha_1*VI_{t-1}$<br>$-B_1*VO_{t-1}-$<br>$B_0*VO_{t-2}$  2008 | $VO_{t+1}=\alpha_1*VI_t$<br>$-B_1*VO_t-$<br>$B_0*VO_{t-1}$ |
| Value held in First Delay Module | $VO_{t-2}$ | $VO_{t-1}$ | $VO_t$<br>2010 | $VO_{t+1}$ |
| Value at node 1904 | $-B_1 \cdot VO_{t-3}$ | $-B_1 \cdot VO_{t-2}$ | $-B_1 \cdot VO_{t-1}$  2012 | $-B_1 \cdot VO_t$ |
| Value held in Second Delay Module | $VO_{t-3}$ | $VO_{t-2}$ | $VO_{t-1}$<br>2014 | $VO_t$ |
| Value at node 1906 | $-B_0 \cdot VO_{t-4}$ | $-B_0 \cdot VO_{t-3}$ | $-B_0 \cdot VO_{t-2}$  2016 | $-B_0 \cdot VO_{t-1}$ |

FIG.20

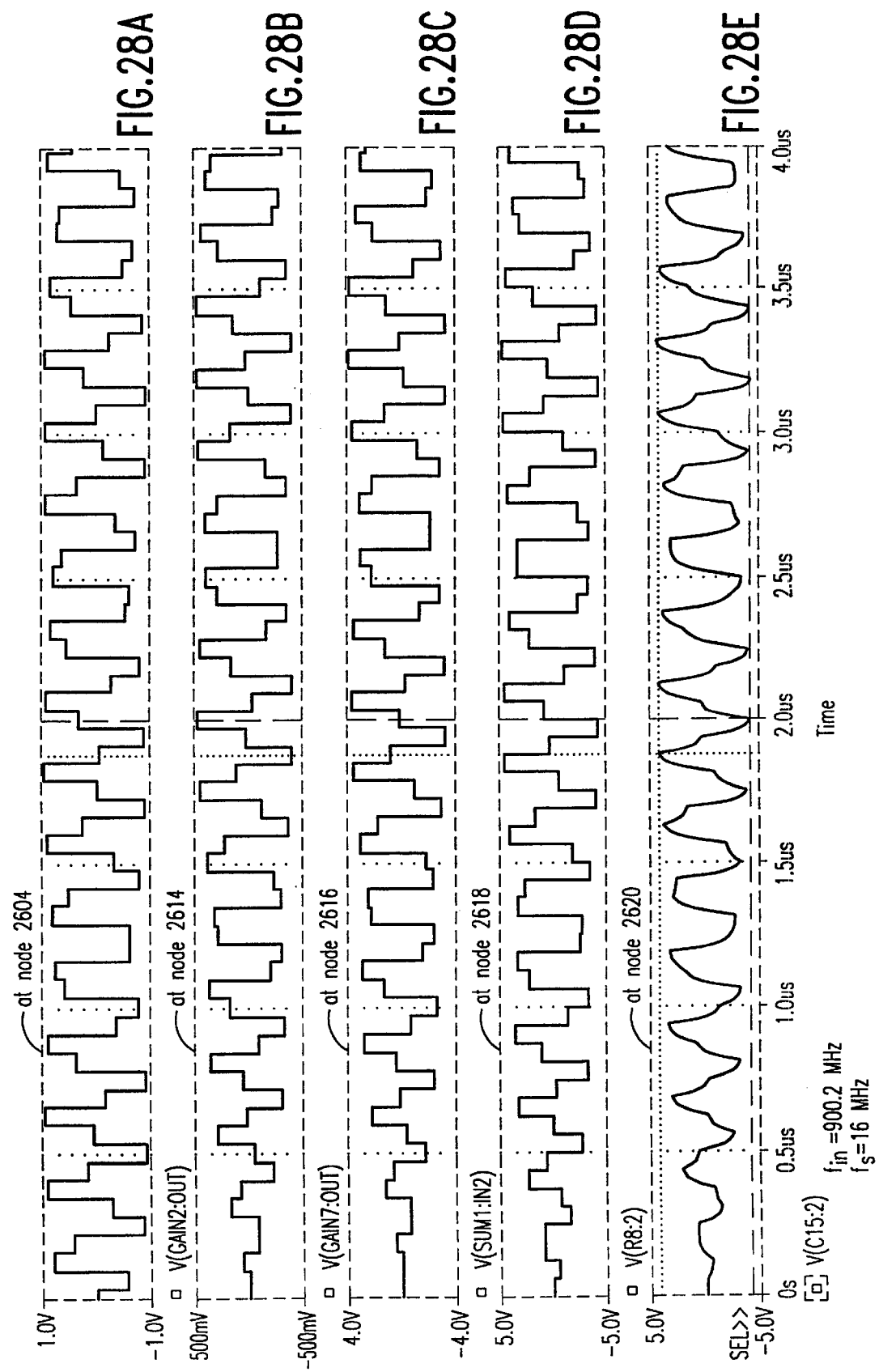

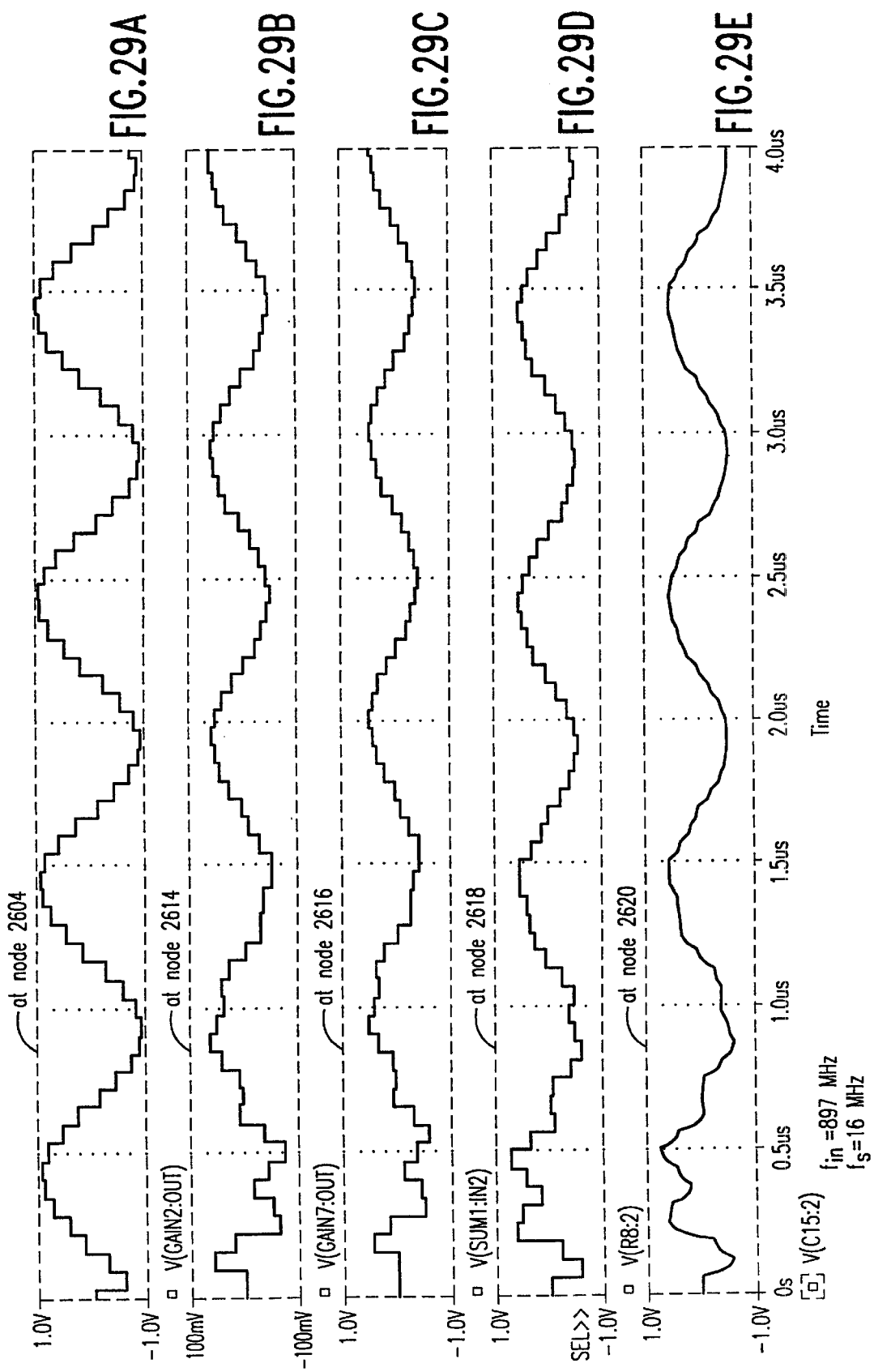

$$V_2 = \frac{C1}{C2} \cdot V_1$$

4702

| Time<br>Node | t<br>(rising edge<br>of ∅₁) | t<br>(rising edge<br>of ∅₂) | t+1<br>(rising edge<br>of ∅₁) | t+1<br>(rising edge<br>of ∅₂) |
|---|---|---|---|---|
| 4516 | $VI_t$  4704 | $VI_t$  4706 | $VI_{t+1}$  4710 | $VI_{t+1}$  4716 |
| 4518 | — | $VI_t$  4708 | $VI_t$  4712 | $VI_{t+1}$  4718 |
| 4536 | —  4705 | — | $VI_t$  4714 | $VI_t$  4720 |
| 4538 | — | —  4709 | — | $VI_t$  4722 |

5102

| Filter Type | Transformation | Associated Design Formulas |
|---|---|---|
| Lowpass | $z^{-1} = \dfrac{Z^{-1} - \alpha}{1 - \alpha Z^{-1}}$ <br> 5104 | 5112 <br> $\alpha = \dfrac{\sin\left(\dfrac{\theta_p - \omega_p}{2}\right)}{\sin\left(\dfrac{\theta_p + \omega_p}{2}\right)}$ <br> $\omega_p$ = desired cutoff frequency |
| Highpass | $-\dfrac{Z^{-1} + \alpha}{1 + \alpha Z^{-1}}$ <br> 5106 | 5114 <br> $\alpha = -\dfrac{\cos\left(\dfrac{\omega_p + \theta_p}{2}\right)}{\cos\left(\dfrac{\omega_p - \theta_p}{2}\right)}$ <br> $\omega_p$ = desired cutoff frequency |
| Bandpass | $-\dfrac{Z^{-2} - \dfrac{2\alpha k}{k+1} Z^{-1} + \dfrac{k-1}{k+1}}{\dfrac{k-1}{k+1} Z^{-2} - \dfrac{2\alpha k}{k+1} Z^{-1} + 1}$ <br> 5108 | 5116 <br> $\alpha = \dfrac{\cos\left(\dfrac{\omega_2 + \omega_1}{2}\right)}{\cos\left(\dfrac{\omega_2 - \omega_1}{2}\right)}$ <br> $k = \cot\left(\dfrac{\omega_2 - \omega_1}{2}\right) \tan\dfrac{\theta_p}{2}$ <br> $\omega_2, \omega_1$ = desired upper and lower cutoff frequencies |
| Bandstop | $\dfrac{Z^{-2} - \dfrac{2\alpha}{1+k} Z^{-1} + \dfrac{1-k}{1+k}}{\dfrac{1-k}{1+k} Z^{-2} - \dfrac{2\alpha}{1+k} Z^{-1} + 1}$ <br> 5110 | 5118 <br> $\alpha = \dfrac{\cos\left(\dfrac{\omega_2 + \omega_1}{2}\right)}{\cos\left(\dfrac{\omega_2 - \omega_1}{2}\right)}$ <br> $k = \tan\left(\dfrac{\omega_2 - \omega_1}{2}\right) \tan\dfrac{\theta_p}{2}$ <br> $\omega_2, \omega_1$ = desired upper and lower cutoff frequencies |

FIG. 51

FIG. 54A $$V_{OUT} = \sum_{j=0}^{n} \alpha_j Z^{-j} V_{IN} - \sum_{K=1}^{m} \beta_K Z^{-K} V_{OUT}$$

EQ. 11

$$V_{OUT} = \sum_{j=0}^{n=1} \alpha_j Z^{-j} V_{IN} - \sum_{K=1}^{m=2} \beta_K Z^{-K} V_{OUT}$$

EQ. 12

$$V_{OUT} = \alpha_0 Z^0 V_{IN} + \alpha_1 Z^{-1} V_{IN} - \beta_1 Z^{-1} V_{OUT} - \beta_2 Z^{-2} V_{OUT}$$

EQ. 13

$$\alpha_0 = 0$$
$$V_{OUT} = \alpha_1 Z^{-1} V_{IN} - \beta_1 Z^{-1} V_{OUT} - \beta_2 Z^{-2} V_{OUT}$$

EQ. 14

FIG. 54B $\beta_K = 0$ FOR FIR (FINITE IMPULSE RESPONSE)

$$V_{OUT} = \sum_{j=0}^{n} \alpha_j \, z^{-j} \, V_{IN}$$

EQ. 15

$n=2$
$\alpha_0=0$
$$V_{OUT} = \alpha_1 z^{-1} V_{IN} + \alpha_2 z^{-2} V_{IN}$$

EQ. 16

$n=3$
$\alpha_0=0$
$\alpha_1 = \alpha_2 = \alpha_3 = 1$
$$V_{OUT} = z^{-1} V_{IN} + z^{-2} V_{IN} + z^{-3} V_{IN}$$

EQ. 17

FIG. 54C $$V_{OUT} = \frac{V_i Z^{-3} + 1.4142\ Z^{-2} + Z^{-1}}{3.41}$$

EQ. 18

$$\frac{V_{OUT}}{V_{IN}} = \frac{Z^3 + 1.4142\ Z^2 + Z}{Z^4}$$

EQ. 19

INTEGRATED FREQUENCY TRANSLATION AND SELECTIVITY WITH A VARIETY OF FILTER EMBODIMENTS

CROSS-REFERENCE TO OTHER APPLICATIONS

This is a continuation-in-part application of U.S. application "Integrated Frequency Translation and Selectivity," Ser. No. 09/175,966, filed Oct. 21, 1998, now U.S. Pat. No. 6,049,706 which is herein incorporated by reference in its entirety.

The following applications of common assignee are related to the present application, and are herein incorporated by reference in their entireties:

"Method and System for Down-Converting Electromagnetic Signals," Ser. No. 09/176,022, filed Oct. 21, 1998.

"Method and System for Frequency Up-Conversion," Ser. No. 09/176,154, filed Oct. 21, 1999.

"Method and System for Ensuring Reception of a Communications Signal," Ser. No. 09/176,415, filed Oct. 21, 1998.

"Universal Frequency Translation, and Applications of Same," Ser. No. 09/176,027, filed Oct. 21, 1998.

"Method and System for Down-Converting Electromagnetic Signals Having Optimized Switch Structures," Ser. No. 09/293,095, filed Apr. 16, 1999, now allowed.

"Method and System for Down-Converting Electromagnetic Signals Including Resonant Structures for Enhanced Energy Transfer," Ser. No. 09/293,342, filed Apr. 16, 1999.

"Method and System for Frequency Up-Conversion Having Optimized Switch Structures," Ser. No. 09/293,097, filed Apr. 16, 1999, now abandoned.

"Method and System for Frequency Up-Conversion With a Variety of Transmitter Configurations," Ser. No. 09/293,580, filed Apr. 16, 1999, now allowed.

"Frequency Translator Having a Controlled Aperture Sub-Harmonic Matched Filter," Ser. No. 60/129,839, filed Apr. 16, 1999.

BACKGROUND OF THE INVENTION

1. Field of the Invention

The present invention is generally related to methods and apparatuses for frequency translation and frequency selectivity.

2. Related Art

FIG. 1 is a block diagram of an example conventional receiver 112. FIG. 2 is a flowchart representing the operation of the receiver 112.

In step 206, a band-select filter 102 filters an RF (radio frequency) spectrum 114. An example RF spectrum 114 is shown in FIG. 4A. The RF spectrum 114 includes signal components at frequencies $f_1$, $f_2$, $f_3$, and $f_4$. Assume, for purposes of example, that the receiver 112 is configured to receive signals at frequency $f_3$.

Typically, the band-select filter 102 is a wide-band filter. The characteristics of the band-select filter 102 are generally illustrated in FIG. 4B. The band-select filter 102 has a center frequency $f_c$, and a band-select bandwidth 402. In the example shown in FIG. 1, where the receiver 112 is receiving an RF spectrum 114, the center frequency $f_c$ of the band-select filter 102 is within the RF range. For example, the center frequency $f_c$ may be 900 MHZ. Depending on the application, the band-select bandwidth 402 may be as much as 50 MHz, or greater. In the example where the center frequency $f_c$ is 900 MHZ and the band-select bandwidth 402 is 50 MHZ, the passband (i.e., the band of frequencies that pass through a filter with little loss, relative to frequencies outside of the band) of the band-select filter 102 is 875 Mhz to 925 MHz. According to these specifications, the quality factor of the band-select filter 102, or Q, is equal to 18 (as described further below, Q is equal to the center frequency divided by the bandwidth, or 900 MHz÷50 Mhz in this example). This Q factor is typical for a band-pass filter operating at RF. In fact, generally, high Q factors at high frequencies are difficult to realize using conventional filter techniques, and have at best limited tuning capabilities.

The band-select filter 102 in step 206 operates to filter out signals outside its passband. For example purposes, assume that $f_1$ and $f_4$ are outside the passband of the band-select filter 102, and $f_2$ and $f_3$ are inside the passband of the band-select filter 102 (this is the case in the example of FIGS. 4A and 4B). Accordingly, in this example, the band-select filter 102 operates to filter out the signal components at frequencies $f_1$ and $f_4$. The band-select filter 102 passes the signal components at frequencies $f_2$ and $f_3$. The result of the operation of the band-select filter 102 is shown in FIG. 4C.

In steps 208 and 210, the signal output by the band-select filter 102 (herein called the band-select filtered spectrum 408 for reference purposes) is processed by a low-noise amplifier (LNA) 104 and a mixer 106. The LNA 104 operates to amplify the band-select filtered spectrum 408, and the mixer 106 operates to down-convert the band-select filtered spectrum 408 in a well known manner.

Both the LNA 104 and the mixer 106 have limited dynamic ranges over which their operation is linear. Outside of these ranges, the LNA 104 and the mixer 106 exhibit non-linear operation. The broader the band select filter 102 (i.e., the wider the pass band), the more energy is able to reach the LNA 104 and the mixer 106. Consequently, the broader the band select filter 102, the greater the chance that the respective dynamic ranges of the LNA 104 and the mixer 106 will be exceeded. For purposes of example, assume that the signal component 420 at frequency $f_3$ combined with the undesired signal component 421 at frequency $f_2$ exceed the linear ranges of the LNA 104 and the mixer 106 (this is a common practical example).

When operating on a signal that is outside their linear ranges (i.e., when operating in a non-linear manner), the LNA 104 and/or the mixer 106 generate spurious signal components. In the given example, when operating on the signal components 420 and 421, the LNA 104 and/or the mixer 106 generate spurious signal components 404. See FIG. 4D. Some of these spurious components 404 may coincide and interfere with signals at desired frequencies. For example, as noted above, the receiver 112 is tuned to receive signals at frequency $f_3$ (in the example of FIGS. 4A–4G, frequency $f_7$ corresponds to $f_3$ after downconversion; similarly, frequency $f_6$ corresponds to $f_2$ after downconversion).

In the process of operating on the signal components 420 and 421, the LNA 104 and/or the mixer 106 generate a spurious signal component 404C at frequency $f_7$. This spurious component 404C coincides with the desired signal component 420 at frequency $f_7$. This spurious component 404C interferes with the desired signal component 420.

In step 212, a channel-select filter 108 filters the signal generated by the LNA 104 and the mixer 106 (this signal is herein called the processed spectrum 410 for reference purposes). The characteristics of the channel-select filter 108 are generally shown in FIG. 4E. The channel-select filter 108 has a center frequency at frequency $f_7$ and a channel-select bandwidth 406. The center frequency $f_7$ of the channel select filter 108 is at a lower frequency than the center frequency of the band select filter 102. For example, the center frequency $f_7$ of the channel select filter 108 may be 10 MHZ. Depending on the application, the channel-select bandwidth 406 may be, for example, 50 KHz. According to these specifications, the quality factor of the channel-select filter 108, or Q, is equal to 200 (as indicated above, and described further below, Q is equal to the center frequency divided by the bandwidth, or 10 MHz÷50 KHz in this example). This Q factor is typical for a narrowband band-pass filter operating at IF (intermediate frequency). As this example illustrates, it is possible to realize higher Q factors at lower frequencies using conventional filter techniques.

As shown in FIG. 4F, the effect of the channel-select filter 108 in step 212 is to filter-out the signal component at frequency $f_6$ and spurious components 404A, 404B, and 404D, but to pass any signals at frequency $f_7$. Both the desired signal component 420 and the spurious component 404C exist at frequency $f_7$, and are within the passband of the channel-select filter 108. Thus, both the desired signal component 420 and the spurious component 404C are passed by the channel-select filter 108.

In step 214, an amplifier 110 amplifies the signal output from the channel-select filter 108 (this signal is called the channel select filtered signal 412 for reference purposes). The channel select filtered signal 412 includes both the desired signal component 420 and the spurious component 404C. Consequently, the amplifier 110 amplifies both the desired signal component 420 and the spurious component 404C.

In other words, once the spurious component 404C is generated, it follows the desired signal component 420 in all downstream processing.

As noted above, the spurious signal component 404C may make it difficult if not impossible to properly receive the desired signal component 420. Accordingly, because the receiver 112 utilized a wide-band, band-select filter 102 prior to amplification and frequency translation by non-linear components (i.e., by the LNA 104 and the mixer 106, respectively), the receiver 112 suffers from potentially degraded performance. The potential for signal interference as described above limits the receiver 112's applicability.

SUMMARY OF THE INVENTION

The present invention is directed to methods and apparatuses for frequency selectivity and frequency translation. The invention is also directed to applications for such methods and apparatuses.

Briefly stated, the invention operates to filter an input signal, and to down-convert the filtered input signal. According to embodiments of the present invention, the filtering operation and the down-conversion operation are performed in an integrated, unified manner.

According to embodiments of the invention, the filtering operation is effectively performed prior to the down-conversion operation. Thus, the frequency selectivity operation performed by the present invention represents input filtering, such as but not limited to front end filtering.

In embodiments of the invention, a relatively high Q factor can be realized regardless of center frequency.

In embodiments of the invention, the input signal is an RF signal. Thus, the frequency selectivity operation performed by the present invention represents relatively high Q RF filtering.

Thus, embodiments of the present invention preferably perform front end, narrowband filtering at RF, followed by frequency down-conversion.

In other words, embodiments of the invention provide precise frequency selectivity at high frequencies. Also, the invention provides for frequency down-conversion.

It is noted that the invention is not limited to the embodiments summarized in this section. The embodiments summarized in this section, as well as other embodiments, are described below.

Further features and advantages of the invention, as well as the structure and operation of various embodiments of the invention, are described in detail below with reference to the accompanying drawings. The drawing in which an element first appears is typically indicated by the leftmost digit(s) in the corresponding reference number.

BRIEF DESCRIPTION OF THE FIGURES

The present invention will be described with reference to the accompanying drawings, wherein:

FIG. 15 is a table illustrating example values at nodes within an example UDF module (shown in FIG. 26) at consecutive time increments;

FIG. 20 is a table representing example values in nodes of the UDF module of FIG. 19 at consecutive time increments;

FIGS. 28A–28F and 29A–29F are waveforms used to illustrate the operation of the UDF module of FIG. 26;

FIG. 51 illustrates an example table of transform expressions that can be used when designing a UDF module according to embodiments of the invention;

FIGS. 53A and 53A-1 illustrate example aliasing modules according to an embodiment of the invention;

FIGS. 54A–54C present filter-related equations that are relevant to embodiments of the invention;

DETAILED DESCRIPTION OF THE PREFERRED EMBODIMENTS

Table of Contents

Figure 1:
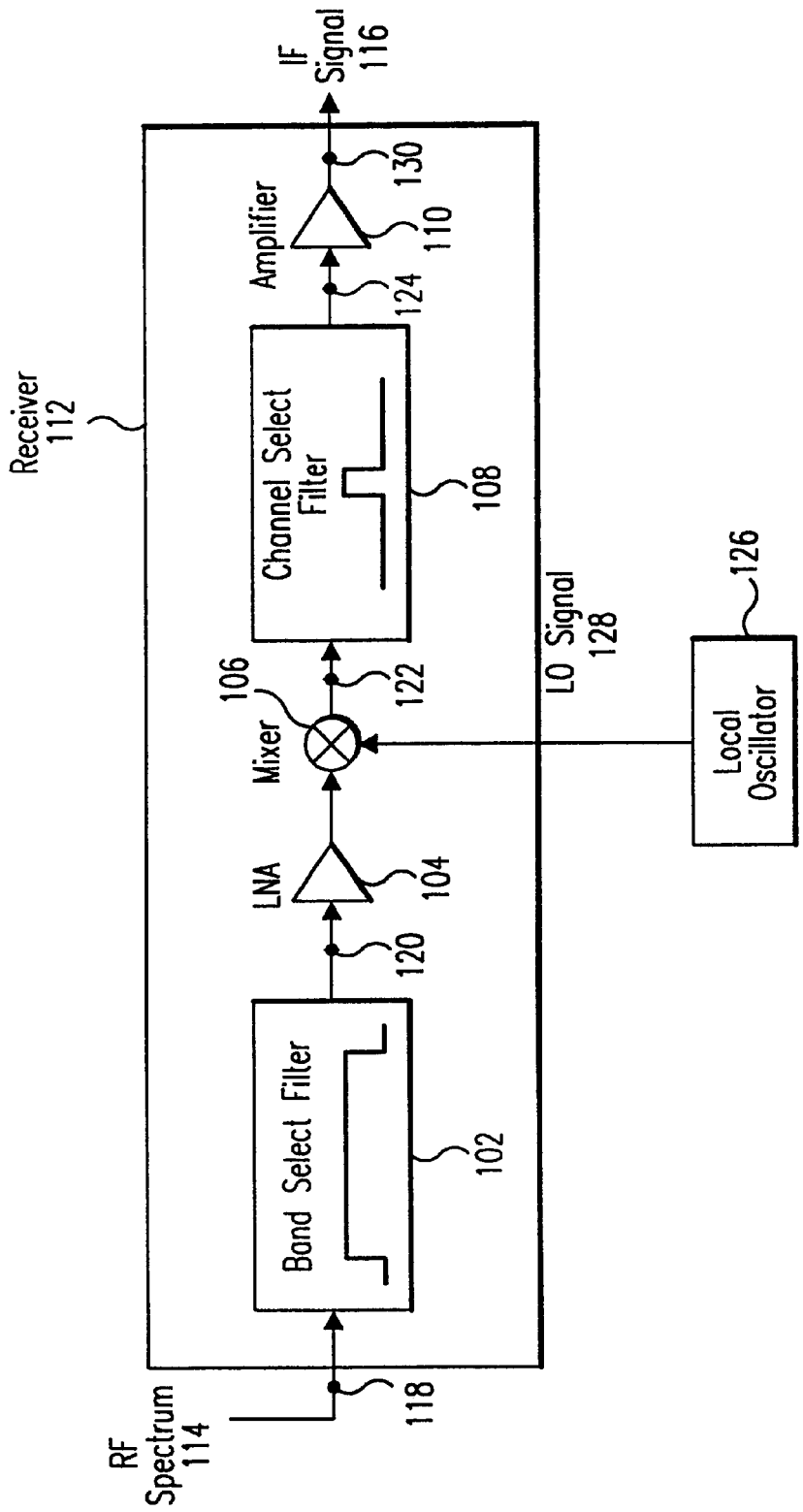
FIG. 1 is a block diagram of a conventional receiver.
Figure 2:
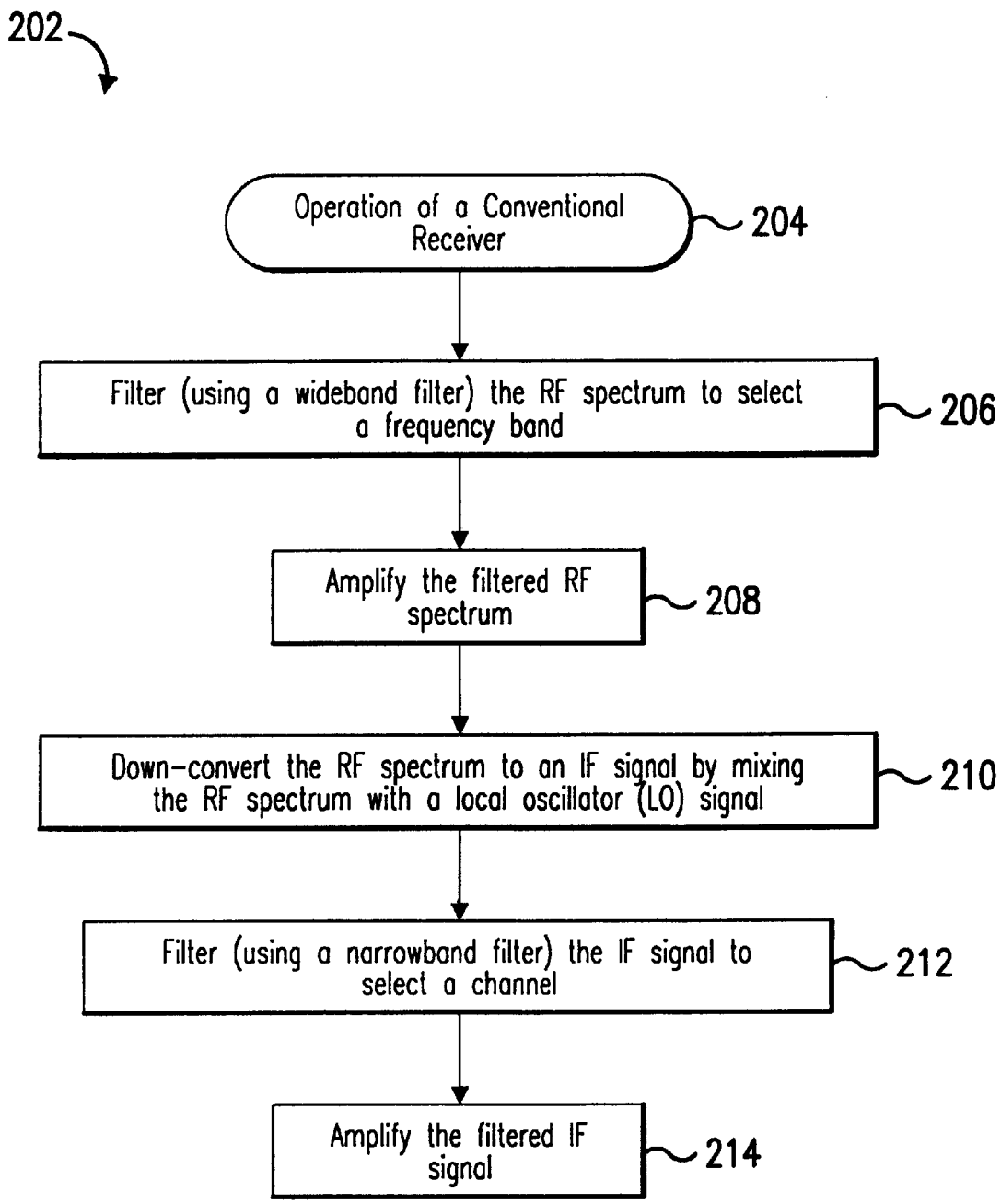
FIG. 2 is a flowchart representing the operation of the conventional receiver of FIG. 1.

1 Terminology
  1.1 Filters
  1.2 Other Terms
2 Overview of the Invention
3 Unified Downconverting and Filtering
  3.1 Conceptual Description
  3.2 High Level Description 3.2.1 Operational Description
3.2.2 Structural Description
3.3 Example Embodiments
  3.3.1 First Embodiment: Band Pass Filtering and Frequency Translation
    3.3.1.1 Operational Description
    3.3.1.2 Structural Description
  3.3.2 Second Embodiment: Low Pass Filtering and Frequency Translation
    3.3.2.1 Operational Description
    3.3.2.2 Structural Description
  3.3.3 Third Embodiment: Filtering With Mid-Point Injection and Frequency Translation
    3.3.3.1 Operational Description
    3.3.3.2 Structural Description
  3.3.4 Fourth Embodiment: Finite Impulse Response (FIR) Filtering
  3.3.5 Fifth Embodiment: Running Average Filter
  3.3.6 Sixth Embodiment: N-Path Filter
  3.3.7 Seventh Embodiment: Passive Filter
  3.3.8 Other Embodiments
3.4 Implementation Examples
  3.4.1 Implementation Example of a Unified Downconverting and Filtering (UDF) Module
  3.4.2 Implementation Examples of Components of the UDF Module
    3.4.2.1 Downconvert and Delay Module
      3.4.2.1.1 Universal frequency down-conversion (UFD) Module
    3.4.2.2 Delay Modules
    3.4.2.3 Scaling Modules
    3.4.2.4 Adder
    3.4.2.5 Control Signal Generator
    3.4.2.6 Output Sample and Hold Module
    3.4.2.7 Output Smoothing Module
    3.4.2.8 Mid-Point Injection Embodiment: High Frequency Delay Module
    3.4.2.9 Mid-Point Injection Embodiment: Optional Filter
    3.4.2.10 Mid-Point Injection Embodiment: Downconvert Module
    3.4.2.11 Mid-Point Injection Embodiment: Upconvert Module
  3.4.3 Implementing the UDF Module as an Integrated Circuit (IC)
  3.4.4 Other Implementations
4 Designing a Unified Downconverting and Filtering (UDF) Module
5 Adjustable UDF Module
6 Amplification
7 Example Applications
  7.1 Receiver
  7.2 Other Application Examples
8 Conclusion

1 Terminology

Various terms and concepts used in this application are generally described in this section. The description in this section is provided for illustrative and convenience purposes only, and is not limiting. The meaning of these terms and concepts will be apparent to persons skilled in the relevant art(s) based on the entirety of the teachings provided herein.

1.1 Filters

A filter is a device that allows electromagnetic signals of specific frequencies to pass with little attenuation. More particularly, a filter passes signals inside a frequency range (called a passband) with little attenuation. The filter does not pass signals outside of the passband (i.e., the filter attenuates signals outside of the passband).

There are a number of different types of filters. These include, for example, low-pass filters, high-pass filters, band-pass filters, notch filters, etc. The characteristics of these filters are generally illustrated in FIGS. 6A–6D.

There are many transfer functions for characterizing the operation of filters. For example, and without limitation, the following biquadratic equation represents the transfer function of a second order filter.

$$\frac{VO}{VI} = \frac{\alpha_2 z^2 + \alpha_1 z + \alpha_0}{\beta_2 z^2 + \beta_1 z + \beta_0} \qquad \text{EQ. 1}$$

Often, the $\beta_2$ coefficient is factored out in order to solve for $z^2$. As will be appreciated, doing so merely results in changing the values of other coefficients. Without any loss of generality, EQ. 1 is re-written below with $\beta_2$ factored out (for ease of illustration, the effect of filtering out $\beta_2$ on the other coefficients of EQ. 1 is not explicitly indicated in the following):

$$\frac{VO}{VI} = \frac{\alpha_2 z^2 + \alpha_1 z + \alpha_0}{z^2 + \beta_1 z + \beta_0}$$

It is noted that the invention is not limited to second order filters (the invention is applicable to filters of other orders), or to EQ. 1 for second order filters.

Figure 21:
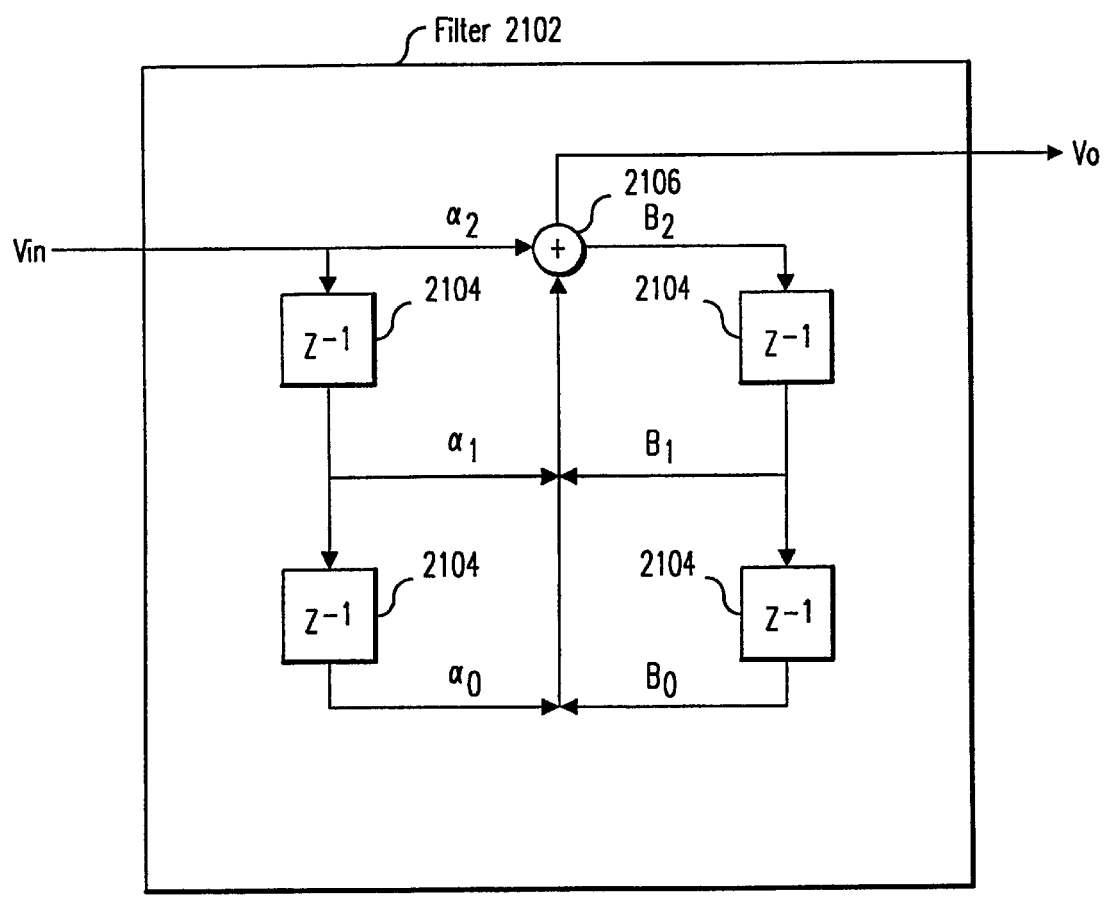
FIG. 21 is an example block diagram of an example filter.

A well known conceptual block diagram implementation of this biquadratic equation is shown in FIG. 21. The $z^{-1}$ designation in FIG. 21 designates a unit delay operation (that is, a $z^{-1}$ module delays an input signal by one time unit).

The biquadratic equation of EQ. 1 applies to second order filter types. The transfer function for a particular type of second order filter (low-pass, high-pass, band-pass, notch, etc.) can be obtained from the biquadratic equation of EQ. 1 by appropriately setting the values of the coefficients. For example, a transfer function of a band-pass filter can be obtained from the biquadratic equation of EQ. 1 by setting $\alpha_2$ and $\alpha_0$ to zero. The resulting transfer function, representing the operation of a band-pass filter, is as follows:

$$\frac{VO}{VI} = \frac{\alpha_1 z}{z^2 + \beta_1 z + \beta_0} \qquad \text{EQ. 2}$$

Solving for VO yields the following:

$$VO = \alpha_1 z^{-1} VI - \beta_1 z^{-1} VO - \beta_0 z^{-2} VO \qquad \text{EQ. 3}$$

In the above, the value z equals the following:

$$z = \sin\left(\frac{f}{F_s}\right) + j\cos\left(\frac{f}{F_s}\right) \qquad \text{EQ. 4}$$

In EQ. 4, f is the frequency, and $F_s$ is the sample frequency of the system.

An example transfer function of a low-pass filter can be obtained from the biquadratic equation of EQ. 1 by setting $\alpha_2$ and $\alpha_1$ equal to zero. The resulting transfer function, corresponding to a low-pass filter, is as follows:

$$\frac{VO}{VI} = \frac{\alpha_0}{z^2 + \beta_1 z + \beta_0} \qquad \text{EQ. 5}$$

Solving for VO yields the following:

$$VO = \alpha_0 z^{-2} VI - \beta_1 z^{-1} VO - \beta_0 z^{-2} VO \qquad \text{EQ. 6}$$

Transfer functions for other types of filters, such as (and without limitation) high-pass filters and notch filters, can be obtained in a similar manner from the biquadratic equation of EQ. 1.

It should be noted that the transfer functions provided above are not the only representations of a band-pass filter and a low-pass filter. Multiple transfer functions for filter types can be obtained via different combinations of coefficient values in the biquadratic of EQ. 1, or via use of base equations other than the biquadratic of EQ. 1.

Figure 5:
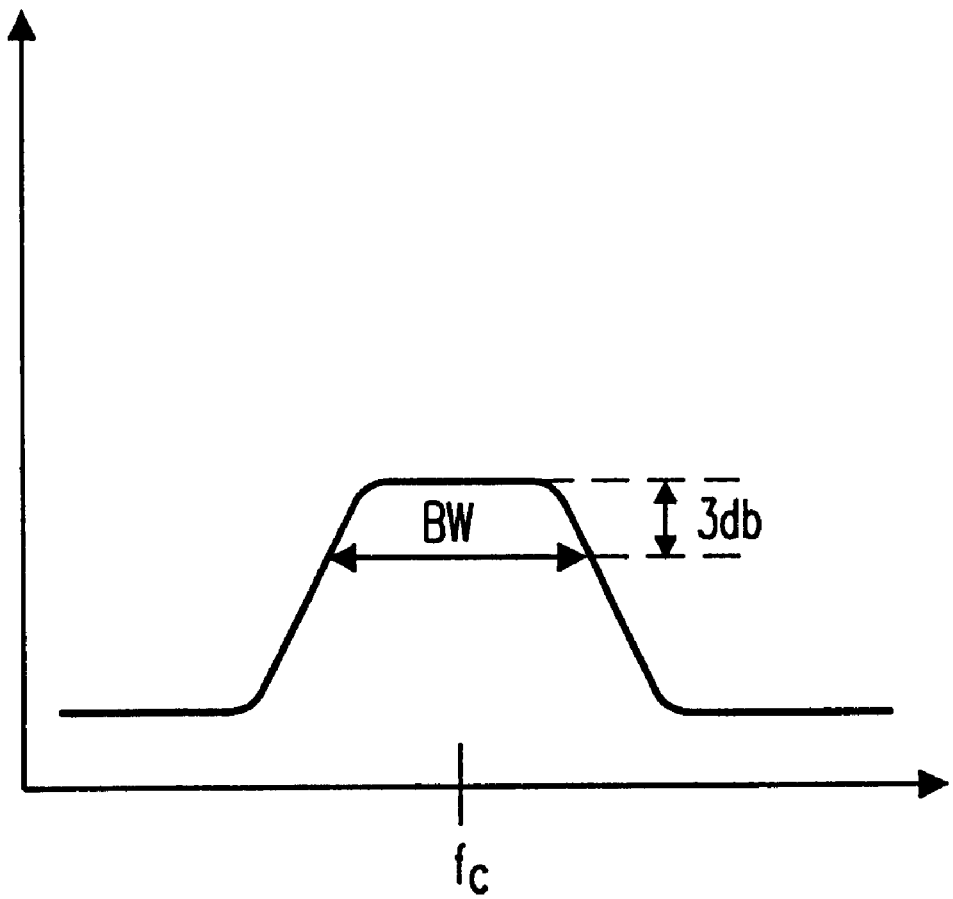
FIG. 5 is used to illustrate the manner in which a filter's quality factor is calculated.
Figure 6A:
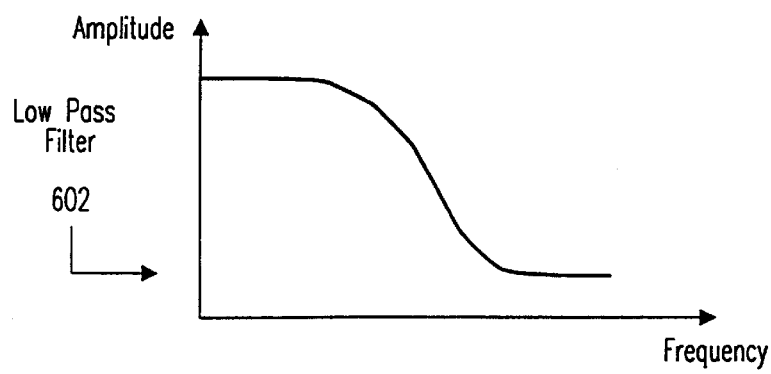
FIGS. 6A–6D illustrate characteristics of different types of filters.
Figure 6B:
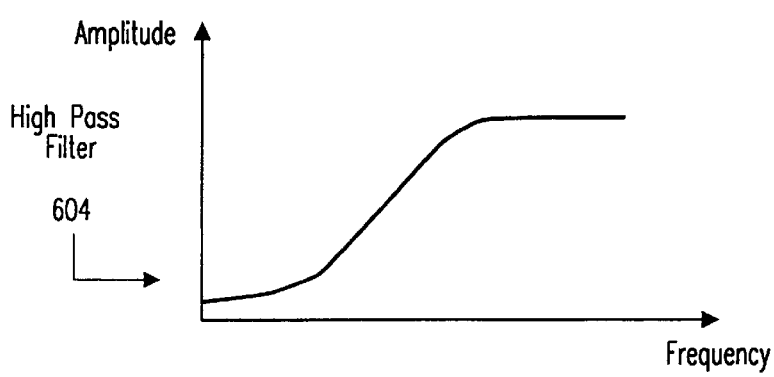
Figure 6C:
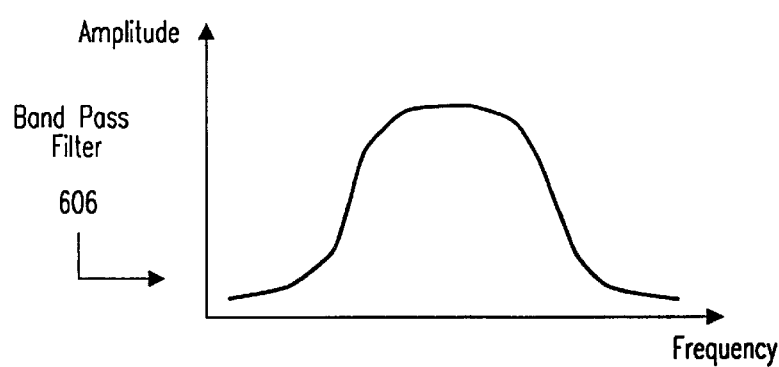
Figure 6D:
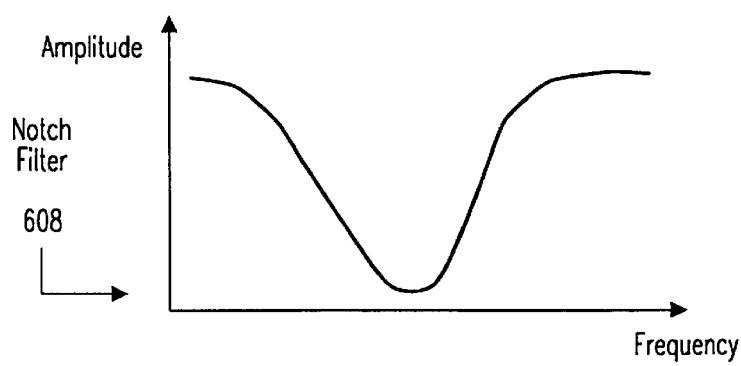

There are a number of measures for characterizing the performance of a filter. For example, and without limitation, the performance of a second order band-pass filter is often measured by its quality factor, or Q. FIG. 5 illustrates the manner in which Q is calculated for a second order filter. Q is equal to the center frequency $f_C$ of the filter divided by the bandwidth BW of the filter. The bandwidth BW is measured at a point 3 DB below the maximum amplitude of the filter. Therefore, if a filter operates at a center frequency $f_C$ of 1 MHz, and has a bandwidth BW of 50 KHz, the Q of the filter is $$\frac{1,000,000}{50,000} = 20$$

1.2 Other Terms

Various terms used in this application are generally described in this section. The description in this section is provided for illustrative and convenience purposes only, and is not limiting. The meaning of these terms will be apparent to persons skilled in the relevant art(s) based on the entirety of the teachings provided herein. These terms may be discussed throughout the specification with additional detail.

Amplitude Modulation (AM): A modulation technique wherein the amplitude of the carrier signal is shifted (i.e., varied) as a function of the information signal. A subset of AM is referred to as "amplitude shift keying" which is used primarily for digital communications where the amplitude of the carrier signal shifts between discrete states rather than varying continuously as it does for analog information.

Analog signal: A signal that is constant or continuously variable as contrasted to changes between discrete states.

Baseband: A frequency band occupied by any generic information signal desired for transmission and/or reception.

Baseband signal: Any generic information signal desired for transmission and/or reception.

Carrier frequency: The frequency of a carrier signal. Typically, it is the center frequency of a transmission signal that is generally modulated.

Carrier signal: An EM wave having at least one characteristic that may be varied by modulation, that is capable of carrying information via modulation.

Control a switch: Causing a switch to open and close. The switch may be, without limitation, mechanical, electrical, electronic, optical, etc., or any combination thereof.

Demodulation: The process of removing or extracting information from a carrier signal.

Digital signal: A signal in which the information contained therein is discrete as contrasted to continuous.

Direct down conversion: A down conversion technique wherein a transmitted signal is directly down converted from the transmitted frequency (i.e., a carrier frequency) to the baseband signal without having an intermediate frequency.

Down conversion: A process for performing frequency translation in which the final frequency is lower than the initial frequency.

Electromagnetic spectrum: A spectrum comprising waves characterized by variations in electric and magnetic fields. Such waves may be propagated in any communication medium, both natural and manmade, including but not limited to air, space, wire, cable, liquid, waveguide, microstrip, stripline, optical fiber, etc. The EM spectrum includes all frequencies greater than zero hertz.

EM signal: A signal in the EM spectrum. Also generally called an EM wave. Unless stated otherwise, all signals discussed herein are EM signals, even when not explicitly designated as such.

Frequency Modulation (FM): A modulation technique wherein the frequency of the carrier signal is shifted (i.e., varied) as a function of the information signal. A subset of FM is referred to as "frequency shift keying" which is used primarily for digital communications where the frequency of the carrier signal shifts between discrete states rather than varying continuously as it does for analog information.

Harmonic: A harmonic is a sinusoidal component of a periodic wave. It has a frequency that is an integer multiple of the fundamental frequency of the periodic wave. In other words, if the periodic waveform has a fundamental frequency of "f" (also called the first harmonic), then it has harmonics at frequencies of "n·f," where "n" is 2, 3, 4, etc. The harmonic corresponding to n=2 is referred to as the second harmonic, the harmonic corresponding to n=3 is referred to as the third harmonic, and so on.

Information signal: The signal that contains the information that is to be transmitted. As used herein, it refers to the original baseband signal at the source. When it is intended that the information signal modulate a carrier signal, it is also referred to as the "modulating baseband signal." It may be voice or data, analog or digital, or any other signal or combination thereof.

Intermediate frequency (IF) signal: A signal that is at a frequency between the frequency of the baseband signal and the frequency of the transmitted signal.

Modulation: The process of varying one or more physical characteristics of a signal to represent the information to be transmitted. Three commonly used modulation techniques are frequency modulation, phase modulation, and amplitude modulation. There are also variations, subsets, and combinations of these three techniques.

Phase Modulation (PM): A modulation technique wherein the phase of the carrier signal is shifted (i.e., varied) as a function of the information signal. A subset of PM is referred to as "phase shift keying" which is used primarily for digital communications where the phase of the carrier signal shifts between discrete states rather than varying continuously as it does for analog information.

Subharmonic: A subharmonic of a periodic waveform is a sinusoidal wave having a frequency that is an integer submultiple of the fundamental frequency of that periodic waveform. That is, a subharmonic frequency is the quotient obtained by dividing the fundamental frequency by an integer. For example, if the periodic waveform has a frequency of "f" (also called the fundamental), then its subharmonics have frequencies of "f/n," where n is 2, 3, 4, etc. The subharmonic corresponding to n=2 is referred to as the second subharmonic, the subharmonic corresponding to n=3 is referred to as the third subharmonic, and so on. A subharmonic itself has harmonics, and the ith harmonic of the ith subharmonic will be at the fundamental frequency of the original periodic waveform. For example, the third subharmonic (which has a frequency of "f/3"), has harmonics at integer multiples of itself (i.e., a second harmonic at "2·f/3," a third harmonic at "3·f/3," and so on). The third harmonic of the third subharmonic of the original signal (i.e., "3·f/3") is at the frequency of the original signal.

Up conversion: A process for performing frequency translation in which the final frequency is higher than the initial frequency.

2 Overview of the Invention

The present invention is directed to methods and apparatuses for frequency selectivity and frequency translation. The invention is also directed to applications for such methods and apparatuses.

According to the present invention, frequency selectivity and frequency translation are performed as a single unified. (i.e., integrated) operation. By performing frequency selectivity and translation as a single unified operation, the invention achieves high frequency selectivity prior to frequency translation. The invention achieves high frequency selectivity at any input frequency (the input frequency refers to the frequency of the input spectrum being filtered and translated), including but not limited to RF (radio frequency) and greater frequencies. It should be understood that the invention is not limited to this example of RF and greater frequencies. The invention is intended, adapted, and capable of working with lower than radio frequencies.

Figure 8:
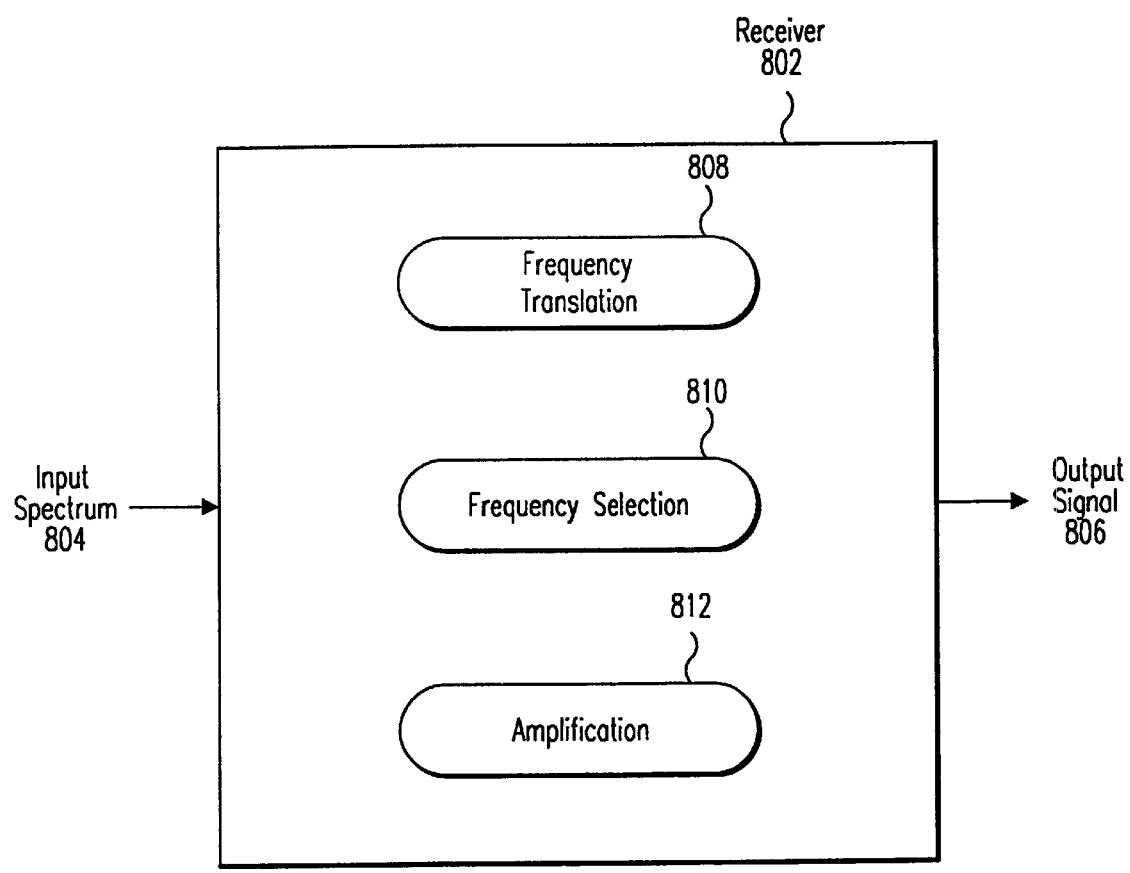
FIG. 8 is a block diagram of a receiver and functions that are performed by the receiver.

Understanding of the invention may be facilitated by considering the operation of a receiver. Generally, a receiver 802 performs three primary functions: frequency translation 808, frequency selection 810, and amplification 812. See FIG. 8. In the conventional receiver 112 of FIG. 1, for example, the mixer 106 performs the frequency translation operation; the band select filter 102 and the channel select filter 108 collectively perform the frequency selection operation; and the LNA 104 and the amplifier 110 collectively perform the amplification operation.

Figure 3:
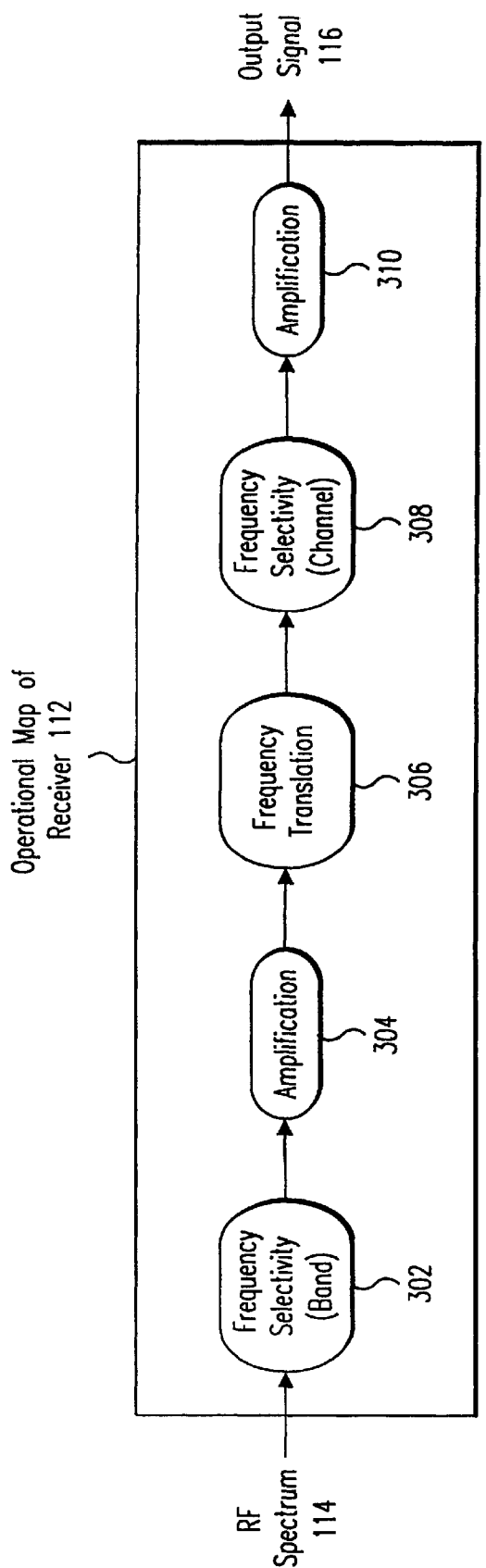
FIG. 3 illustrates an operational map of the conventional receiver of FIG. 1.
Figure 4A:
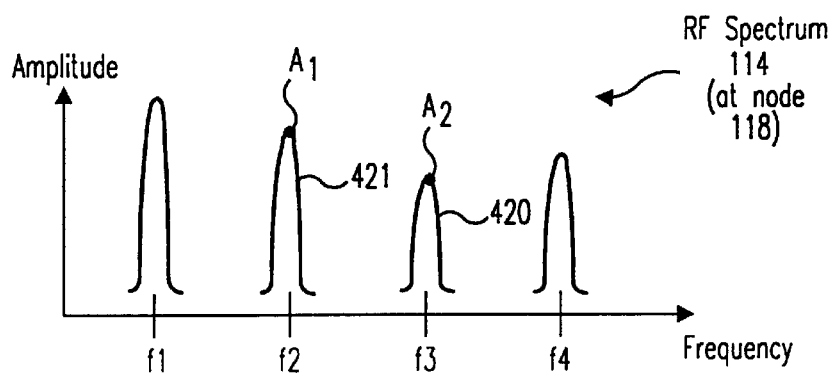
FIGS. 4A–4G are waveforms used to illustrate the operation of the conventional receiver of FIG. 1.
Figure 4B:
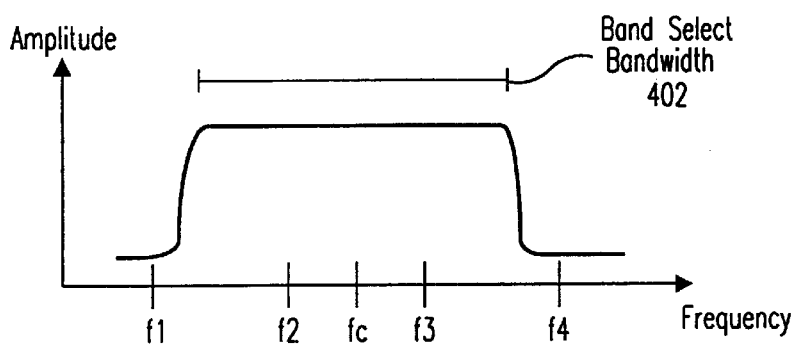
Figure 4C:
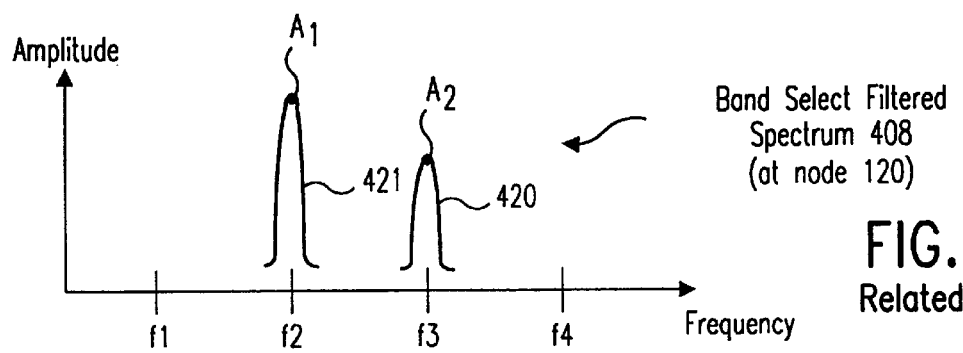
Figure 4D:
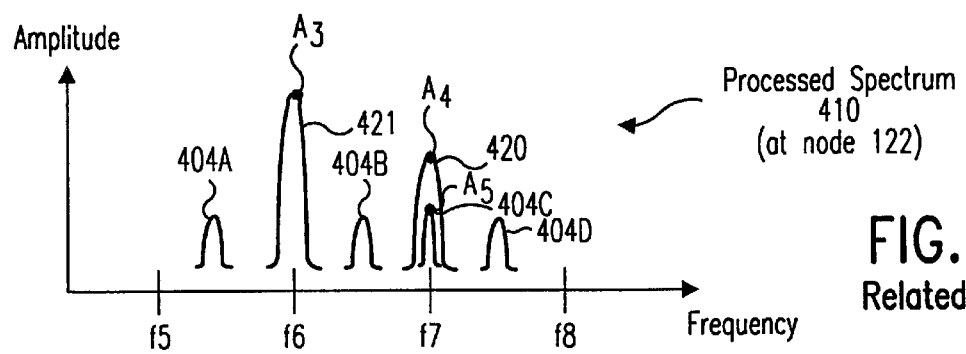
Figure 4E:
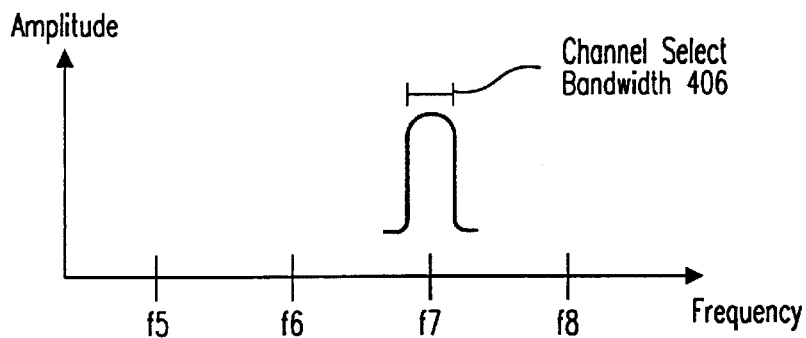
Figure 4F:
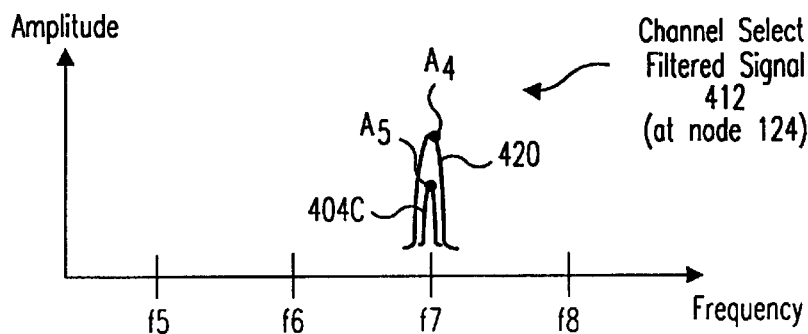
Figure 4G:
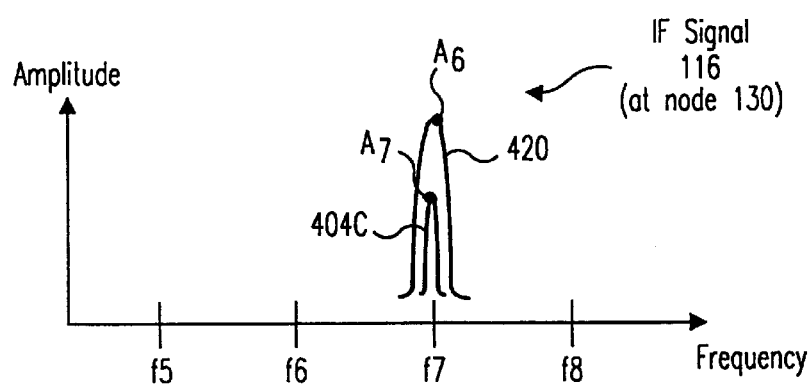

In the conventional receiver 112, note that the band select filter 102 is positioned prior to the mixer 106, and the channel select filter 108 is positioned after the mixer 106. Thus, in the conventional receiver 112, only a portion of the frequency selection operation 810 is performed prior to the frequency translation operation 808. Specifically, only band select filtering (i.e., wideband or image reject filtering) is performed prior to the frequency translation operation 810; channel select filtering (i.e., narrowband filtering) is performed after the frequency translation operation 808. This operational map of the conventional receiver 112 is illustrated in FIG. 3.

As described above, in the conventional receiver 112, signal components at frequencies near the desired frequency are not filtered out by the band select filter 102. This is because the bandwidth of the band select filter 102 is wide (specifically, the bandwidth of the band select filter 102 is greater than the bandwidth of the channel select filter 108). These signal components can exceed the dynamic range of the system and cause the LNA 104 and/or the mixer 106 to generate spurious signal components that may interfere with other signal components at desired frequencies (see FIGS. 4A–4G). Thus, the conventional receiver 112 suffers from potentially degraded performance because only band select or wideband filtering is performed prior to the frequency translation operation 808 or other operations (such as the amplification operation 812) that involve components having a limited linear range (such as the mixer 106 and the LNA 104).

Figure 9:
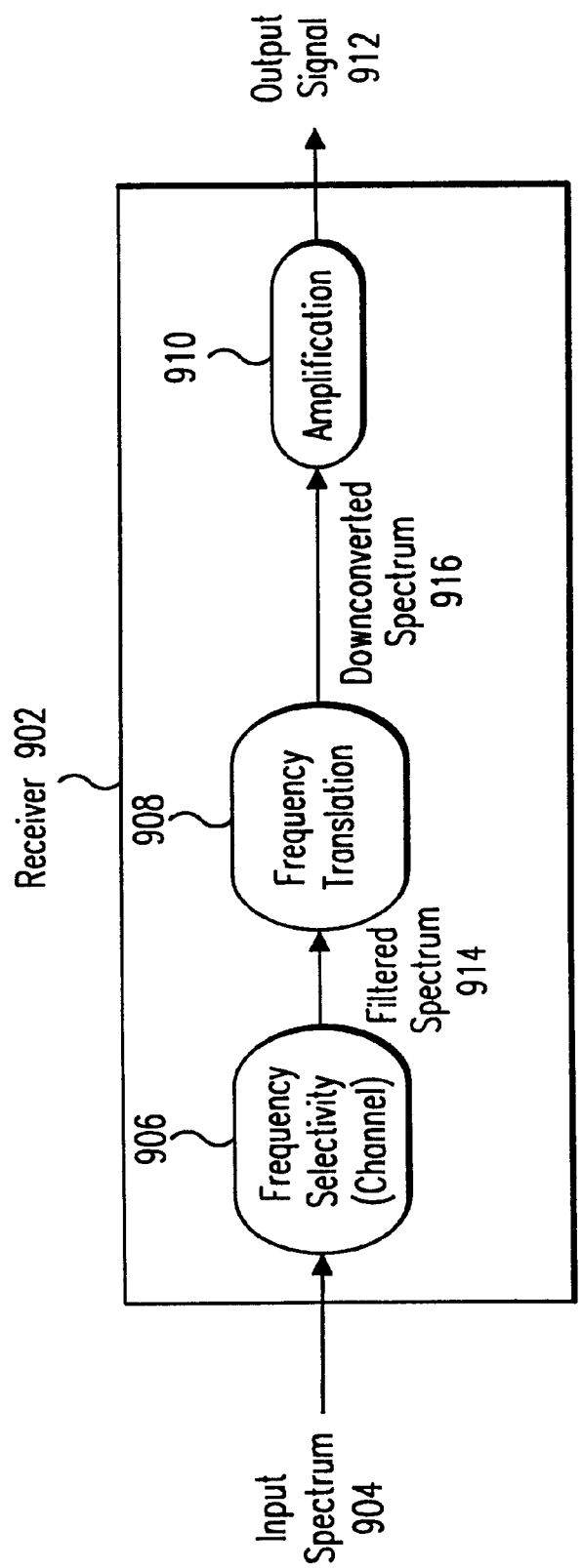
FIG. 9 is an operational map of a receiver according to a preferred embodiment of the present invention.

What would be desired is a receiver 902 having an operational map as shown in FIG. 9. In the receiver 902 of FIG. 9, preferably filtering (shown as the frequency selectivity operation 906 in FIG. 9) with a relatively narrow bandwidth (such as channel select filtering) is performed prior to the frequency translation operation 908 and the amplification operation 910. The advantages of the functional arrangement of the receiver 902 shall be considered with reference to FIGS. 10A–10E.

Figure 10A:
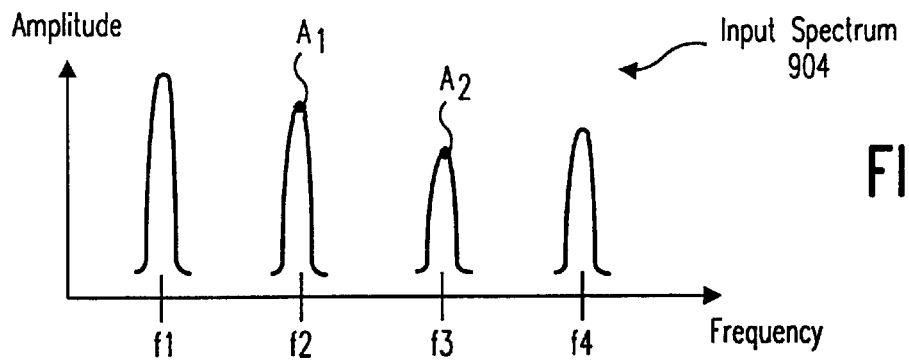
FIGS. 10A–10E are waveforms used to describe the operational map of FIG. 9.
Figure 10B:
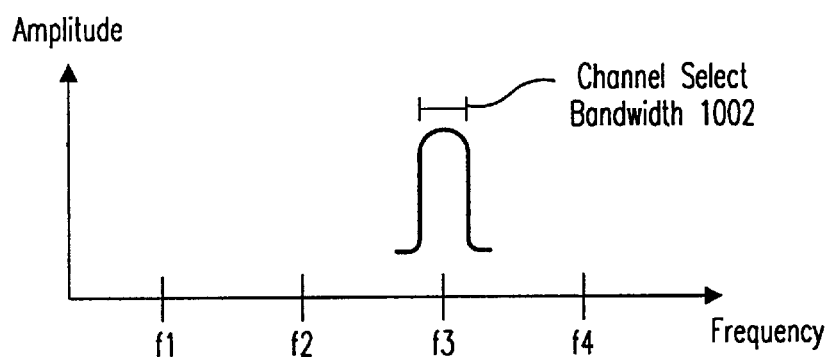
Figure 10C:
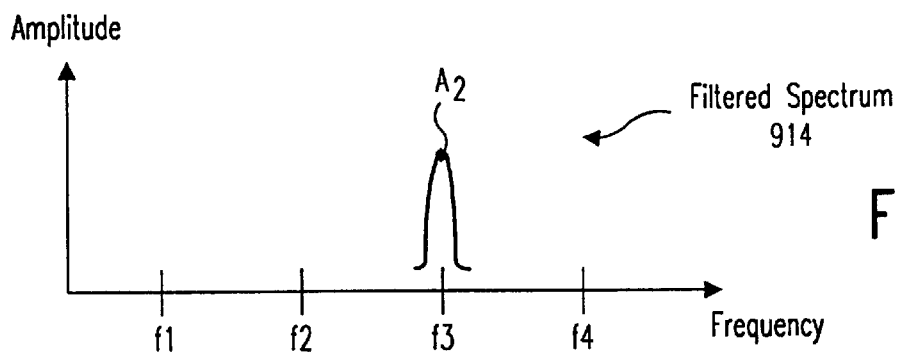

FIG. 10A illustrates an example input spectrum 904 having signal components at frequencies $f_1$, $f_2$, $f_3$, and $f_4$. Input spectrum 904 is, for example, an RF spectrum. Assume, for purposes of example, that the receiver 902 is tuned to receive signals at frequency $f_3$. In the receiver 902, the frequency selectivity operation 906 is first performed on the input spectrum 904. In the example receiver 902, this frequency selectivity operation 906 comprises channel select filtering. The characteristics of such filtering is generally illustrated in FIG. 10B, where the filter (that is performing the frequency selectivity operation 906) is centered at frequency $f_3$ and has a channel select bandwidth 1002.

In the case where the input spectrum 904 is an RF spectrum, the center frequency $f_3$ is also an RF frequency. For purposes of example, assume that the center frequency $f_3$ is 900 MHZ. Preferably, the channel select bandwidth 1002 is consistent with that of a narrow band filter. For example and without limitation, the channel select bandwidth 1002 may be 50 KHz, such that the passband associated with the frequency selectivity operation 906 is 899.95 MHZ to 900.05 MHz. Accordingly, the frequency selectivity operation 906 of the receiver 902 represents a front end, narrow band filtering operation operating at RF. The Q of this filter is 900 MHZ divided by 50 KHZ, or 18,000. Thus, with the present invention, filters with high Q factors at high frequencies are realizable.

The frequency selectivity operation 906 operates to filter out signal components not falling within the passband associated with the frequency selectivity operation 906. For purposes of example, assume that the signal component at frequency $f_3$ falls within this passband, but the signal components at $f_1$, $f_2$, and $f_4$ fall outside this passband (this is the example shown in FIGS. 10A and 10B). Accordingly, only the signal component at frequency $f_3$ is passed by the frequency selectivity operation 906. This signal component at frequency $f_3$ is referred to as the filtered spectrum 914 for reference purposes.

In the receiver 902 of FIG. 9, the frequency translation operation 908 and the amplification operation 910 follow the frequency selectivity operation 906. Because of the operation of the frequency selectivity operation 906, these operations 908, 910 operate on only the signal component at frequency $f_3$. Other signal components (that is, the signal components at frequencies $f_1$, $f_2$, and $f_4$) were filtered out by the frequency selectivity operation 906 and, thus, these signal components are not processed by the frequency translation operation 908 or the amplification operation 910.

Figure 10D:
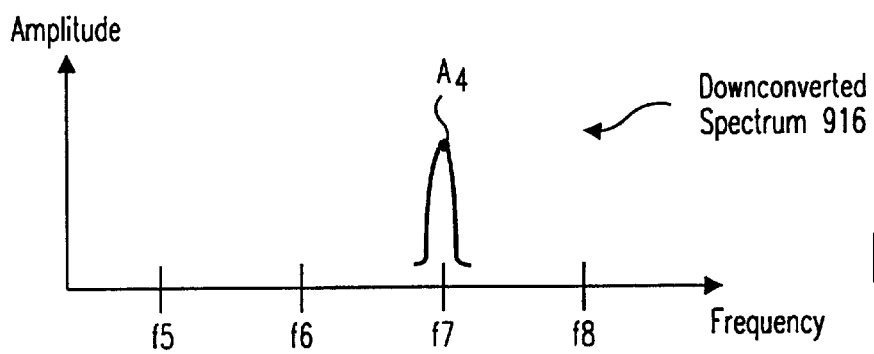
Figure 10E:
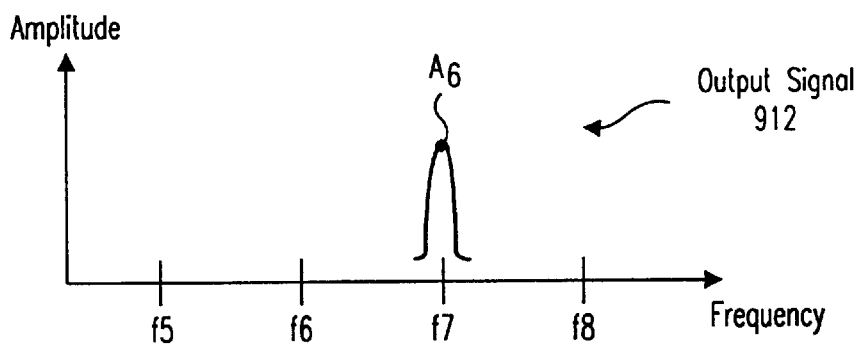

When the frequency translation operation 908 and the amplification operation 910 operate on the filtered signal 914, spurious components due to other than the filtered signal 914 are not generated. The result of the frequency translation operation 908 is depicted in FIG. 10D, and the result of the amplification operation 910 is depicted in FIG. 10E. Note that the desired output signal 912 shown in FIG. 10E is not compromised by spurious signal components.

The present invention is directed to methods and apparatuses for unified down-converting and filtering (UDF). The invention preferably performs at least the frequency selectivity operation 906 and the frequency translation operation 908. According to embodiments of the present invention, the frequency selectivity operation 906 performed by the present invention comprises filtering at any frequency, such as RF or greater. Such filtering is effectively performed prior to performance of the frequency translation operation 908, as shown in FIG. 9. Accordingly, the present invention exhibits the advantages described above with reference to FIGS. 10A–10E.

In some embodiments, the filter bandwidth of the present invention is consistent with narrow band filtering. Thus, the present invention can be accurately characterized as performing a narrow band filtering operation. In other embodiments, depending on the application, the filter bandwidth of the present invention is consistent with wide band filtering. Thus, the present invention can be accurately characterized as performing a wide band filtering operation. However, it should be understood that such characterizations of the invention are provided herein for illustrative purposes only. The filtering capabilities of the invention are not limited to those filter bandwidths typically associated with "narrow band filtering" and "wide band filtering." Instead, the unified down-converting and filtering (UDF) functionality of the present invention can be designed with substantially any filter bandwidth. The present invention is intended, adapted, and capable of filtering using substantially any filter bandwidth.

As noted above, the invention is capable of operating with input electromagnetic signals having frequencies equal to RF and above. In these embodiments, the invention operates to filter and downconvert at RF and greater frequencies. However, it should be understood that the invention is not limited to operation at RF and above. Instead, the invention is intended, adapted, and capable of working with substantially any frequency.

The invention is operable with any communication medium, including but not limited to wireless, optical, wire, etc., and variations and combinations thereof.

Figure 7A:
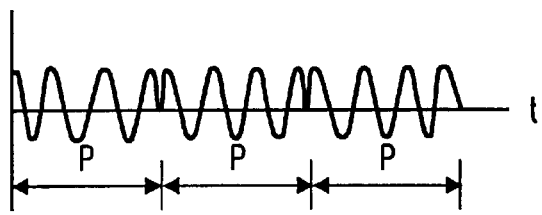
FIGS. 7A–7C illustrate different types of modulation schemes.
Figure 7B:
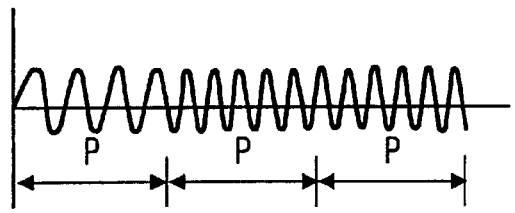
Figure 7C:
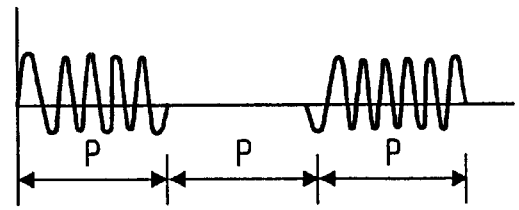

Signals referred to herein may be modulated or unmodulated. Modulated signals may have been generated using any modulation scheme, such as AM, FM, PM, etc., or combinations thereof. See, for example and without limitation, various modulation examples shown in FIGS. 7A–7C.

The invention is described in detail below.

3 Unified Downconverting and Filtering

The following sections describe operational methods for unified down-converting and filtering (UDF) according to embodiments of the invention. Structural exemplary embodiments for achieving these methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

3.1 Conceptual Description

The present invention is conceptually described in this section.

Figure 11:
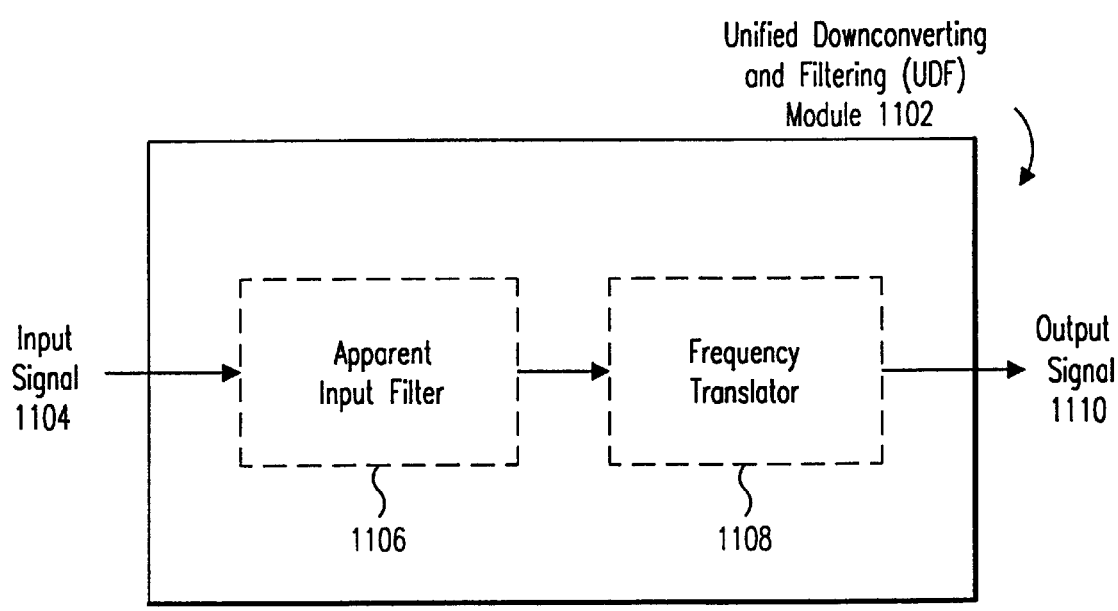
FIG. 11 is a block diagram of a unified downconverting and filtering (UDF) module according to an embodiment of the invention.

FIG. 11 is a conceptual block diagram of a unified down-converting and filtering (UDF) module 1102 according to an embodiment of the present invention. The UDF module 1102 performs at least the frequency translation operation 908 and the frequency selectivity operation 906 (FIG. 9).

The effect achieved by the UDF module 1102 is to perform the frequency selectivity operation 906 prior to the performance of the frequency translation operation 908. Thus, the UDF module 1102 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1104 received by the UDF module 1102 are at radio frequencies. The UDF module 1102 effectively operates to input filter these RF input signals 1104. Specifically, in these embodiments, the UDF module 1102 effectively performs input, channel select filtering of the RF input signal 1104. Accordingly, the invention achieves high selectivity at high frequencies.

The UDF module 1102 effectively performs various types of filtering, including but not limited to bandpass filtering, low pass filtering, high pass filtering, notch filtering, all pass filtering, band stop filtering, etc., and combinations thereof.

Conceptually, the UDF module 1102 includes a frequency translator 1108. The frequency translator 1108 conceptually represents that portion of the UDF module 1102 that performs frequency translation (down conversion).

The UDF module 1102 also conceptually includes an apparent input filter 1106 (also sometimes called an input filtering emulator). Conceptually, the apparent input filter 1106 represents that portion of the UDF module 1102 that performs input filtering.

In practice, the input filtering operation performed by the UDF module 1102 is integrated with the frequency translation operation. The input filtering operation can be viewed as being performed concurrently with the frequency translation operation. This is a reason why the input filter 1106 is herein referred to as an "apparent" input filter 1106.

The UDF module 1102 of the present invention includes a number of advantages. For example, high selectivity at high frequencies is realizable using the UDF module 1102. This feature of the invention is evident by the high Q factors that are attainable. For example, and without limitation, the UDF module 1102 can be designed with a filter center frequency $f_C$ on the order of 900 MHz, and a filter bandwidth on the order of 50 KHz. This represents a Q of 18,000, as indicated below.

$$\frac{900 \cdot 10^6}{50 \cdot 10^3} = 18,000$$

It should be understood that the invention is not limited to filters with high Q factors. The filters contemplated by the present invention may have lesser or greater Qs, depending on the application, design, and/or implementation. Also, the scope of the invention includes filters where Q factor as described herein is not applicable.

The invention exhibits additional advantages. For example, the filtering center frequency $f_C$ of the UDF module 1102 can be electrically adjusted, either statically or dynamically.

Also, the UDF module 1102 can be designed to amplify input signals.

Further, the UDF module 1102 can be implemented without large resistors, capacitors, or inductors. Also, the UDF module 1102 does not require that high tolerances be maintained on its individual components, i.e., its resistors, capacitors, inductors, etc. As a result, the architecture of the UDF module 1102 is friendly to integrated circuit design techniques and processes.

These and other advantages of the UDF module 1102 of the present invention will be apparent to persons skilled in the relevant art(s) based on the discussion contained herein.

Further understanding of the UDF module 1102 may be facilitated by making a comparison with the conventional receiver 112 (FIGS. 1 and 3). The frequency selectivity operations 302, 308 performed by the conventional receiver 112 are distinct from the frequency translation operation 306 (see FIG. 3). More particularly, the components which perform the frequency selectivity operation 302, 308 (that is, the band-select filter 102 and the channel-select filter 108) are different from the component that performs the frequency translation operation 306 (that is, the mixer 106).

Figure 12:
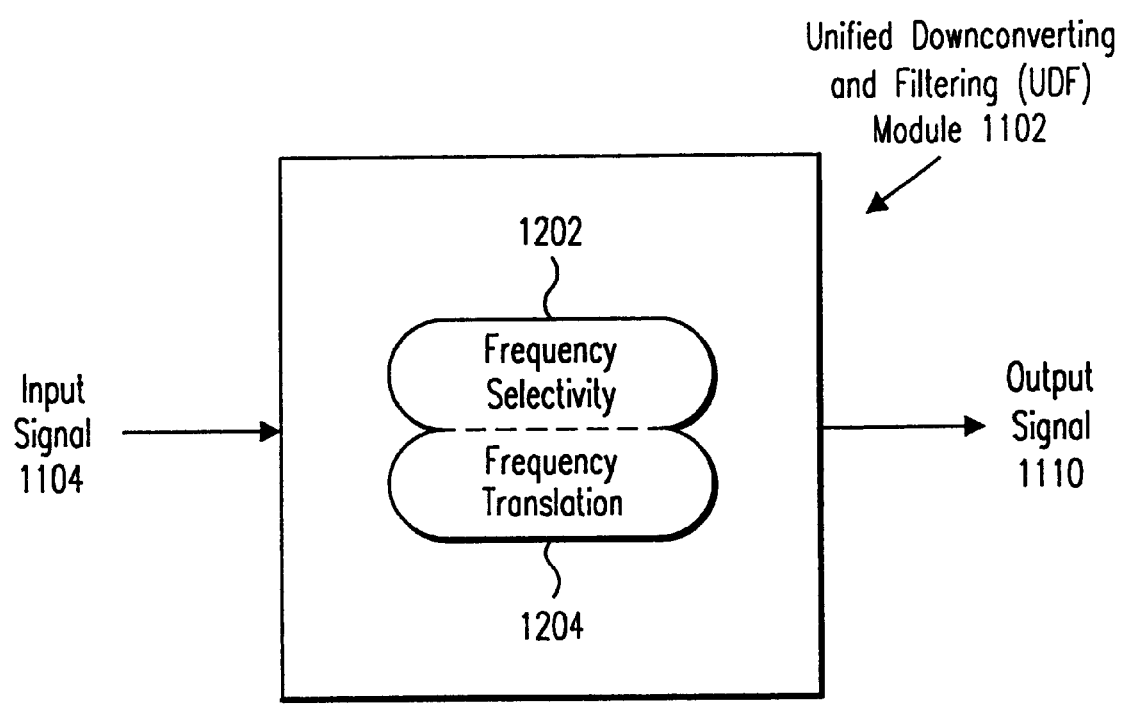
FIG. 12 is a block diagram of the UDF module of FIG. 11, wherein the unified performance of the frequency selectivity operation and the frequency translation operation according to the present invention is depicted.

The features and advantages exhibited by the UDF module 1102 are achieved at least in part by adopting a new technological paradigm with respect to frequency selectivity and translation. Specifically, according to the present invention, the UDF module 1102 performs the frequency selectivity operation and the frequency translation operation as a single, unified (integrated) operation. This is conceptually represented in FIG. 12, where the selectivity operation 1202 is shown as being combined or integrated with the frequency translation operation 1204. This is also indicated via the dotted line representations of the apparent input filter 1106 and the frequency translator 1108 in FIG. 11.

Figure 13:
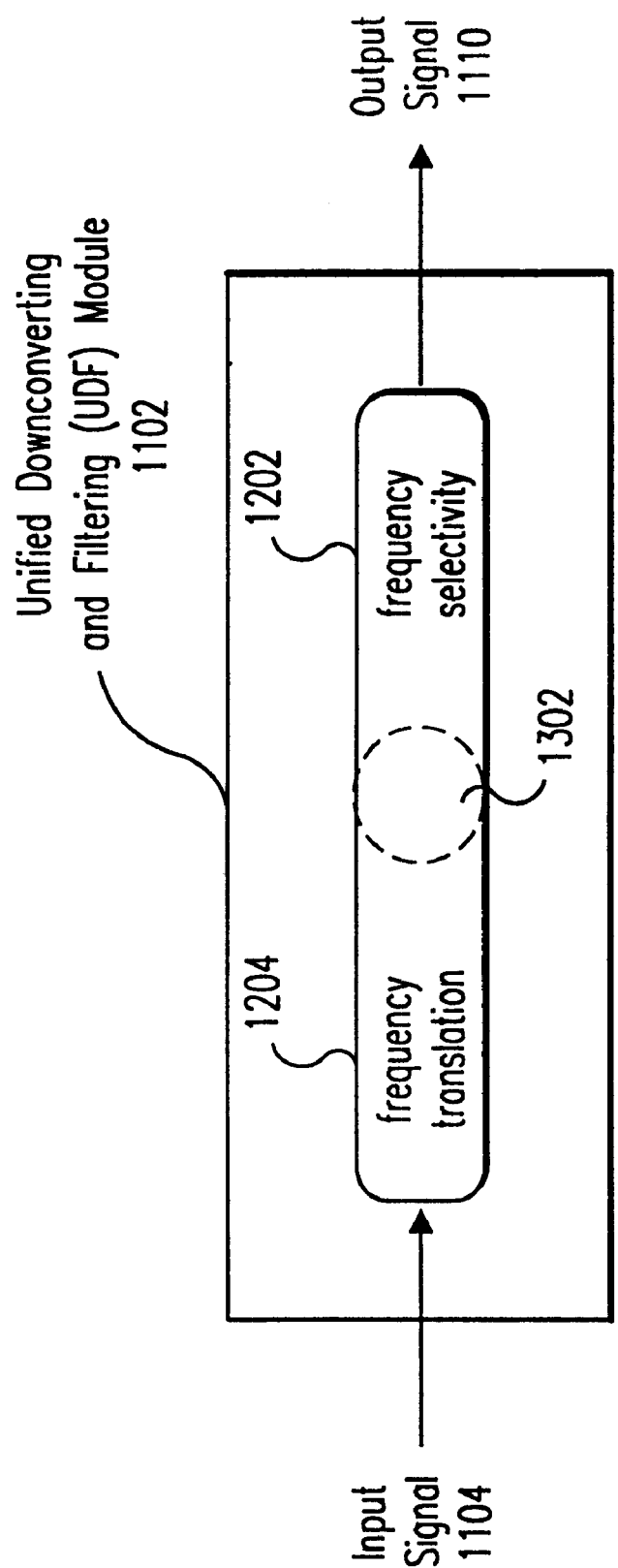
FIG. 13 is a block diagram of the UDF module of FIG. 11, wherein it is illustrated that operations related to the frequency translation operation are performed prior to operations relating to the frequency selectivity operation, according to an embodiment of the invention.

Referring to FIG. 13, as described above, the UDF module 1102 preferably performs frequency translation 1204 prior to frequency selectivity 1202 (in other embodiments, the reverse is true). The overlapping area 1302 depicted in FIG. 13 indicates that the operations relating to frequency translation 1204 also contribute to the performance of frequency selectivity 1202, and/or vice versa.

3.2 High Level Description

This section (including its subsections) provides a high-level description of unified down-converting and filtering (UDF) according to the present invention. In particular, an operational process of down-converting and filtering is described at a high-level. Also, a structural implementation for achieving this process is described at a high-level. This structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

3.2.1 Operational Description

Figure 14:
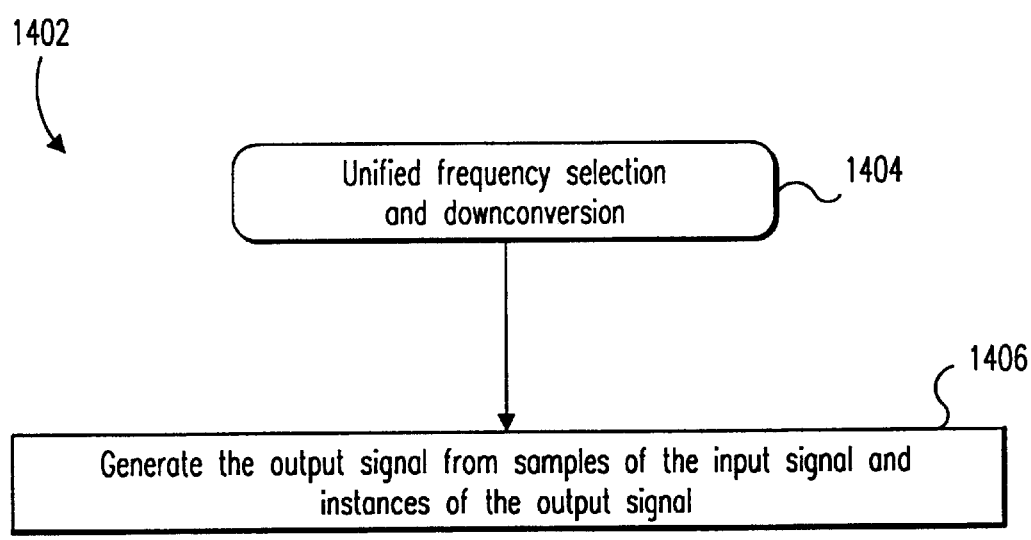
FIG. 14 is a flowchart depicting the operation of the unified downconverting and filtering (UDF) module according to an embodiment of the invention.

According to embodiments of the present invention, the UDF module generates an output signal from an input signal using samples/instances of the input signal and samples/instances of the output signal. This operation is represented by step 1406 in a flowchart 1402 (FIG. 14). By operating in this manner, the UDF module preferably performs input filtering and frequency down-conversion in a unified manner.

For illustrative purposes, the operation of the invention is often represented by flowcharts, such as flowchart 1402 in FIG. 14. It should be understood, however, that the use of flowcharts is for illustrative purposes only, and is not limiting. For example, the invention is not limited to the operational embodiment(s) represented by the flowcharts. Instead, alternative operational embodiments will be apparent to persons skilled in the relevant art(s) based on the discussion contained herein. Also, the use of flowcharts should not be interpreted as limiting the invention to discrete or digital operation. In practice, as will be appreciated by persons skilled in the relevant art(s) based on the herein discussion, the invention can be achieved via discrete or continuous operation, or a combination thereof. Further, the flow of control represented by the flowcharts is provided for illustrative purposes only. As will be appreciated by persons skilled in the relevant art(s), other operational control flows are within the scope and spirit of the present invention. Also, the ordering of steps may differ in various embodiments.

Figure 16:
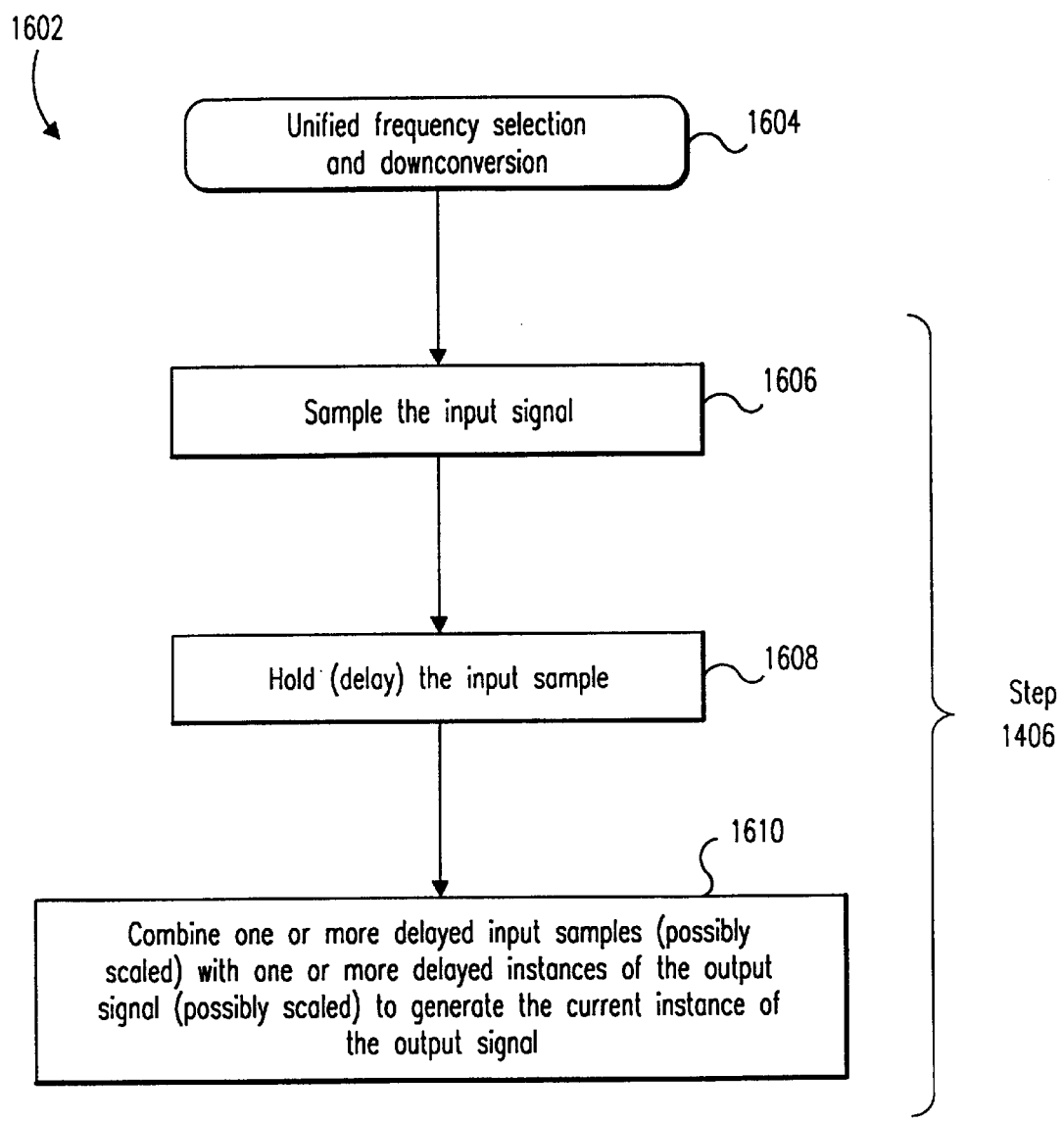
FIG. 16 is a more detailed operational flowchart of the unified downconverting and filtering(UDF) operations performed by embodiments of the invention.

The operation of embodiments of the invention shall now be described in greater detail with reference to a flowchart 1602 shown in FIG. 16. The steps of flowchart 1602 generally represent step 1406 in FIG. 14.

In step 1606, the input signal is sampled. This input sample includes information (such as amplitude, phase, etc.) representative of the input signal existing at the time the sample was taken.

As described further below, the effect of repetitively performing step 1606 is to translate the frequency (that is, down-convert) of the input signal to a desired lower frequency, such as an intermediate frequency (IF) or baseband.

In step 1608, the input sample is held (that is, delayed).

In step 1610, one or more delayed input samples (some of which may have been scaled), such as the delayed input sample of step 1608, are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.)

As noted above, this operation of the present invention supports multiple filtering types, including but not limited to bandpass, low pass, high pass, notch, all pass, etc., and combinations thereof.

3.2.2 Structural Description

Figure 17:
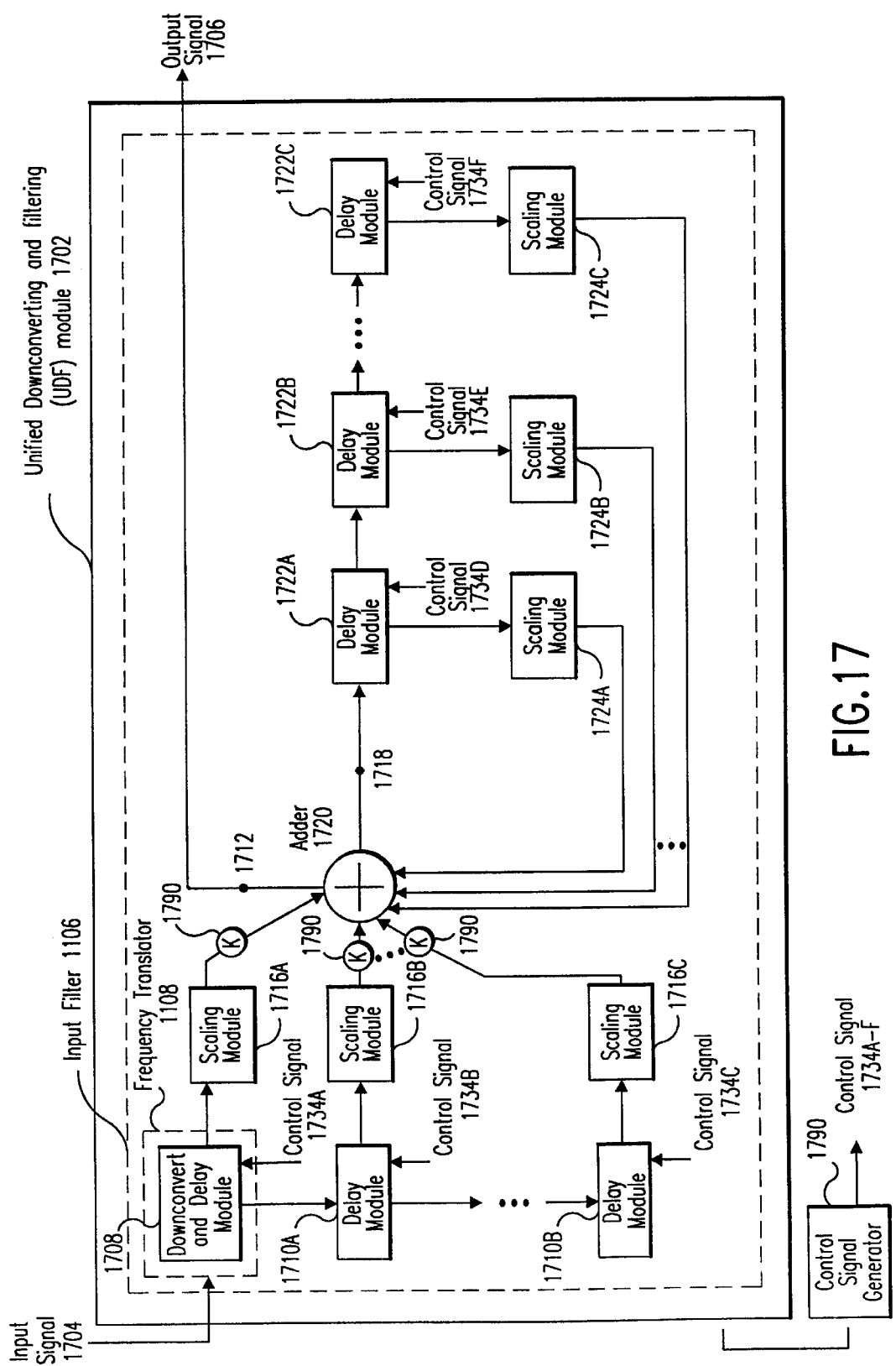
FIG. 17 is a more detailed block diagram of an example UDF module according to an embodiment of the invention.

FIG. 17 illustrates a UDF module 1702 according to an embodiment of the invention. The UDF module 1702 includes a portion that generally corresponds to the frequency translator 1108 (FIG. 11). The UDF module 1702 includes another portion that generally corresponds to the input filter 1106. Note that the portion of the UDF module 1702 that corresponds to the frequency translator 1108 also forms a part of the input filter 1106. This further highlights the preferred aspect of the invention that the frequency selectivity operation 1202 and the frequency translation operation 1204 are performed as an integrated and unified operation.

Note that the UDF module 1702 includes scaling elements 1790. These elements are optional, and are used for amplification. The scaling elements 1790 are discussed in a section below. In the present discussion, the scaling elements 1790 are not considered.

The operation of the UDF module 1702 shall now be described with reference to flowchart 1602 in FIG. 16.

In step 1606, a down-convert and delay module 1708 samples the input signal 1704. This sampling operation is performed in accordance with a control signal 1734A. The down-convert and delay module 1708, when repetitively performing step 1606, results in translating the frequency of the input signal 1704 to a desired lower frequency, such as IF or baseband. Accordingly, the down-convert and delay module 1708 down-converts the input signal 1704 to a desired lower frequency.

In step 1608, the down-convert and delay module 1708 holds (delays) the input sample. This delaying operation by the down-convert and delay module 1708 contributes to the performance of the frequency selectivity operation 1202.

In step 1610, components of the UDF module 1702 operate to combine one or more delayed input samples (some of which may have been scaled) with one or more delayed instances of the output signal 1706 (some of which may have been scaled) to generate a current instance of the output signal 1706. More particularly, delay modules 1710A, 1710B, etc., operate to delay samples of the input signal 1704 taken by the down-convert and delay module 1708 (although two delay modules 1710A, 1710B are shown in the example of FIG. 17, the invention is not limited to this embodiment). Scaling modules 1716A, 1716B, 1716C, etc., operate to scale these delayed input samples from the down-convert and delay module 1708 and the delay modules 1710A, 1710B, etc.

Delay modules 1722A, 1722B, 1722C, etc., operate to delay instances of the output signal 1706 (note that the output signal 1706 is present at both nodes 1712 and 1718). (Although three delay modules 1722A–1722C are shown in the example of FIG. 17, the invention is not limited to this embodiment.) Scaling modules 1724A, 1724B, 1724C, etc., operate to scale these delayed instances of the output signal 1706 from the delay modules 1722A, 1722B, 1722C, etc.

An adder 1720 operates to combine the delayed and scaled input samples and the delayed and scaled instances of the output signal 1706 to generate instances of the output signal 1706.

As noted above, different embodiments of the UDF module utilize different numbers and/or configurations of delay modules 1710, 1722, and different numbers and/or configurations of scaling modules 1716 and 1724. Also, the operation of the delay modules 1710, 1722 and the scaling modules 1716, 1724 will vary among embodiments of the UDF module. For example, the amount of delay introduced by each delay module 1710, 1722 will vary among embodiments of the UDF module. Also, the scale factors of scaling modules 1716, 1724 will vary among embodiments of the UDF module (generally, the scale factor of each scaling module 1716, 1724 may be any real number). For example, and without limitation, the scale factor of one or more scaling modules in some embodiments may be zero. Accordingly, it should be understood that the embodiments of the UDF module shown and discussed herein are provided for illustrative purposes only. The present invention is not limited to the embodiments of the UDF module shown and discussed herein. Alternate embodiments of the UDF module, differing slightly or greatly from those shown and discussed herein, will be apparent to persons skilled in the relevant art(s) based on the discussion contained herein.

3.3 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

3.3.1 First Embodiment: Band Pass Filtering and Frequency Translation

An example embodiment of the invention, wherein band-pass filtering and frequency translation are performed, is described in the following sections.

3.3.1.1 Operational Description

A representation of a transfer function for a band-pass filter is shown in EQ. 3, which was discussed above and presented below for convenience. As indicated above, EQ. 3 is described herein for illustrative purposes only, and is not limiting.

$$VO = \alpha_1 z^{-1} VI - \beta_1 z^{-1} VO - \beta_0 z^{-2} VO \qquad \text{EQ. 3}$$

As evidenced by EQ. 3, the output signal VO is formed from a summation of scaled delayed values of the input signal VI and scaled delayed values of the output signal VO. More particularly, at any given time t, the value of the output signal VO is equal to a scaled value of the input signal VI from time t−1, minus a scaled value of the output signal VO from time t−1, minus a scaled value of the output signal VO from a time t−2.

It is noted that EQ. 3 is a transfer function for band-pass filtering the input signal VI. EQ. 3 is not in any way related to translating the frequency of the input signal VI. That is, EQ. 3 is not in any way related to down-converting the input signal VI. However, the invention preferably operates such that frequency translation is performed at substantially the same time that band-pass filtering is performed in accordance with EQ. 3. Such operation of the present invention shall now be described with reference to a flowchart 1802 presented in FIG. 18.

In step 1806, at a time t−1, the input signal VI is under-sampled. According to the present invention and as further described below, this under-sampling of the input signal results in translating the frequency of the input signal VI to a desired lower frequency (such as IF or baseband), such that the input sample is an instance of a down-converted image of the input signal VI. As described below, this input sample is used in the frequency selectivity operation. This further indicates the integrated operation of the present invention.

In step 1808, at a time t, the input sample that was held from step 1806 is released and scaled. The scaling value can be any real number, including but not limited to zero.

In steps 1810 and 1812, at time t, an instance of the output signal VO that was previously captured at time t−1, and that was held until this time, is released and scaled. The scaling value can be any real number, including but not limited to zero.

In steps 1814 and 1816, at time t, an instance of the output signal that was previously captured at time t−2, and that was held until this time, is released and scaled. The scaling value can be any real number, including but not limited to zero.

In step 1818, at time t, a current instance of the output signal, $VO_t$, is generated by combining the scaled and delayed sample of the input signal $VI_{t-1}$ with the scaled and delayed instances of the output signal $VO_{t-1}$ and $VO_{t-2}$.

3.3.1.2 Structural Description

Figure 19:
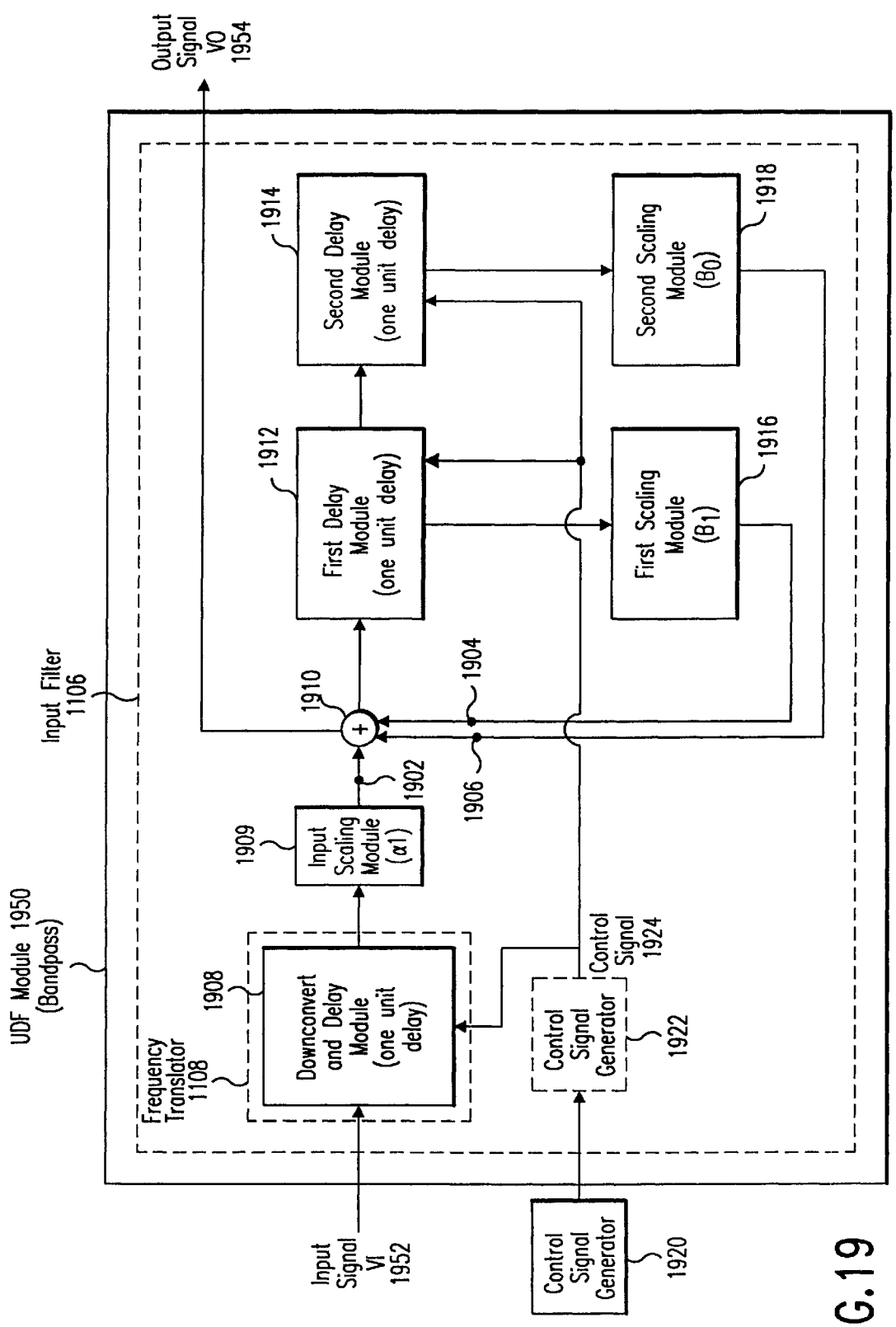
FIG. 19 is an example implementation of the operational steps of FIG. 18.

FIG. 19 is a block diagram of a UDF module 1950 according to an embodiment of the invention. The UDF module 1950 includes a portion that corresponds to the frequency translator 1108 (FIG. 11), and a portion that corresponds to the input filter 1106. Note that the portion corresponding to the frequency translator 1108, that is, the down-convert and delay module 1908, also forms a part of the input filter 1106. This is indicative of the preferred aspect of the invention wherein the frequency selectivity operation 1202 and the frequency translation operation 1208 are performed as a single unified operation.

Figure 18:
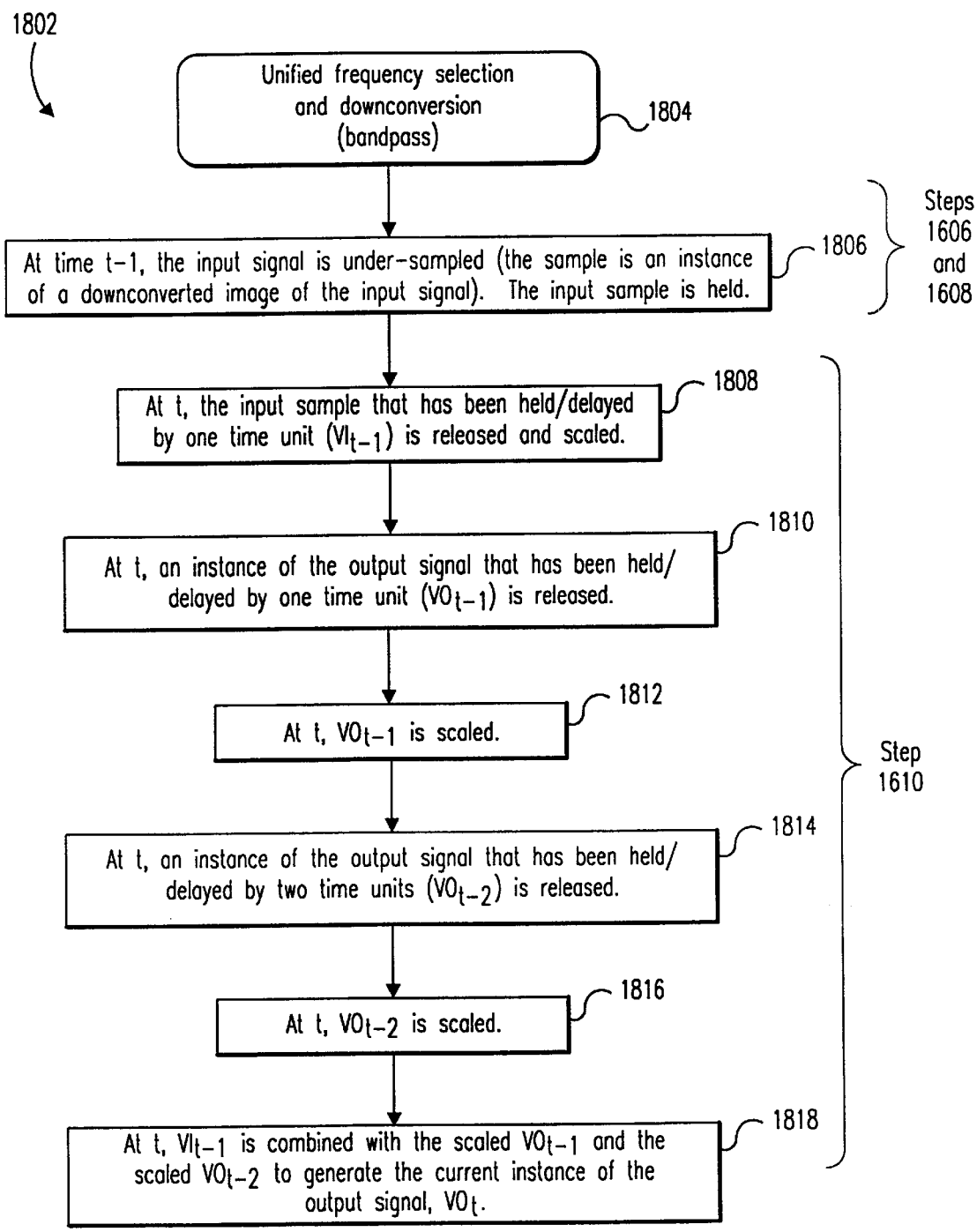
FIG. 18 is an operational flowchart of the unified downconverting and filtering (UDF) operations performed by embodiments of the invention, wherein the filtering operation comprises a band-pass filtering operation.

The UDF module 1950 of FIG. 19 is a structural embodiment for performing the operational steps of flowchart 1802 (FIG. 18). However, it should be understood that the scope and spirit of the present invention includes other structural embodiments for performing the steps of flowchart 1802. The specifics of these other structural embodiments will be apparent to persons skilled in the relevant art(s) based on the discussion contained herein.

The operation of the UDF module 1950 is now described in detail with reference to the flowchart 1802 of FIG. 18. Reference also will be made to a table 2002 in FIG. 20 that indicates example values at nodes in the UDF module 1950 at a number of consecutive time increments.

In step 1806, at time t−1, the down-convert and delay module 1908 under-samples the input signal VI. This input sample is denoted as $VI_{t-1}$. As noted above, in performing step 1806, the down-convert and delay module 1908 operates to translate the frequency of the input signal VI to a desired lower frequency, such as IF or baseband. Accordingly, the input sample $VI_{t-1}$ represents an instance of a down-converted image of the input signal VI. This operation of the down-convert and delay module 1908 is further described below.

Also in step 1806, the down-convert and delay module 1908 holds the input sample $VI_{t-1}$ for preferably one time unit. See cell 2004 in Table 2002. As apparent from EQ. 3, above, the band-pass filtering transfer function requires that the input sample be held for one time unit. Accordingly, when performing this portion of step 1806, the down-convert and delay module 1908 is performing a portion of the frequency selectivity operation 1202. Accordingly, as should be apparent by this description, the down-convert and delay module 1908 contributes to both the frequency translation operation 1204 and the frequency selectivity operation 1202.

In step 1808, at time t, the input sample that was held for one time unit (that is, $VI_{t-1}$) is released by the down-convert and delay module 1908, and scaled by the input scaling module 1909. Accordingly, the signal present at node 1902 is (see cell 2006 in Table 2002): $\alpha_1 \cdot VI_{t-1}$.

Previously, at time t−1, the first delay module 1912 captured an instance of the output signal VO. This instance of the output signal VO is denoted as $VO_{t-1}$. Instep 1810, at time t, the first delay module 1912 releases this instance of the output signal $VO_{t-1}$. In step 1812, this instance of the output signal $VO_{t-1}$ is scaled by the first scaling module 1916. The value present at node 1904 after operation of the first scaling module 1916 is (see cell 2012 in Table 2002): $-\beta_1 \cdot VO_{t-1}$.

Previously, at time t−1, the second delay module 1914 captured an instance of the output signal VO stored in the first delay module 1912 (note that the first delay module 1912 sampled the output signal VO to obtain this instance at time t−2). This instance of the output signal VO is denoted as $VO_{t-2}$. At time t, this instance of the output signal $VO_{t-2}$ is released by the second delay module 1914.

In step 1816, the second scaling module scales this instance of the output signal $VO_{t-2}$. After operation of the second scaling module 1918, the following value is present at node 1906 (see cell 2016 in Table 2002): $-\beta_0 \cdot VO_{t-2}$.

In step 1818, at time t, a summer 1910 adds the values present at nodes 1902, 1904, and 1906. The sum represents the current instance of the output signal VO. This output signal instance is denoted as $VO_t$, and is equal to the following (see field 2008 in Table 2002): $\alpha_1 \cdot VI_{t-1} - \beta_1 \cdot VO_{t-1} - \beta_0 \cdot VO_{t-2}$.

3.3.2 Second Embodiment: Low Pass Filtering and Frequency Translation

An example embodiment of the invention, wherein low-pass filtering and frequency translation are performed, is described in the following sections.

3.3.2.1 Operational Description

EQ. 6 is a representation of a transfer function for a low-pass filter. EQ. 6, first introduced above, is presented below for convenience. As indicated above, EQ. 6 is described herein for illustrative purposes only, and is not limiting.

$$VO = \alpha_0 z^{-2} VI - \beta_1 z^{-1} VO - \beta_0 z^{-2} VO \qquad \text{EQ. 6}$$

As evidenced by EQ. 6, a low-pass filtering operation can be achieved by adding a scaled instance of the input signal VI that has been delayed by two time units to two scaled instances of the output signal VO that had been delayed by one and two time units, respectively.

Note that the low-pass transfer function of EQ. 6 is not in any way related to the frequency translation operation 1204. However, the invention preferably operates such that frequency translation is performed at substantially the same time that low-pass filtering is performed in accordance with EQ. 6. Such operation of the present invention shall now be described with reference to a flowchart 2202 presented in FIG. 22.

In step 2206, at a time t−2, the input signal VI is under-sampled. The input sample is denoted as $VI_{t-2}$. According to the present invention and as further described below, this under-sampling of the input signal results in translating the frequency of the input signal VI to a desired lower frequency (such as IF or baseband), such that the input sample is an instance of a down-converted image of the input signal VI. The input sample is preferably held for two time periods.

Also in step 2206, the input sample $VI_{t-2}$ is held for two time units. As evident from EQ. 6, in order to achieve a low-pass filtering operation, it is necessary to hold an instance of the input signal VI by two time units. Accordingly, this aspect of step 2206 constitutes a portion of the frequency selectivity operation 1202. Thus, in performing step 2206, the present invention is performing aspects of the frequency selectivity operation 1202. Thus, the down-convert and delay module 2308 contributes to both the frequency translation operation and the frequency selectivity operation.

In step 2208, at time t, the input sample $VI_{t-2}$ that had been held by two time units is released. This input sample $VI_{t-2}$ is scaled in step 2210.

In steps 2212 and 2214, at time t, an instance of the output signal $VO_{t-1}$ that has been held by one time unit is released and scaled.

In steps 2216 and 2218, at time t, an instance of the output signal $VO_{t-2}$ that has been held by two time units is released and scaled.

In step 2220, at time t, the current instance of the output signal, $VO_t$, is generated by combining the scaled input sample $VI_{t-2}$ with the scaled instances of the output signal $VO_{t-1}$ and $VO_{t-2}$.

3.3.2.2 Structural Description

Figure 23:
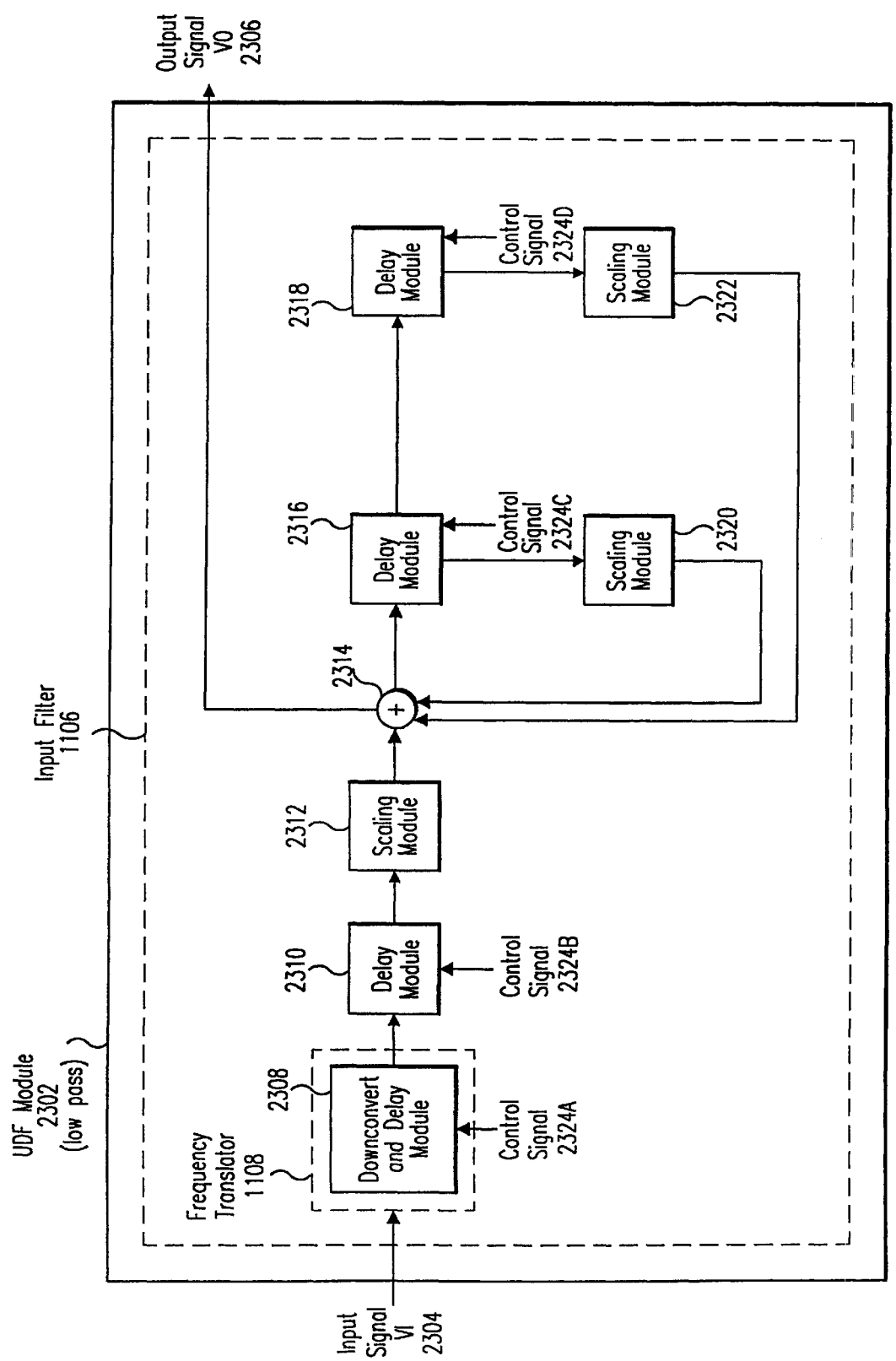
FIG. 23 is an example UDF module useful for implementing the steps of the flowchart in FIG. 22.

FIG. 23 is a block diagram of a UDF module 2302 according to an embodiment of the invention. The UDF module 2302 includes a portion that corresponds to the frequency translator 1108, and a portion that corresponds to the input filter 1106. Note that the portion of the UDF module 2302 that corresponds to the frequency translator 1108 also forms a part of the input filter 1106.

The UDF module 2302 is a structural embodiment for performing the operational steps of flowchart 2202. However, it should be understood that the scope and spirit of the present invention includes other structural embodiments for performing the steps of flowchart 2202. The specifics of these other structural embodiments will be apparent to persons skilled in the relevant art(s) based on the discussion contained herein.

Figure 22:
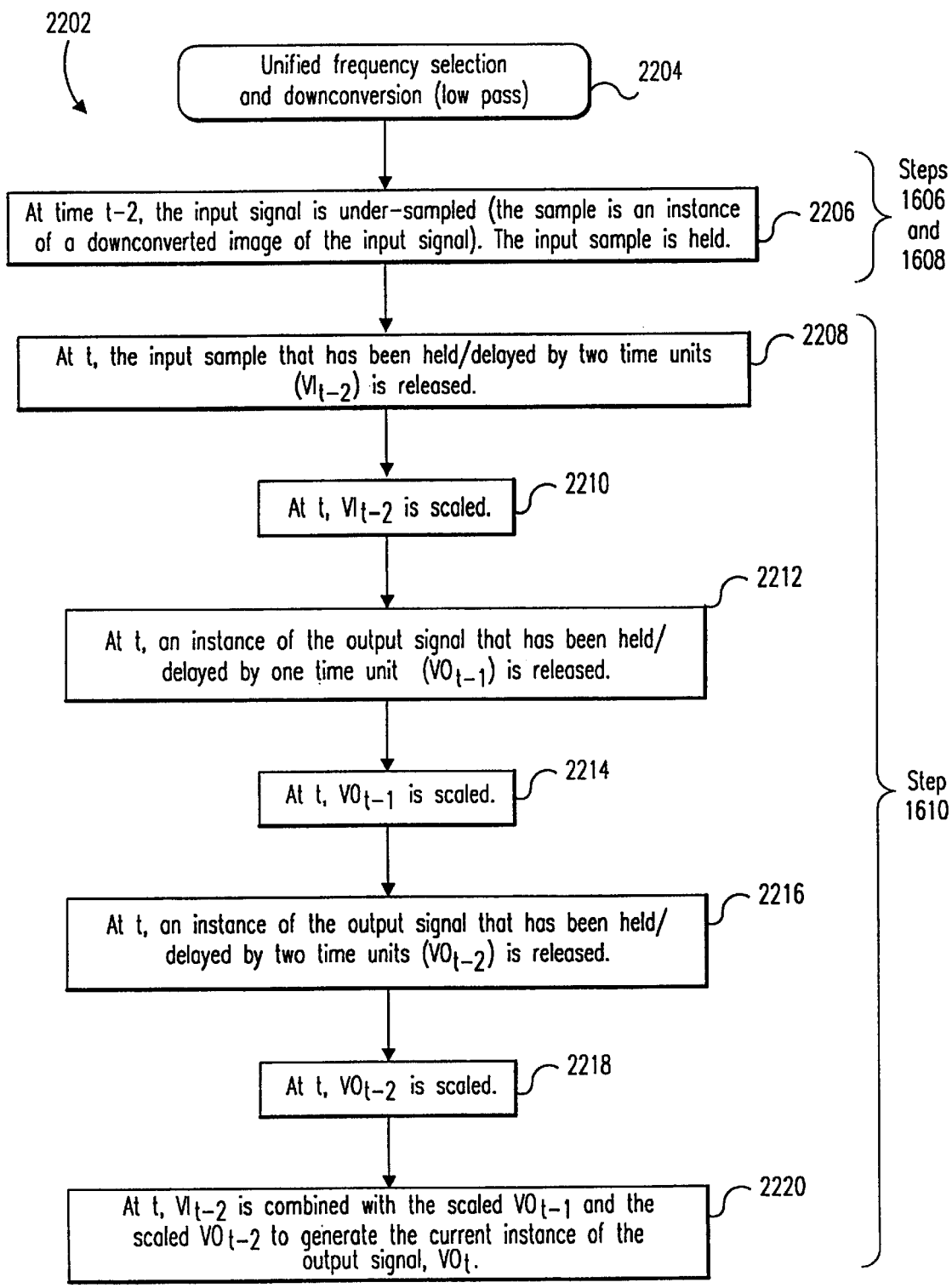
FIG. 22 is an operational flowchart of the unified downconverting and filtering (UDF) operations performed by embodiments of the invention, wherein the filtering operation comprises a low-pass filtering operation.

The operation of the UDF module 2302 shall now be described in detail with reference to the flowchart 2202 of FIG. 22.

At a time t–2, the down-convert and delay module 2308 under-samples the input signal VI. This input sample is denoted as $VI_{t-2}$. The down-convert and delay module 2308 under-samples the input signal VI to obtain input sample $VI_{t-2}$ in accordance with a control signal 2324A. As further described below, the down-convert and delay module 2308 performs such sampling in a manner that operates to translate the frequency of the input signal VI to a desired lower frequency, such as IF or baseband. Accordingly, the input sample $VI_{t-2}$ represents an instance of a down-converted image of the input signal VI.

Also in step 2206, the down-convert and delay module 2308 holds the input sample $VI_{t-2}$ for one time unit. At time t–1, the input sample $VI_{t-2}$ is captured by a delay module 2310, and held for an additional time unit. As evident from the low-pass filtering transfer function of EQ. 6, in order to perform the low-pass filtering operation, it is necessary to hold or delay the input signal VI by two time units. As just described, this delaying operation is performed collectively by the down-convert and delay module 2308 and the delay module 2310. Therefore, in performing this aspect of step 2206, the down-convert and delay module 2308 contributes to the performance of the frequency selectivity operation 1202, as well as the frequency translation operation 1204.

In step 2208, at time t, the input sample $VI_{t-2}$ that has been held/delayed by two time units is released by the delay module 2310.

In step 2210, at time t, the input sample $VI_{t-2}$ is scaled by the scaling module 2312.

Previously, at time t–1, the delay module 2316 captured an instance of the output signal VO. This instance of the output signal VO is denoted as $VO_{t-1}$. In step 2212, at time t, this instance of the output signal $VO_{t-1}$ is released by the delay module 2316.

In step 2214, at time t, this instance of the output signal $VO_{t-1}$ is scaled by the scaling module 2320.

Previously, at time t–1, the delay module 2318 captured an instance of the output signal VO stored in the delay module 2316. This instance of the output signal VO is denoted as $VO_{t-2}$. At time t, in step 2216, this instance of the output signal $VO_{t-2}$ is released by the delay module 2318.

In step 2218, at time t, this instance of the output signal $VO_{t-2}$ is scaled by the scaling module 2322.

In step 2220, at time t, the current instance of the output signal, $VO_t$, is generated by combining the scaled input sample $VI_{t-2}$ with the scaled instances of the output signal, $VO_{t-1}$ and $VO_{t-2}$.

3.3.3 Third Embodiment: Filtering with Mid-Point Injection and Frequency Translation The UDF embodiments described above are provided for illustrative purposes only. The invention is not limited to these embodiments.

For example, as will be appreciated by persons skilled in the relevant art(s), it is possible to achieve a given set of filter characteristics using a variety of transfer functions. The elements of such transfer functions can be arranged and configured to satisfy particular goals and/or requirements.

In a similar manner, a variety of UDF embodiments are possible. In such embodiments, components contained therein are selected and arranged to satisfy particular goals and/or requirements.

Figure 44:
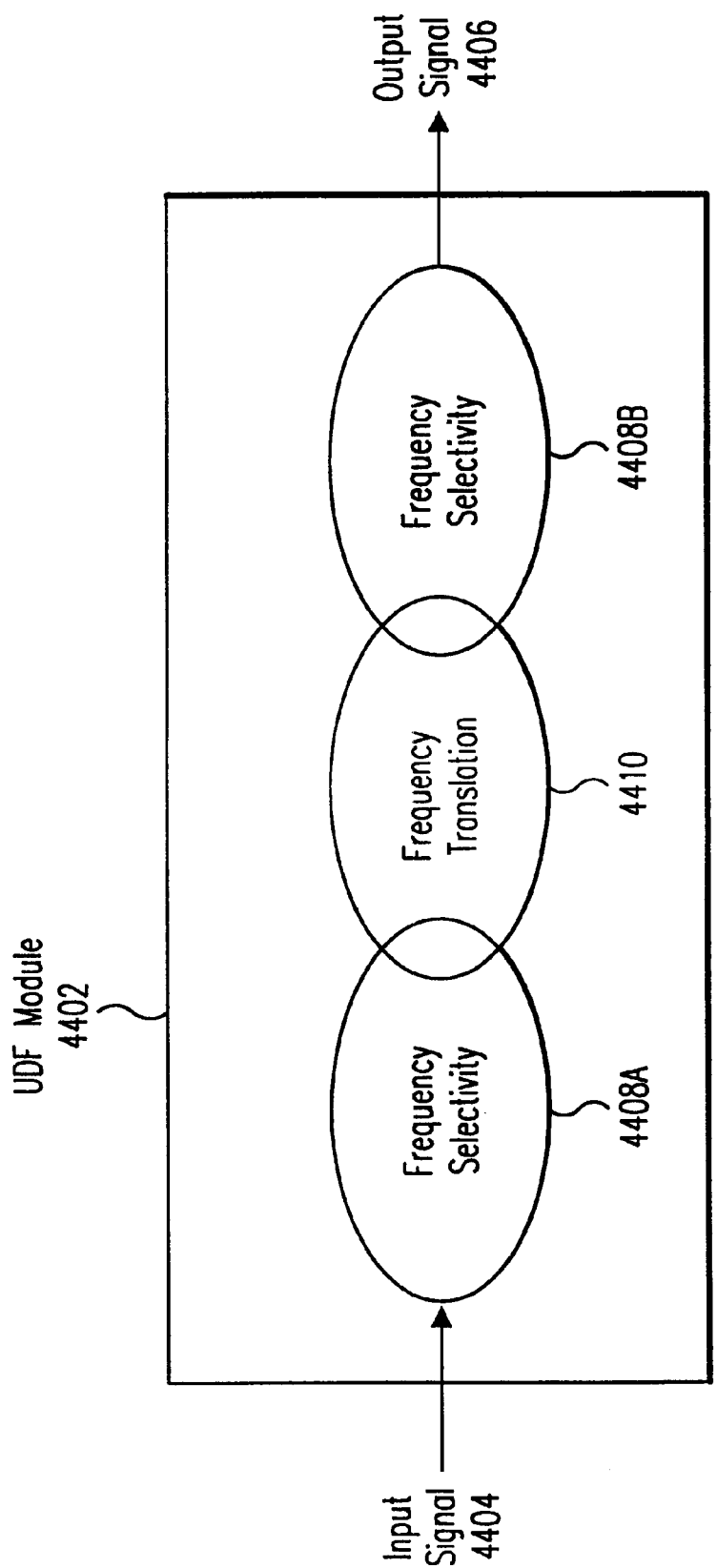
FIG. 44 illustrates an operational map of an example UDF module according to an alternate embodiment of the invention.

For example, and without limitation, it is possible to construct a UDF module 4402 having the operational map illustrated in FIG. 44. Such operation is herein characterized as filtering with mid-point injection, in combination with frequency translation. These embodiments are described in the following sections.

It is noted that the mid-point injection embodiment is presented to illustrate the great flexibility of the invention. In particular, UDF embodiments according to the invention can be constructed with a great variety of components and component configurations. Additional UDF embodiments will be apparent to persons skilled in the relevant art(s) based on the teachings contained herein.

3.3.3.1 Operational Description

EQ. 3, discussed above, is a representation of a transfer function for a band-pass filter. EQ. 3 is reproduced below for convenience. As indicated above, EQ. 3 is described herein for illustrative purposes only, and is not limiting.

$$VO = \alpha_1 z^{-1} VI - \beta_1 z^{-1} VO - \beta_0 z^{-2} VO \qquad \text{EQ. 3}$$

An embodiment of the UDF module for performing, in a unified manner, the frequency translation operation 1204 and the frequency selectivity operation 1202 according to the band-pass filtering transfer function of EQ. 3 was described above. See, for example, FIGS. 18 and 19.

Figure 24:
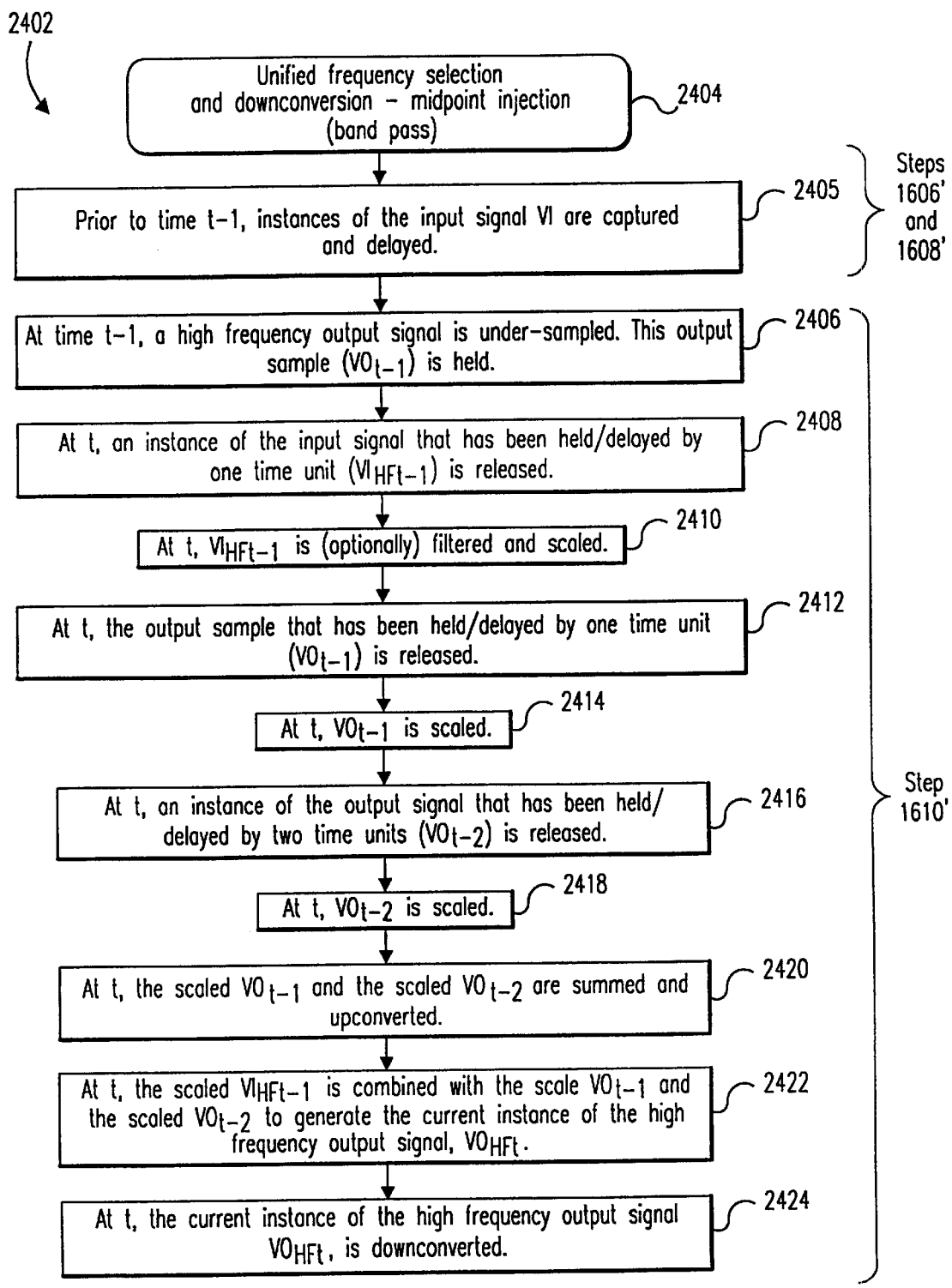
FIG. 24 is a flowchart illustrating the operation of an example midpoint injection embodiment of the present invention.

An alternate embodiment of the present invention, wherein frequency translation is performed in an integrated manner with frequency selectivity per the band-pass filtering transfer function of EQ. 3, shall now be described with reference to a flowchart 2402 presented in FIG. 24. In flowchart 2402, step 2405 generally corresponds to steps 1606 and 1608 of FIG. 16, and steps 2406–2424 generally correspond to step 1610.

In step 2405, prior to and including time t–1, instances of the input signal VI are captured and delayed, as required by the band-pass filtering transfer function of EQ. 3. These delayed instances of the input signal VI are used in conjunction with other values (described below) to generate instances of the output signal VO.

For example, at time t–1, an instance of the input signal VI is captured. This capturing of the input signal VI is performed prior to any frequency translation of the input signal VI. Accordingly, the resulting instance of the input signal VI is representative of the input signal VI prior to down-conversion. This instance of the input signal VI is denoted as $VI_{HFt-1}$, where HF stands for "high frequency."

In step 2406, at a time t–1, the output signal is under-sampled. The output signal being sampled has a relatively high frequency. In particular, the frequency of the output signal is generally equal to the frequency of the input signal VI before down-conversion. Accordingly, the output signal being sampled in step 2406 is denoted as $VO_{HF}$, where HF stands for "high frequency."

According to the present invention, the under-sampling performed in step 2406 operates to translate the frequency of the high-frequency output signal $VO_{HF}$ to a desired lower frequency, such as IF or baseband. Accordingly, the output sample $VO_{t-1}$ represents an instance of a down-converted image of the high-frequency output signal VOHF. As apparent from this discussion, this aspect of step 2406 relates to the frequency translation operation 4410.

Also in step 2406, the output sample $VO_{t-1}$ is held for one time period. As evident from EQ. 3, the bandpass filtering transfer function requires that the output signal be held, as is being done in step 2406. Therefore, this aspect of step 2406 relates to the frequency selectivity operation 4408.

Accordingly, in step 2406, operations related to both the frequency translation operation 4410 and the frequency selectivity operation 4408 are performed in a single, unified (integrated) manner.

In steps 2408 and 2410, at time t, the high-frequency instance of the input signal $VI_{HFt-1}$ that has been held by one time unit is released and optionally filtered and scaled. Preferably, the filtering done at this point involves relatively wide filter bandwidths (for example, wideband filtering as opposed to narrowband filtering).

In steps 2412 and 2414, at time t, the output sample $VO_{t-1}$ from step 2406 that has been held for one time unit is released, and scaled.

In steps 2416 and 2418, at time t, an instance of the output signal VO that has been held by two time units is released and scaled. This instance of the output signal VO is denoted as $VO_{t-2}$.

In step 2420, at time t, the scaled $VO_{t-1}$ and the scaled $VO_{t-2}$ are summed. Note that $VO_{t-1}$ and $VO_{t-2}$ are at a frequency that is lower than the frequency of the input signal 2504. This is due to the fact that $VO_{t-1}$ was obtained from an under-sampling operation that involved frequency down-conversion (as described above in step 2406), and the fact that $VO_{t-2}$ was obtained from $VO_{t-1}$.

Also in step 2420, the sum of the scaled $VO_{t-1}$ and the scaled $VO_{t-2}$ is upconverted to a frequency substantially equal to the frequency of the input signal VI.

In step 2422, at time t, the scaled instance of the input signal $VI_{HFt-1}$ is combined with the upconverted sum of the scaled $VO_{t-1}$ and the scaled $VO_{t-2}$. This results in generating the current instance of the high-frequency output signal, $VO_{HFt}$.

In step 2424, at time t, this current instance of the high-frequency output signal, $VO_{HFt}$, is down-converted to the desired lower frequency, for example, IF or baseband. The result is an instance of the low-frequency output signal, $VO_{LFt}$, where LF stands for "low frequency."

3.3.3.2 Structural Description

Figure 25:
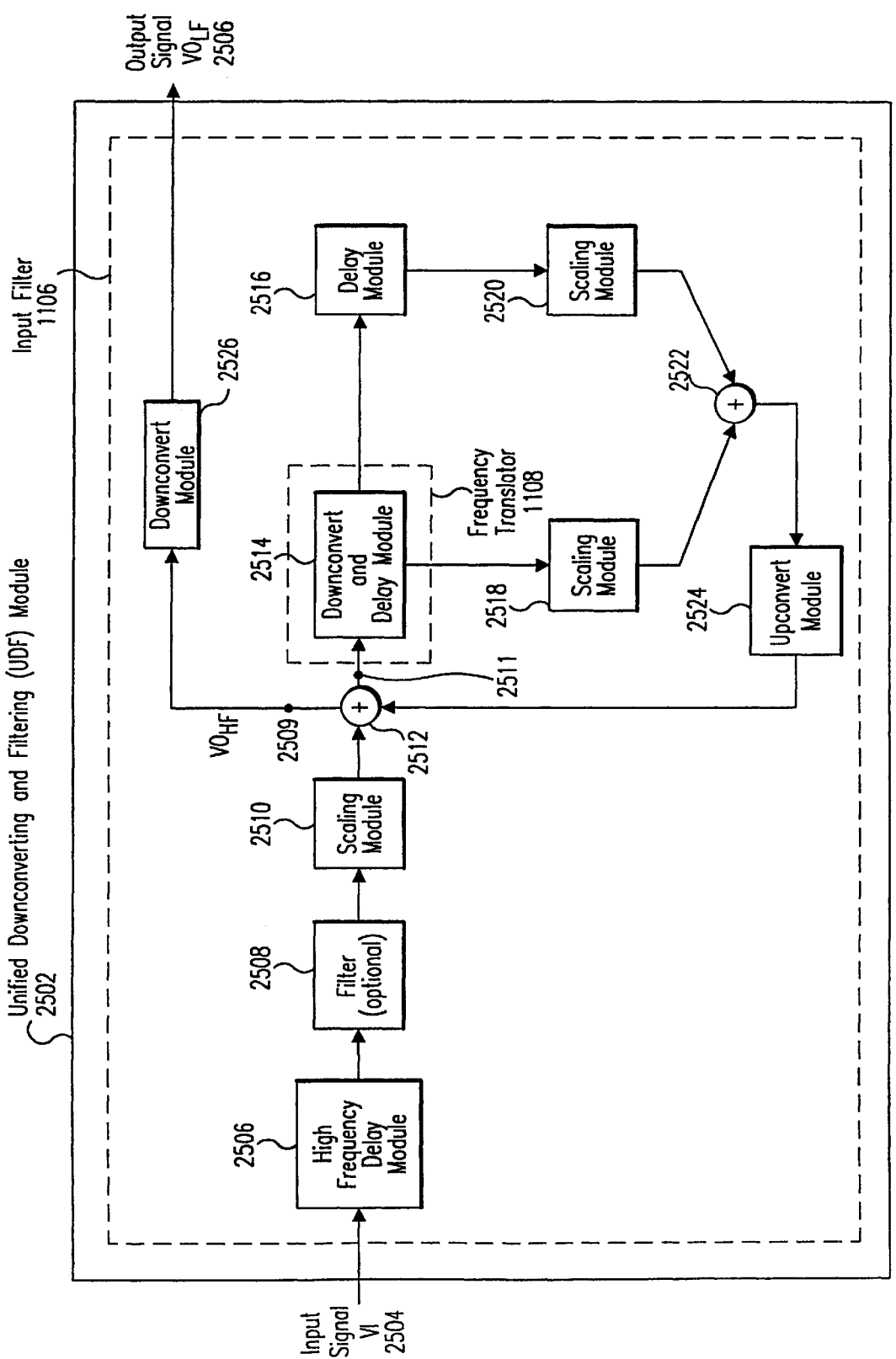
FIG. 25 is an example UDF module useful for performing the operational steps of the flowchart of FIG. 24.

FIG. 25 is a block diagram of a UDF module 2502 according to an embodiment of the invention. The UDF module 2502 includes a portion that corresponds to the frequency translator 1108, and a portion that corresponds to the input filter 1106. Note that the portion of the UDF module 2502 that corresponds to the frequency translator 1108 also forms a part of the portion of the UDF module 2502 that corresponds to the input filter 1106.

The UDF module 2502 is a structural embodiment for performing the operational steps of flowchart 2402. However, it should be understood that the scope and spirit of the present invention includes other structural embodiments for performing the steps of flowchart 2402. The specifics of these other structural embodiments will be apparent to persons skilled in the relevant art(s) based on the discussion contained herein.

The operation of the UDF module 2502 shall now be described in detail with reference to the flowchart 2402 of FIG. 24.

In step 2405, prior to and including time t−1, a high frequency delay module 2506 captures instances of the input signal VI. For example, at time t−1, an instance of the input signal VI is captured by the high frequency delay module 2506. This instance of the input signal VI is noted as $VI_{HFt-1}$.

In step 2406, at a time t−1, the down-convert and delay module 2514 under-samples a high-frequency representation of the output signal $VO_{HF}$. This high-frequency output signal $VO_{HF}$ is at a frequency substantially equal to the frequency of the input signal VI. As discussed in further detail below, the down-convert and delay module 2514 under-samples the high frequency output signal $VO_{HF}$ in a manner so as to translate the frequency of the high-frequency output signal $VO_{HF}$ to a desired lower frequency, such as IF or baseband. Accordingly, the output sample $VO_{t-1}$ represents an instance of a down-converted image of the high frequency output signal $VO_{HF}$.

Also in step 2406, the output sample $VO_{t-1}$ is held by the down-convert and delay module 2514.

In step 2408, at time t, the instance of the input signal $VI_{HFt-1}$, that was previously captured by the high-frequency delay module 2506 at time t−1, is released.

In step 2410, at time t, the instance of the input signal $VI_{HFt-1}$ is optionally filtered by a filter 2508, and scaled by a scaling module 2510.

In step 2412, at time t, the output sample $VO_{t-1}$ from step 2406 is released by the down-convert and delay module 2514.

In step 2414, at time t, the output sample $VO_{t-1}$ is scaled by the scaling module 2518.

Previously, at time t−1, a low frequency delay module 2516 captured an instance of the output sample $VO_{t-2}$ stored in the down-convert and delay module 2514. In step 2416, at time t, this instance of the output signal $VO_{t-2}$ is released by the low frequency delay module 2516.

In step 2418, at time t, the instance of the output signal $VO_{t-2}$ is scaled by the scaling module 2520.

In step 2420, at time t, an adder 2522 sums the scaled sample of the output signal $VO_{t-1}$ and the scaled instance of the output signal $VO_{t-2}$. Recall that $VO_{t-1}$ and $VO_{t-2}$ are at a frequency that is lower than the frequency of the input signal 2504. This is due to the fact that $VO_{t-1}$ was obtained from an under-sampling operation that involved frequency down-conversion (as described above in step 2406), and the fact that $VO_{t-2}$ was obtained from $VO_{t-1}$ (as described above in step 2416).

Also in step 2420, the sum of the scaled $VO_{t-1}$ and the scaled $VO_{t-2}$ is upconverted by an upconvert module 2524 to a frequency substantially equal to the frequency of the input signal VI.

In step 2422, at time t, the scaled instance of the input signal $VI_{HFt-1}$, is combined with the upconverted sum of the scaled sample of the output signal $VO_{t-1}$ and the scaled instance of the output signal $VO_{t-2}$ The result is the current instance of the high-frequency output signal, $VO_{HFt}$. Note that this instance of the high-frequency output signal $VO_{HFt}$ is at a frequency generally equal to the frequency of the input signal VI.

In step 2424, at time t, a down-convert module 2526 down-converts the current instance of the high-frequency output signal, $VO_{HFt}$, to a desired lower frequency, such as IF or baseband. The result is an instance of the low-frequency output signal, $VO_{LFt}$.

3.3.4 Fourth Embodiment: Finite Impulse Response (FIR) Filtering

The filtering embodiments described above can be generally characterized as infinite impulse response (IIR) filters. Generally speaking, in IIR filters, the output is a function of the input and the output.

Finite impulse response (FIR) filters also exist. Generally speaking, in FIR filters, the output is a function of the input alone.

As discussed above, according to embodiments of the invention, the output signal is generated from current and/or prior samples/instances of the input signal and/or the output signal. Accordingly, the invention is directed to IIR and FIR filters.

FIR filters according to embodiments of the invention are considered in greater detail in this section.

Consider first EQ. 11 shown in FIG. 54A. EQ. 11 is a general filter transfer function. A variety of filters, including linear phase filters, can be represented using instances and/or variations of EQ. 11.

For example, the example bandpass filter transfer function of EQ. 3 can be derived from EQ. 11. This is shown in EQS. 12–14 of FIG. 54A, where EQ. 14 is equivalent to EQ. 3.

IIR filter transfer functions can be derived from EQ. 11. This is shown, for example, in EQS. 15 and 16 of FIG. 54B. EQ. 16 represents an example IIR filter transfer function.

Figure 55:
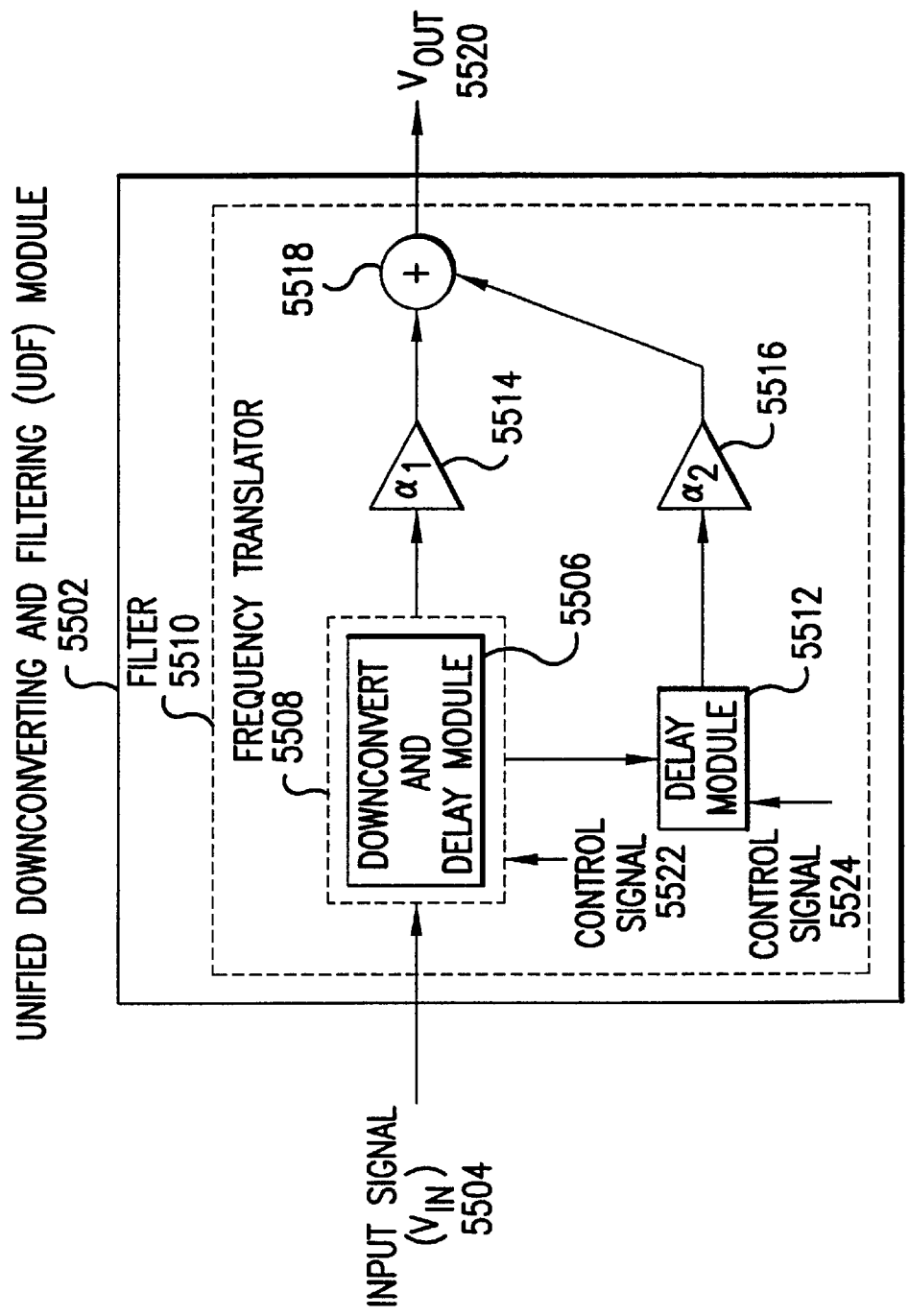
FIG. 55 is a block diagram of a unified downconverting and filtering (UDF) module that performs finite impulse response (FIR) filtering according to an embodiment of the invention.

FIG. 55 illustrates an unified downconverting and filtering (UDF) module 5502. The UDF module 5502 is an example FIR filter, and corresponds to the example IIR filter transfer function of EQ. 16.

The UDF module 5502 includes a frequency translator 5508, which is preferably implemented using a down-convert and delay module 5506. The down-convert and delay module 5506 samples the input signal 5504. As further described below, the down-convert and delay module 5506 performs such sampling in a manner that operates to translate the frequency of the input signal 5504 to a lower frequency, such as IF or baseband (this sampling operation is performed in accordance with a control signal 5522). The input sample represents an instance of a down-converted image of the input signal 5504. Accordingly, the down-convert and delay module 5506 down-converts the input signal 5504 to a desired lower frequency. In some embodiments, the operation of the down-convert and delay module 5506 is sometimes referred to as "integrate and transfer," because the invention provides for a number of advantages, such as enhanced energy transfer during the frequency translation operation. Additional details regarding the manner in which the invention performs frequency down-conversion are provided below, and are further provided in pending U.S. application "Method and System for Down-Converting Electromagnetic Signals," referenced above.

The down-convert and delay module 5506 also holds (delays) the input sample for a period of time. In the example of FIG. 55, the down-convert and delay module 5506 delays the input sample for one time unit (such as one sample period), although other embodiments achieve different amounts of delay.

As evident from the FIR filtering transfer function of EQ. 17, in order to perform filtering, it is necessary to hold or delay the input signal by various time units. As just described, the down-convert and delay module 5506 participates in this delaying operation. Therefore, the down-convert and delay module 5506 contributes to both the performance of the frequency selectivity operation 1202, as well as the frequency translation operation 1204. In fact, as apparent from the teachings contained herein, when performing the frequency translation operation 1204, the down-convert and delay module 5506 is also performing at least a portion of the frequency selectivity operation 1202, and vice versa. Thus, according to the invention, performance of the frequency selectivity operation 1202 is integrated with performance of the frequency translation operation 1204. This is further evident in FIG. 55, which shows the frequency translator 5508 (comprising the down-convert and delay module 5506) being a part of the filter 5510.

The example UDF module 5502 also includes a delay module 5512, scaling modules 5514, 5516, and summer 5518. The operation of these elements will be apparent to persons skilled in the relevant art(s) based on the teachings provided herein.

The example UDF module 5502 only includes two taps (a tap is a branch between two points, in this case between the input signal and the summer 5518). Other FIR embodiments include greater than two taps. For example, many FIR embodiments include at least 16 taps. Some FIR embodiments include much more than 16 taps, such as 50 taps, 256 taps, etc., or more taps. As will be apparent to persons skilled in the relevant art(s) based on the herein teachings, the number of taps will depend on the transfer function being used, and the manner in which it is desired to implement the transfer function.

FIR embodiments according to the invention may be implemented with linear phase.

Figure 62:
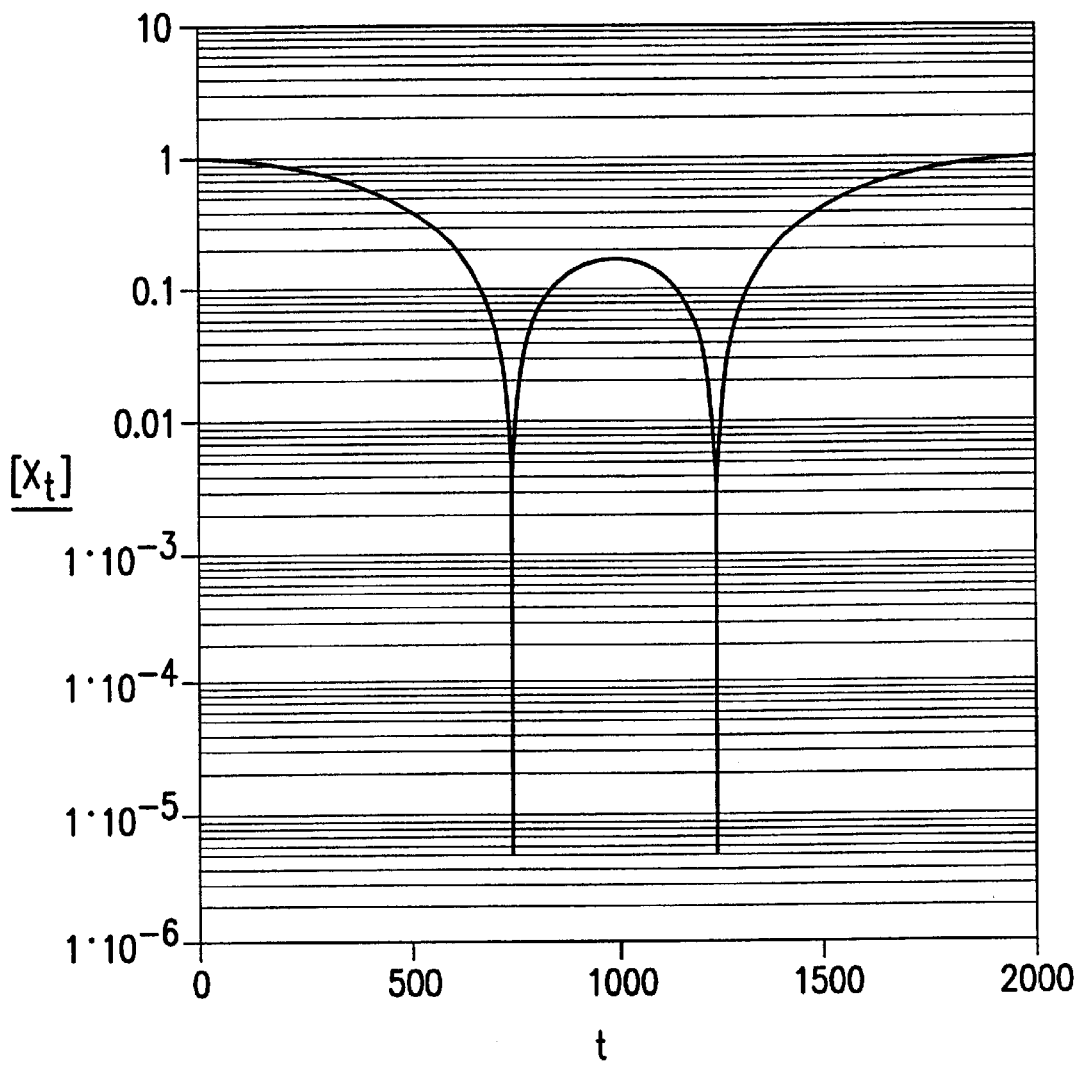
FIG. 62 illustrates characteristics of an example FIR filter.

An example FIR transfer function is shown as EQ. 19 in FIG. 54C. This transfer function is provided for illustrative purposes only, and is not limiting. See also corresponding EQ. 18 in FIG. 54C. This transfer function is representative of a low pass filter having the following characteristics: 3 db at 0.17 of the clock (control signal), and at least 9 db rejection at 0.5 of the clock. Additional characteristics are shown in FIG. 62.

Figure 61:
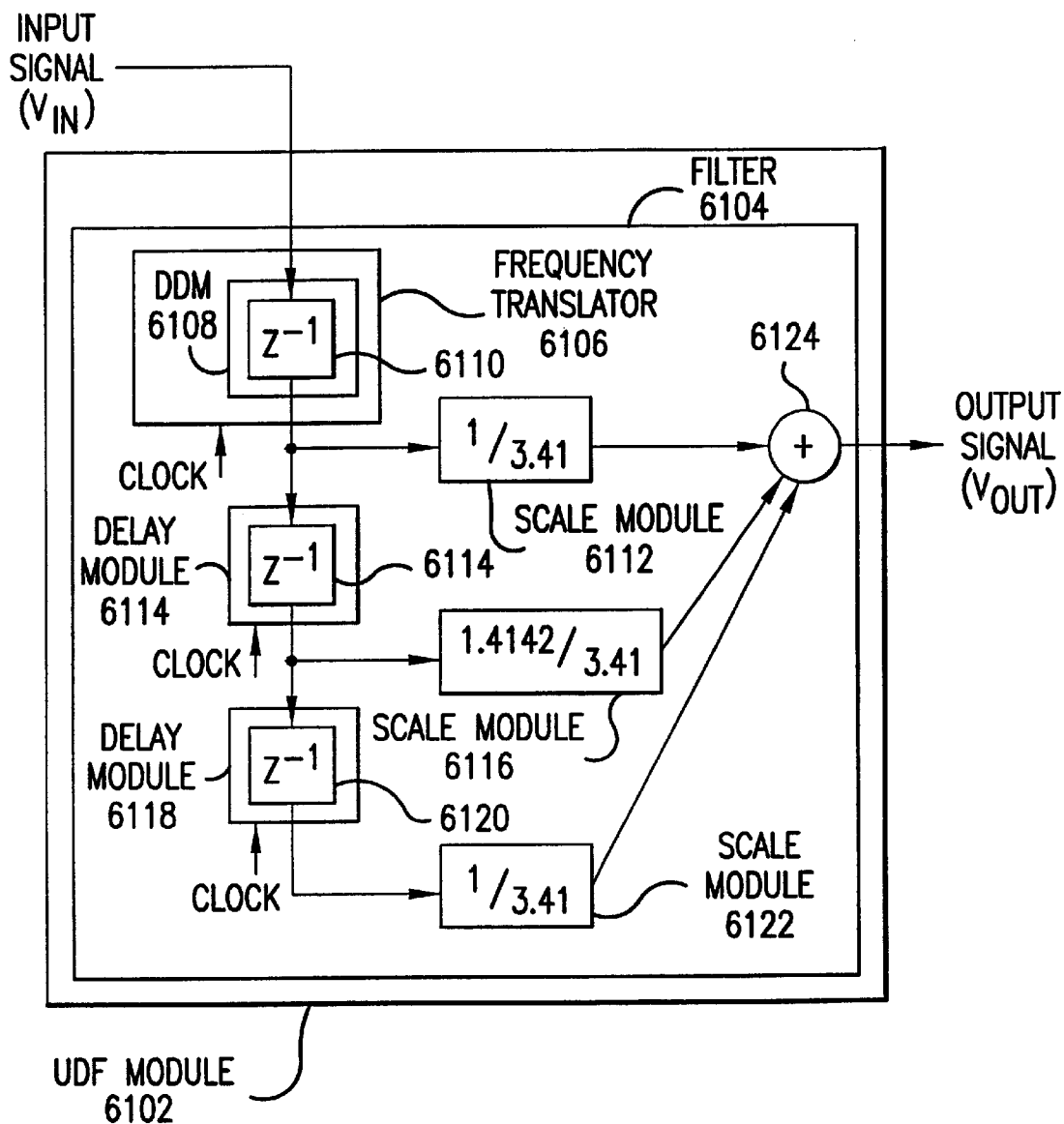
FIG. 61 is a block diagram of an example FIR filter according to an embodiment of the invention.

An example UDF module 6102 corresponding to this FIR transfer function is shown in FIG. 61. This UDF module 6102 maps to the FIR transfer function of EQS. 18 and 19. The structure and operation of this UDF module will be apparent to persons skilled in the relevant art(s) based on the teachings contained herein. It is noted that the invention is not limited to this implementation. Other implementations of the transfer function according to the principles of the invention will be apparent to persons skilled in the relevant art(s) based on the teachings presented herein.

It is noted that the FIR transfer function presented in EQ. 19 is provided for illustrative purposes only, and is not limiting. Design and construction of different transfer functions to achieve other filter functions and characteristics will be apparent to persons skilled in the relevant art(s), and these different transfer functions are within the scope and spirit of the invention. Implementation of such transfer functions as a UDF module will be apparent to persons skilled in the relevant art(s) based on the teachings presented herein, and such UDF module embodiments and implementations are within the scope and spirit of the present invention.

3.3.5 Fifth Embodiment: Running Average Filter

In the embodiments discussed above, the control signals were the same frequency, although their phases sometimes differed. In these embodiments, the requirement that all the control signals be at the same frequency placed demands on circuit design and implementation (although such demands could be satisfied).

The invention is directed to embodiments where the control signals do not have to be at the same frequency. By lifting this requirement, generally, circuit design and implementation is simplified, and hardware requirements are reduced.

Figure 56:
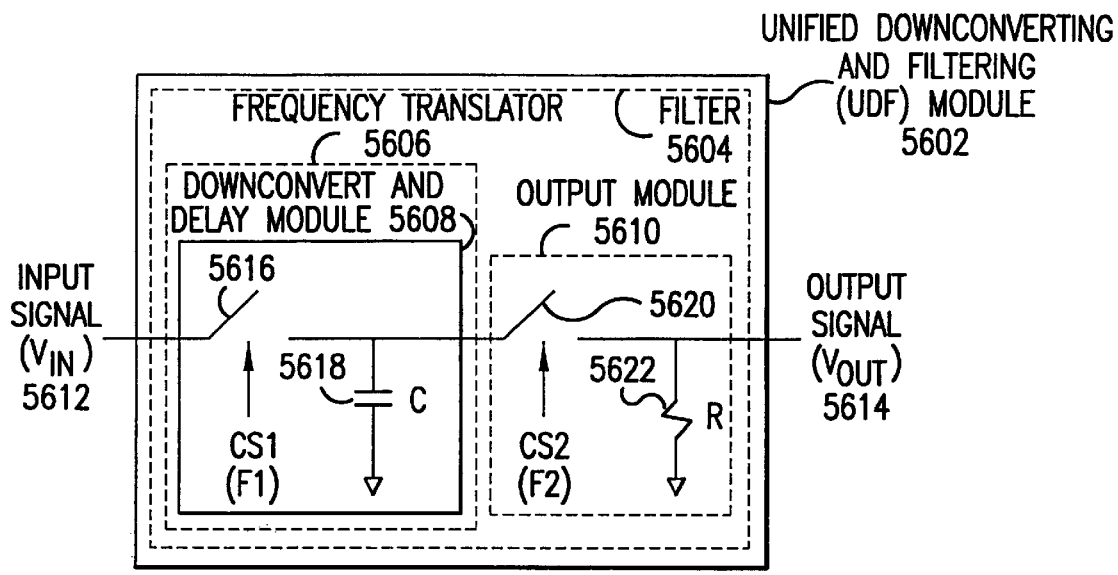
FIG. 56 is a block diagram of a unified downconverting and filtering (UDF) module that performs running average filtering according to an embodiment of the invention.

FIG. 56 illustrates an example unified down-converting and filtering (UDF) module 5602 where the control signals CS1 and CS2 are not at the same frequency.

The UDF module 5602 includes a frequency translator 5606, which is preferably implemented using a down-convert and delay module 5608. The down-convert and delay module 5608 samples the input signal 5612. As further described below, the down-convert and delay module 5608 performs such sampling in a manner that operates to translate the frequency of the input signal 5612 to a lower frequency, such as IF or baseband (this sampling operation is performed in accordance with the control signal CS1). The input sample represents an instance of a down-converted image of the input signal 5612. Accordingly, the down-convert and delay module 5608 down-converts the input signal 5612 to a desired lower frequency. In some embodiments, the operation of the down-convert and delay module 5608 is sometimes referred to as "integrate and transfer," because the invention provides for a number of advantages, such as enhanced energy transfer during the frequency translation operation. Additional details regarding the manner in which the invention performs frequency down-conversion are provided below, and are further provided in pending U.S. application "Method and System for Down-Converting Electromagnetic Signals," referenced above.

The down-convert and delay module 5608 also holds (delays) the input sample for a period of time. In the example of FIG. 56, the down-convert and delay module 5608 delays the input sample for one time unit (such as one sample period), although other embodiments achieve different amounts of delay.

As evident from the filtering transfer functions discussed herein, in order to perform filtering, it is necessary to hold or delay the input signal 5612 by various time units. As just described, the down-convert and delay module 5608 participates in this delaying operation. Therefore, the down-convert and delay module 5608 contributes to both the performance of the frequency selectivity operation 1202, as well as the frequency translation operation 1204. In fact, as apparent from the teachings contained herein, when performing the frequency translation operation 1204, the down-convert and delay module 5608 is also performing at least a portion of the frequency selectivity operation 1202, and vice versa. Thus, according to the invention, performance of the frequency selectivity operation 1202 is integrated with performance of the frequency translation operation 1204. This is further evident in FIG. 56, which shows the frequency translator 5608 (comprising the down-convert and delay module 5608) being a part of the filter 5604.

In the example of FIG. 56, the down-convert and delay module 5608 is implemented using a switch 5616 and a capacitor 5618. The invention is directed to other embodiments of the down-convert and delay module 5608. Such other embodiments are described herein, and are further described in pending U.S. application "Method and System for Down-Converting Electromagnetic Signals," referenced above, as well as the other applications referenced above.

Figure 57A:
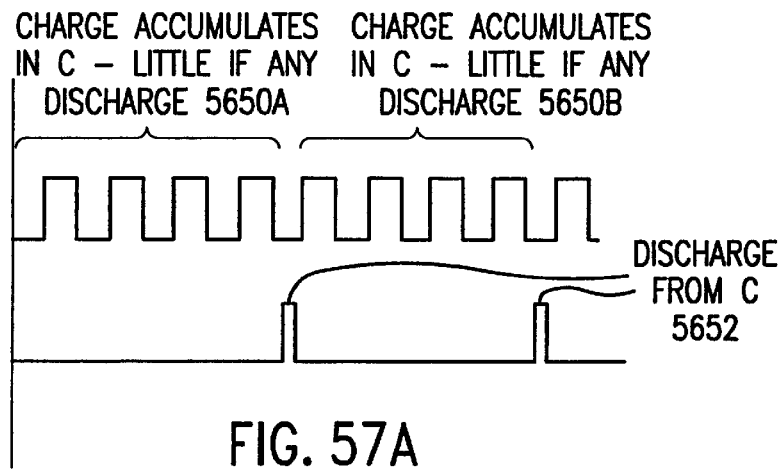
FIG. 57A illustrates example control signals used to illustrate the operation of the UDF module of FIG. 56.

As noted above, in the example UDF module 5602, the control signals CS1 and CS2 are not at the same frequency. Preferably, frequency f1 of control signal CS1 is greater than frequency f2 of control signal CS2. For example, and without limitation, in the example of FIG. 57A the ratio of f1 to f2 is four, such that there are four pulses in CS1 for every one pulse in CS2. It is noted that this example is provided for illustrative purposes only; and is not limiting. The invention encompasses other ratios of f1 to f2, as will be apparent to persons skilled in the relevant art(s) based on the teachings presented herein.

During each pulse of CS1, the switch 5616 closes and the capacitor 5618 charges as a function of the input signal 5612. In other words, the capacitor 5618 accumulates charge during the pulses of CS1. The capacitor 5618 is sufficiently large to accommodate the charge. Teachings regarding example sizes of the capacitor to achieve this functionality are provided in the applications referenced above.

The capacitor 5618 only begins to discharge when switch 5620 closes in the output module 5610 upon a pulse in CS2. Since, in the example of FIG. 57A, there are four pulses of CS1 to every one pulse of CS2, charge accumulates in the capacitor 5618 over four pulses of CS1 (or, equivalently, over four samples taken by switch 5616) before discharging through the switch 5620 in the output module 5610. Thus, since f1>f2, the capacitor 5618 accumulates charge from a number of samples before discharge begins.

This accumulation of charge operates to average the samples taken of the input signal 5612. Such averaging has a number of advantages. For example, and without limitation, averaging operates to increase signal-to-noise ratio as noise is averaged out. This advantage is enhanced as the pulse aperture of CS1 is optimized.

The averaging achieved by the invention also contributes to the filtering effect. In other words, the UDF module 5602 operates to filter the input signal 5612. Accordingly, such embodiments of the invention (as represented by way of example by FIG. 56) are sometimes called "running average filters."

Figure 57B:
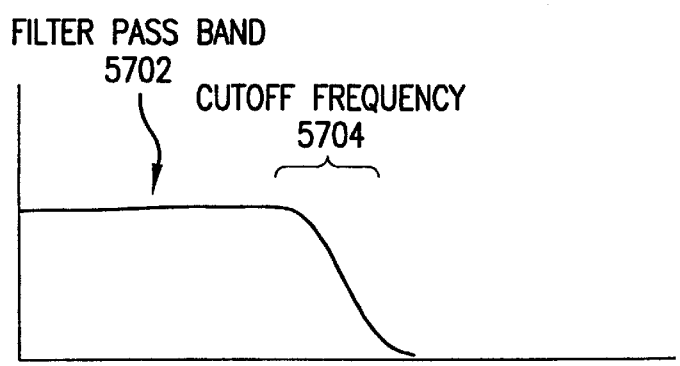
FIG. 57B illustrates an example filter passband used to illustrate the operation of the UDF module of FIG. 56.

The output module 5614 operates to establish the cutoff frequency 5704 of the filter (see FIG. 57B, for example).

In embodiments, the ratio of f1 to f2 is sufficient to allow the capacitor 5618 (or other energy storage device) to sufficiently charge before being discharged upon the closing of switch 5620 in the output module 5610. When selecting the frequencies of CS1 and CS2, as well as other characteristics of CS1 and CS2 (such as their respective pulse widths or apertures), and characteristics of other elements such as the capacitor 5618 and the resistor 5622, consideration is given to the amount of charging that is desired of the capacitor 5618, and the amount of discharge of capacitor 5618 that is desired when switch 5620 is closed, and the timing of same.

3.3.6 Sixth Embodiment: N-Path Filter

Another type of filter is called an "n-path filter." An n-path filter includes, appropriately, n taps.

Figure 58A:
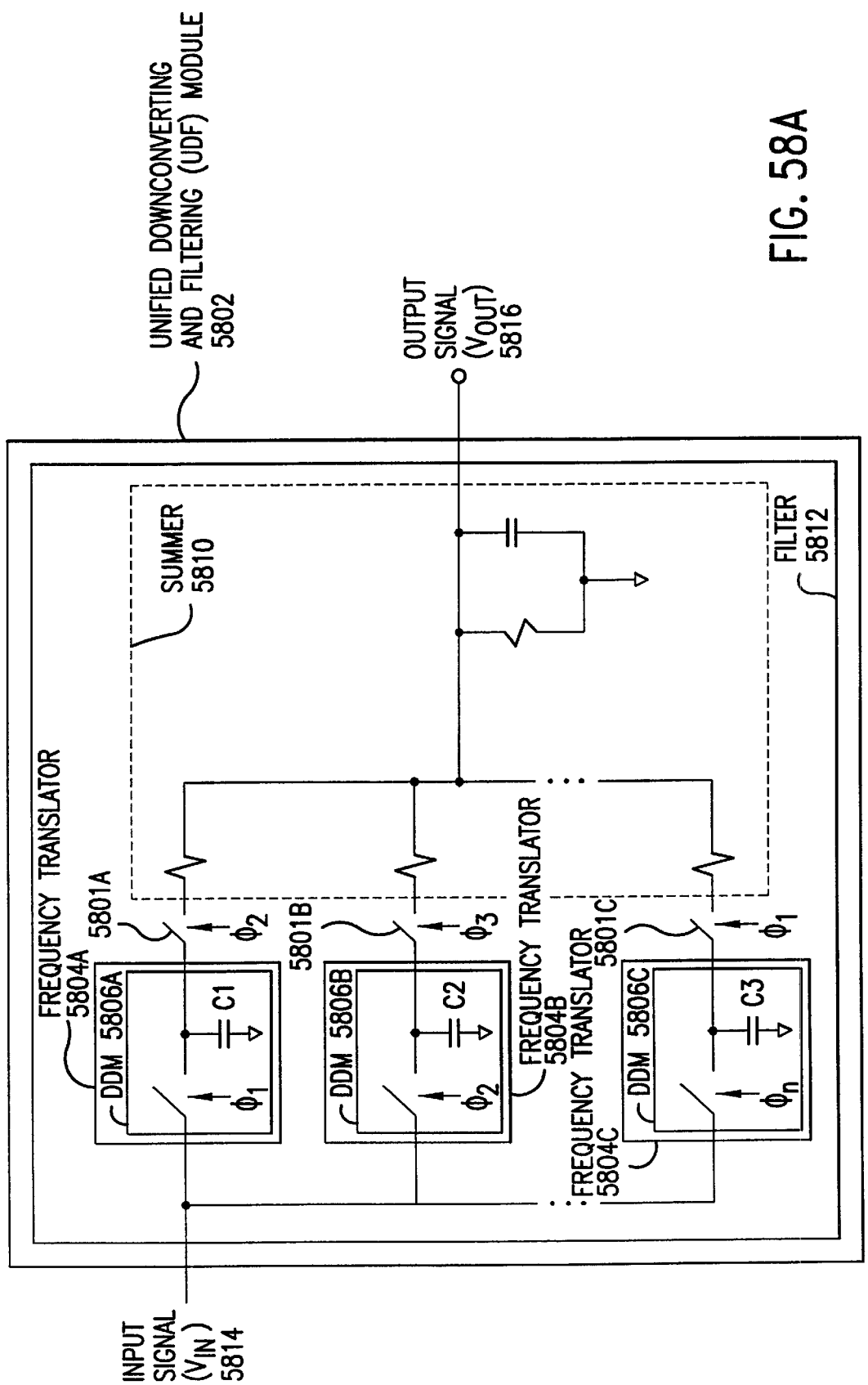
FIGS. 58A and 58B are block diagrams of unified downconverting and filtering (UDF) modules representative of n-path filters according to embodiments of the invention.

The invention is directed to n-path filters. FIG. 58A illustrates an example n-path filter (UDF module 5802) according to an embodiment of the invention.

According to this embodiment, each tap preferably includes a frequency translator 5804, which preferably comprises a down-convert and delay module (DDM) 5806.

The down-convert and delay module 5806 samples the input signal 5814. As further described below, the down-convert and delay module 5806 such sampling in a manner that operates to translate the frequency of the input signal 5814 to a lower frequency, such as IF or baseband. The input sample represents an instance of a down-converted image of the input signal 5814. Accordingly, the down-convert and delay module 5806 down-converts the input signal 5814 to a desired lower frequency. In some embodiments, the operation of the down-convert and delay module 5806 is sometimes referred to as "integrate and transfer," because the invention provides for a number of advantages, such as enhanced energy transfer during the frequency translation operation. Additional details regarding the manner in which the invention performs frequency down-conversion are provided below, and are further provided in pending U.S. application "Method and System for Down-Converting Electromagnetic Signals," referenced above.

The down-convert and delay module 5806 also holds (delays) the input sample for a period of time.

As evident from the filtering transfer functions discussed herein, in order to perform filtering, it is necessary to hold or delay the input signal 5814 by various time units. As just described, the down-convert and delay module 5806 participates in this delaying operation. Therefore, the down-convert and delay module 5806 contributes to both the performance of the frequency selectivity operation 1202, as well as the frequency translation operation 1204. In fact, as apparent from the teachings contained herein, when performing the frequency translation operation 1204, the down-convert and delay module 5806 is also performing at least a portion of the frequency selectivity operation 1202, and vice versa. Thus, according to the invention, performance of the frequency selectivity operation 1202 is integrated with performance of the frequency translation operation 1204. This is further evident in FIG. 58A, which shows the frequency translators 5804 (comprising the down-convert and delay modules 5806) being a part of the filter 5812.

In the example of FIG. 58A, the down-convert and delay modules 5806 are implemented using a switch and a capacitor. The invention is directed to other embodiments of the down-convert and delay modules 5806. Such other embodiments are described herein, and are further described in pending U.S. application "Method and System for Down-Converting Electromagnetic Signals," referenced above, as well as the other applications referenced above. Characteristics of the switch and capacitor are also discussed in these applications.

In the example embodiment of FIG. 58A, the control signals have the same frequency but different non-overlapping phases (alternatively, the control signals can be viewed as a single control signal with multiple, non-overlapping phases).

Figure 59A:
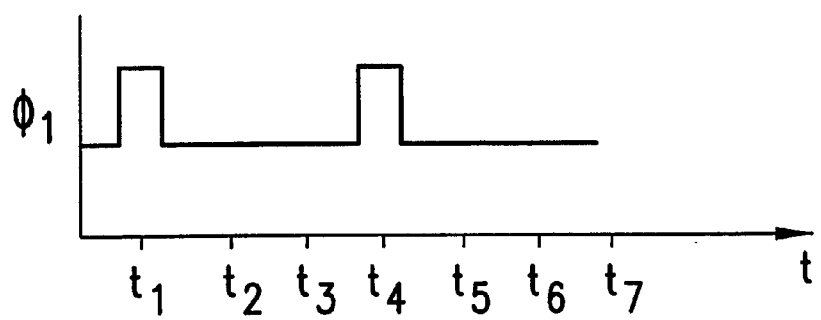
FIGS. 59A–59C are example control signals used to illustrate the operation of the UDF module of FIG. 58A.
Figure 59B:
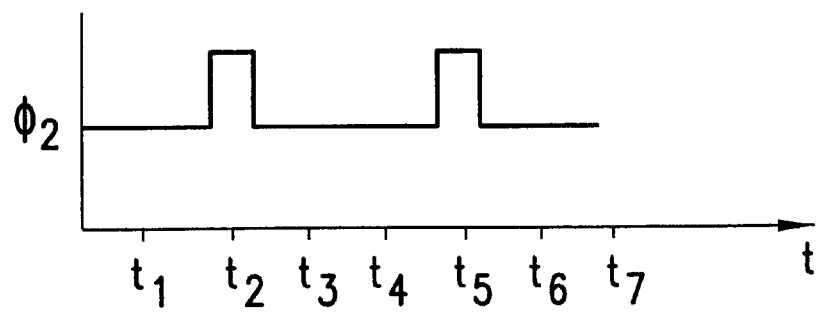
Figure 59C:
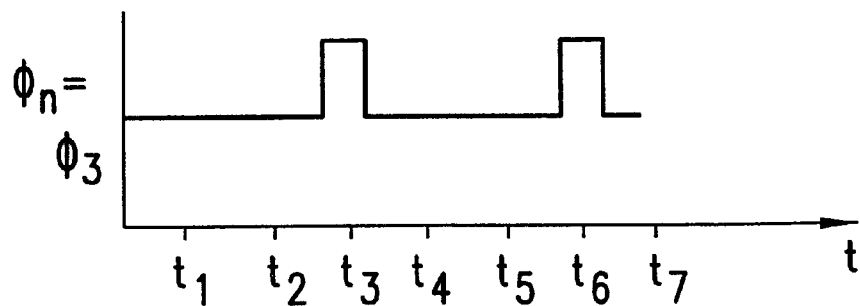

The control signals are represented in FIG. 58A as $\phi_1$, $\phi_2$, ..., $\phi_n$. An example of the control signals (where n is equal to 3) is shown in FIGS. 59A–59C.

Since the control signals have non-overlapping phases, the switches in the down-convert and delay modules 5806 are closed at different times. In other words, the down-convert and delay modules 5806 sample the input signal 5814 at different times. Thus, sampling of the input signal 5814 can be said to roll through or rotate through the down-convert and delay modules 5806 in the taps.

A given down-convert and delay module 5806 samples when its respective control signal pulses, and then holds the sample (i.e., delays the sample). Accordingly, the down-convert and delay modules 5806 delay their respective samples. At any time, since the control signals have non-overlapping delays, the delay introduced by one down-convert and delay module 5806A differs from the delays introduced by the other down-convert and delay modules 5806B, 5806C. Also, for the same reason, the delay introduced by a given down-convert and delay module 5806 differs at different times.

As a result, the tap which corresponds to a given factor in a filter transfer function changes over time. For example, suppose that the filter transfer function implemented by the UDF 5802 of FIG. 58A includes a $z^{-2}$ factor. At time $t_n$, this factor may be provided by down-convert and delay module 5806A; at time $t_{n+1}$, this factor may be provided by down-convert and delay module 5806B; at time $t_{n+2}$, this factor may be provided by down-convert and delay module 5806C; at time $t_{n+3}$, this factor may be again provided by down-convert and delay module 5806A; and so on. Accordingly, it can be said that delay factors roll through, or rotate through, the taps.

The example embodiment of the UDF module 5802 of FIG. 58A includes additional switches 5801. In some embodiments, these switches can be considered to be part of the DDMs 5806, or external to the DDMs 5806. These switches 5801 prevent signal bleed through. They are clocked by clock signals of non-overlapping phases. Preferably, clocking of a given switch 5801 is one phase delayed from the switch in the corresponding DDM 5806, although other phase relationships are envisioned by the invention. At any time, the output signal 5816 is coupled to only one DDM 5806 via operation of the switches 5801.

Figure 58B:
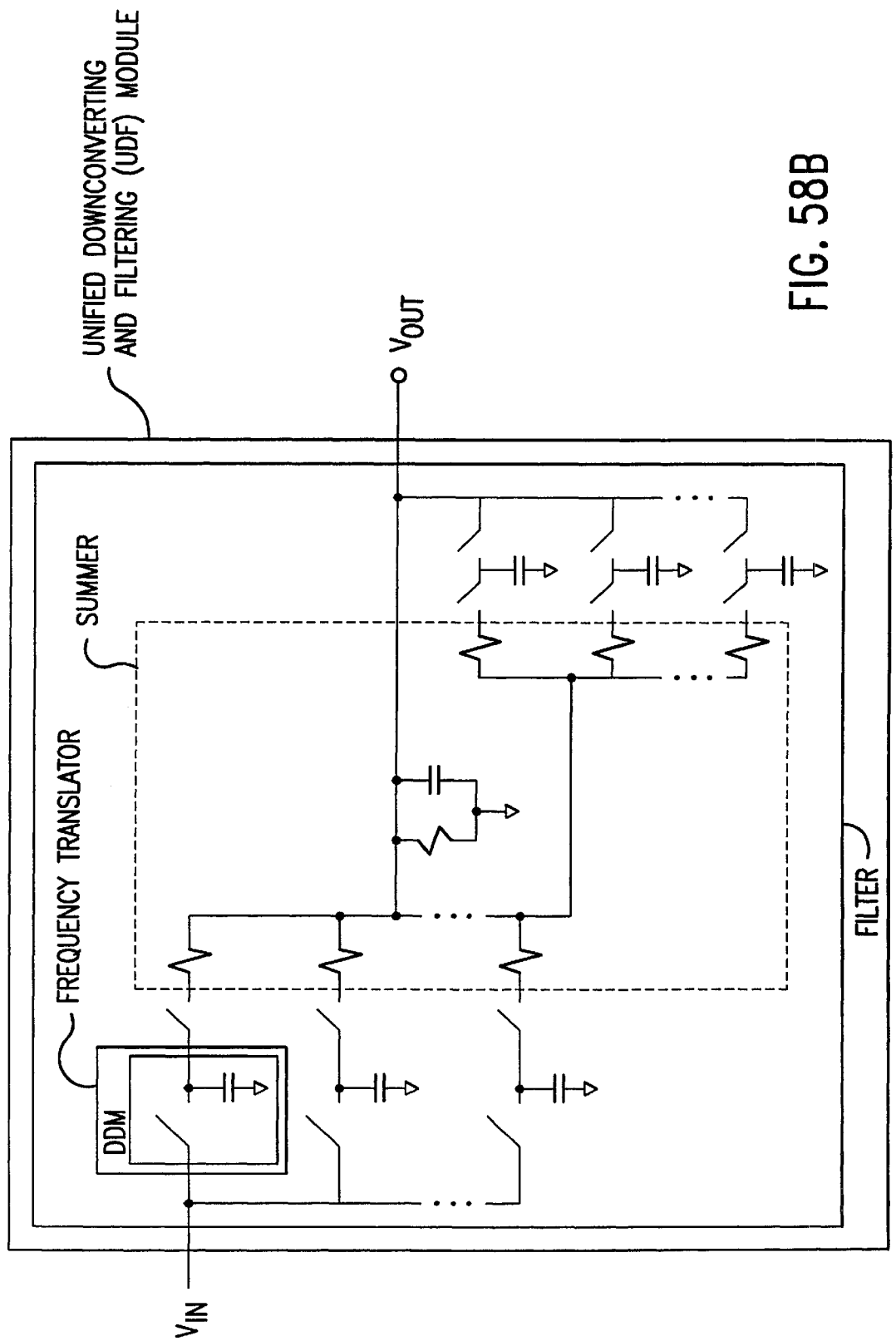

According to the invention, n-path filters may be IIR filters or FIR filters. An example FIR filter according to the invention is shown in FIG. 58A. An example IIR filter according to the invention is shown in FIG. 58B.

3.3.7 Seventh Embodiment: Passive Filter

The invention is also directed to passive filters. Generally speaking, a passive filter is one that does not include any amplifiers, such as any buffer amplifiers.

Figure 60:
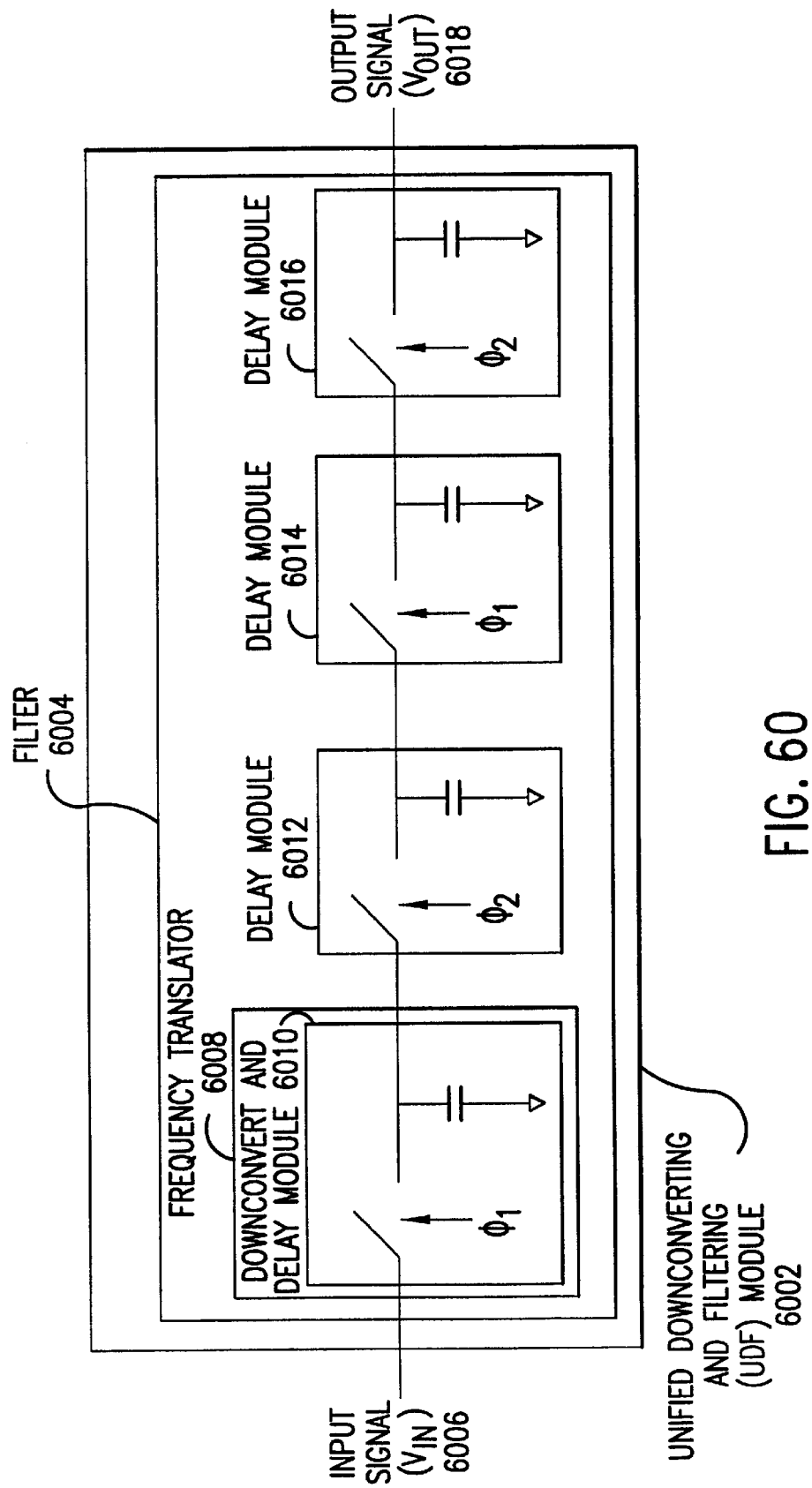
FIG. 60 is a block diagram of a unified downconverting and filtering (UDF) module that is representative of a passive filter according to an embodiment of the invention.

An example passive filter (UDF module 6002) according to an embodiment of the invention is shown in FIG. 60. The example of FIG. 60 represents a IIR filter, although the invention is not limited to this example. The UDF module 6002 includes a frequency translator 6008, which preferably comprises a down-convert and delay module (DDM) 6010.

The down-convert and delay module 6010 samples the input signal 6006. As further described below, the down-convert and delay module 6010 performs such sampling in a manner that operates to translate the frequency of the input signal 6006 to a lower frequency, such as IF or baseband. The input sample represents an instance of a down-converted image of the input signal 6006. Accordingly, the down-convert and delay module 6010 down-converts the input signal 6006 to a desired lower frequency. In some embodiments, the operation of the down-convert and delay module 6010 is sometimes referred to as "integrate and transfer," because the invention provides for a number of advantages, such as enhanced energy transfer during the frequency translation operation. Additional details regarding the manner in which the invention performs frequency down-conversion are provided below, and are further provided in pending U.S. application "Method and System for Down-Converting Electromagnetic Signals," referenced above, as well as other applications referenced above.

The down-convert and delay module 6010 also holds (delays) the input sample for a period of time.

As evident from the filtering transfer functions discussed herein, in order to perform filtering, it is necessary to hold or delay the input signal 6006 by various time units. As just described, the down-convert and delay module 6010 participates in this delaying operation. Therefore, the down-convert and delay module 6010 contributes to both the performance of the frequency selectivity operation 1202, as well as the frequency translation operation 1204. In fact, as apparent from the teachings contained herein, when performing the frequency translation operation 1204, the down-convert and delay module 6010 is also performing at least a portion of the frequency selectivity operation 1202, and vice versa. Thus, according to the invention, performance of the frequency selectivity operation 1202 is integrated with performance of the frequency translation operation 1204. This is further evident in FIG. 60, which shows the frequency translator 6008 (comprising the down-convert and delay module 6010) being a part of the filter 6004.

In the example of FIG. 60, the down-convert and delay module 6010 is implemented using a switch and a capacitor. The invention is directed to other embodiments of the down-convert and delay module 6010. Such other embodiments are described herein, and are further described in pending U.S. application "Method and System for Down-Converting Electromagnetic Signals," referenced above, as well as the other applications referenced above.

The example of FIG. 60 includes three additional delay modules 6012, 6014, 6016, although the invention is not limited to this embodiment. Different embodiments will include more than or less than three additional delay modules. As will be appreciated, the number of delay modules used will depend on the filter characteristics desired, the transfer function used, and the implementation thereof.

It is noted that the control signals utilized in the UDF module 6002 are preferably of the same frequency, but having non-overlapping phases. Non-overlapping pulses prevent signal bleedthrough.

Although not shown in FIG. 60, the samples and delayed samples can be weighted (and in embodiments the weights can be changed statically or dynamically), thereby allowing one to achieve different types of filters and filtering characteristics, and also allowing one to achieve amplification.

3.3.8 Other Embodiments

Figure 63:
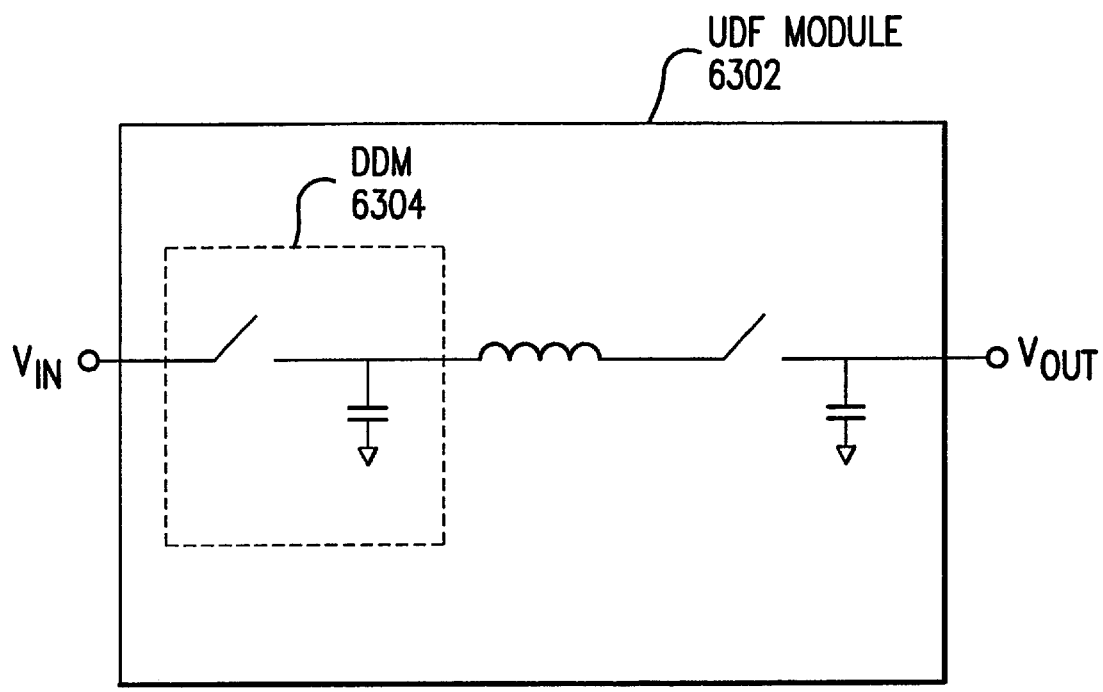
FIG. 63 is a block diagram of a UDF module according to another embodiment of the invention.

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. One such embodiment is shown, for example, in FIG. 63. Such alternate embodiments include, but are not limited to, embodiments of the UDF module where the filtering function is performed according to transfer functions differing from those utilized above. Such alternate embodiments also include, but are not limited to, embodiments of the UDF module where the frequency selectivity operation comprises filtering types not discussed above, such as, but not limited to, high pass filtering, notch filtering, etc. Such alternate embodiments fall within the scope and spirit of the present invention.

3.4 Implementation Examples

Exemplary operational and/or structural implementations related to the method(s), structure(s), and/or embodiments described above are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

Figure 26:
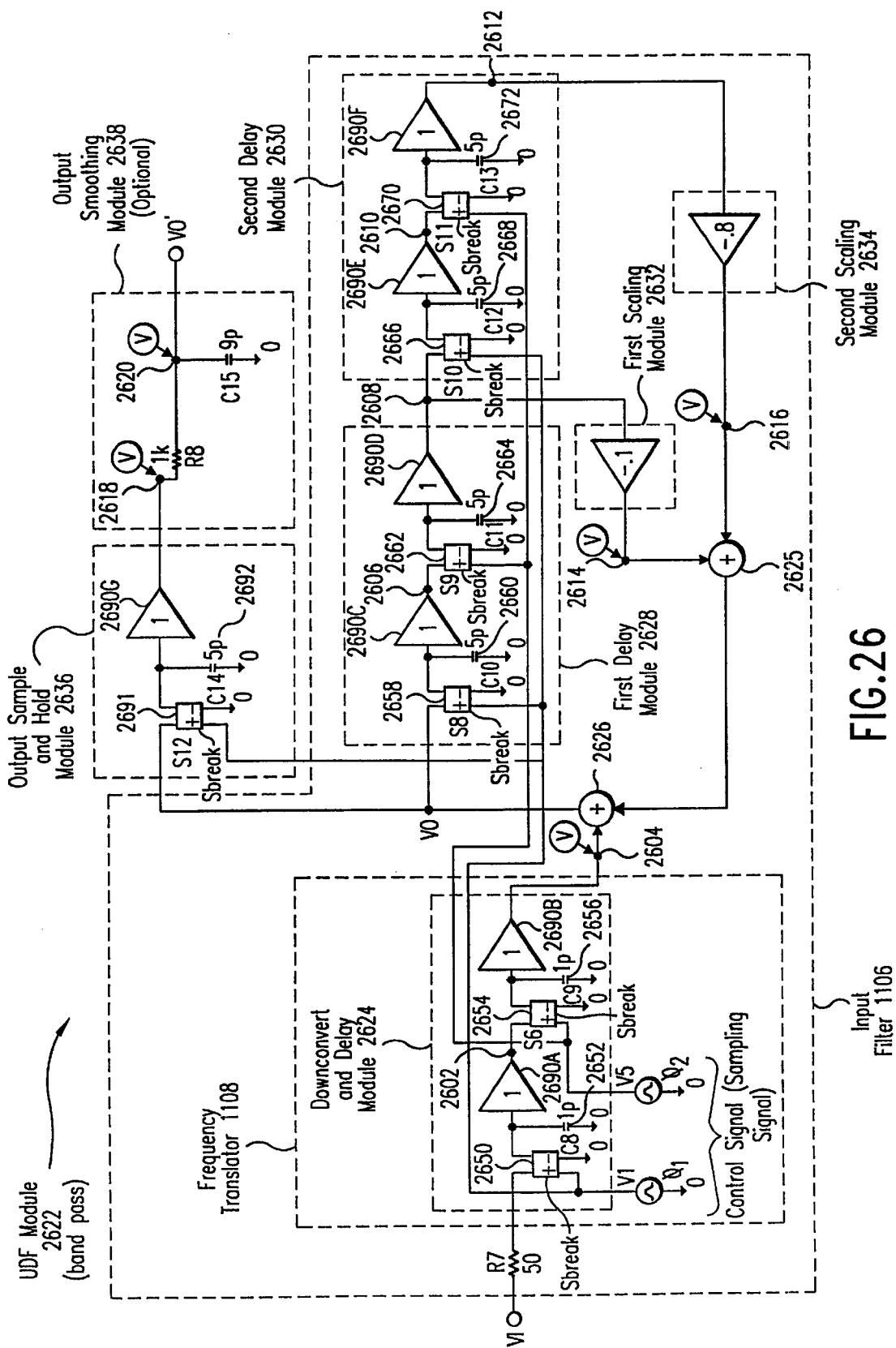
FIG. 26 is an example implementation of the UDF module according to an embodiment of the invention.

3.4.1 Implementation Example of a Unified Downconverting and Filtering (UDF) Module FIG. 26 illustrates an example implementation of the unified down-converting and filtering (UDF) module 2622.

The UDF module 2622 performs the frequency translation operation 1204 and the frequency selectivity operation 1202 in an integrated, unified manner as described above, and as further described below.

In the example of FIG. 26, the frequency selectivity operation 1202 performed by the UDF module 2622 comprises a band-pass filtering operation. As noted above, EQ. 3 is an example representation of a band-pass filtering transfer function. EQ. 3 is presented below for convenience. As indicated above, EQ. 3 is described herein for illustrative purposes only, and is not limiting.

$$VO = \alpha_1 z^{-1} VI - \beta_1 z^{-1} VO - \beta_0 z^{-2} VO \qquad \text{EQ. 3}$$

In the example of FIG. 26, the UDF module 2622 performs band-pass filtering in accordance with the example band-pass filtering transfer function of EQ. 3.

The UDF module 2622 includes a down-convert and delay module 2624, first and second delay modules 2628 and 2630, first and second scaling modules 2632 and 2634, an output sample and hold module 2636, and an (optional) output smoothing module 2638. Other embodiments of the UDF module will have these components in different configurations, and/or a subset of these components, and/or additional components. For example, and without limitation, in the configuration shown in FIG. 26, the output smoothing module 2638 is optional. Alternate embodiments of the UDF module will be apparent to persons skilled in the relevant art(s) based on the discussion contained herein.

As further described below, in the example of FIG. 26, the down-convert and delay module 2624 and the first and second delay modules 2628 and 2630 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low. See, for example, FIGS. 33A and 33B.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 26, it is assumed that $\alpha_1$ is equal to one. Thus, the output of the down-convert and delay module 2624 is not scaled. As evident from the embodiments described above, however, the invention is not limited to this example.

Figures 27A, 27B:
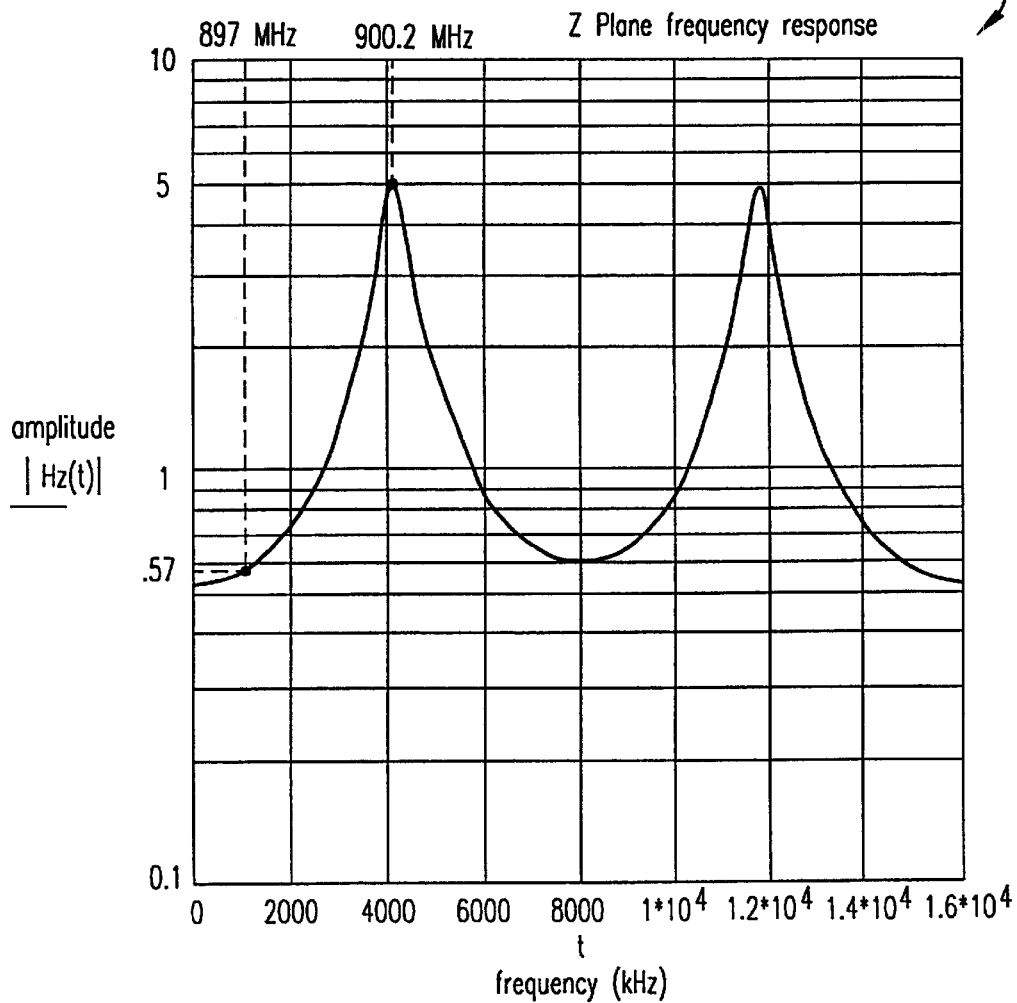
FIGS. 27A and 27B are used to illustrate the filter characteristics of the UDF module of FIG. 26.
Figure 28F:
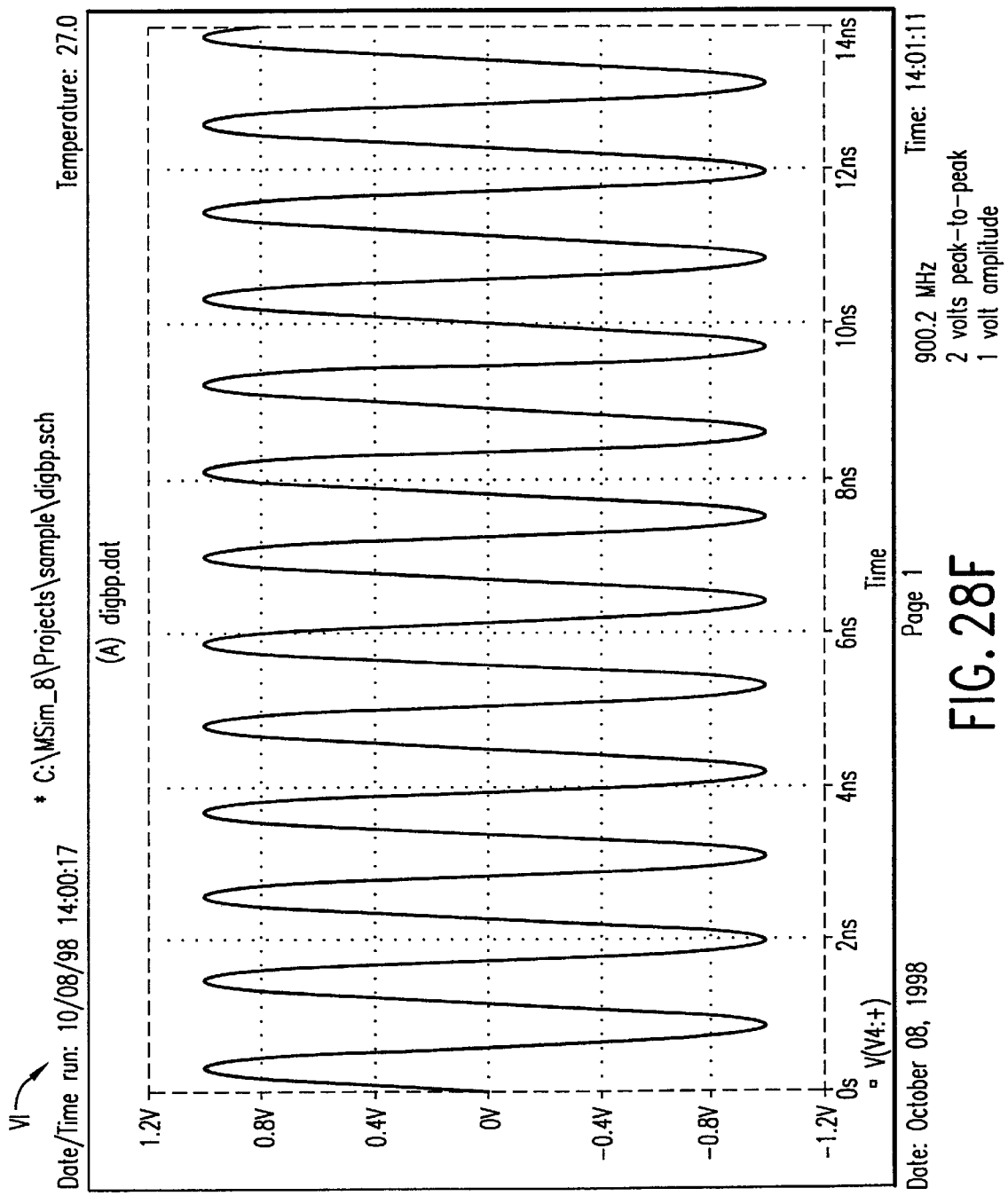
Figure 29F:
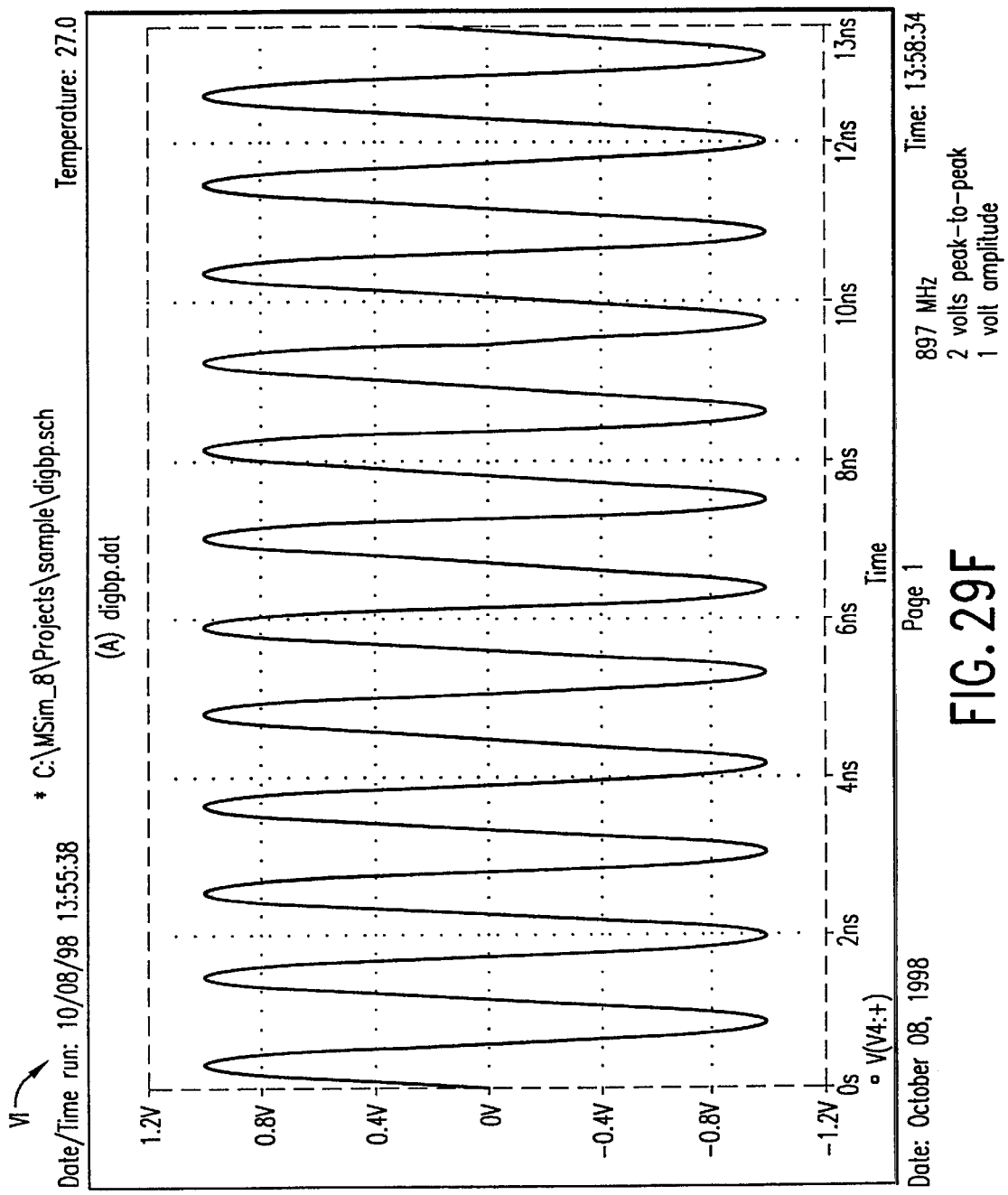

The filter characteristics of the example UDF module 2622 are presented in FIGS. 27A and 27B. The example UDF module 2622 has a filter center frequency of 900.2 MHZ and a filter bandwidth of 570 KHz. The pass band of the UDF module 2622 is on the order of 899.915 MHz to 900.485 MHz. The Q factor of the UDF module 2622 is approximately 1579 (i.e., 900.2 MHZ divided by 570 KHz).

Example waveforms present at nodes in the UDF module 2622 according to an example where the frequency of the input signal VI is 900.2 MHz and the frequency of the control or sample signal is 16 MHz, are presented in FIGS. 28A–28E. FIG. 28F illustrates VI corresponding to the example of FIGS. 28A–28E. FIGS. 28A–28F represent an in-band example, since the frequency of the input signal VI (i.e., 900.2 MHZ) is within the passband of the example UDF module 2622. As such, the UDF module 2622 amplifies the input signal by a factor of approximately 5, as predicted by the frequency response of FIG. 27B.

Another series of example waveforms present in the UDF module 2622 where the frequency of the input signal VI is 897 MHz and the frequency of the control or sampling signal is 16 MHz, are presented in FIGS. 29A–29E. FIG. 29F illustrates VI corresponding to the example of FIGS. 29A–29E. FIGS. 29A–29F represent an out-of-band example, since the frequency of the input signal VI (i.e., 897 MHZ) is not within the passband of the example UDF module 2622. As such, the UDF module 2622 attenuates the input signal by a factor of approximately 0.57, as predicted by the frequency response of FIG. 27B.

The operation of the UDF module 2622 shall now be described with reference to a Table 1502 (FIG. 15) that indicates example values at nodes in the UDF module 2622 at a number of consecutive time increments. It is assumed in Table 1502 that the UDF module 2622 begins operating at time t–1. As indicated below, the UDF module 2622 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of at time t–1, a switch 2650 in the down-convert and delay module 2624 closes. This allows a capacitor 2652 to charge to the current value of an input signal, $VI_{t-1}$, such that node 2602 is at $VI_{t-1}$. This is indicated by cell 1504 in FIG. 15. In effect, the combination of the switch 2650 and the capacitor 2652 in the down-convert and delay module 2624 operates to translate the frequency of the input signal VI to a desired lower frequency, such as IF or baseband. Thus, the value stored in the capacitor 2652 represents an instance of a down-converted image of the input signal VI. This operation of the down-convert and delay module 2624 is further described below.

Also at the rising edge of $\phi_1$ at time t–1, a switch 2658 in the first delay module 2628 closes, allowing a capacitor 2660 to charge to $VO_{t-1}$, such that node 2606 is at $VO_{t-1}$. This is indicated by cell 1506 in Table 1502. (In practice, $VO_{t-1}$ is undefined at this point. However, for ease of understanding, $VO_{t-1}$ shall continue to be used for purposes of explanation.)

Also at the rising edge of $\phi_1$ at time t–1, a switch 2666 in the second delay module 2630 closes, allowing a capacitor 2668 to charge to a value stored in a capacitor 2664. At this time, however, the value in capacitor 2664 is undefined, so the value in capacitor 2668 is undefined. This is indicated by cell 1507 in table 1502.

At the rising edge of $\phi_2$ at time t–1, a switch 2654 in the down-convert and delay module 2624 closes, allowing a capacitor 2656 to charge to the level of the capacitor 2652. Accordingly, the capacitor 2656 charges to $VI_{t-1}$, such that node 2604 is at $VI_{t-1}$. This is indicated by cell 1510 in Table 1502.

The UDF module 2622 may optionally include a unity gain module 2690A between capacitors 2652 and 2656. The unity gain module 2690A operates as a current source to enable capacitor 2656 to charge without draining the charge from capacitor 2652. For a similar reason, the UDF module 2622 may include other unity gain modules 2690B–2690G. It should be understood that, for many embodiments and applications of the invention, these unity gain modules 2690A–2690G are optional. The structure and operation of the unity gain modules 2690 will be apparent to persons skilled in the relevant art(s).

Also at the rising edge of $\phi_2$ at time t–1, a switch 2662 in the first delay module 2628 closes, allowing a capacitor 2664 to charge to the level of the capacitor 2660. Accordingly, the capacitor 2664 charges to $VO_{t-1}$, such that node 2608 is at $VO_{t-1}$. This is indicated by cell 1514 in Table 1502.

Also at the rising edge of $\phi_2$ at time t–1, a switch 2670 in the second delay module 2630 closes, allowing a capacitor 2672 to charge to a value stored in a capacitor 2668. At this time, however, the value in capacitor 2668 is undefined, so the value in capacitor 2672 is undefined. This is indicated by cell 1515 in table 1502.

At time t, at the rising edge of, the switch 2650 in the down-convert and delay module 2624 closes. This allows the capacitor 2652 to charge to $VI_t$, such that node 2602 is at $VI_t$. This is indicated in cell 1516 of Table 1502.

Also at the rising edge of $\phi_1$ at time t, the switch 2658 in the first delay module 2628 closes, thereby allowing the capacitor 2660 to charge to $VO_t$. Accordingly, node 2606 is at $VO_t$. This is indicated in cell 1520 in Table 1502.

Further at the rising edge of $\phi_1$ at time t, the switch 2666 in the second delay module 2630 closes, allowing a capacitor 2668 to charge to the level of the capacitor 2664. Therefore, the capacitor 2668 charges to $VO_{t-1}$, such that node 2610 is at $VO_{t-1}$. This is indicated by cell 1524 in Table 1502.

At the rising edge of $\phi_2$ at time t, the switch 2654 in the down-convert and delay module 2624 closes, allowing the capacitor 2656 to charge to the level of the capacitor 2652. Accordingly, the capacitor 2656 charges to $VI_t$, such that node 2604 is at $VI_t$. This is indicated by cell 1528 in Table 1502.

Also at the rising edge of $\phi_2$ at time t, the switch 2662 in the first delay module 2628 closes, allowing the capacitor 2664 to charge to the level in the capacitor 2660. Therefore, the capacitor 2664 charges to $VO_t$, such that node 2608 is at $VO_t$. This is indicated by cell 1532 in Table 1502.

Further at the rising edge of $\phi_2$ at time t, the switch 2670 in the second delay module 2630 closes, allowing the capacitor 2672 in the second delay module 2630 to charge to the level of the capacitor 2668 in the second delay module 2630. Therefore, the capacitor 2672 charges to $VO_{t-1}$, such that node 2612 is at $VO_{t-1}$. This is indicated in cell 1536 of FIG. 15.

At time t+1, at the rising edge of $\phi_1$, the switch 2650 in the down-convert and delay module 2624 closes, allowing the capacitor 2652 to charge to $VI_{t-1}$. Therefore, node 2602 is at $VI_{t+1}$, as indicated by cell 1538 of Table 1502.

Also at the rising edge of by at time t+1, the switch 2658 in the first delay module 2628 closes, allowing the capacitor 2660 to charge to $VO_{t-1}$. Accordingly, node 2606 is at $VO_{t+1}$, as indicated by cell 1542 in Table 1502.

Further at the rising edge of $\phi_1$ at time t+1, the switch 2666 in the second delay module 2630 closes, allowing the capacitor 2668 to charge to the level of the capacitor 2664. Accordingly, the capacitor 2668 charges to $VO_t$, as indicated by cell 1546 of Table 1502.

In the example of FIG. 26, the first scaling module 2632 scales the value at node 2608 (i.e., the output of the first delay module 2628) by a scaling factor of –0.1. Accordingly, the value present at node 2614 at time t+1 is $-0.1*VO_t$. Similarly, the second scaling module 2634 scales the value present at node 2612 (i.e., the output of the second scaling module 2630) by a scaling factor of –0.8. Accordingly, the value present at node 2616 is $-0.8*VO_{t-1}$ at time t+1.

At time t+1, the values at the inputs of the summer 2626 are: $VI_t$ at node 2604, $-0.1*VO_t$ at node 2614, and $-0.8*VO_t$ at node 2616 (in the example of FIG. 26, the values at nodes 2614 and 2616 are summed by a second summer 2625, and this sum is presented to the summer 2626). Accordingly, at time t+1, the summer generates a signal equal to $VI_t - 0.1*VO_t - 0.8*VO_{t-1}$.

At the rising edge of $\phi_1$ at time t+1, a switch 2691 in the output sample and hold module 2636 closes, thereby allowing a capacitor 2692 to charge to $VO_{t+1}$. Accordingly, the capacitor 2692 charges to $VO_{t+1}$, which is equal to the sum generated by the adder 2626. As just noted, this value is equal to: $VI_t - 0.1*VO_t - 0.8*VO_t$. This is indicated in cell 1550 of Table 1502. This value is presented to the output smoothing module 2638, which smooths the signal to thereby generate the instance of the output signal $VO_{t+1}$. It is apparent from inspection that this value of $VO_{t+1}$ is consistent with the band pass filter transfer function of EQ. 3.

3.4.2 Implementation Examples of Components of the UDF Module

Implementation examples of the components of the UDF module according to embodiments of the present invention are described in the following sections. These example implementations are provided for purposes of illustration only, and are not limiting.

3.4.2.1 Downconvert and Delay Module

Referring to FIG. 17 only for illustrative purposes, the down-convert and delay module 1708 performs the frequency translation operation. In an embodiment, the down-convert and delay module 1708 under-samples the input signal VI such that the input under-samples form a down-converted signal. In an example implementation, the down-converted signal is an intermediate frequency (IF) representation of the input signal VI. In another example implementation, the down-converted signal is a demodulated baseband signal. The invention is not limited to these implementation examples.

In addition to performing the frequency translation operation, the down-convert and delay module 1708 also delays the input samples for the frequency selectivity (filtering) operation. Thus, the down-convert and delay module 1708 contributes to both the frequency translation operation and the frequency selectivity operation.

The down-convert and delay module is further described below.

3.4.2.1.1 Universal Frequency Down-conversion (UFD) Module

In FIG. 26, the downconvert and delay module 2624 represents an example implementation of the down-convert and delay modules described herein, such as 1708 in FIG. 17, 1908 in FIG. 19, 2308 in FIG. 23, and 2514 in FIG. 25. The downconvert and delay module 2624 preferably includes the switch 2650 and the capacitor 2652. The switch 2650 and the capacitor 2652 operate to down-convert the input signal VI. This aspect of the invention is described in this section.

In particular, the following discussion describes down-converting using a Universal Frequency Translation (UFT) Module. The down-conversion of an EM signal by aliasing the EM signal at an aliasing rate is fully described in co-pending U.S. Patent Application entitled "Methods and Systems for Down-converting an Electromagnetic Signal," application Ser. No. 098/176,022, the full disclosure of which is incorporated herein by reference. A relevant portion of the above mentioned patent application is summarized below to describe down-converting an input signal to produce a down-converted signal that exists at a lower frequency or a baseband signal.

Figure 53A:
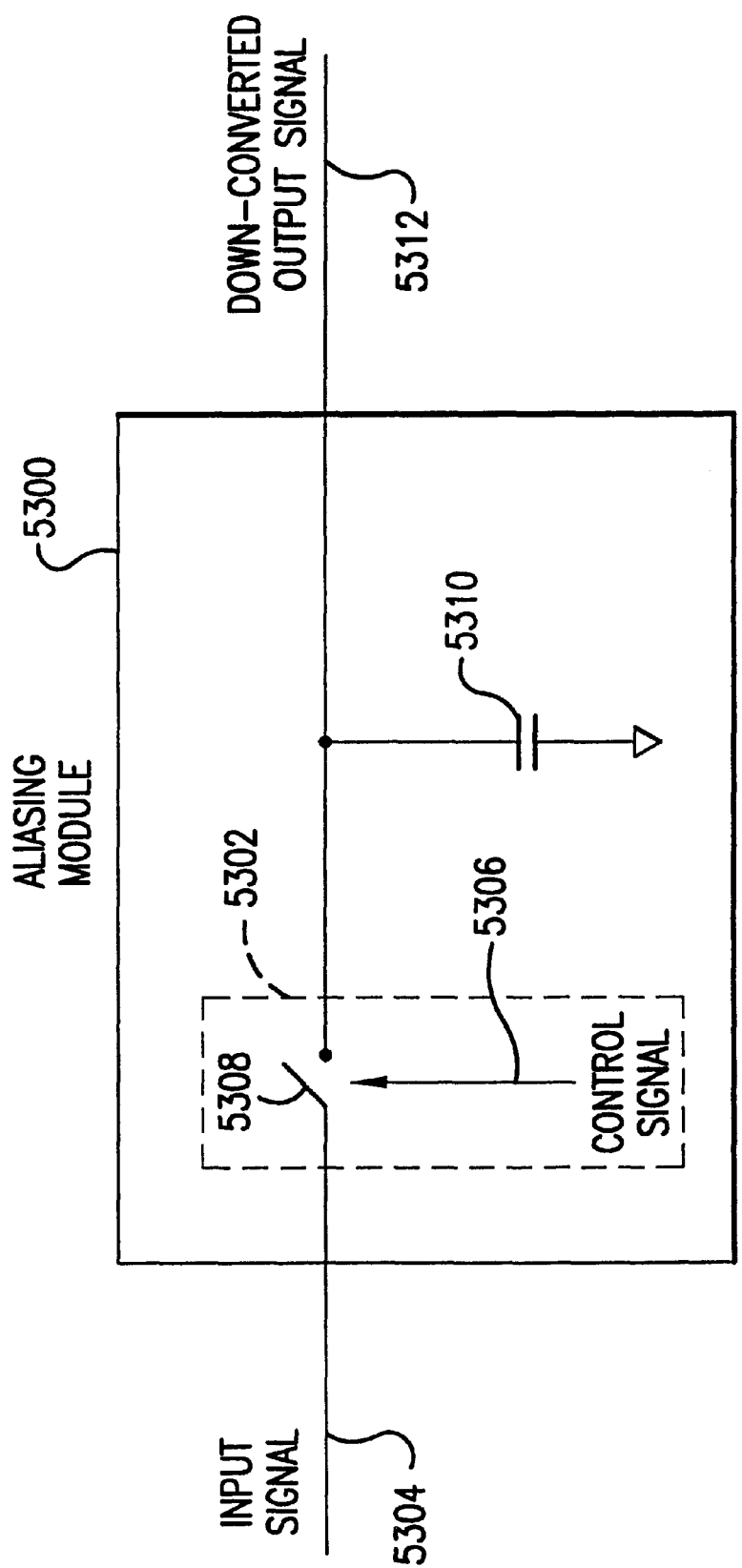
Figures 1, 53A:
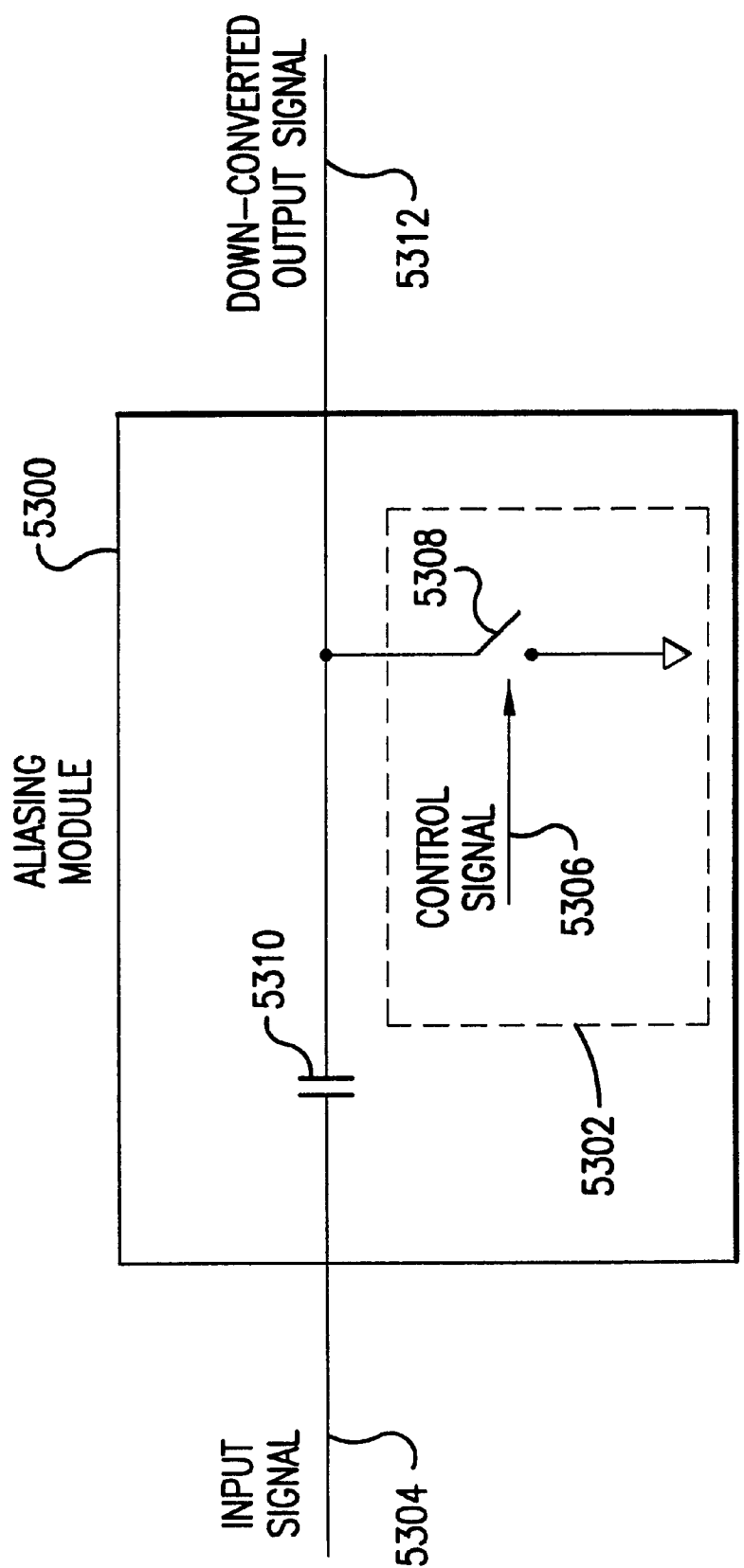

FIG. 53A illustrates an aliasing module 5300 (also called in this context a universal frequency down-conversion module) for down-conversion using a universal frequency translation (UFT) module 5302 which down-converts an EM input signal 5304. In particular embodiments, aliasing module 5300 includes a switch 5308 and a capacitor 5310. The electronic alignment of the circuit components is flexible. That is, in one implementation, the switch 5308 is in series with input signal 5304 and capacitor 5310 is shunted to ground (although it may be other than ground in configurations such as differential mode). In a second implementation (see FIG. 53A-1), the capacitor 5310 is in series with the input signal 5304 and the switch 5308 is shunted to ground (although it may be other than ground in configurations such as differential mode). Aliasing module 5300 with UFT module 5302 can be easily tailored to down-convert a wide variety of electromagnetic signals using aliasing frequencies that are well below the frequencies of the EM input signal 5304.

In one implementation, aliasing module 5300 down-converts the input signal 5304 to an intermediate frequency (IF) signal. In another implementation, the aliasing module 5300 down-converts the input signal 5304 to a demodulated baseband signal. In yet another implementation, the input signal 5304 is a frequency modulated (FM) signal, and the aliasing module 5300 down-converts it to a non-FM signal, such as a phase modulated (PM) signal or an amplitude modulated (AM) signal. Each of the above implementations is described below.

In an embodiment, the control signal 5306 (which is an example of control signal $\phi_1$ that controls switch 2650 in FIG. 26) includes a train of pulses that repeat at an aliasing rate that is equal to, or less than, twice the frequency of the input signal 5304 In this embodiment, the control signal 5306 is referred to herein as an aliasing signal because it is below the Nyquist rate for the frequency of the input signal 5304. Preferably, the frequency of control signal 5306 is much less than the input signal 5304.

Figure 53B:
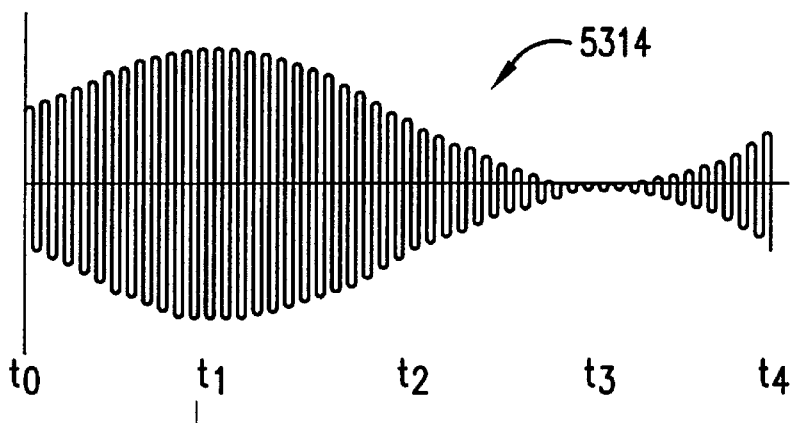
FIGS. 53B–53F illustrate example waveforms used to describe the operation of the aliasing modules of FIGS. 53A and 53A-1.
Figure 53C:
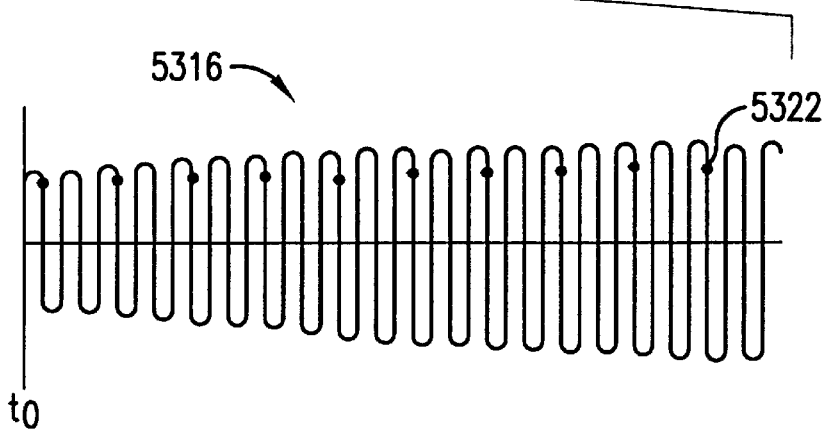
Figure 53D:
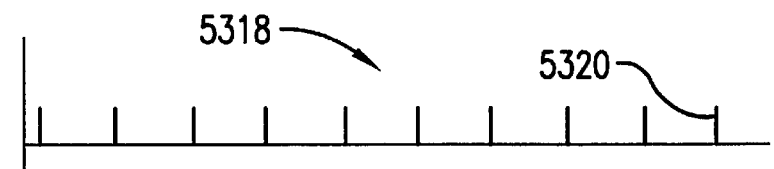
Figure 53E:
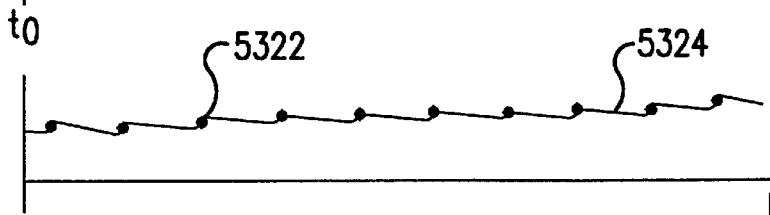

The train of pulses 5318 of FIG. 53D controls the switch 5308 to alias the input signal 5304 with the control signal 5306 to generate a down-converted output signal 5312. More specifically in an embodiment, switch 5308 closes on a first edge of each pulse 5320 of FIG. 53D and opens on a second edge of each pulse. When the switch 5308 is closed, the input signal 5304 is coupled to the capacitor 5310, and charge is transferred from the input signal to the capacitor 5310. The charge stored during successive pulses forms down-converted output signal 5312.

Exemplary waveforms are shown in FIGS. 53B–53F.

FIG. 53B illustrates an analog amplitude modulated (AM) carrier signal 5314 that is an example of input signal 5304. For illustrative purposes, in FIG. 53C, an analog AM carrier signal portion 5316 illustrates a portion of the analog AM carrier signal 5314 on an expanded time scale. The analog AM carrier signal portion 5316 illustrates the analog AM carrier signal 5314 from time $t_0$ to time $t_1$.

FIG. 53D illustrates an exemplary aliasing signal 5318 that is an example of control signal 5306. Aliasing signal 5318 is on approximately the same time scale as the analog AM carrier signal portion 5316. In the example shown in FIG. 53D, the aliasing signal 5318 includes a train of pulses 5320 having negligible apertures that tend towards zero (the invention is not limited to this embodiment, as discussed below). The pulse aperture may also be referred to as the pulse width as will be understood by those skilled in the art(s). The pulses 5320 repeat at an aliasing rate, or pulse repetition rate of aliasing signal 5318. The aliasing rate is determined as described below, and further described in co-pending U.S. Patent Application entitled "Method and System for Down-converting an Electromagnetic Signal," application Ser. No. 09/176,022.

Figure 53F:
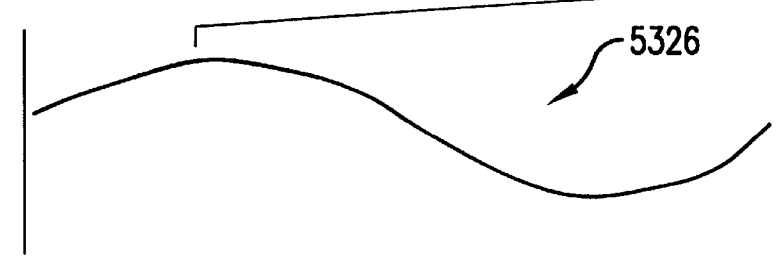

As noted above, the train of pulses 5320 (i.e., control signal 5306) control the switch 5308 to alias the analog AM carrier signal 5316 (i.e., input signal 5304) at the aliasing rate of the aliasing signal 5318. Specifically, in this embodiment, the switch 5308 closes on a first edge of each pulse and opens on a second edge of each pulse. When the switch 5308 is closed, input signal 5304 is coupled to the capacitor 5310, and charge is transferred from the input signal 5304 to the capacitor 5310. The charge transferred during a pulse is referred to herein as an under-sample. Exemplary under-samples 5322 form down-converted signal portion 5324 (FIG. 53E) that corresponds to the analog AM carrier signal portion 5316 (FIG. 53C) and the train of pulses 5320 (FIG. 53D). The charge stored during successive under-samples of AM carrier signal 5314 forms a down-converted signal 5324 (FIG. 53E) that is an example of down-converted output signal 5312 (FIG. 53A). In FIG. 53F a demodulated baseband signal 5326 represents the demodulated baseband signal 5324 after filtering on a compressed time scale. As illustrated, down-converted signal 5326 has substantially the same "amplitude envelope" as AM carrier signal 5314. Therefore, FIGS. 53B–53F illustrate down-conversion of AM carrier signal 5314.

The waveforms shown in FIGS. 53B–53F are discussed herein for illustrative purposes only, and are not limiting. Additional exemplary time domain and frequency domain drawings, and exemplary methods and systems of the invention relating thereto, are disclosed in co-pending U.S. Patent Application entitled "Method and System for Down-converting an Electromagnetic Signal," application Ser. No. 09/176,022.

As indicated above, the aliasing rate of control signal 5306 determines whether the input signal 5304 is down-converted to an IF signal, down-converted to a demodulated baseband signal, or down-converted from an FM signal to a PM or an AM signal. Generally, relationships between the input signal 5304, the aliasing rate of the control signal 5306, and the down-converted output signal 5312 are illustrated below:

(Freq. of input signal 5304)=n•(Freq. of control signal 5306)±(Freq. of down-converted output signal 5312)

For the examples contained herein, only the "+" condition will be discussed. The value of n represents a harmonic or sub-harmonic of input signal 5304 (e.g., n=0.5, 1, 2, 3, ...).

When the aliasing rate of control signal 5306 is off-set from the frequency of input signal 5304, or off-set from a harmonic or sub-harmonic thereof, input signal 5304 is down-converted to an IF signal. This is because the under-sampling pulses occur at different phases of subsequent cycles of input signal 5304. As a result, the under-samples form a lower frequency oscillating pattern. If the input signal 5304 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHz input signal to a 1 MHz IF signal, the frequency of the control signal 5306 would be calculated as follows:

$(Freq_{input} - Freq_{IF})/n = Freq_{control}$ (901 MHz–1 MHz)/n=900/n

For n=0.5, 1, 2, 3, 4, etc., the frequency of the control signal 5306 would be substantially equal to 1.8 GHz, 900 MHz, 450 MHz, 300 MHz, 225 MHz, etc.

Exemplary time domain and frequency domain drawings, illustrating down-conversion of analog and digital AM, PM and FM signals to IF signal, and exemplary methods and systems thereof, are disclosed in co-pending U.S. Patent Application entitled "Method and System for Down-converting an Electromagnetic Signal," application Ser. No. 09/176,022.

Alternatively, when the aliasing rate of the control signal 5306 is substantially equal to the frequency of the input signal 5304, or substantially equal to a harmonic or sub-harmonic thereof, input signal 5304 is directly down-converted to a demodulated baseband signal. This is because, without modulation, the under-sampling pulses occur at substantially the same point of subsequent cycles of the input signal 5304. As a result, the under-samples form a constant output baseband signal. If the input signal 5304 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHz input signal to a demodulated baseband signal (i.e., zero IF), the frequency of the control signal 5306 would be calculated as follows:

$(Freq_{input} - Freq_{IF})/n = Freq_{control}$ (900 MHz–0 MHz)/n=900 MHz/n

For n=0.5, 1, 2, 3, 4, etc., the frequency of the control signal 5306 should be substantially equal to 1.8 GHz, 900 MHz, 450 MHz, 300 MHz, 225 MHz, etc.

Exemplary time domain and frequency domain drawings, illustrating direct down-conversion of analog and digital AM and PM signals to demodulated baseband signals, and exemplary methods and systems thereof, are disclosed in the co-pending U.S. Patent Application entitled "Method and System for Down-converting an Electromagnetic Signal," application Ser. No. 09/176,022.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHz and $F_2$ equal to 901 MHz, to a PSK signal, the aliasing rate of the control signal 5306 would be calculated as follows:

Frequency of the input=$(F_1+F_2)\div 2$=(899 MHz+901 MHz)÷2=900 MHz

Frequency of the down-converted signal=0 (i.e., baseband)

$(Freq_{input} - Freq_{IF})/n = Freq_{control}$ (900 MHz–0 MHz)/n=900 MHz/n

For n=0.5, 1, 2, 3, etc., the frequency of the control signal 5306 should be substantially equal to 1.8 GHz, 900 MHz, 450 MHz, 300 MHz, 225 MHz, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHz and $F_2$ equal to 901 MHz, to an ASK signal, the aliasing rate of the control signal 5306 should be substantially equal to:

(900 MHz–0 MHz)/$n$=900 MHz/$n$, or (901 MHz–0 MHz)/$n$=901 MHz/$n$.

For the former case of 900 MHz/n, and for n=0.5, 1, 2, 3, 4, etc., the frequency of the control signal 5306 should be substantially equal to 1.8 GHz, 900 MHz, 450 MHz, 300 MHz, 225 MHz, etc. For the latter case of 901 MHz/n, and for n=0.5, 1, 2, 3, 4, etc., the frequency of the control signal 5306 should be substantially equal to 1.802 GHz, 901 MHz, 450.5 MHz, 300.333 MHz, 225.25 MHz, etc. The frequency of the down-converted AM signal is substantially equal to the difference between the lower frequency $F_1$ and the upper frequency $F_2$ (i.e., 1 MHz).

Exemplary time domain and frequency domain drawings, illustrating down-conversion of FM signals to non-FM signals, and exemplary methods and systems thereof, are disclosed in the co-pending U.S. Patent Application entitled "Method and System for Down-converting an Electromagnetic Signal," application Ser. No. 09/176,022.

In an embodiment, the pulses of the control signal 5306 have negligible apertures that tend towards zero. This makes the UFT module 5302 a high input impedance device. This configuration is useful for situations where minimal disturbance of the input signal may be desired.

In another embodiment, the pulses of the control signal 5306 have non-negligible apertures that tend away from zero. This makes the UFT module 5302 a lower input impedance device. This allows the lower input impedance of the UFT module 5302 to be substantially matched with a source impedance of the input signal 5304. This also improves the energy transfer from the input signal 5304 to the down-converted output signal 5312, and hence the efficiency and signal to noise (s/n) ratio of UFT module 5302.

Exemplary systems and methods for generating and optimizing the control signal 5306 and for otherwise improving energy transfer and s/n ratio, are disclosed in the co-pending U.S. Patent Application entitled "Method and System for Down-converting an Electromagnetic Signal," application Ser. No. 09/1766,022.

3.4.2.2 Delay Modules

As indicated above, a delay module operates to delay samples/instances of a signal presented at its input by a known amount.

For example, in the embodiment of the UDF module 2622 shown in FIG. 26, the first and second delay modules 2628 and 2630 operate to delay instances of the output signal VO. Specifically, the first delay module 2628 delays instances of the output signal VO by one time unit. The second delay module 2630 also delays instances of the output signal VO by one time unit. However, the second delay module 2630 receives its input from the first delay module 2628. Accordingly, the effect of the second delay module 2630 (in combination with the first delay module 2628) is to delay instances of the output signal VO by two time units. This is required, for example, by the second and third components of the example band-pass filtering transfer function of EQ. 3.

Figure 45:
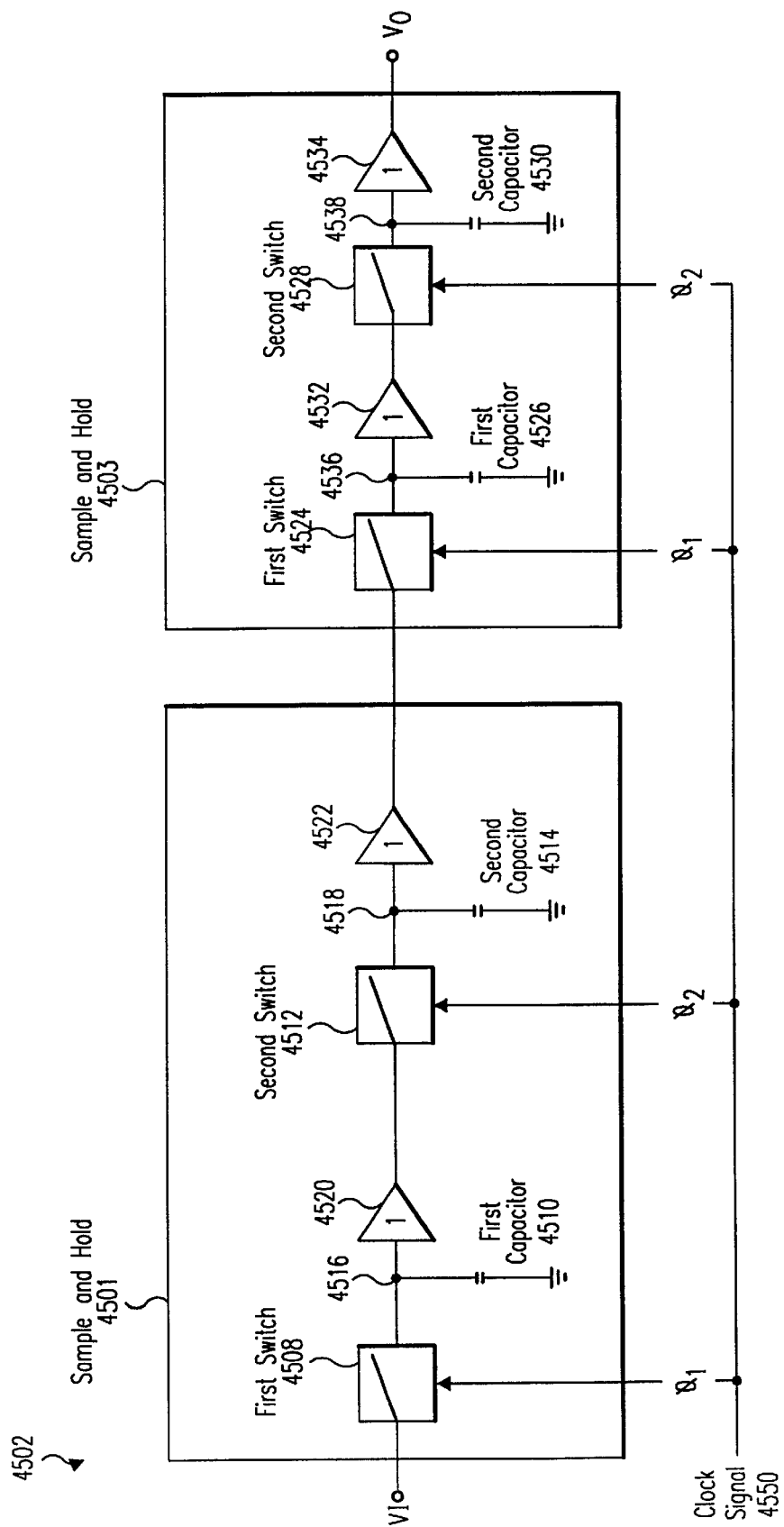
FIG. 45 is used to illustrate the operation of a sample and hold circuit according to an embodiment of the invention.

In the embodiment of the UDF module 2622 shown in FIG. 26, the first delay module 2628 and the second delay module 2630 are each implemented using a sample and hold circuit. For ease of presentation and illustration, such sample and hold circuits are depicted in FIG. 45. (As apparent from the discussion contained herein, other embodiments of the UDF module include delay modules. Such delay modules can also be implemented using sample and hold circuits. Alternatively, well known delay circuits or processors/software can be utilized, as will be apparent to persons skilled in the relevant art(s) based on the teachings contained herein.)

More particularly, FIG. 45 shows two sample and hold circuits 4501 and 4503. The sample and holds 4501 and 4503 are similar in structure and operation. Generally, the first delay module 2628 and the second delay module 2630 can each be implemented using either the sample and hold 4501 or the sample and hold 4503. Preferably, the first delay module 2628 and the second delay module 2630 are generally implemented in the example configuration shown in FIG. 45.

Figure 48:
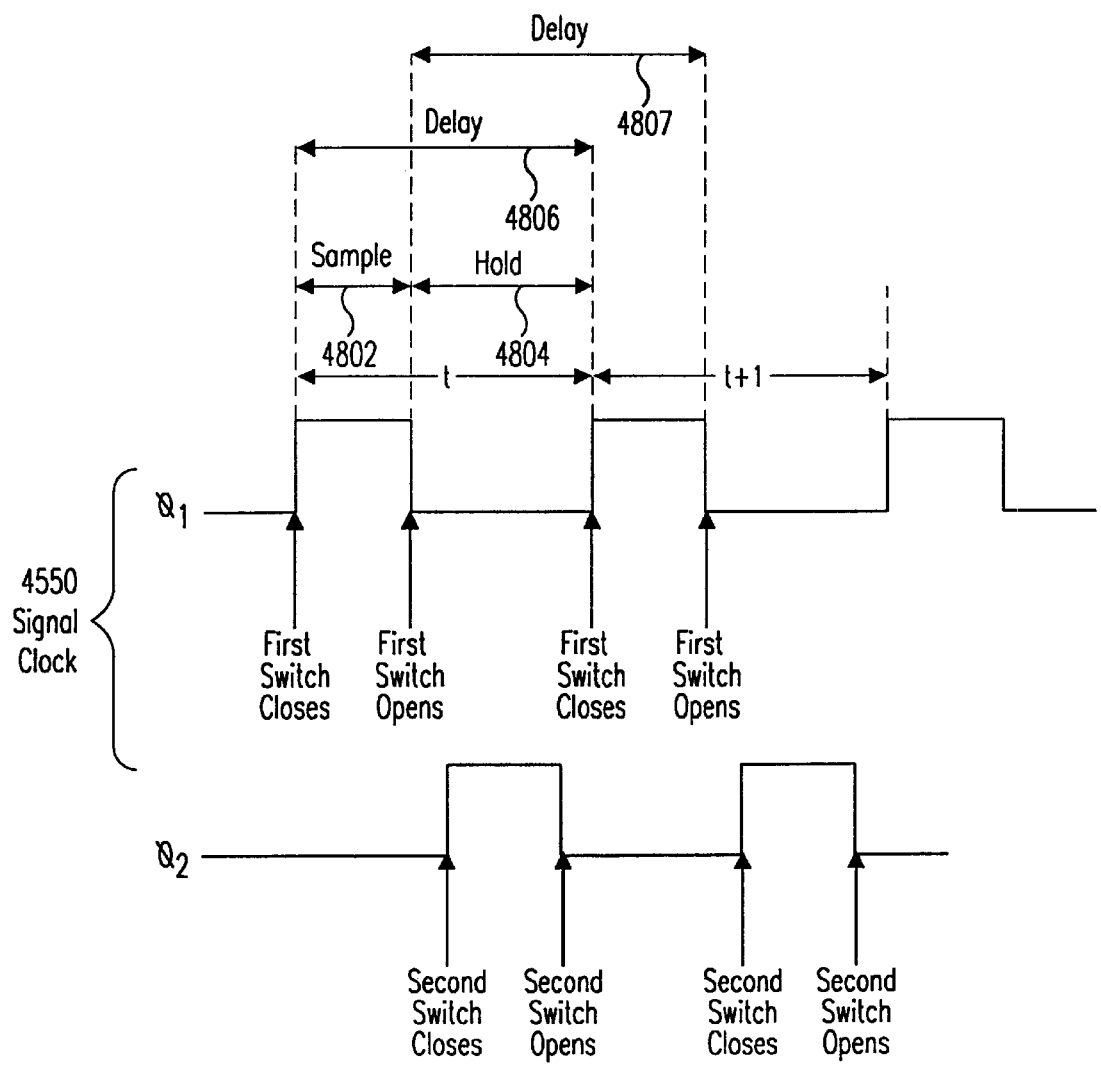
FIG. 48 illustrates an example bi-phase clock signal used to control switches in the sample and hold circuits of FIG. 45.

Each sample and hold 4501, 4503 includes a first switch 4508, 4524 and a second switch 4512, 4528, respectively. The first switches 4508, 4524, and the second switches 4512, 4528 are controlled by a clock signal 4550. Preferably, the clock signal 4550 has two phases, $\phi_1$ and $\phi_2$. Preferably, $\phi_1$ and $\phi_2$ have the same frequency, but are non-overlapping. The first switches 4508, 4524 are controlled by $\phi_1$. Preferably, the first switches 4508 and 4524 close on rising edges of $\phi_1$, and open on the following falling edges of $\phi_1$. The second switches 4512, 4528 are controlled by $\phi_2$. Preferably, the second switches 4512 and 4528 close on rising edges of $\phi_2$, and open on the following falling edges of $\phi_2$. Example representations of $\phi_1$ and $\phi_2$ are shown in FIG. 48. It is noted that the invention is not limited to this switching convention. In other embodiments, other switching conventions are used. Further, other circuit configurations could be used.

The sample and holds 4501, 4503 also each include a first capacitor 4510, 4526 and a second capacitor 4514, 4530, respectively. The sample and holds 4501, 4503 optionally include unity gain modules 4520, 4522, 4532, 4534 which operate in the manner described above.

Figure 46:
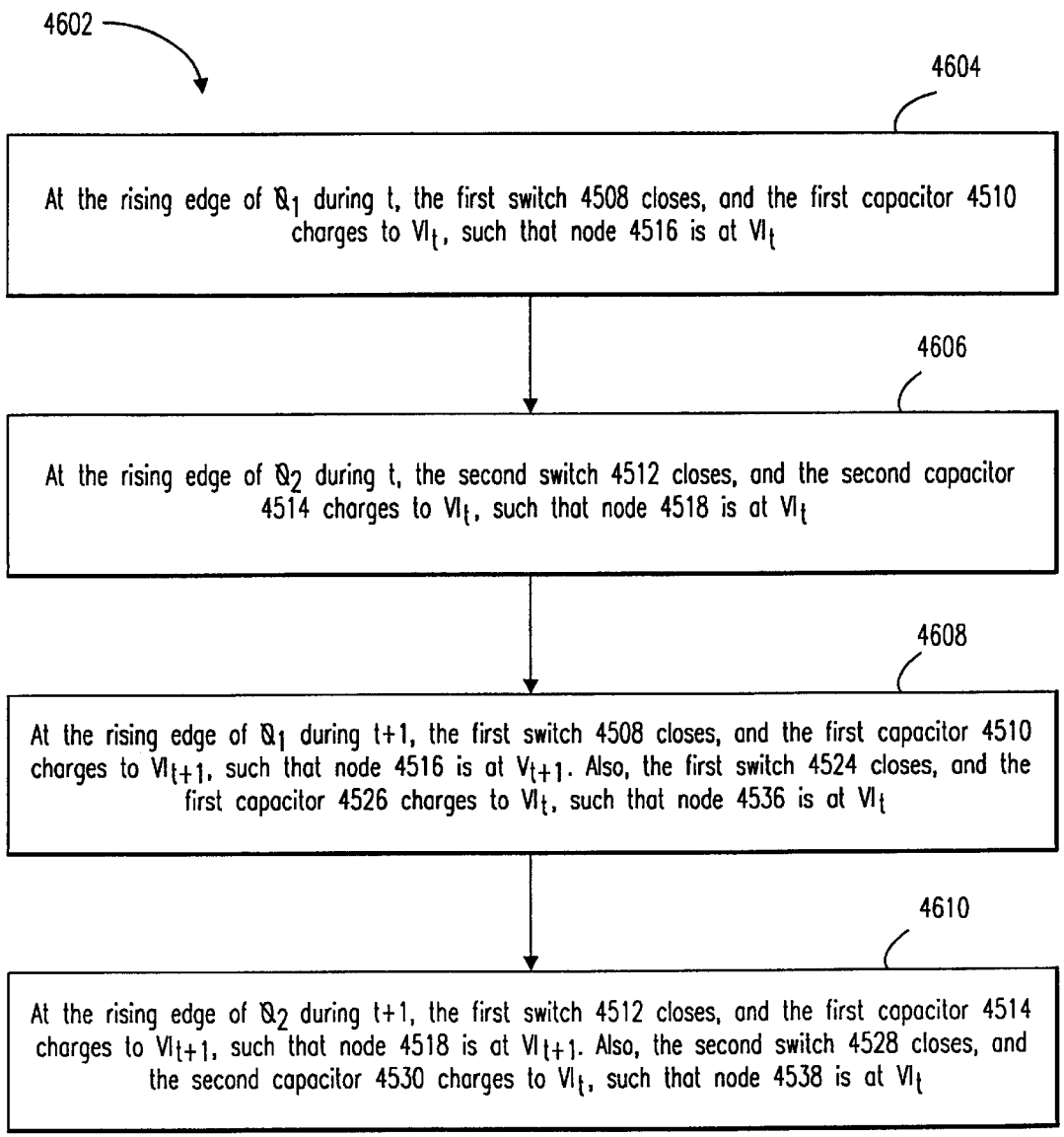
FIG. 46 is a flowchart representing an example operation of the sample and hold circuits shown in FIG. 45.
Figure 47:
FIG. 47 is a table indicating example values present at nodes in the sample and hold circuits of FIG. 45.

The operation of the sample and holds 4501, 4503 is now described with reference to a flowchart 4602 shown in FIG. 46. Reference shall also be made to a Table 4702 that indicates example values at particular nodes in the sample and holds 4501 and 4503 at a number of consecutive time increments. In the example of Table 4702, it is assumed that operation of the sample and holds 4501, 4503 begins at time t. One or more cycles are required for the sample and holds 4501, 4503 to reach steady state. The number of cycles required to reach steady state will be apparent to persons skilled in the relevant art(s) based on the teachings contained herein.

In step 4604, at the rising edge of $\phi_1$ during a time t, the switch 4508 closes. Upon the closing of the first switch 4508, the first capacitor 4510 charges to $VI_t$ such that node 4516 is at $VI_t$. This is indicated in cell 4704 of Table 4702.

Note that the first switch 4524 in the sample and hold 4503 also closes upon the rising edge of $\phi_1$ during t. This causes the first capacitor 4526 in the sample and hold 4503 to charge to the level stored in the second capacitor 4514 in the sample and hold 4501. However, in the example currently being discussed, the value of the second capacitor 4514 at the rising edge of $\phi_1$ during time t is undefined. Accordingly, the charge in the first capacitor 4526 at this time t is undefined, as indicated in cell 4705 in Table 4702.

In step 4606, at the rising edge of $\phi_2$ during time t, the second switch 4512 in the sample and hold 4501 closes. This causes the second capacitor 4514 to charge to the level of the first capacitor 4510. Accordingly, the second capacitor 4514 charges to $VI_t$. This causes the value at node 4518 to become $VI_t$. This is indicated in cell 4708 of table 4702.

Also upon the rising edge of $\phi_2$ during time t, the second switch 4528 in the sample and hold 4503 closes, such that the second capacitor 4530 charges to the level of the first capacitor 4526 in the sample and hold 4503. However, as described above, the charge in the first capacitor 4526 at this time is undefined. Accordingly, the charge in the second capacitor 4530 at this time is undefined, as indicated by cell 4709 in Table 4702.

In step 4608, at the rising edge of $\phi_1$ during time t+1, the first switch 4508 in the sample and hold 4501 closes. This causes the first capacitor 4510 to charge to $VI_{t+1}$, such that node 4516 is at $VI_{t+1}$. This is indicated in cell 4710 in Table 4702.

Also on the rising edge of during time t+1, the first switch 4524 in the sample and hold 4503 closes. This causes the first capacitor 4526 in the sample and hold 4503 to charge to the level of the second capacitor 4514 in the sample and hold 4501. Accordingly, the first capacitor 4526 charges to $VI_t$, such that node 4536 is at $VI_t$. This is indicated in cell 4714 of Table 4702.

In step 4610, at the rising edge of $\phi_2$ during time t+1, the second switch 4512 in the sample and hold 4501 closes. This causes the second capacitor 4514 in the sample and hold 4501 to charge to the level of the first capacitor 4510. In other words, the second capacitor 4514 charges to $VI_{t+1}$, such that node 4518 is at $VI_{t+1}$. This is indicated by cell 4718 in Table 4702.

Also at the rising edge of $\phi_2$ during time t+1, the second switch 4528 in the sample and hold 4503 closes. This causes the second capacitor 4530 to charge to the level of the first capacitor 4526 in the sample and hold 4503. In other words, the second capacitor 4530 charges to $VI_t$ such that node 4538 is at $VI_t$. This is indicated in cell 4722 of Table 4702.

FIG. 48 illustrates another representation of the operation of the sample and holds 4501, 4503. FIG. 48 illustrates $\phi_1$ and $\phi_2$ of the clock signal 4550. As discussed above, the first switches 4508, 4524 close at rising edges of $\phi_1$, and open at falling edges of $\phi_1$. The second switches 4512,4528 close at rising edges of $\phi_2$, and open at failing edges of $\phi_2$.

Consider now the sample and hold 4501. When the first switch 4508 closes, the first capacitor 4510 begins to charge to the input signal VI and continues to charge until the first switch 4508 opens. The first switch 4508 is closed while $\phi_1$ is high. Accordingly, while $\phi_1$ is high, the sample and hold 4501 samples the input signal VI. This is indicated in FIG. 48 by a sample period 4802.

FIG. 48 also indicates a hold period 4804. During this hold period 4804, the sample of the input signal VI that is stored in the first capacitor 4510 is held in the sample and hold 4501. Specifically, this input sample is held in the first capacitor 4510 until the next rising edge of $\phi_1$ (during time t+1). Also, at the rising edge of $\phi_2$ during time t, the second switch 4512 closes and the second capacitor 4514 charges to this input sample. This value is held in the second capacitor 4514 until the next rising edge of $\phi_2$ at time t+1.

Accordingly, in sample and hold 4501, VI is sampled at the beginning of t, and is held in the sample and hold 4501 until after time period t expires (i.e., for greater than a full period of the clock signal 4550). Note, however, that the next sample and hold 4503 does not sample the output of the first sample and hold 4501 until the next rising edge of $\phi_1$ (that is, the rising edge of $\phi_1$ during time t+1). Thus, the first sample and hold 4501 samples VI at time t; this sample $VI_t$ does not propagate to the next sample and hold 4503 until time t+1. Accordingly, the sample and hold 4501 effectively holds or delays the sample of the input signal VI for one time period. This delay period is denoted as 4806 in FIG. 48.

In practice, the charge in the first capacitor 4510 tracks the input signal VI while the first switch 4508 is closed (i.e., during the sample period 4802 of time t). The charge stored in the first capacitor 4510 at the falling edge of $\phi_1$ of time t constitutes the input sample $VI_t$. In other words, the input sample $VI_t$ is defined in the sample and hold 4501 at the falling edge of $\phi_1$ of time t. The input sample in the sample and hold 4501 is not re-defined until the next falling edge of $\phi_1$ (i.e., the falling edge of $\phi_1$ of time t+1). Accordingly, the delay of the sample and hold 4501 can be considered to be delay 4807 shown in FIG. 48.

The discussion in this section has thus far focused on the delay modules 2628, 2630 implemented using sample and hold circuits, as in the example UDF module 2622 of FIG. 26. However, the invention is not limited to this implementation example. Instead, the delay modules in the UDF module can be implemented using any apparatus or circuit that operates to delay an incoming signal by a predetermined amount.

Figure 32:
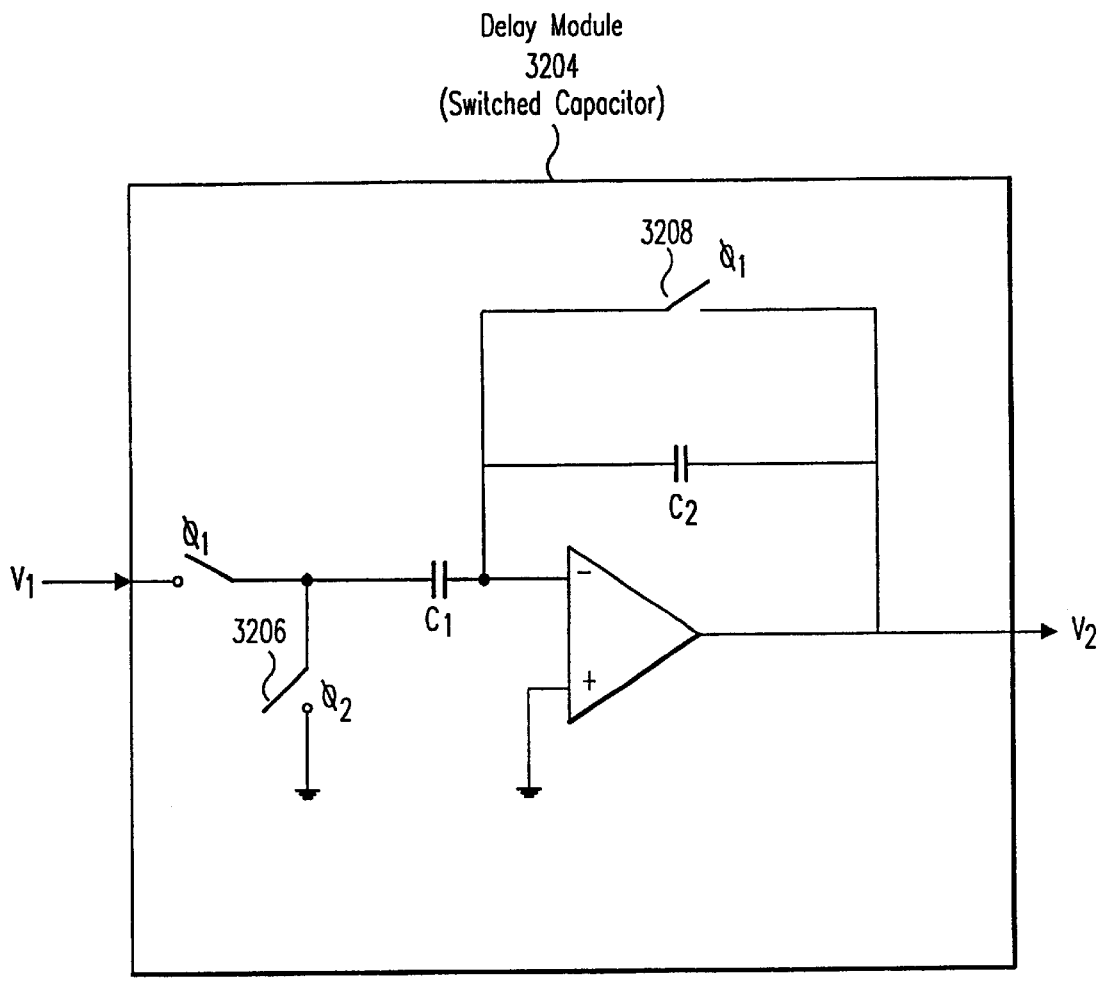
FIG. 32 illustrates an example switched capacitor used to implement the delay modules in an example UDF module according to an embodiment of the invention.
Figure 33A:
FIGS. 33A and 33B illustrate a clock signal having two phases, $\phi1$ and $\phi2$.
Figure 33B:
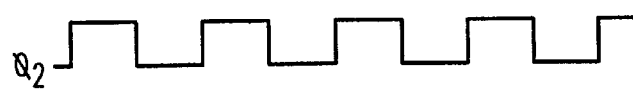

For example, referring for illustrative purposes only to FIG. 17, the delay modules 1710, 1722 can each be implemented using a switched capacitor topology 3204, such as that shown in FIG. 32. The switch capacitor topology 3204 includes two switches 3208 and 3206 which operate according to $\phi_1$ and $\phi_2$ of a clock signal. An example representation of $\phi_1$ and $\phi_2$ is shown in FIGS. 33A and 33B.

In addition to delaying an input signal VI, the particular switch capacitor shown in FIG. 32 also scales the input signal as follows:

$$V2 = \frac{C1}{C2} * V1$$

Accordingly, when using a switched capacitor such as that shown in FIG. 32, the switch capacitor performs the function of both the delay module 1710, 1722 and the associated scaling module 1716, 1724.

Figure 34:
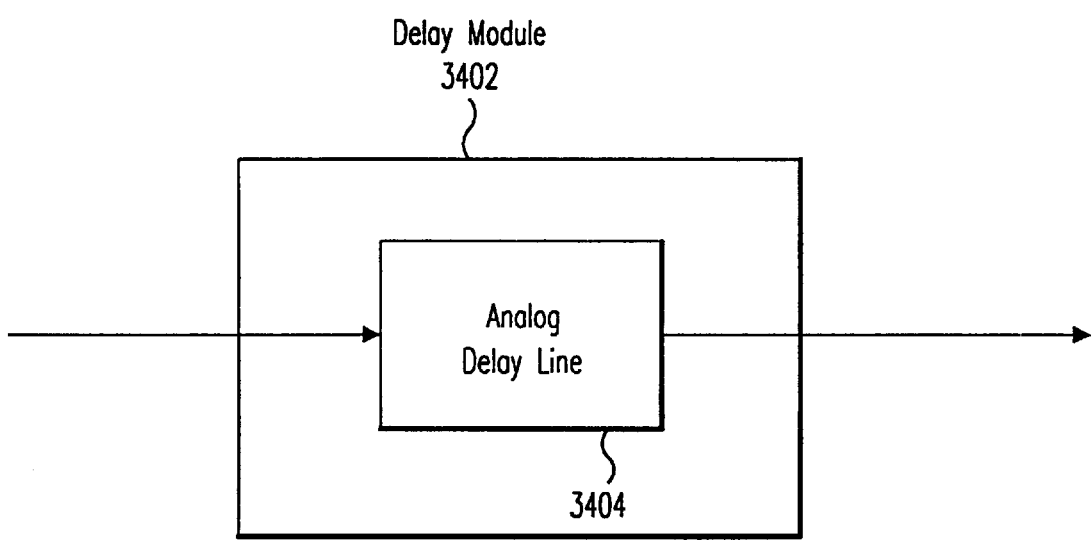
FIG. 34 illustrates an example analog delay line used to implement the delay modules of an example UDF module according to an embodiment of the invention.

The delay modules 1710, 1722 can also each be implemented using an analog delay line, such as the analog delay line 3404 in FIG. 34, for example. As will be apparent to persons skilled in the relevant art(s), an analog delay line 3404 is constructed using a combination of capacitors, inductors, and/or resistors. The analog delay line 3404 operates to delay an input signal by a known amount. In some embodiments, the analog delay line 3404 is combined with other components to achieve this function, such as samplers.

The above implementation examples are provided for illustrative purposes only, and are not limiting. Other implementation examples will be apparent to persons skilled in the relevant art(s) based on the teachings contained herein.

3.4.2.3 Scaling Modules

The scaling modules in the UDF module operate to scale signals present at their respective inputs. Such scaling contributes to the filter characteristics (such as the filter center frequency and bandwidth) of the UDF module.

Referring for illustrative purposes only to the UDF module 1702 in FIG. 17, the scaling modules 1716, 1724 can be implemented using any apparatus or circuit that scales an input signal by a known amount. The scaling factor may be less than 1 (in the case of attenuation) or greater than 1 (in the case of amplification). More generally, the scaling factor may be any real number, including but not limited to zero.

Figure 35:
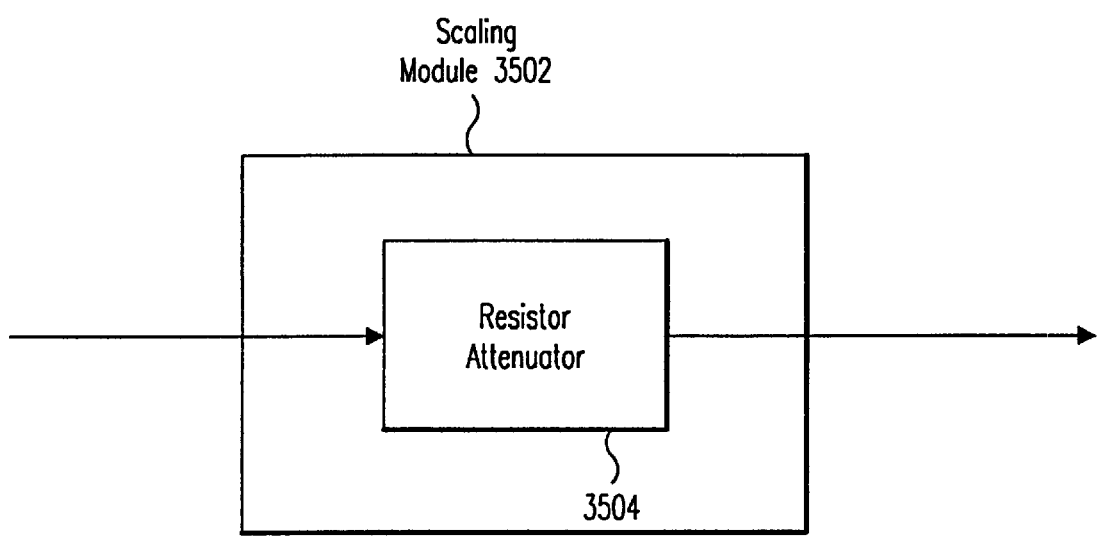
FIG. 35 illustrates a resistor attenuater used to implement the scaling modules in an example UDF module according to an embodiment of the invention.
Figure 36:
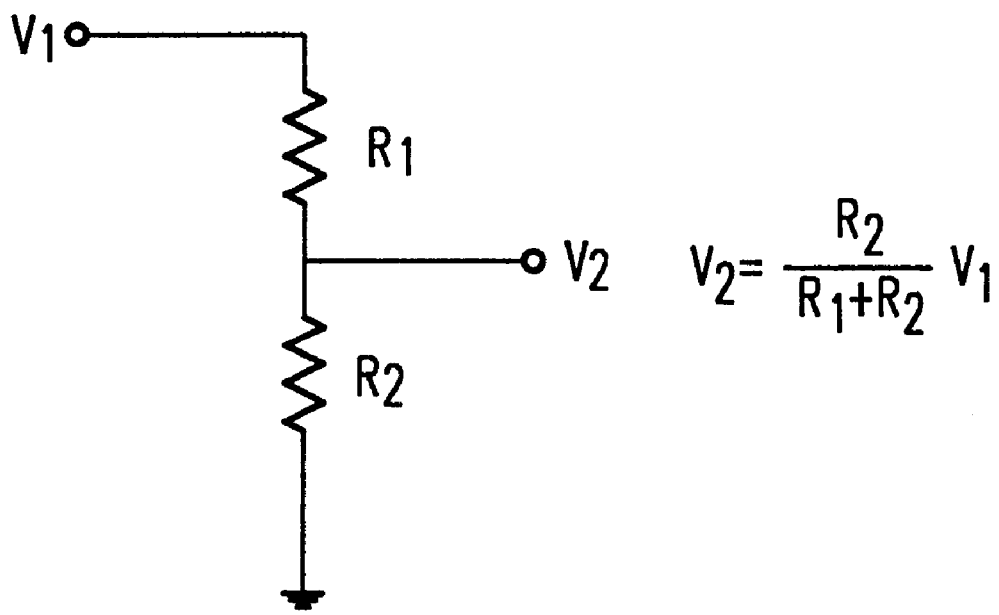
FIG. 36 illustrates an example resistor attenuater.

For example, each scaling module 1716, 1724 can be implemented using a resistor attenuater 3504, as shown in FIG. 35. As will be appreciated by persons skilled in the relevant art(s), there are many types and configurations of resistor attenuaters. FIG. 36 illustrates an example resistor attenuater 3602. This example resistor attenuater 3602 scales an input V1 by:

$$V2 = \frac{R_2}{R_1 + R_2} * V1$$

Other circuit diagrams for resistor attenuaters suitable for use as the scaling modules 1716, 1724 in the UDF module 1702 will be apparent to persons skilled in the relevant art(s).

Figure 37:
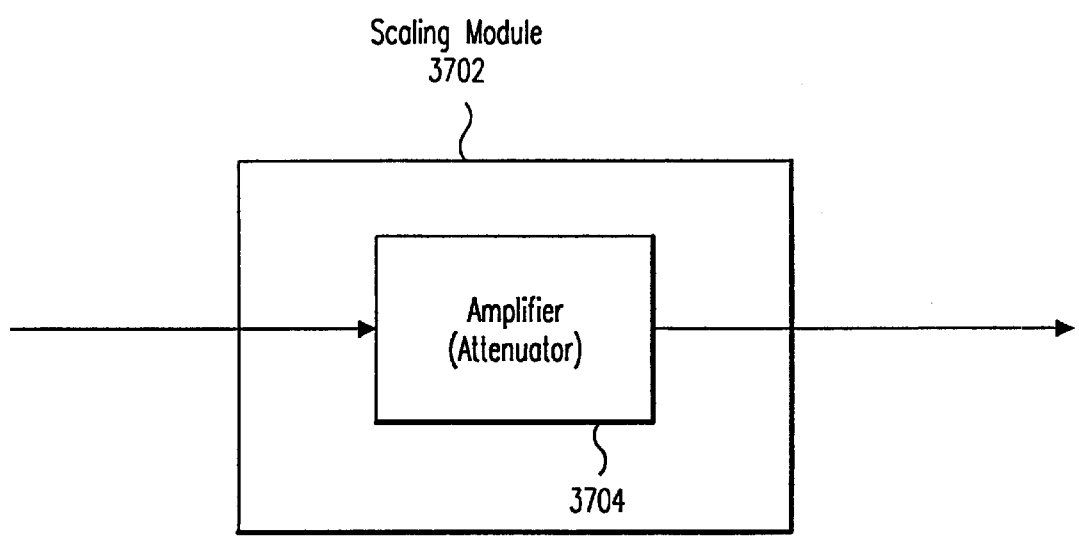
FIG. 37 illustrates an example amplifier capable of implementing the scaling module in an example UDF module according to an embodiment of the invention.

An amplifier/attenuater 3704 can also be used to implement the scaling modules 1716, 1724. An example amplifier 3704 is shown in FIG. 37. As will be appreciated by persons skilled in the relevant art(s), amplifiers suitable for use as scaling modules 1716, 1724 in the UDF module 1702 can be implemented using a variety of circuit components, such as, but not limited to, operational amplifiers (OP AMPS), transistors, FETS, etc.

The above implementation examples are provided for illustrative purposes only, and are not limiting. Other implementation examples will be apparent to persons skilled in the relevant art(s) based on the teachings contained herein.

3.4.2.4 Adder

Referring for illustrative purposes only to FIG. 17, the adder 1720 (also called the summer herein) sums the signals presented at its inputs. The adder 1720 can be implemented using any apparatus or circuit that sums a plurality of input signals.

Figure 38:
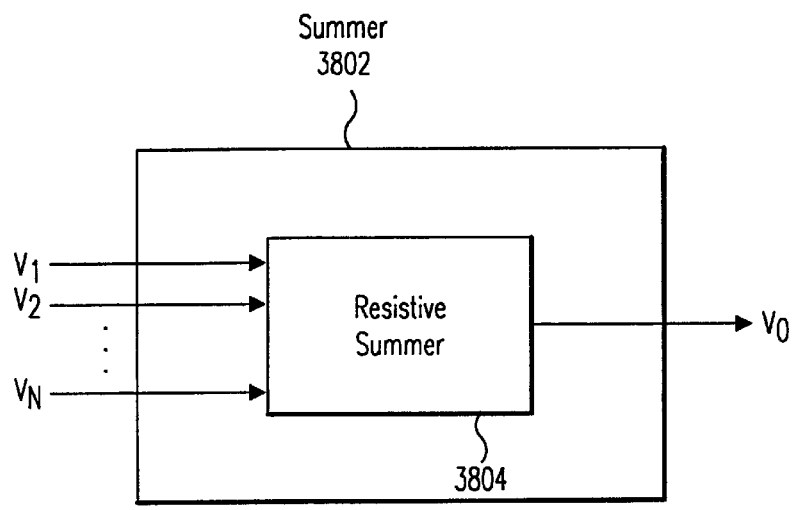
FIG. 38 illustrates an example resistive summer capable of implementing the summer/adder in an example UDF module according to an embodiment of the invention.
Figure 39:
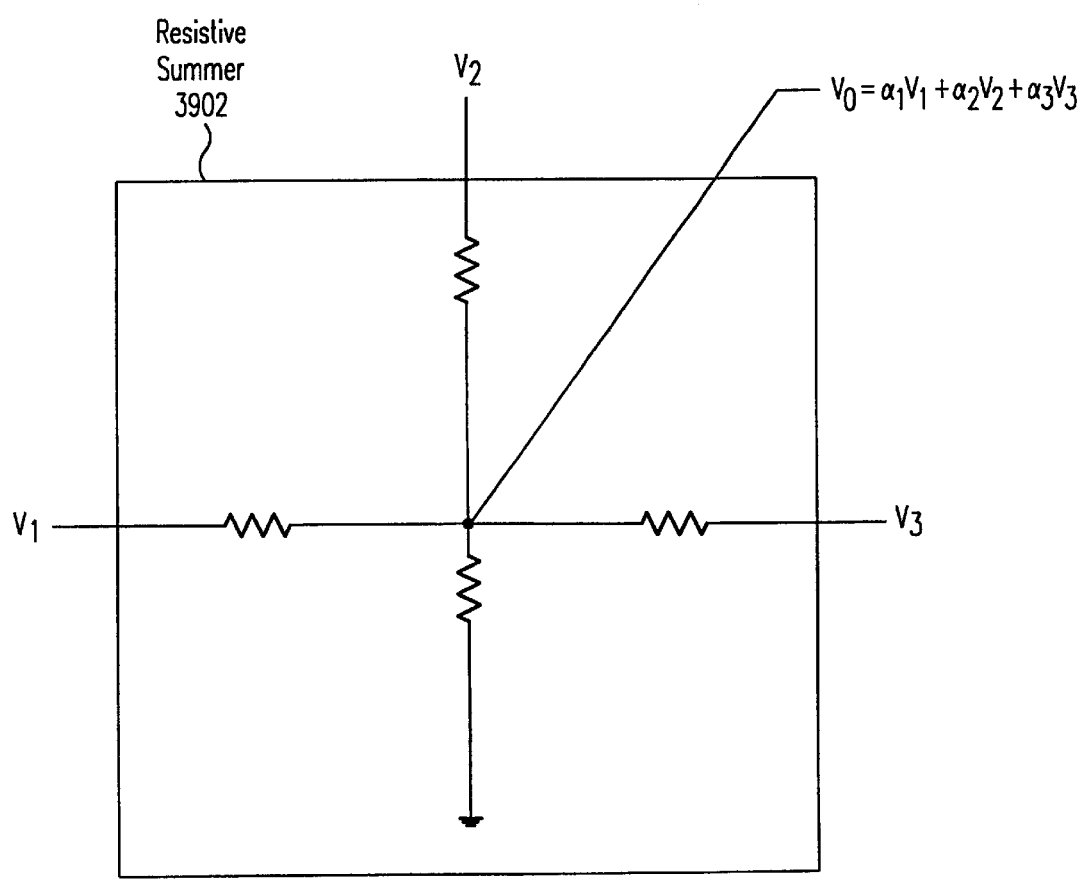
FIG. 39 illustrates an example resistive summer.

For example, the adder 1720 can be implemented using a resistive summer 3804 (FIG. 38). As will be appreciated by persons skilled in the relevant art(s), there are many configurations of resistive summers. FIG. 39 illustrates an example resistive summer 3902 that can be used to implement the adder 1720. However, the invention is not limited by this example.

Figure 40:
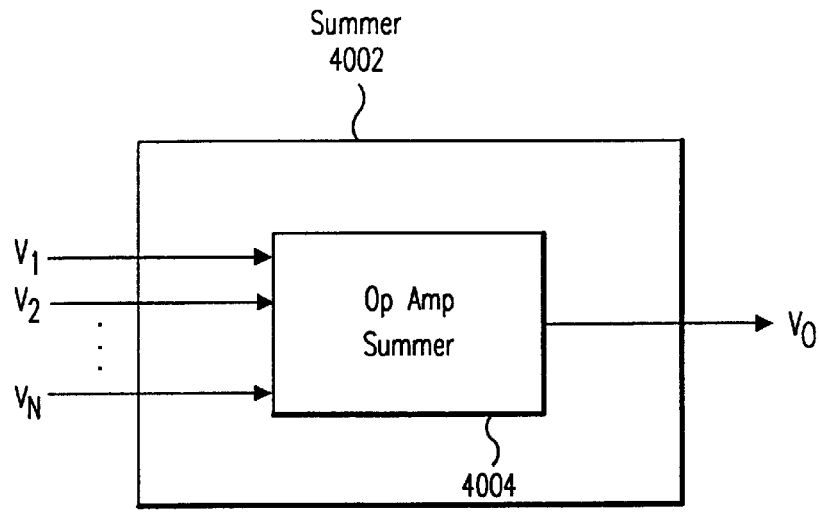
FIG. 40 illustrates an example OPAMP (operational amplifier) summer capable of implementing the summer/adder in an example UDF module according to an embodiment of the invention.
Figure 41:
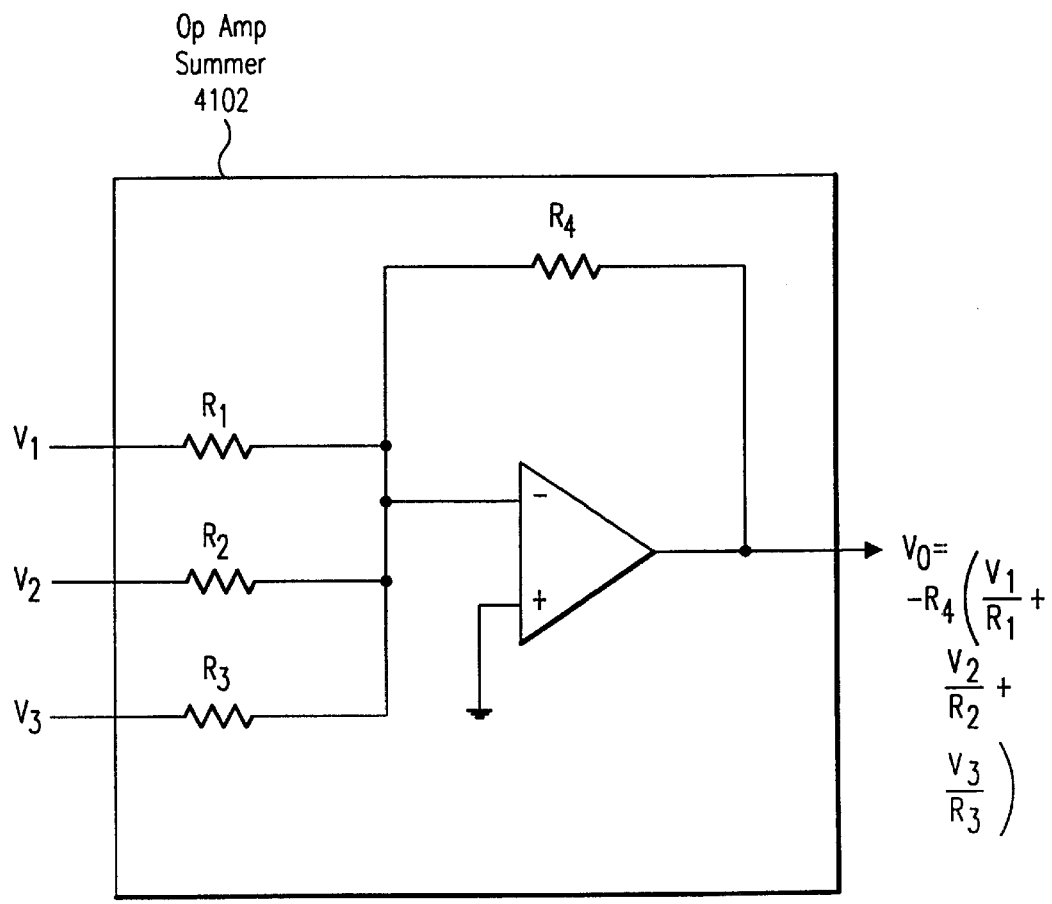
FIG. 41 illustrates an example OPAMP summer.

The adder 1720 could also be implemented using an OP AMP summer 4004 (FIG. 40). As will be appreciated by persons skilled in the relevant art(s), there are many types and configurations of OP AMP summers. For illustrative purposes, an example OP AMP summer 4102 is provided in FIG. 41. The structure and operation of the OP AMP summer 4102 will be apparent to persons skilled in the relevant art(s). It should be understood that the invention is not limited by the example OP AMP summer 4102 provided in FIG. 41.

The adder 1720 can also be implemented using a combination of summer components. This is shown, for example, in the embodiment of FIG. 26.

The above implementation examples are provided for illustrative purposes only, and are not limiting. Other implementation examples will be apparent to persons skilled in the relevant art(s) based on the teachings contained herein.

3.4.2.5 Control Signal Generator

Referring for illustrative purposes only to the UDF module 1702 in FIG. 17, the down-convert and delay module 1708 and the delay modules 1710, 1722 preferably operate according to control signals 1734A–1734F. Preferably, the control signals 1734A–1734F represent a bi-phase control signal, that is, a control signal with two phases, $\phi_1$ and $\phi_2$. Preferably, $\phi_1$ and $\phi_2$ have the same frequency and are not overlapping.

Figure 42:
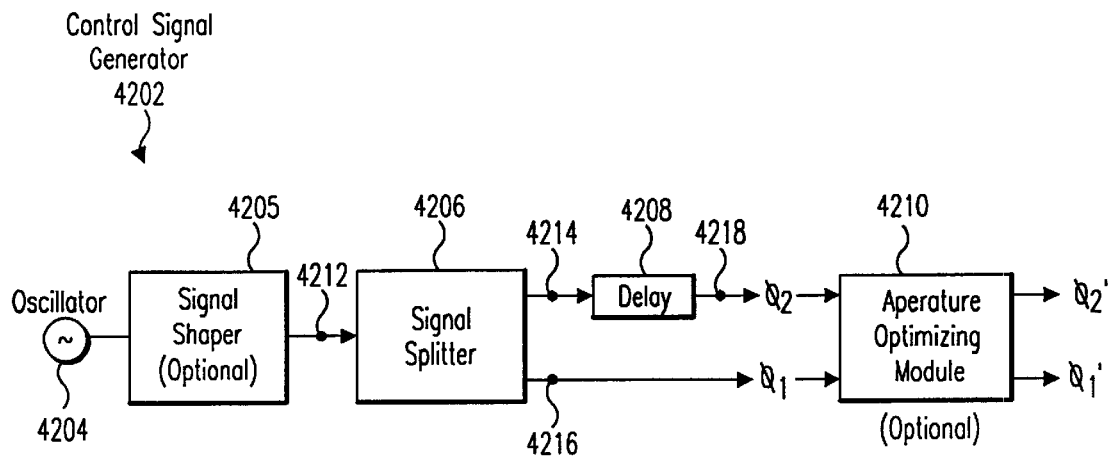
FIG. 42 illustrates an example control signal generator according to an embodiment of the invention.
Figure 43A:
FIGS. 43A–43D illustrate signals present at nodes in the control signal generator of FIG. 42.
Figure 43B:
Figure 43C:
Figure 43D:

An example representation of $\phi_1$ and $\phi_2$ is shown in FIGS. 43B and 43D. Any apparatus and circuit for generating such a bi-phase control signal can be utilized with the present invention. An example implementation of a control signal generator 1790 is presented in FIG. 42.

The control signal generator 1790 includes an oscillator 4204 and optionally a signal shaper 4205 that generate a series of pulses at a sampling frequency $f_S$. This is represented in FIG. 43A. A signal splitter 4206 splits this oscillating signal into two identical signals. An example representation of these two signals is shown in FIGS. 43B and 43C. These two signals are present at nodes 4216 and 4214, respectively, in the control signal generator 4202.

The signal splitter 4206 may cause some attenuation in the signals. Consequently, some embodiments of the invention may include amplifiers.

A delay module 4208 operates to delay one of the signals so as to generate $\phi_2$ present at node 4218. This is shown in FIG. 43D.

As noted above, in some embodiments, it is useful to adjust the aperture (width) of the pulses in one or more of the control signals $\phi_1$ and/or $\phi_2$. In such embodiments, an optional aperture optimizing module 4210 performs the task of adjusting the aperture (width) of the pulses of the control signals $\phi_1$ and/or $\phi_2$. The structure and operation of an embodiment of the aperture optimizing module 4210 is described in detail in co-pending U.S. Patent Application titled, "Methods and Systems for Down-Converting Electromagnetic Signals," referenced above.

The above implementation examples are provided for illustrative purposes only, and are not limiting. Other implementation examples will be apparent to persons skilled in the relevant art(s) based on the teachings contained herein.

3.4.2.6 Output Sample and Hold Module

Some embodiments of the UDF module may include an output sample and hold module. For example, the example UDF module 2622 in FIG. 26 includes an output sample and hold module 2636. Preferably, the output sample and hold module 2636 is positioned at the output of the adder 2626.

As evident from the embodiments discussed above, the output signal VO generated by the UDF module is typically represented by the output of the adder (although there are some embodiments and applications where this is not the case). See, for example, the UDF module 1702 in FIG. 17. In some implementations of the UDF module, such as that shown in FIG. 26, the value present at the output of the adder 2626 may not always represent a valid instance of the output signal VO. This is due, for example, to the propagation of signals through the UDF module. The output sample and hold module 2636 ensures that only valid values of the output of the adder 2626 (i.e., only valid instances of the output signal VO) are presented to downstream devices external to the UDF module.

In the example of FIG. 26, the value at the output of the adder 2626 is guaranteed to be valid only at rising edges of $\phi_1$. Accordingly, a switch 2691 in the output sample and hold module 2636 closes upon rising edges of $\phi_1$, thereby allowing the capacitor 2692 in the output sample and hold module 2636 to charge to the value at the output of the adder 2626. This value in the capacitor 2692 is presented to an output smoothing module 2638. The signal generated by the output smoothing module 2638 represents the output signal VO. See, for example, cell 1550 in Table 1502, and the accompanying description provided above.

The above implementation examples are provided for illustrative purposes only, and are not limiting. Other implementation examples will be apparent to persons skilled in the relevant art(s) based on the teachings contained herein.

3.4.2.7 Output Smoothing Module

Some embodiments of the UDF module may include an output smoothing module. For example, the example UDF module 2622 of FIG. 26 includes an output smoothing module 2636. The output smoothing module 2638 operates to smooth the signal generated by the output sample and hold module 2636. It is noted that the output smoothing module is an optional component.

The above implementation example is provided for illustrative purposes only, and is not limiting. Other implementation examples will be apparent to persons skilled in the relevant art(s) based on the teachings contained herein.

3.4.2.8 Mid-Point Injection Embodiment: High Frequency Delay Module

Referring to FIG. 25, the high frequency delay module 2506 utilized in the UDF module 2502 of the mid-point injection embodiments of the present invention can be implemented using any apparatus that delays a relatively high frequency signal, or instances of the signal, for a given amount of time. The frequency of the signal may be, for example, RF or greater (but the invention is not limited to these frequencies—the frequency of the signal may be less than RF).

Any well known delay lines and/or transmission structures can be used to implement the high frequency delay module 2506. For example, a transmission line of known length can be used to implement the high frequency delay module 2506. As will be apparent to persons skilled in the relevant art(s), a particular delay can be obtained using a transmission line of known length.

Other apparatuses or structures for implementing the high frequency delay module 2506 will be apparent to persons skilled in the relevant art(s) based on the discussion contained herein.

3.4.2.9 Mid-Point Injection Embodiment: Optional Filter

Referring to FIG. 25, the filter 2508 optionally utilized in the UDF module 2502 of the mid-point injection embodiments of the present invention can be implemented using any appropriate filtering apparatus. Preferably, the filter 2508 represents a high frequency, wideband filter. Any appropriate known filter topology can be employed, such as an LC configuration, strip lines, and/or a saw filter. Many apparatuses or structures for implementing the filter 2508 will be apparent to persons skilled in the relevant art(s) based on the discussion contained herein.

3.4.2.10 Mid-Point Injection Embodiment: Downconvert Module

Referring to FIG. 25, the downconvert module 2526 utilized in the UDF module 2502 of the mid-point injection embodiments of the present invention can be implemented using any apparatus that performs frequency downconversion. For example, any well known frequency down-conversion apparatus employing a mixer and an oscillator can be used. Other well known apparatuses that perform frequency down-conversion suitable for use with the present invention will be apparent to persons skilled in the relevant art(s) based on the discussion contained herein.

According to embodiments of the invention, the downconvert module 2526 is alternatively implemented using the universal frequency down-conversion (UFD) module. The UFD module is described above.

3.4.2.11 Mid-Point Injection Embodiment: Upconvert Module

Referring to FIG. 25, the upconvert module 2524 utilized in the UDF module 2502 of the mid-point injection embodiments of the present invention can be implemented using any apparatus that performs frequency upconversion that retains amplitude and phase information. For example, any well known frequency upconversion apparatus employing a mixer and an oscillator can be used. Other well known apparatuses that perform frequency upconversion suitable for use with the present invention will be apparent to persons skilled in the relevant art(s) based on the discussion contained herein.

The reader is directed to co-pending U.S. application "Method and System for Frequency Up-Conversion," application Ser. No. 09/176,154, incorporated herein by reference in its entirety. Teachings relating to frequency up-conversion contained in that U.S. application may be applicable to this and other aspects of the present invention.

3.4.3 Implementing the UDF Module as an Integrated Circuit (IC)

The invention is direct to the UDF module implemented on an integrated circuit (IC).

Understanding of this aspect of the invention may be facilitated by considering IC fabrication technology.

The fabrication of filters typically requires very tight tolerances on component parts of the filters, such as capacitors, inductors, resistors, etc. In contrast, the UDF module of the present invention does not require a high degree of accuracy on the values of elements used therein. More particularly, the UDF module does not require a high degree of accuracy on the value of any given individual circuit element used therein.

Instead, according to the invention, the parameters of the filters depend on the ratio of element values. This is illustrated, for example, by the above description of the switched capacitor of FIG. 32, where the scaling factor depended on the ratio of C1 to C2.

As will be appreciated by persons skilled in the relevant art(s), it is difficult with present day fabrication technology to achieve tight tolerances on individual circuit component values, especially when operating at high frequencies (such as RF and above). However, current technology allows for tight tolerances on the ratios of circuit component values. This is generally the case for all operating frequencies. Thus, the invention facilitates the IC fabrication process.

This aspect of the present invention is one factor that enables the UDF module to be implemented as an IC.

There are a number of additional aspects of the UDF module that enable it to be implemented as an IC.

For example, the component of the UDF module that preferably performs the frequency translation operation, i.e., the universal frequency down-conversion module, is achieved using a limited number of components. See, for example, the embodiment of FIG. 26, where the frequency down-conversion operation is being performed essentially by a switch 2650 and a capacitor 2652.

Also, according to the present invention, input filtering is preferably achieved using a limited number of components. Again, for example, see the example UDF module 2622 of FIG. 26.

Further, the goals of the invention (input filtering and frequency translation) are preferably achieved without the use of large capacitors, inductors, or resistors. These aspects of the invention are discussed above.

Thus, the architecture of the invention is friendly to integrated circuit design techniques and processes. Consequently, as will be appreciated by persons skilled in the relevant art(s) based on the teachings contained herein, any of the embodiments of the UDF module can be implemented on an integrated circuit using existing fabrication technology.

3.4.4 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

4 Designing a Unified Downconverting and Filtering (UDF) Module

A methodology for designing a unified downconverting and filtering (UDF) module according to an embodiment of the invention shall now be described. This methodology is applicable to any of the embodiments of the UDF module discussed or contemplated herein.

It should be understood that this methodology is provided for purposes of illustration, and is not intended to limited the invention. Alternate design methodologies, differing slightly or substantially from those described herein, will be apparent to persons skilled in the relevant art(s) based on the teachings contained herein. Such alternate design methodologies fall within the scope and spirit of the present invention.

Figure 49:
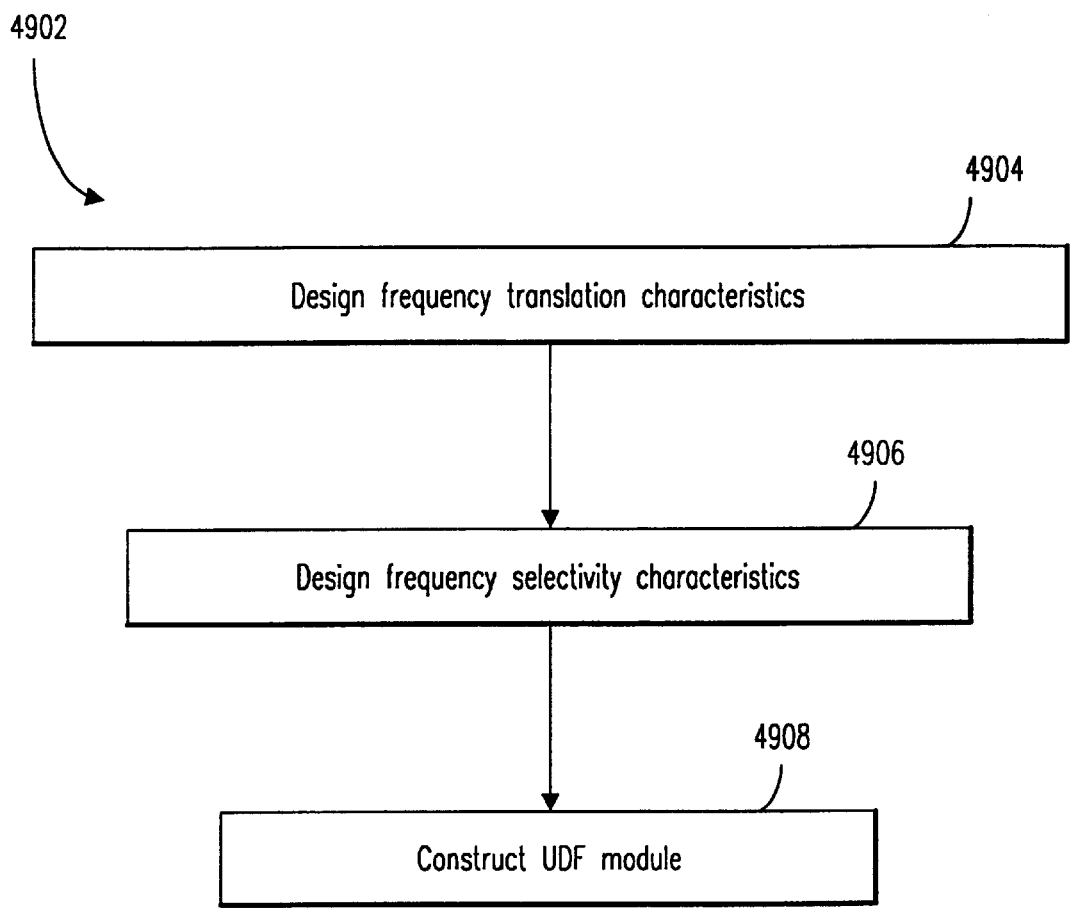
FIG. 49 is a flowchart depicting the manner in which a UDF module is designed according to an embodiment of the invention.

Referring now to a flowchart 4902 in FIG. 49, in step 4904, the UDF module is designed so as to exhibit desired frequency translation characteristics. Such characteristics may include, for example and without limitation, the expected frequency of the input signal and the desired frequency of the output signal. Such characteristics may also include, for example and without limitation, whether the input signal is down-converted to an IF signal, down-converted to a demodulated baseband signal, down-converted from an FM signal to a PM or an AM signal, etc. Such characteristic may also include, for example and without limitation, whether energy transfer should be augmented during the frequency translation process.

In step 4906, the UDF module is designed so as to exhibit desired frequency selectivity characteristics. Such characteristics may include, for example and without limitation, the type of filtering to be performed by the UDF module (low pass, high pass, band pass, all pass, band stop, notch, etc.), the filtering center frequency, the filtering bandwidth, the filtering passband, etc.

It is noted that steps 4904 and 4906 may be performed in any order.

In step 4908, the UDF module is constructed in accordance with the design considerations of steps 4904 and 4906.

The operation of the steps of flowchart 4902 shall now be described in greater detail with reference to a flowchart 5002 in FIG. 50.

Figure 50:
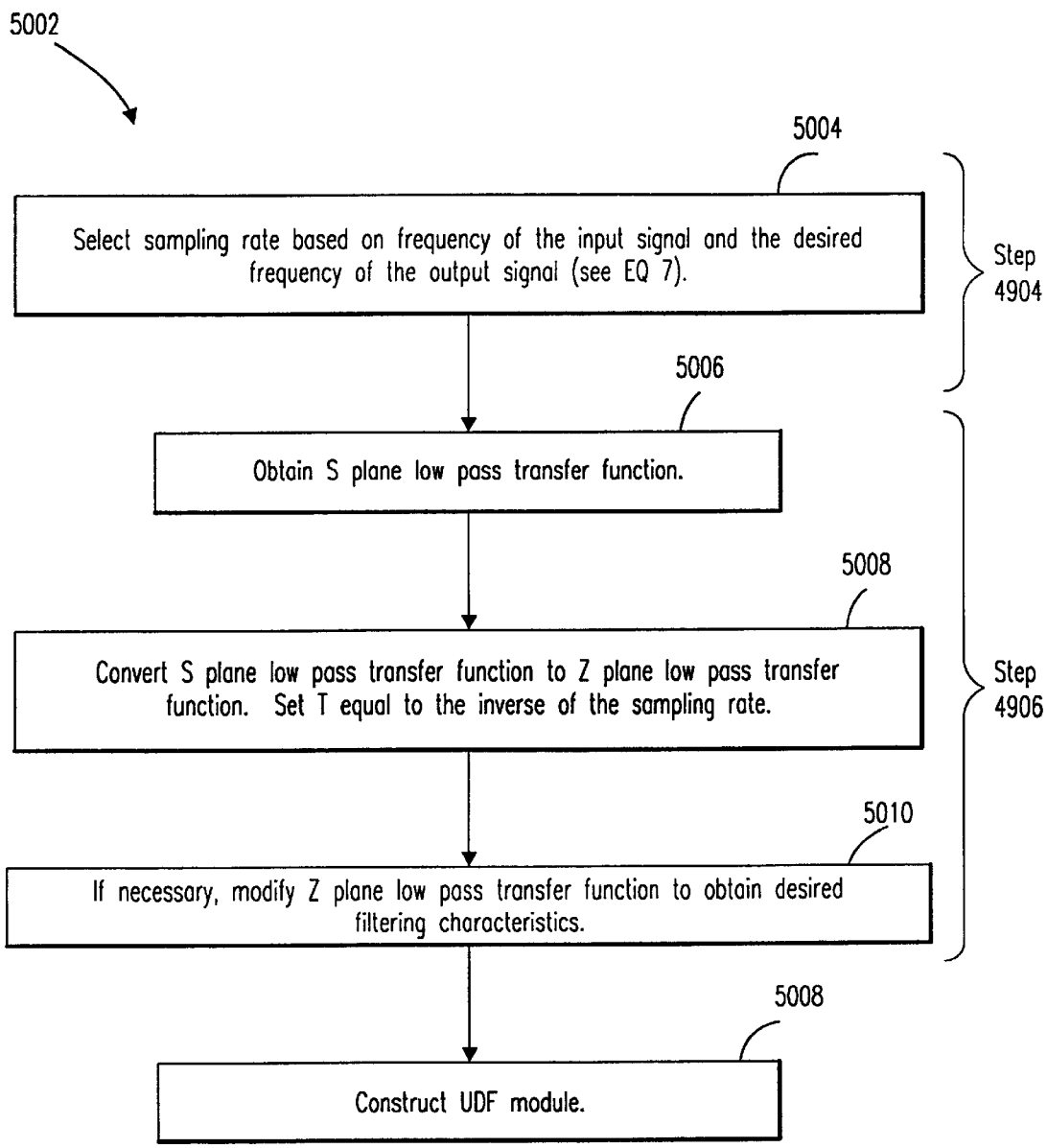
FIG. 50 is a more detailed flowchart depicting the manner in which a UDF module is designed according to an embodiment of the invention.

Step 4904 (designing the UDF module so as to exhibit desired frequency translation characteristics) is represented by step 5004 in FIG. 50. Preferably, the desired frequency translation characteristics of the UDF module is established by selecting the sampling rate. There may be other considerations, as described above, and further described in co-pending U.S. Patent Application titled, "Methods and Systems for Down-Converting Electromagnetic Signals," referenced above.

Step 4906 (designing the UDF module so as to exhibit desired frequency selectivity characteristics) is represented by steps 5006–5010 in FIG. 50, which are now described.

In step 5006, a low pass transfer function in the S plane is obtained/selected. As will be appreciated by persons skilled in the relevant art(s), it is common practice to design a filter by starting with a lowpass filter at a desired cutoff frequency. As will be further appreciated by persons skilled in the relevant art(s), there are numerous formulas and/or design tables for low pass transfer functions, including Butterworth, Chebyshev, elliptic filters, etc. Any of these may be utilized as the S plane low pass transfer function obtained/selected in step 5006.

In step 5008, the S plane low pass transfer function obtained in step 5006 is converted to a Z plane low pass transfer function. Step 5008 is preferably performed by substituting S variables in the S plane low pass transfer function with the expression provided in EQ. 8. As will be appreciated by persons skilled in the relevant art(s), other S plane to Z plane transformations exist. Any of these transformations may be used in the present invention.

$$S = \frac{2(1 - z^{-1})}{T(1 + z^{-1})} \qquad \text{EQ. 8}$$

In EQ. 8, T represents the inverse of the sampling rate (determined in step 5004). In other words, T is equal to 1/(sampling rate).

In step 5010, if necessary, the Z plane low pass transfer function is modified to obtain desired filtering characteristics. Preferably, the modifications of step 5010 are performed using any well known transformation expressions. Examples of such well known transformation expressions are provided, without limitation, in FIG. 51 (the transformation expressions of FIG. 51 are independent of the manner in which the S plane to Z plane conversion was performed in step 5008). In these expressions, $\theta_p$ represents the cutoff frequency of the S low pass transfer function obtained and modified in steps 5006 and 5008.

The table 5102 in FIG. 51 is from Oppenheim and Schafer, *Digital Signal Processing*, Prentice-Hall, New Jersey, 1975, page 230. This entire publication is herein incorporated by reference.

As will be appreciated by persons skilled in the relevant art(s), other transformation expressions exist. Any such transformations can be used by the present invention.

When using the example transformations of table 5102, it is possible to obtain a Z plane high pass transfer function from the Z plane low pass transfer function of step 5008 by using the transformation and formulas of cells 5106 and 5114. It is possible to obtain a Z plane bandpass transfer function from the Z plane low pass transfer function of step 5008 by using the transformation and formulas of cells 5108 and 5116. It is possible to obtain a Z plane bandstop transfer function from the Z plane low pass transfer function of step 5008 by using the transformation and formulas of cells 5110 and 5118. It is possible to obtain a modified Z plane lowpass transfer function from the Z plane low pass transfer function of step 5008 by using the transformation and formulas of cells 5104 and 5112.

The equations and transformations of FIG. 51 establish filtering characteristics such as the center frequency and the passband. For example, with regard to the bandpass filter, once the transformation in cell 5108 has been applied to the Z plane low pass transfer function generated in step 5008, the original low pass cutoff frequency $\theta_p$ represents the center frequency of the band pass filter. The passband of the band pass filter is defined by $\omega_1$ and $\omega_2$.

It is noted that Z plane transfer functions generated as described above with reference to steps 5006, 5008, and 5010 may differ in form and/or content from the transfer functions of EQS. 1–6. This illustrates the great flexibility, broad scope, and wide applicability of the present invention. In particular, the present invention is operable according to (i.e., the invention can be implemented in accord with) any or at least a large number of filtering transfer functions generated using any or at least a large number of procedures, as will be apparent to persons skilled in the relevant art(s) based on the teachings contained herein.

Still referring to FIG. 50., in step 4908, the UDF module is constructed in accordance with the design considerations of steps 5004–5010. Consider, for example, the UDF module 1702 in FIG. 17. The number of delay elements and the arrangement of the delay elements in the UDF module 1702 (such as the downconvert and delay module 1708 and the delay modules 1710, 1722) are dictated by the delay factors in the filter transfer function produced after operation of steps 5006, 5008, and 5010. This is apparent from the discussion in prior sections. The sampling rate selected in step 5004 corresponds to the control signal 1734. The constants in the filter transfer function (produced after operation of steps 5006, 5008, and 5010) are achieved by the scaling modules 1716, 1724 (and optionally 1790).

5 Adjustable UDF Module

As noted above, and referring to FIG. 17 for illustrative purposes only, the frequency translation and selectivity characteristics of the UDF module 1702 are established in large part by the control signal 1734 (including the sample clock) and the scaling modules 1716, 1724. In embodiments of the UDF module, various parameters are adjustable, including but not limited to the control signal 1734 and the scaling modules 1716, 1724. Accordingly, frequency translation and selectivity characteristics of the UDF module that depend on the control signal 1734 and the scaling modules 1716, 1724 are adjustable. In some embodiments, such characteristics (and perhaps others) are electronically adjustable.

Frequency translation characteristics, including but not limited to the desired frequency of the output signal, whether the input signal is down-converted to an IF signal, down-converted to a demodulated baseband signal, down-converted from an FM signal to a PM or an AM signal, etc., and whether energy transfer should be augmented during the frequency translation process, can be adjusted by adjusting, for example and without limitation, characteristics of the control signal 1734 (such as rate and/or pulse aperature).

Frequency selectivity characteristics, including but not limited to the filter center frequency, the filter bandwidth, the filter passband, the filter type, etc., can be adjusted by adjusting, for example and without limitation, the scaling factors of the scaling modules 1716, 1722 and/or the control signal 1734 (such as rate and/or pulse aperature).

The control signal can be adjusted, for example, by implementing the control signal generator 4202 (FIG. 42) using a tunable oscillator, and implementing the aperature optimizing module 4210 using tunable components (such as tunable resistors, capacitors, inductors, etc.). Such tunable elements may be electrically tunable.

The scaling factors can be adjusted by implementing the scaling modules 1716, 1722 using adjustable components, such as tunable resistors, capacitors, inductors, etc. Such tunable elements may be electrically tunable.

The tunable devices may be manually controlled. Alternatively, embodiments of the UDF module include control modules to automatically control such tunable devices (in some embodiments, the control modules operate according to user input and/or commands). The control modules may operate in real time, such that the UDF module is dynamically tunable. The control modules may be implemented as a software controlled processor, a state machine, etc., or combinations thereof.

6 Amplification

As described above, unified down-converting and filtering according to embodiments of the present invention involves both frequency down-conversion and filtering. According to embodiments of the invention, unified down-converting and filtering of the present invention also includes signal amplification. This feature of the invention is discussed in this section.

Recall, for example purposes only, EQ. 2 that represents an example transfer function of a band-pass filter. (It is noted that EQ. 2 is referred to for illustrative purposes. This aspect of the invention is applicable to other transfer functions and other filter types.)

$$\frac{VO}{VI} = \frac{\alpha_1 z}{z^2 + \beta_1 z + \beta_0} \qquad \text{EQ. 2}$$

It is possible to achieve amplification or attenuation by a factor K by scaling the numerator by K. K is a real number. Doing this for EQ. 2 yields the following:

$$\frac{VO}{VI} = \frac{K\alpha_1 z}{z^2 + \beta_1 z + \beta_0} \qquad \text{EQ. 9}$$

Solving for VO yields the following:

$$VO = K\alpha_1 z^{-1} VI - \beta_1 z^{-1} VO - \beta_0 z^{-2} VO \qquad \text{EQ. 10}$$

In embodiments of the invention, such amplification is achieved as specified by EQS. 9 and 10 by inserting a scaling module having a scale factor K in each feedforward path of the UDF module. Consider, for example, UDF module 1702 in FIG. 17. A scaling module 1790 having scale factor K is inserted into each feedforward path to thereby achieve an amplification or attenuation factor of K. The scaling modules 1790 may be electrically adjustable/tunable.

Alternatively, the scale factors of scaling modules 1716 are adjusted to incorporate the amplification/attentuation scale factor K. In such embodiments, the scale factors of the scaling modules 1716 affect both the filtering operation and the amplification/attenuation operation.

It is noted that this feature of the invention is optional. Where amplification is not required, the scaling modules 1790 can be omitted (or their scale factors can be set to 1).

The invention supports amplification adjustment. That is, the amplification achieved by the UDF module 1702 can be adjusted by adjusting the scale factors of the scaling modules 1716. Such amplification adjustment can be performed statically or dynamically, and can also be performed electronically.

Such adjustment can be manually controlled, or can be automatically controlled using a processor operating according to control modules that comprise software, a hardware state machine, etc., or a combination thereof. In some embodiments, the control modules operate according to user input and/or commands.

This amplification feature of the invention has been described in the context of the example UDF module 1702 of FIG. 17 for illustrative purposes only. The amplification feature as described herein is equally applicable to other UDF modules.

7 Example Applications

The following sections describe applications involving the UDF module of the present invention. The invention includes these applications. It should be understood that the invention is not limited to the particular applications described below. Equivalents, extensions, variations, deviations, etc., of the following will be apparent to persons skilled in the relevant art(s) based on the teachings contained herein. In particular, any application requiring the performance of at least a frequency translation operation and a frequency selectivity operation may utilize the UDF module described herein. Such applications are within the scope and spirit of the present invention.

7.1 Receiver

As noted above with reference to FIG. 8, a receiver performs three primary functions: frequency translation 808, frequency selection 810, and amplification 812.

Embodiments of the unified down-converting and filtering (UDF) module perform the frequency translation operation 808 and the frequency selection module 810. In some embodiments, the frequency selection operation 810 performed by the UDF module represents input filtering at any frequency, including RF and greater frequencies. Accordingly, such embodiments of the UDF module perform the primary functions of a receiver, except for amplification.

Figure 30:
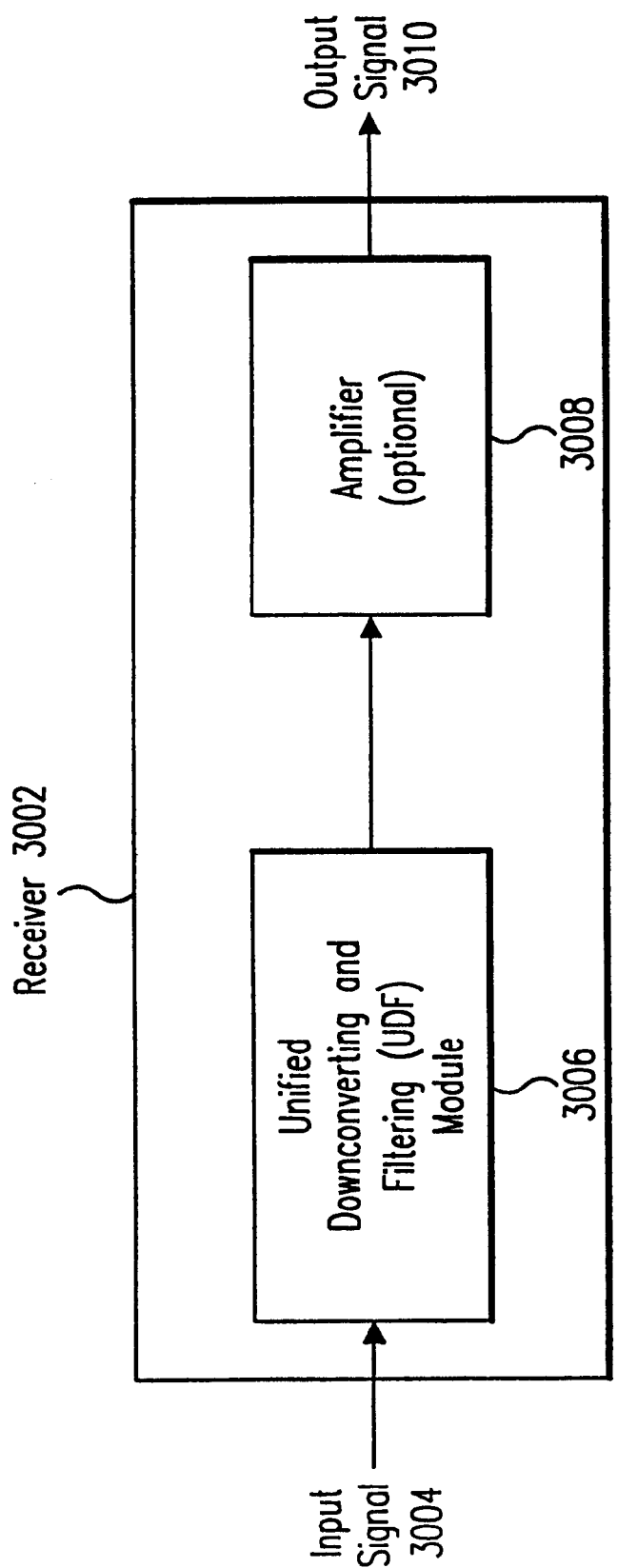
FIG. 30 is a block diagram of an example receiver according to an embodiment of the invention.

Therefore, it is possible to form a receiver in accordance with the present invention by combining the UDF module 1102 with an amplifier. This is shown in FIG. 30.

Figure 31:
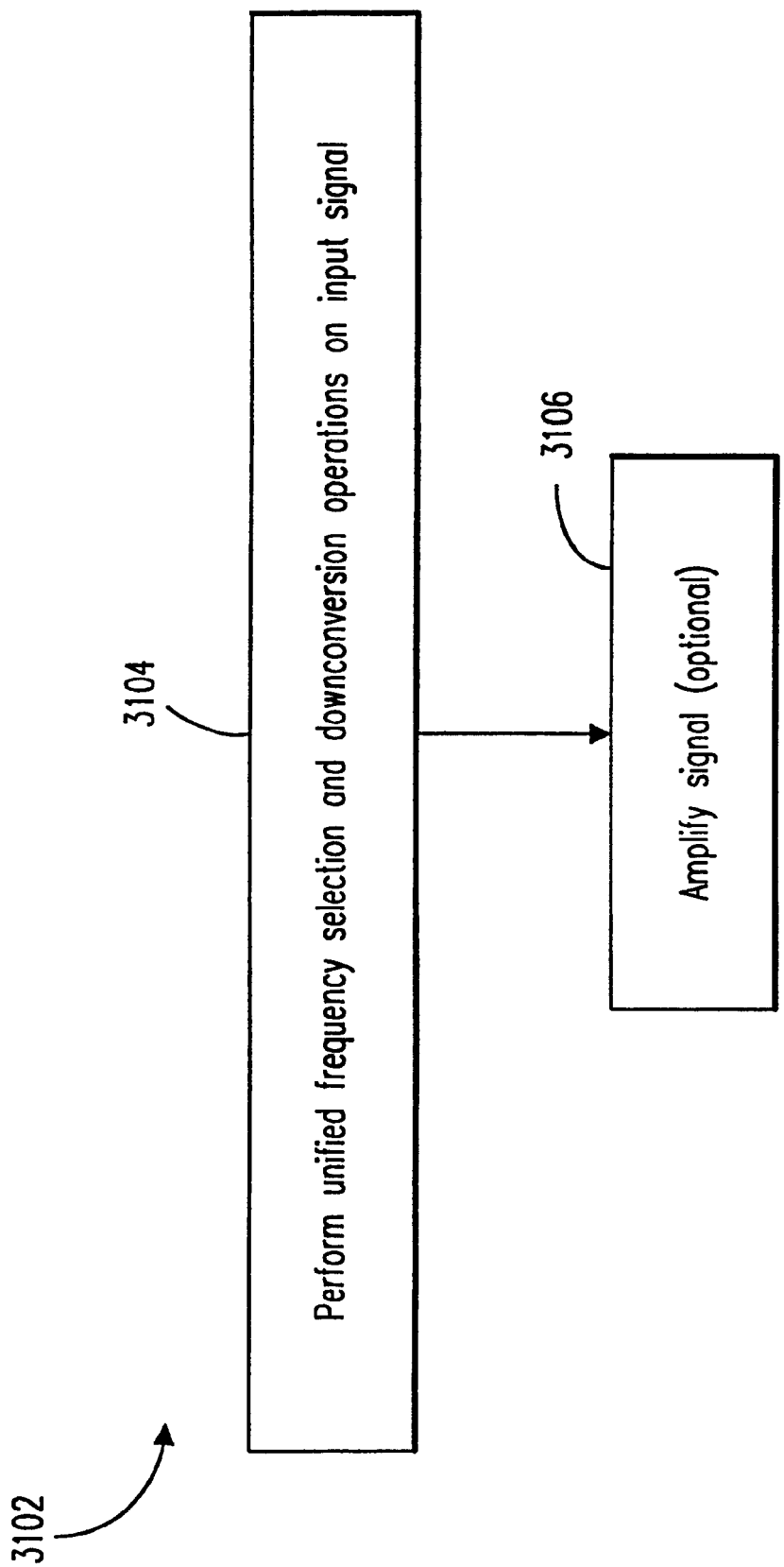
FIG. 31 is a flowchart representing the operation of the receiver of FIG. 30 according to an embodiment of the invention.

According to this receiver 3002, the UDF module 3006 performs unified frequency selection and conversion operations on an input signal 3004 in the manner described herein. The amplifier 3008 amplifies the output of the UDF module 1102 to thereby generate an output signal 3010. This operation of the receiver 3002 is represented in a flowchart 3102 in FIG. 31.

In some applications, the level of the output signal generated by the UDF module 3006 is sufficient for downstream processing. In such cases, an amplifier is not necessary. In this case, the embodiment of the UDF module 3006 shown in FIG. 30 (that performs frequency selection and translation, but not amplification) is sufficient to act as a receiver.

As noted above, some UDF embodiments also perform amplification. In such embodiments, the UDF module performs the primary functions of a receiver, i.e., frequency translation 808, frequency selection 810, and amplification 812. In such embodiments, the UDF module alone is sufficient to act as a receiver.

As will be apparent to persons skilled in the relevant art(s), the receiver 3002 can be implemented on an integrated circuit (IC). As discussed above, the UDF module can be implemented on an IC. Depending on the application, the UDF module performs most, if not all, of the functions required of a receiver. Accordingly, it follows that any receiver implemented using an embodiment of the UDF module can be implemented on an IC. Embodiments of the present invention are directed to such receivers implemented on an IC.

7.2 Other Application Examples

The applications described above are provided for purposes of illustration. These applications are not intended to limit the invention. Alternate applications, differing slightly or substantially from those described herein, will be apparent to persons skilled in the relevant art(s) based on the teachings contained herein. Such alternate applications fall within the scope and spirit of the present invention.

Figure 52A:
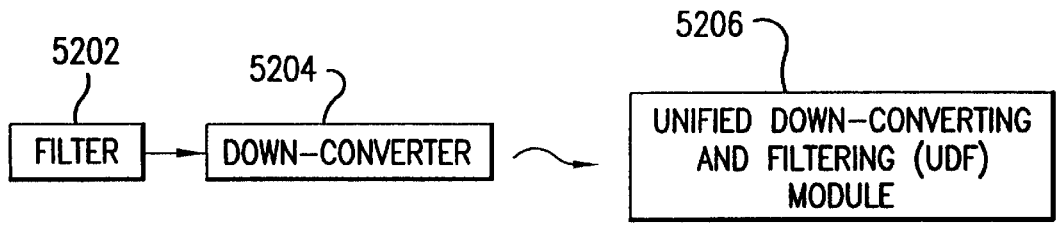
FIGS. 52A–52F illustrate example applications of the UDF module according to embodiments of the invention.
Figure 52B:
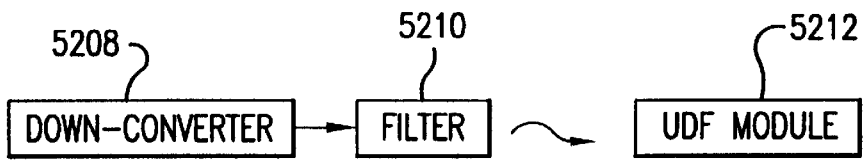
Figure 52C:
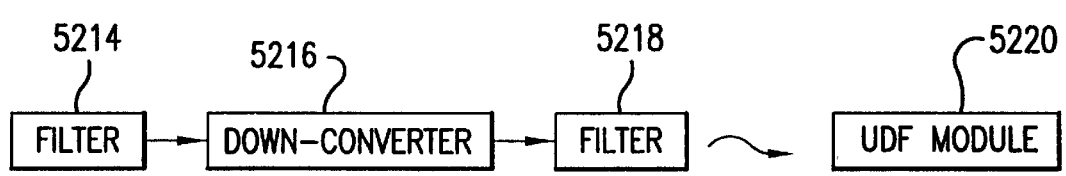
Figure 52D:
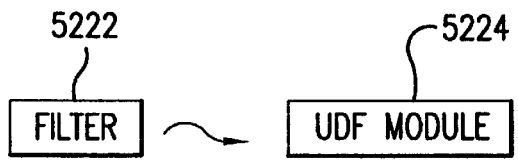
Figure 52E:
Figure 52F:

For example, and without limitation, UDF embodiments can be utilized in applications that involve filtering and frequency translation (in any combination or order), as illustrated in FIGS. 52A–52C. Also, UDF embodiments can be utilized in applications that involve filtering with or without down-conversion (in the latter case, the extent of frequency down-conversion by such UDF embodiments is minimized), as shown in FIG. 52D. Further, UDF embodiments can be utilized in applications that involve down-conversion with or without filtering (in the latter case, such UDF embodiments pass substantially all frequencies), as shown in FIG. 52E. Additionally, UDF embodiments can be utilized in applications that involve amplification or attentuation, as shown in FIG. 52F. It is noted that these features of the invention can be combined. Specifically, depending on the application, one or more of filtering, frequency translation, and amplification/attenuation can be arranged in desired combinations.

8 CONCLUSION

Example implementations of the systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An apparatus for down-converting and filtering an input signal having a carrier frequency, comprising:

(a) sampling means for sampling and delaying the input signal at a sampling frequency of less than twice the carrier frequency to produce a delayed input sample of a down-converted image of the input signal;

(b) delaying means for generating one or more delayed instances of an output signal; and (c) combining means for combining at least the delayed input sample with the one or more delayed instances of the output signal to generate an instance of the output signal.

2. The apparatus of claim 1, wherein the delayed input sample is an analog signal and the delayed instances are analog signals.

3. The apparatus of claim 1, wherein the delayed instances are delayed by an integral number of sampling periods of the sampling means.

4. The apparatus of claim 1, wherein the delaying means includes one or more sample-and-hold circuits.

5. The apparatus of claim 1, wherein the combining means includes a summer.

6. The apparatus of claim 1, further including means for scaling at least one of the delayed input sample and the one or more delayed instances of the output signal.

7. The apparatus of claim 1, wherein the input signal is a radio frequency signal.

8. The apparatus of claim 1, wherein the sampling means samples the input signal according to a control signal.

9. A method for down-converting and filtering an input signal having a carrier frequency, comprising the steps of:
   (a) sampling and delaying the input signal at a sampling frequency of less than twice the carrier frequency to produce a delayed input sample of a down-converted image of the input signal;
   (b) delaying an output signal to generate one or more delayed instances of the output signal; and
   (c) combining at least the delayed input sample with the one or more delayed instances of the output signal to generate an instance of the output signal.

10. The method of claim 9, wherein the delayed input sample is an analog signal, and wherein step (b) includes the step of storing the one or more delayed instances as analog signals.

11. The method of claim 9, wherein a sampling period is equal to the inverse of the sampling frequency, wherein the delayed instances are delayed by one or more integral numbers of the sampling period.

12. The method of claim 9, wherein step (c) includes the step of summing the delayed input sample with the one or more delayed instances of the output signal to generate an instance of the output signal.

13. The method of claim 9, further including the step of scaling at least one of the delayed input sample and the one or more delayed instances of the output signal.

14. The method of claim 9, further including the step of receiving the input signal, wherein the input signal is a radio frequency signal.

15. The method of claim 9, wherein step (a) includes the step of:
   (1) sampling the input signal according to a control signal.

16. The method of claim 9, further including the step of:
   (d) adjusting at least one frequency selectivity characteristic.

17. The method of claim 16, wherein step (d) includes the step of:
   (1) tuning one of a filter center frequency, a filter bandwidth, and a filter passband.

18. An apparatus for down-converting and filtering an input signal having a carrier frequency, comprising:
   (a) a plurality of sampling means for sampling and delaying the input signal to produce a plurality of delayed input samples of a down-converted image of the input signal, wherein each of the plurality of sampling means samples the input signal at a corresponding sampling frequency that is less than twice the carrier frequency;
   (b) delaying means for generating one or more delayed instances of an output signal; and
   (c) combining means for combining at least the plurality of delayed input samples with the one or more delayed instances of the output signal to generate an instance of the output signal.

19. A method for down-converting and filtering an input signal having a carrier frequency, comprising the steps of:
   (a) sampling and delaying the input signal at a plurality of sampling frequencies of less than twice the carrier frequency to produce delayed input samples of a down-converted image of the input signal;
   (b) delaying an output signal to generate one or more delayed instances of the output signal; and
   (c) combining at least the delayed input samples with the one or more delayed instances of the output signal to generate an instance of the output signal.

* * * * *

UNITED STATES PATENT AND TRADEMARK OFFICE
CERTIFICATE OF CORRECTION

PATENT NO. : 6,560,301 B1
DATED : May 6, 2003
INVENTOR(S) : Cook et al.

It is certified that error appears in the above-identified patent and that said Letters Patent is hereby corrected as shown below:

Title page,
Item [56], References Cited, OTHER PUBLICATIONS, please insert the following:
-- English-language Abstract of Japanese Patent Publications No. 04-123614, from *http:wwwl.ipdl.jpo.go.jp,* 2 Pages (April 23, 1992 - Date of publication of application). --.
"Basili, P. et al.," reference, (first occurrence) please replace with the following:
-- Basili,P. *et al.,* "Case Study of Intense Scintillation Events on the OTS Path," *IEEE Trans. On Antennas and Propagation,* vol. 38, no. 1, January 1990, pp. 107-113. --.
"Press Release, Parkerversion Expands Senio Management Team," reference, please replace "Senio" with -- Senior --.

Column 1,
Line 19, please replace "1999" with -- 1998 --.

Signed and Sealed this

Tenth Day of August, 2004

JON W. DUDAS
*Acting Director of the United States Patent and Trademark Office*